(12) United States Patent
Miyazawa et al.

(10) Patent No.: US 10,777,598 B2
(45) Date of Patent: Sep. 15, 2020

(54) IMAGE PICKUP DEVICE AND ELECTRONIC APPARATUS

(71) Applicant: SONY CORPORATION, Tokyo (JP)

(72) Inventors: Shinji Miyazawa, Kanagawa (JP); Yoshiaki Masuda, Kanagawa (JP)

(73) Assignee: Sony Corporation, Toyko (JP)

( * ) Notice: Subject to any disclaimer, the term of this patent is extended or adjusted under 35 U.S.C. 154(b) by 0 days.

(21) Appl. No.: 16/085,415

(22) PCT Filed: Mar. 10, 2017

(86) PCT No.: PCT/JP2017/009669
§ 371 (c)(1),
(2) Date: Sep. 14, 2018

(87) PCT Pub. No.: WO2017/163926
PCT Pub. Date: Sep. 28, 2017

(65) Prior Publication Data
US 2019/0043910 A1 Feb. 7, 2019

(30) Foreign Application Priority Data
Mar. 24, 2016 (JP) .................................. 2016-059979

(51) Int. Cl.
*H01L 27/146* (2006.01)
*H01L 25/18* (2006.01)
(Continued)

(52) U.S. Cl.
CPC ...... *H01L 27/14634* (2013.01); *H01L 21/768* (2013.01); *H01L 25/065* (2013.01);
(Continued)

(58) Field of Classification Search
CPC . H01L 27/14634; H01L 25/18; H01L 25/065; H01L 21/768; H01L 25/07;
(Continued)

(56) References Cited

U.S. PATENT DOCUMENTS

2001/0050721 A1 12/2001 Miyake
2007/0236596 A1 10/2007 Sekine et al.
(Continued)

FOREIGN PATENT DOCUMENTS

JP 2001-292354 10/2001
JP 2002-171430 6/2002
(Continued)

OTHER PUBLICATIONS

International Search Report prepared by the Japan Patent Office dated Apr. 25, 2017, for International Application No. PCT/JP2017/009669.

*Primary Examiner* — Cuong B Nguyen
(74) *Attorney, Agent, or Firm* — Sheridan Ross P.C.

(57) ABSTRACT

The present disclosure relates to an image pickup device and an electronic apparatus that enable further downsizing of device size.
The device includes: a first structural body and a second structural body that are layered, the first structural body including a pixel array unit, the second structural body including an input/output circuit unit, and a signal processing circuit; a first through-via, a signal output external terminal, a second through-via, and a signal input external terminal that are arranged below the pixel array, the first through-via penetrating through a semiconductor substrate constituting a part of the second structural body, the second through-via penetrating through the semiconductor substrate; a substrate connected to the signal output external terminal and the signal input external terminal; and a circuit board connected to a first surface of the substrate. The present disclosure can be applied to, for example, the image pickup device, and the like.

20 Claims, 78 Drawing Sheets

(51) Int. Cl.
*H04N 5/369* (2011.01)
*H04N 5/374* (2011.01)
*H01L 25/065* (2006.01)
*H01L 21/768* (2006.01)
*H01L 25/07* (2006.01)
*H01L 23/00* (2006.01)

(52) U.S. Cl.
CPC .............. *H01L 25/07* (2013.01); *H01L 25/18* (2013.01); *H01L 27/1469* (2013.01); *H01L 27/14627* (2013.01); *H01L 27/14636* (2013.01); *H04N 5/369* (2013.01); *H04N 5/374* (2013.01); *H04N 5/379* (2018.08); *H01L 24/48* (2013.01); *H01L 24/73* (2013.01); *H01L 2224/48227* (2013.01); *H01L 2224/48463* (2013.01); *H01L 2224/73257* (2013.01)

(58) Field of Classification Search
CPC ........... H01L 27/1469; H01L 27/14627; H01L 27/14636; H01L 24/48; H01L 24/73; H01L 2224/48227; H01L 2224/48463; H01L 2224/73257; H04N 5/369; H04N 5/374; H04N 5/379
See application file for complete search history.

(56) References Cited

U.S. PATENT DOCUMENTS

| | | |
|---|---|---|
| 2007/0291982 A1 | 12/2007 | Sung et al. |
| 2011/0221956 A1 | 9/2011 | Sekine et al. |
| 2011/0249106 A1 | 10/2011 | Makino et al. |
| 2011/0316108 A1 | 12/2011 | Nihei et al. |
| 2013/0092820 A1 | 4/2013 | Takemoto |
| 2014/0042299 A1* | 2/2014 | Wan .................. H01L 27/14609 250/208.1 |
| 2014/0240566 A1 | 8/2014 | Shizukuishi |
| 2014/0334601 A1* | 11/2014 | Shizukuishi ...... H01L 27/14661 378/62 |
| 2015/0085369 A1 | 3/2015 | Tazawa et al. |

FOREIGN PATENT DOCUMENTS

| | | |
|---|---|---|
| JP | 2003-274420 | 9/2003 |
| JP | 2007-281929 | 10/2007 |
| JP | 2008-005488 | 1/2008 |
| JP | 2010-273757 | 12/2010 |
| JP | 2012-009732 | 1/2012 |
| JP | 2012-064883 | 3/2012 |
| JP | 2013-090127 | 5/2013 |
| JP | 2014-030170 | 2/2014 |
| JP | 2014-072294 | 4/2014 |
| JP | 2015-068853 | 4/2015 |

* cited by examiner

FIG. 16
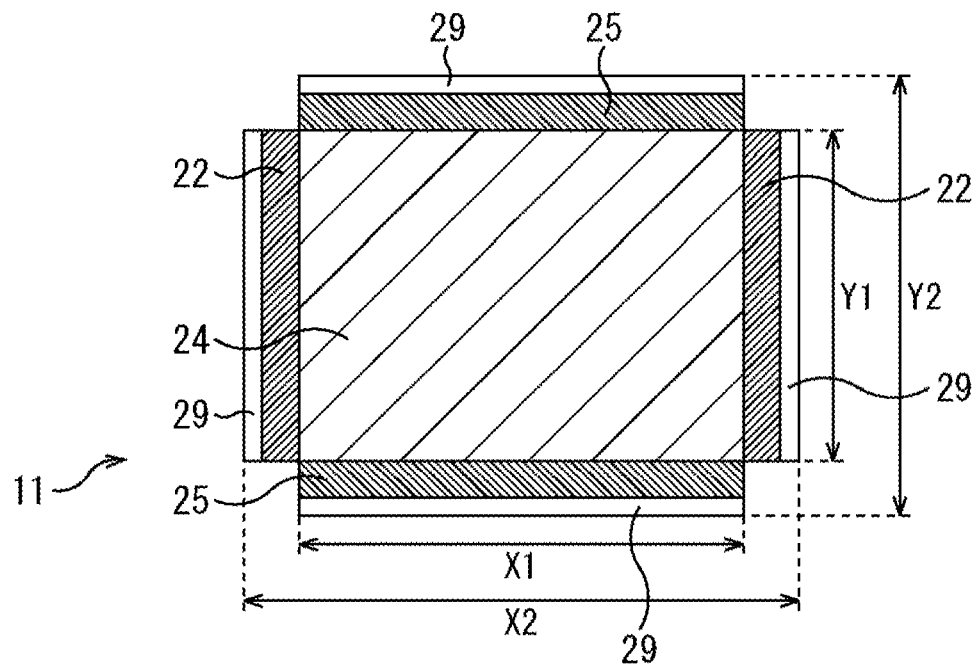
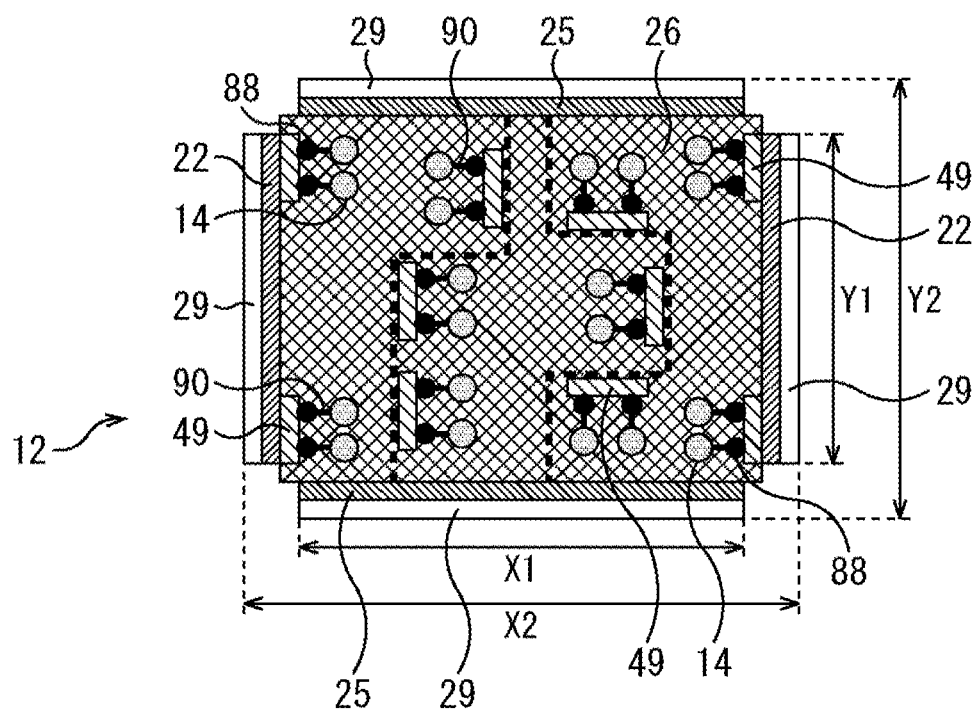

FIG. 20
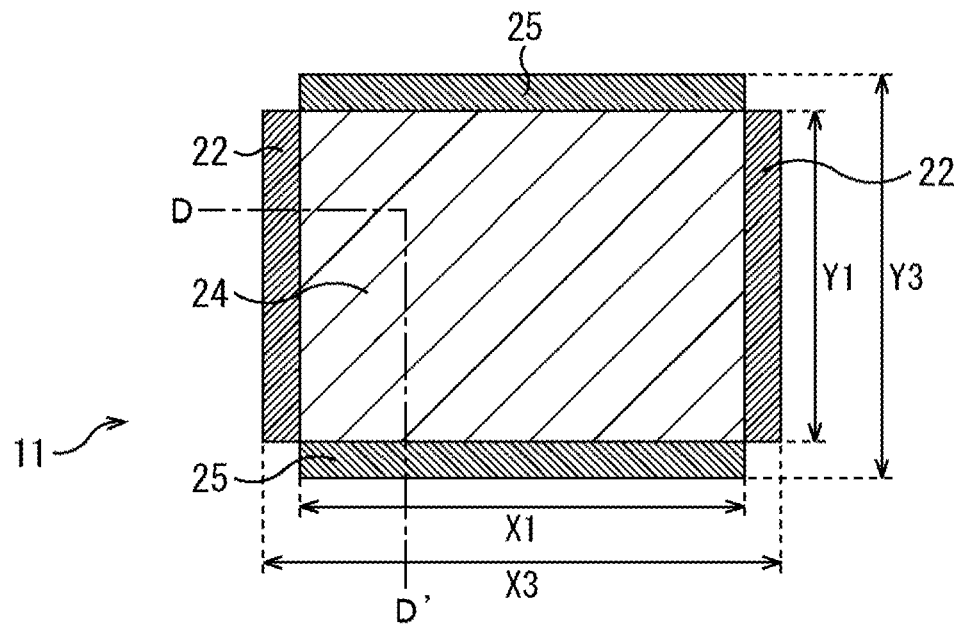
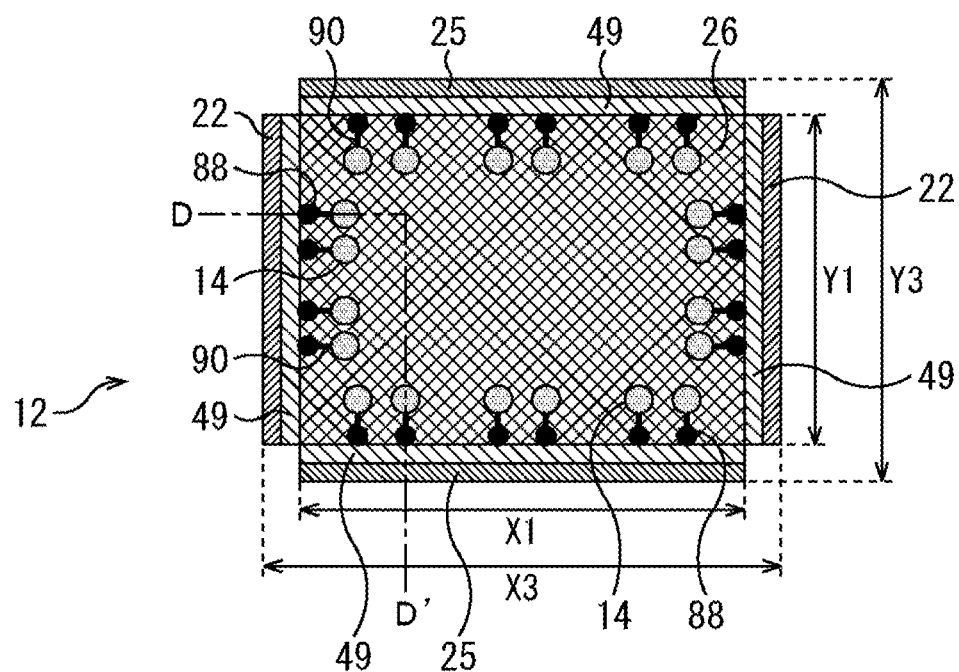

FIG. 61
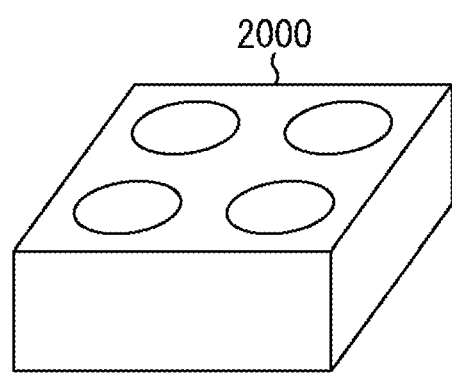
A
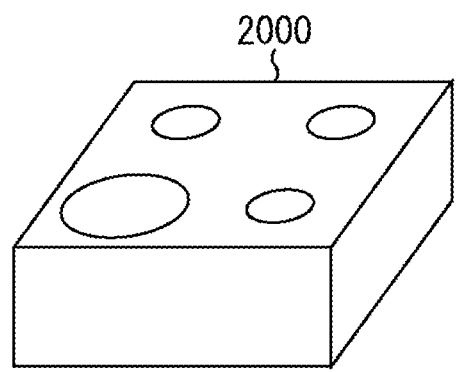
B

IMAGE PICKUP DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2017/009669 having an international filing date of 10 Mar. 2017, which designated the United States, which PCT application claimed the benefit of Japanese Patent Application No. 2016-059979 filed 24 Mar. 2016, the entire disclosures of each of which are incorporated herein by reference.

TECHNICAL FIELD

The present disclosure relates to an image pickup device and an electronic apparatus, and in particular to an image pickup device and an electronic apparatus that enables further downsizing of device size.

BACKGROUND ART

An image pickup device such as a complementary metal oxide semiconductor (CMOS) image sensor has been further downsized, for example, by a configuration devised in which a plurality of semiconductor substrates is layered (for example, see Patent Document 1).

CITATION LIST

Patent Document

Patent Document 1: Japanese Patent Application Laid-Open No. 2014-72294

SUMMARY OF THE INVENTION

Problems to be Solved by the Invention

As the image pickup device is further downsized, the area occupied by the terminal portion that takes out the output signal increases with respect to the plane size of the device, and downsizing becomes difficult.

The present disclosure has been made in view of such a situation, and is intended to enable further downsizing of the device size.

Solutions to Problems

A first image pickup device of one aspect of the present technology includes: a first structural body and a second structural body that are layered, the first structural body including a pixel array unit in which a pixel that performs photoelectric conversion is two-dimensionally arrayed, the second structural body being positioned below the first structural body, the second structural body including an input circuit unit that inputs a predetermined signal from an outside of the device, an output circuit unit that outputs a pixel signal output from the pixel to the outside of the device, and a signal processing circuit; an output unit and an input unit that are arranged below the pixel array unit of the first structural body, the output unit including the output circuit unit, a first through-via connected to the output circuit unit and penetrating through a semiconductor substrate constituting a part of the second structural body, and a signal output external terminal that connects the output circuit unit to the outside of the device via the first through-via, the input unit including the input circuit unit, a second through-via connected to the input circuit unit and penetrating through the semiconductor substrate, and a signal input external terminal that connects the input circuit unit to the outside of the device via the second through-via; a substrate connected to the signal output external terminal and the signal input external terminal; and a circuit board connected to a first surface of the substrate, the first surface facing a second surface to which the signal output external terminal and the signal input external terminal are connected.

A second image pickup device of one aspect of the present technology includes: a first structural body, a glass substrate, a transmittance attenuation layer, and a second structural body that are layered, the first structural body including a pixel array unit in which a pixel that performs photoelectric conversion is two-dimensionally arrayed, the glass substrate positioned above the first structural body, the transmittance attenuation layer being positioned above the first structural body and attenuating transmittance of incident light, the second structural body being positioned below the first structural body, the second structural body including an input circuit unit that inputs a predetermined signal from an outside of the device, an output circuit unit that outputs a pixel signal output from the pixel to the outside of the device, and a signal processing circuit; and an output unit and an input unit that are arranged below the pixel array unit of the first structural body, the output unit including the output circuit unit, a first through-via connected to the output circuit unit and penetrating through a semiconductor substrate constituting a part of the second structural body, and a signal output external terminal that connects the output circuit unit to the outside of the device via the first through-via, the input unit including the input circuit unit, a second through-via connected to the input circuit unit and penetrating through the semiconductor substrate, and a signal input external terminal that connects the input circuit unit to the outside of the device via the second through-via.

A third image pickup device of one aspect of the present technology includes: a first structural body, a glass substrate, and a second structural body that are layered, the first structural body including a pixel array unit in which a pixel that performs photoelectric conversion is two-dimensionally arrayed, the glass substrate being positioned above the first structural body and including a light incident surface subjected to moth-eye processing, the second structural body being positioned below the first structural body, the second structural body including an input circuit unit that inputs a predetermined signal from an outside of the device, an output circuit unit that outputs a pixel signal output from the pixel to the outside of the device, and a signal processing circuit; and an output unit and an input unit that are arranged below the pixel array unit of the first structural body, the output unit including the output circuit unit, a first through-via connected to the output circuit unit and penetrating through a semiconductor substrate constituting a part of the second structural body, and a signal output external terminal that connects the output circuit unit to the outside of the device via the first through-via, the input unit including the input circuit unit, a second through-via connected to the input circuit unit and penetrating through the semiconductor substrate, and a signal input external terminal that connects the input circuit unit to the outside of the device via the second through-via.

An electronic apparatus of one aspect of the present technology includes: a first structural body and a second structural body that are layered, the first structural body including a pixel array unit in which a pixel that performs photoelectric conversion is two-dimensionally arrayed, the second structural body being positioned below the first structural body, the second structural body including an input circuit unit that inputs a predetermined signal from an outside of the device, an output circuit unit that outputs a pixel signal output from the pixel to the outside of the device, and a signal processing circuit; an output unit and an input unit that are arranged below the pixel array unit of the first structural body, the output unit including the output circuit unit, a first through-via connected to the output circuit unit and penetrating through a semiconductor substrate constituting a part of the second structural body, and a signal output external terminal that connects the output circuit unit to the outside of the device via the first through-via, the input unit including the input circuit unit, a second through-via connected to the input circuit unit and penetrating through the semiconductor substrate, and a signal input external terminal that connects the input circuit unit to the outside of the device via the second through-via; a substrate connected to the signal output external terminal and the signal input external terminal; and a circuit board connected to a first surface of the substrate, the first surface facing a second surface to which the signal output external terminal and the signal input external terminal are connected.

In the first image pickup device of one aspect of the present technology, the first structural body and the second structural body are layered, the first structural body including the pixel array unit in which the pixel that performs photoelectric conversion is two-dimensionally arrayed, the second structural body being positioned below the first structural body and including: the input circuit unit that inputs the predetermined signal from the outside of the device; the output circuit unit that outputs the pixel signal output from the pixel to the outside of the device; and the signal processing circuit. Furthermore, the output unit and the input unit are arranged below the pixel array unit of the first structural body, the output unit including: the output circuit unit; the first through-via connected to the output circuit unit and penetrating through the semiconductor substrate constituting a part of the second structural body; and the signal output external terminal that connects the output circuit unit to the outside of the device via the first through-via, the input unit including: the input circuit unit; the second through-via connected to the input circuit unit and penetrating through the semiconductor substrate; and the signal input external terminal that connects the input circuit unit to the outside of the device via the second through-via. Furthermore, the substrate and the circuit board are included, the substrate being connected to the signal output external terminal and the signal input external terminal, the circuit board being connected to the first surface of the substrate, the first substrate facing the second surface to which the signal output external terminal and the signal input external terminal are connected.

In the second image pickup device of one aspect of the present technology, the first structural body, the glass substrate, the transmittance attenuation layer, and the second structural body are layered, the first structural body including the pixel array unit in which the pixel that performs photoelectric conversion is two-dimensionally arrayed, the glass substrate being positioned above the first structural body, the transmittance attenuation layer being positioned above the first structural body and attenuating transmittance of incident light, the second structural body being positioned below the first structural body and including: the input circuit unit that inputs the predetermined signal from the outside of the device; the output circuit unit that outputs the pixel signal output from the pixel to the outside of the device; and the signal processing circuit. Furthermore, the output unit and the input unit are arranged below the pixel array unit of the first structural body, the output unit including: the output circuit unit; the first through-via connected to the output circuit unit and penetrating through the semiconductor substrate constituting a part of the second structural body; and the signal output external terminal that connects the output circuit unit to the outside of the device via the first through-via, the input unit including: the input circuit unit; the second through-via connected to the input circuit unit and penetrating through the semiconductor substrate; and the signal input external terminal that connects the input circuit unit to the outside of the device via the second through-via.

In the third image pickup device of one aspect of the present technology, the first structural body, the glass substrate, and the second structural body are layered, the first structural body including the pixel array unit in which the pixel that performs photoelectric conversion is two-dimensionally arrayed, the glass substrate being positioned above the first structural body and having light incident surface subjected to moth-eye processing, the second structural body being positioned below the first structural body and including: the input circuit unit that inputs the predetermined signal from the outside of the device; the output circuit unit that outputs the pixel signal output from the pixel to the outside of the device; and the signal processing circuit. Furthermore, the output unit and the input unit are arranged below the pixel array unit of the first structural body, the output unit including: the output circuit unit; the first through-via connected to the output circuit unit and penetrating through the semiconductor substrate constituting a part of the second structural body; and the signal output external terminal that connects the output circuit unit to the outside of the device via the first through-via, the input unit including: the input circuit unit; the second through-via connected to the input circuit unit and penetrating through the semiconductor substrate; and the signal input external terminal that connects the input circuit unit to the outside of the device via the second through-via.

The electronic apparatus of one aspect of the present technology is an apparatus including the first image pickup device.

Effects of the Invention

According to one aspect of the present technology, the device size can be further downsized.

Note that, an effect described herein is not necessarily limited and may be any of effects described in the present disclosure.

BRIEF DESCRIPTION OF DRAWINGS

FIG. 16 is a diagram illustrating a sixth example circuit arrangement configuration of the circuit arrangement in the image pickup device.

FIG. 20 is a diagram illustrating a tenth example circuit arrangement configuration of the circuit arrangement in the image pickup device.

FIG. 61 is a diagram for explaining the configuration of the camera module.

MODE FOR CARRYING OUT THE INVENTION

Figure 1:
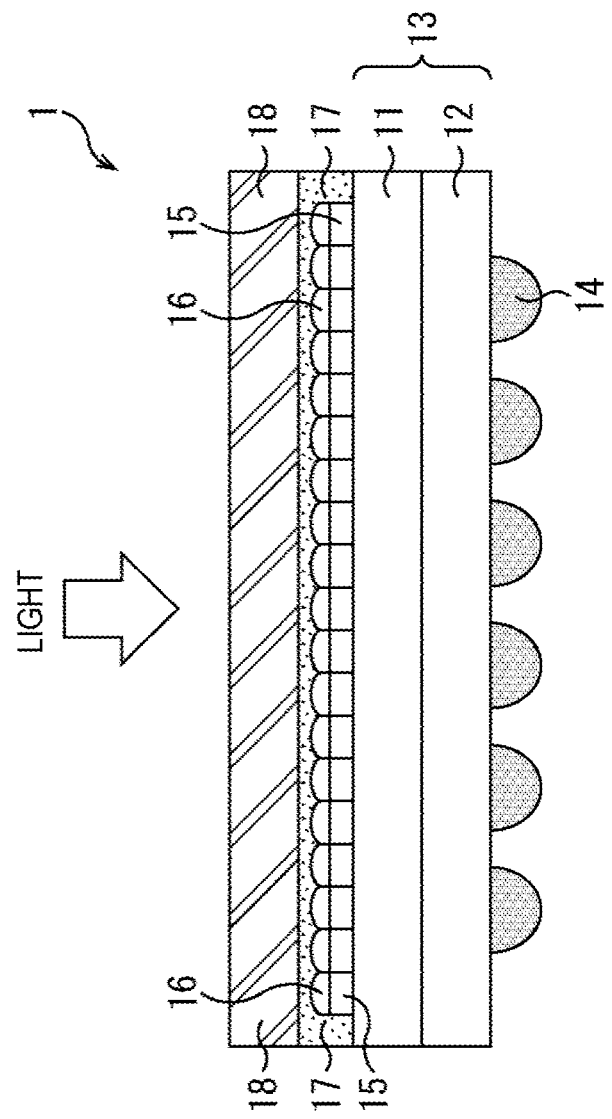
FIG. 1 is a diagram illustrating a schematic structure of an image pickup device adopting the present technology.

Hereinafter, modes (hereinafter referred to as embodiments) for carrying out the present technology will be described. Note that, the description will be made in the following order.

1. Schematic structure of image pickup device
2. System configuration of image pickup device
3. Example circuit arrangement configuration of pixel
4. Example configuration of input circuit and output circuit
5. Example circuit arrangement configuration of image pickup device
6. Cross-sectional structure of image pickup device
7. Circuit arrangement of image pickup device in case where another upper and lower wiring lines connection structure is used
8. Comparative example with other image pickup devices
9. Other example circuit arrangement configurations of image pickup device
10. Detailed structure of image pickup device
11. Manufacturing method
12. Further modification
13. Example of three-layer layered structural body
14. Configuration including lens module
15. Configuration of capsule endoscope
16. Method of manufacturing image pickup device with lens module
17. About compound eye form
18. Camera module including transmittance attenuation layer
19. Formation of transmittance attenuation layer
20. Application example to electronic apparatus
21. Usage examples of image sensor
22. Application example to endoscopic surgical system
23. Application example to mobile body <1. Schematic Structure of Image Pickup Device>

FIG. 1 illustrates a schematic structure of an image pickup device as a semiconductor device adopting the present technology.

An image pickup device 1 illustrated in FIG. 1 converts light or an electromagnetic wave incident on the device in an arrow direction in the figure into an electric signal. Hereinafter, in the present disclosure, for convenience, a device will be described that converts the light, as an object to be converted into the electric signal, into the electric signal, as an example.

The image pickup device 1 includes a layered structural body 13 in which a first structural body 11 and a second structural body 12 are layered, an external terminal 14, and a protective substrate 18 formed on the upper side of the first structural body 11. Note that, in the following, for convenience, in FIG. 1, a side of an incident surface where the light is incident on the device is set to the upper side, and a side of another surface facing the incident surface of the device is set to the lower side, and the first structural body 11 is referred to as an upper structural body 11, and the second structural body 12 is referred to as a lower structural body 12.

As described later, the image pickup device 1 is formed by pasting a semiconductor substrate (wafer) constituting a part of the upper structural body 11, a semiconductor substrate (wafer) constituting a part of the lower structural body 12, and the protective substrate 18 to each other at the wafer state, and then dividing them into solid pieces of a plurality of the image pickup devices 1.

The upper structural body 11 before being divided into the solid pieces is a semiconductor substrate (wafer) including a pixel for converting the incident light into the electric signal. The pixel includes, for example, a photodiode (PD) for photoelectric conversion and a plurality of pixel transistors that controls photoelectric conversion operation and reading operation of the photoelectrically converted electric signal. The upper structural body 11 included in the image pickup device 1 after being divided into the solid pieces may be referred to as an upper chip, an image sensor substrate, or an image sensor chip.

The pixel transistor included in the image pickup device 1 is desirably a MOS transistor, for example.

On the upper surface of the upper structural body 11, for example, a color filter 15 of red (R), green (G), or blue (B), and an on-chip lens 16 are formed. On the upper side of the on-chip lens 16, the protective substrate 18 is arranged for protecting structural objects of the image pickup device 1, particularly the on-chip lens 16 and the color filter 15. The protective substrate 18 is a transparent glass substrate, for example. If the hardness of the protective substrate 18 is higher than the hardness of the on-chip lens 16, the function of protecting the on-chip lens 16 is strengthened.

The lower structural body 12 before being divided into the solid pieces is a semiconductor substrate (wafer) that includes a semiconductor circuit including a transistor and a wiring line. The lower structural body 12 included in the image pickup device 1 after being divided into the solid pieces may be referred to as a lower chip, a signal processing substrate, or a signal processing chip. On the lower structural body 12, a plurality of the external terminals 14 is formed for electrically connecting to a wiring line (not illustrated) of the outside of the device. The external terminals 14 are solder balls, for example.

The image pickup device 1 has a cavity-less structure in which the protective substrate 18 is fixed to the upper side of the upper structural body 11 or the upper side of the on-chip lens 16 via the glass seal resin 17 arranged on the on-chip lens 16. Since the hardness of the glass seal resin 17 is lower than the hardness of the protective substrate 18, as compared with a case where no seal resin exists, the glass seal resin 17 can function to alleviate the stress applied to the protective substrate 18 from the outside of the image pickup device 1 to be transmitted to the inside of the device.

Note that, the image pickup device 1 may have a cavity structure, as a structure different from the cavity-less structure, in which a columnar or wall-like structure is formed on the upper surface of the upper structural body 11, and the protective substrate 18 is fixed to the columnar or wall-like structure to be supported with a gap above the on-chip lens 16.

<2. System Configuration of Image Pickup Device>

Figure 2:
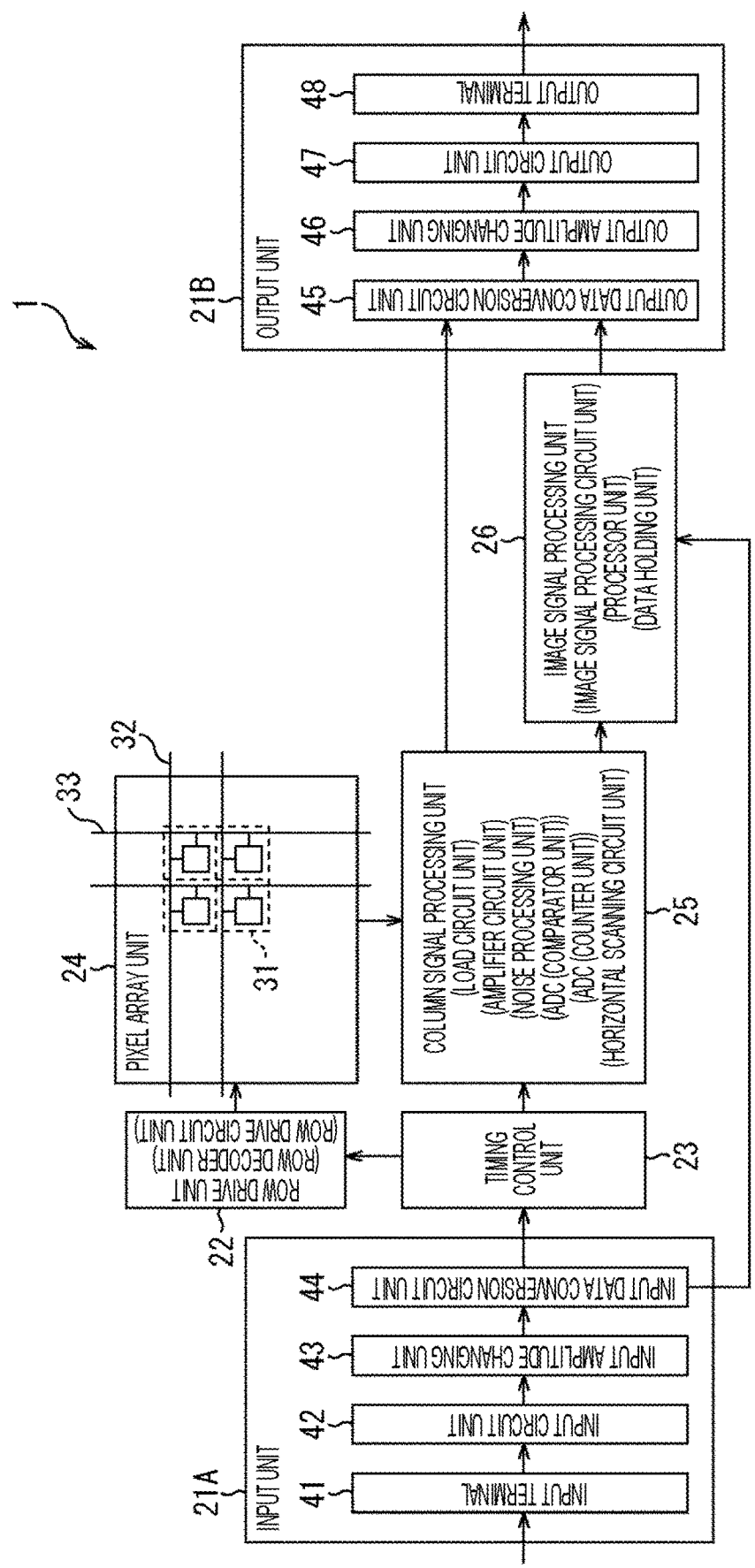
FIG. 2 is a block diagram illustrating an example system configuration of the image pickup device.

FIG. 2 is a block diagram illustrating an example system configuration of the image pickup device 1.

The image pickup device 1 of FIG. 2 includes a pixel array unit 24 in which a plurality of pixels 31 each having a photoelectric conversion unit (PD) is arranged in a row direction and a column direction.

The pixel array unit 24 includes a row drive signal line 32 for driving the pixels 31 for each row, and a vertical signal line (column reading line) 33 for reading signals generated as a result of photoelectric conversion from the plurality of pixels 31 driven for each row. As illustrated in FIG. 2, the plurality of pixels 31 arrayed in the row direction is connected to one row drive signal line 32. The plurality of pixels 31 arrayed in the column direction is connected to one vertical signal line 33.

The image pickup device 1 further includes a row drive unit 22 and a column signal processing unit 25.

The row drive unit 22 includes, for example, a row address control unit that determines a position of a row for driving pixels, in other words, a row decoder unit, and a row drive circuit unit that generates signals for driving the pixels 31.

The column signal processing unit 25 includes, for example, a load circuit unit connected to the vertical signal line 33 and forming a source follower circuit with each of the pixels 31. Furthermore, the column signal processing unit 25 may include an amplifier circuit unit that amplifies the signals read from the pixels 31 via the vertical signal line 33. Moreover, the column signal processing unit 25 may further include a noise processing unit for reducing a noise level of a system from the signals read from the pixels 31 as a result of photoelectric conversion.

The column signal processing unit 25 includes an analog-to-digital converter (ADC) for converting the signals read from the pixels 31 or analog signals subjected to the noise-processing into digital signals. The ADC includes a comparator unit for comparing an analog signal to be converted with a reference sweep signal to be compared with the analog signal, and a counter unit that measures time until a comparison result in the comparator unit is inverted. The column signal processing unit 25 may further include a horizontal scanning circuit unit that performs control of scanning a reading column.

The image pickup device 1 further includes a timing control unit 23. On the basis of a timing control signal or a reference clock signal input to the device, the timing control unit 23 supplies a signal for controlling timing to the row drive unit 22 and the column signal processing unit 25. Hereinafter, in the present disclosure, all or part of the row drive unit 22, the column signal processing unit 25, and the timing control unit 23 may be simply referred to as a pixel peripheral circuit unit, a peripheral circuit unit, or a control circuit unit.

The image pickup device 1 further includes an image signal processing unit 26. The image signal processing unit 26 is a circuit that performs various types of signal processing to the data obtained as a result of photoelectric conversion, in other words, data obtained as a result of image pickup operation in the image pickup device 1. The image signal processing unit 26 includes, for example, an image signal processing circuit unit, and a data holding unit. The image signal processing unit 26 may further include a processor unit.

An example of the signal processing executed in the image signal processing unit 26 is tone curve correction processing that gives more gradation in a case where image pickup data subjected to the AD conversion is data obtained by photographing a dark subject, and reduces the gradation in a case where the image pickup data is data obtained by photographing a bright subject. In this case, it is desirable to store characteristic data of a tone curve in advance in the data holding unit of the image signal processing unit 26, on what type of tone curve the gradation of the image pickup data is to be corrected.

The image pickup device 1 further includes an input unit 21A. The input unit 21A inputs, for example, the reference clock signal, the timing control signals such as a vertical synchronizing signal and a horizontal synchronizing signal, the characteristic data to be stored in the data holding unit of the image signal processing unit 26, and the like to the image pickup device 1 from the outside of the device. The input unit 21A includes an input terminal 41 that is the external terminal 14 for inputting the data to the image pickup device 1, and an input circuit unit 42 that takes a signal input to the input terminal 41 into the image pickup device 1.

The input unit 21A further includes an input amplitude changing unit 43 that changes the amplitude of the signal taken in by the input circuit unit 42 to an amplitude easy to use inside the image pickup device 1.

The input unit 21A further includes an input data conversion circuit unit 44 that changes arrangement of a data string of input data. The input data conversion circuit unit 44 is, for example, a serial-to-parallel conversion circuit that receives a serial signal as the input data and converts the signal into a parallel signal.

Note that, the input amplitude changing unit 43 and the input data conversion circuit unit 44 may be omitted.

In a case where the image pickup device 1 is connected to external memory devices such as a flash memory, SRAM, and DRAM, the input unit 21A can further include a memory interface circuit that receives data from these external memory devices.

The image pickup device 1 further includes an output unit 21B. The output unit 21B outputs image data photographed by the image pickup device 1, and image data subjected to the signal processing by the image signal processing unit 26, from the image pickup device 1 to the outside of the device. The output unit 21B includes an output terminal 48 that is the external terminal 14 for outputting the data from the image pickup device 1 to the outside of the device, and an output circuit unit 47 that is a circuit that outputs the data from the inside of the image pickup device 1 to the outside of the device, and is a circuit that drives an external wiring line connected to the output terminal 48 and is outside the image pickup device 1.

The output unit 21B further includes an output amplitude changing unit 46 that changes the amplitude of the signal used inside the image pickup device 1 to an amplitude that is easily used by an external device connected to the outside of the image pickup device 1.

The output unit 21B further includes an output data conversion circuit unit 45 that changes arrangement of a data string of output data. The output data conversion circuit unit 45 is, for example, a parallel-to-serial conversion circuit that converts a parallel signal used inside the image pickup device 1 into a serial signal.

The output data conversion circuit unit 45 and the output amplitude changing unit 46 may be omitted.

In a case where the image pickup device 1 is connected to external memory devices such as a flash memory, SRAM, and DRAM, the output unit 21B can further include a memory interface circuit that outputs data to these external memory devices.

Note that, in the present disclosure, for convenience, a circuit block including both or at least one of the input unit 21A and the output unit 21B may be referred to as an input/output unit 21. Furthermore, a circuit unit including both or at least one of the input circuit unit 42 and the output circuit unit 47 may be referred to as an input/output circuit unit 49.

<3. Example Circuit Arrangement Configuration of Pixel>

Figure 3:
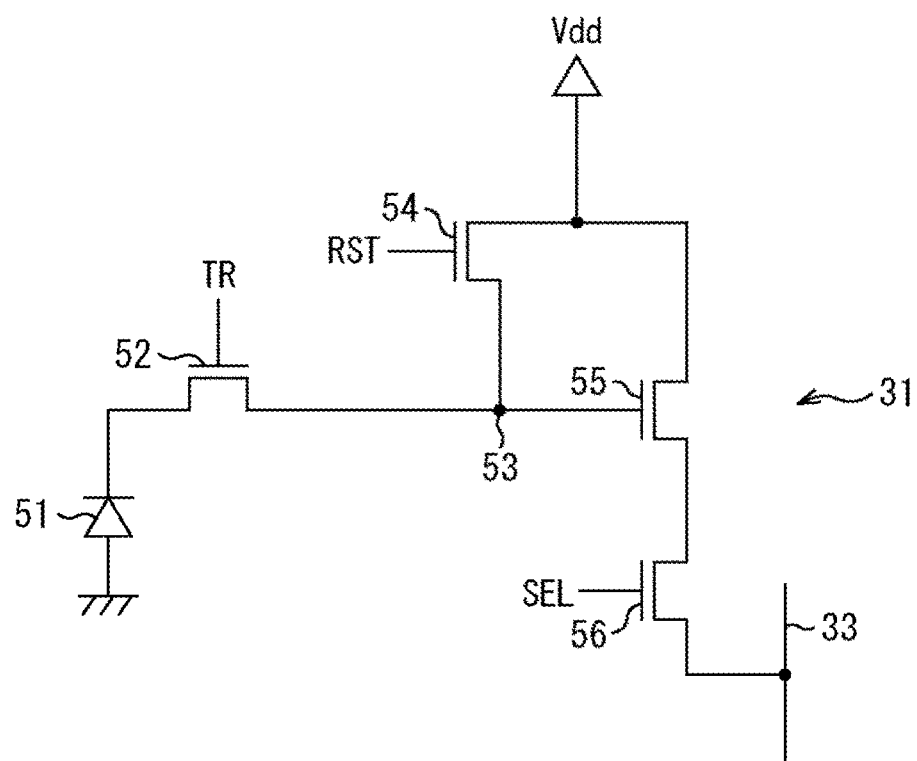
FIG. 3 is a diagram illustrating an example circuit arrangement configuration of a pixel.

FIG. 3 illustrates an example circuit arrangement configuration of a pixel 31 of the image pickup device 1 according to the present embodiment.

The pixel 31 includes a photodiode 51 as a photoelectric conversion element, a transfer transistor 52, a floating diffusion (FD) 53, a reset transistor 54, an amplifier transistor 55, and a selection transistor 56.

The photodiode 51 generates and accumulates a charge (signal charge) corresponding to the amount of light received. The anode terminal of the photodiode 51 is grounded, and the cathode terminal is connected to the FD 53 via the transfer transistor 52.

When turned on by a transfer signal TR, the transfer transistor 52 reads the charge generated by the photodiode 51 and transfers the charge to the FD 53.

The FD 53 holds the electric charge read from the photodiode 51. When turned on by a reset signal RST, the reset transistor 54 resets a potential of the FD 53 by discharging the charge accumulated in the FD 53 to the drain (constant voltage source Vdd).

The amplifier transistor 55 outputs a pixel signal corresponding to the potential of the FD 53. In other words, the amplifier transistor 55 constitutes a source follower circuit together with a load MOS (not illustrated) as a constant current source connected via the vertical signal line 33, and the pixel signal indicating a level corresponding to the charge accumulated in the FD 53 is output from the amplifier transistor 55 to the column signal processing unit 25 via the selection transistor 56 and the vertical signal line 33.

The selection transistor 56 is turned on when the pixel 31 is selected by a selection signal SEL, and outputs the pixel signal of the pixel 31 to the column signal processing unit 25 via the vertical signal line 33.

Each of the signal lines through which the transfer signal TR, the selection signal SEL, and the reset signal RST are transmitted corresponds to the row drive signal line 32 of FIG. 2.

Although the pixel 31 can be configured as described above, it is not limited to this configuration, and other configurations can be adopted.

<4. Example Configuration of Input Circuit Unit and Output Circuit Unit>

Figure 4:
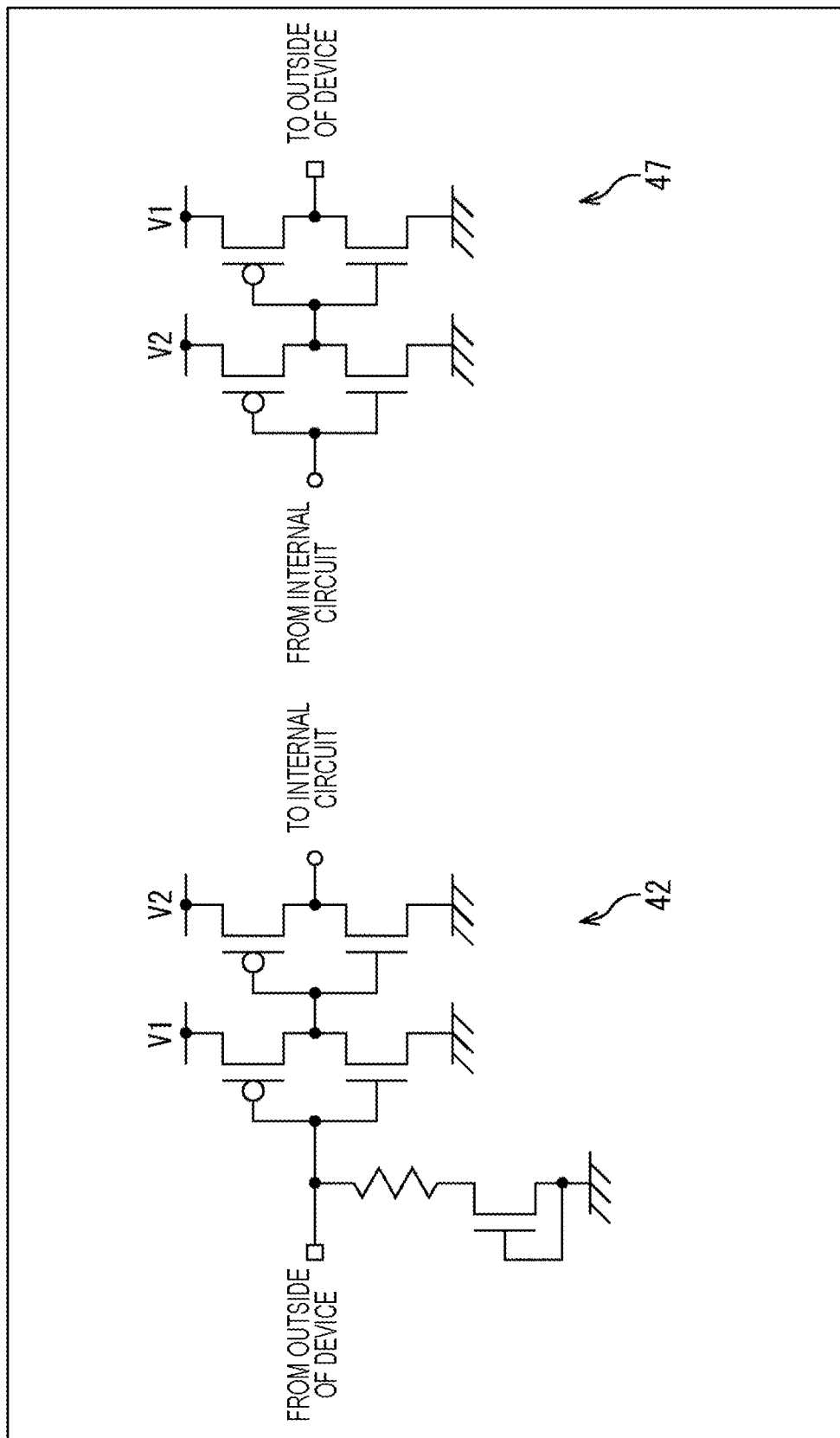
FIG. 4 is a diagram illustrating an example configuration of an input circuit unit and an output circuit unit.

FIG. 4 illustrates an example circuit arrangement configuration of the input circuit unit 42 included in the input unit 21A, and the output circuit unit 47 included in the output unit 21B of the image pickup device 1 according to the present embodiment.

Note that, for one external terminal 14, the input/output circuit unit 49 may include either the input circuit unit 42 or the output circuit unit 47, or may include a bidirectional input/output circuit including both the input circuit unit 42 and the output circuit unit 47 in parallel.

The input circuit unit 42 is a circuit having the following features.

(1) The input circuit unit 42 is a circuit in which logic is the same between the data input from the input terminal 41 of the image pickup device 1 to the input circuit unit 42 and the data output from the input circuit unit 42 to the internal circuit of the image pickup device 1, or the logic is only inverted, in other words, it is a circuit that does not change the arrangement of the data in the signal string, further in other words, it is a circuit that does not change a position at which "1" and "0" or "Hi" and "Low" of the logic are switched in the signal string.

(2) The input circuit unit 42 is a circuit that converts a voltage amplitude of a signal input to the input terminal 41 of the image pickup device 1 into a voltage amplitude suitable to be received by a circuit arranged at the subsequent stage of the input circuit unit 42, in other words, a circuit that is more internal in the image pickup device 1. This circuit may convert the data input to the circuit into a direction in which the voltage amplitude decreases.

(2)' Alternatively, the input circuit unit 42 is a circuit that converts a signal (for example, a small amplitude differential signal of LVDS) input to the input circuit unit 42 into a format or a voltage amplitude (for example, a single-end full swing digital signal) suitable to be received by the circuit arranged at the subsequent stage of the input circuit unit 42, in other words, the circuit that is more internal in the image pickup device 1, and outputs the converted signal. This circuit may convert the data input to the circuit into a direction in which the voltage amplitude increases.

(3) Moreover, in a case where excessive noise is input to the input circuit unit 42, a protective circuit may be included that blocks and does not propagate the noise to the circuit arranged at the subsequent stage of the input circuit unit 42, in other words, the circuit that is more internal in the image pickup device 1.

The output circuit unit 47 is a circuit having the following features.

(1) The output circuit unit 47 is a circuit in which logic is the same between the data input from the internal circuit of the image pickup device 1 to the output circuit unit 47 and the data output from the output circuit unit 47 to the outside of the image pickup device 1 via the output terminal 48 of the image pickup device 1, or the logic is only inverted, in other words, it is a circuit that does not change the arrangement of the data in the signal string, further in other words, it is a circuit that does not change a position at which "1" and "0" or "Hi" and "Low" of the logic are switched in the signal string.

(2) The output circuit unit 47 is a circuit that increases drive current capability of a signal line between the output terminal 48 of the image pickup device 1 and an external element connected to the image pickup device 1. Alternatively, it is a circuit for increasing the voltage amplitude of the signal line. This circuit may convert the data input to the circuit into the direction in which the voltage amplitude increases.

(2)' Alternatively, the output circuit unit 47 is a circuit that converts a signal (for example, a single-end full swing digital signal) input to the output circuit unit 47 from the internal circuit of the image pickup device 1 into a format or a voltage amplitude (for example, a small amplitude differential signal of LVDS) suitable to be received by the external element connected to the output terminal 48, and outputs the converted signal. This circuit may convert the data input to the circuit into the direction in which the voltage amplitude decreases.

As illustrated in FIG. 4, the input/output circuit unit 49 including at least either the input circuit unit 42 or the output circuit unit 47 includes one or more transistors. In the present disclosure, for convenience, a transistor included in the input/output circuit unit 49 may be referred to as an input/output transistor. The input/output circuit unit 49 may include an inverter circuit, a buffer circuit, or the like, or may further include an enable circuit that controls input operation or output operation.

The input circuit unit 42 or the output circuit unit 47 can also serve as the amplitude changing unit of the input signal or the output signal by appropriately setting the power supply voltage used in the circuit. For example, in a case where an amplitude of a signal in the image signal processing unit 26 and a part of the pixel peripheral circuit unit of the image pickup device 1 is V2, and an amplitude of a signal input from the outside of the image pickup device 1 to the input terminal 41 or an amplitude of a signal output from the output terminal 48 to the outside of the image pickup device 1 is V1 that is greater than V2, in the circuit of the input circuit unit 42 or the output circuit unit 47 illustrated in FIG. 4, for example, by setting the power supply voltage of the inverter positioned on the internal circuit side of the image pickup device 1 to V2 and the power supply voltage of the inverter positioned in the outside direction of the image pickup device 1 to V1, the input circuit unit 42 can receive the signal of the amplitude V1 from the outside, and reduce the amplitude to V2 to input the signal to the internal circuit of the image pickup device 1, and the output circuit unit 47 can receive the signal of the amplitude V2 from the internal circuit of the image pickup device 1, and increase the amplitude to V1 to output the signal to the outside.

Note that, in a case where the voltages V1 and V2 illustrated in FIG. 4 are set to the same voltage, the configuration does not have the function of changing the signal amplitude.

Note that, including the above description, in the present disclosure, a voltage difference between a reference voltage (in the case of the circuit of FIG. 4, the ground voltage) in a transistor circuit and a voltage that is a voltage of the power supply supplied to the circuit and different from the reference voltage (in the case of the circuit of FIG. 4, for example, V1) may be simply referred to as a power supply voltage.

<5. Example Circuit Arrangement Configuration of Image Pickup Device>

Next, description will be made for a circuit arrangement of the image pickup device 1 according to the present embodiment, in other words, how each block of the image pickup device 1 illustrated in FIG. 2 is divided and mounted into the upper structural body 11 and the lower structural body 12.

Figure 5:
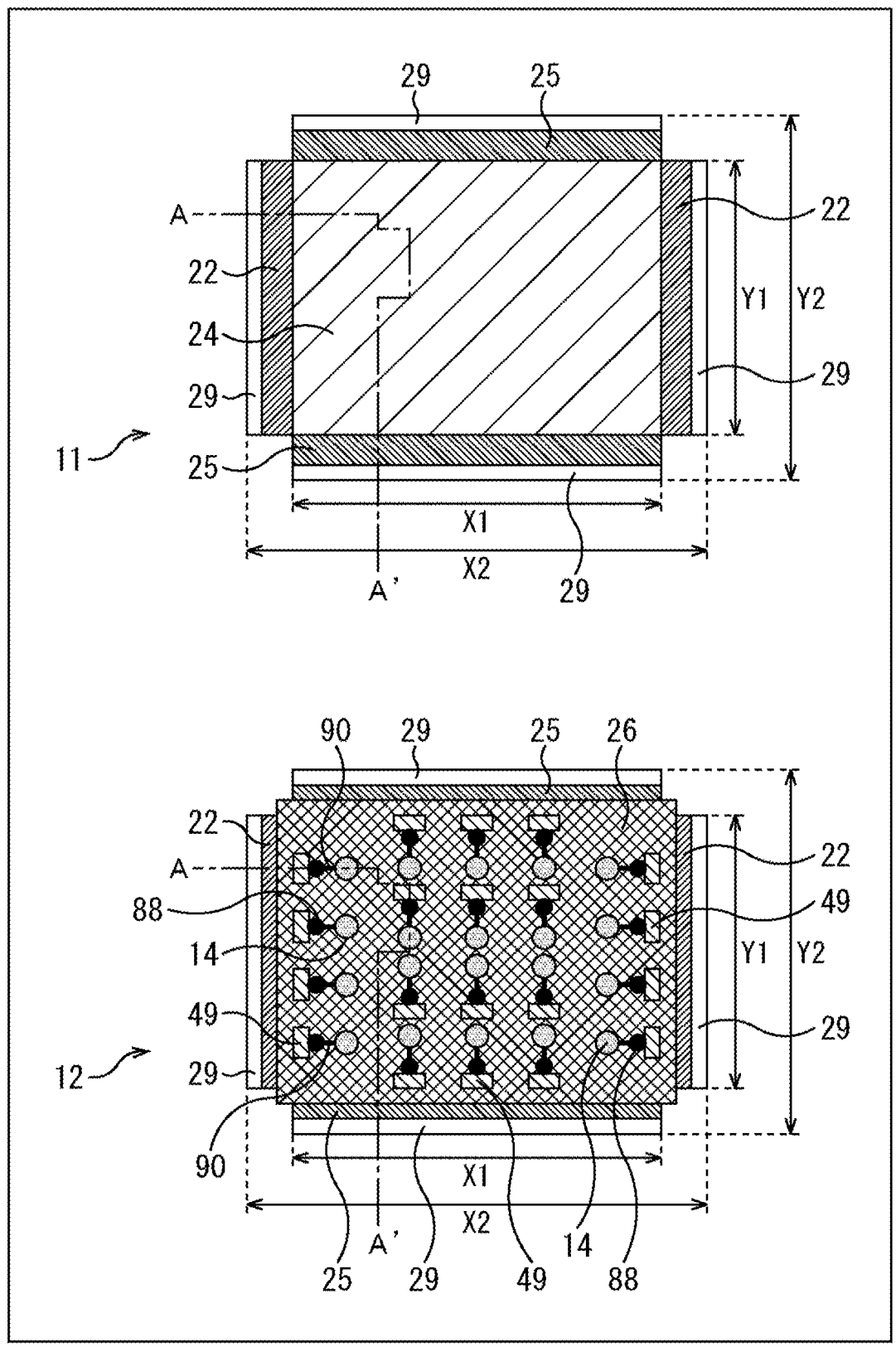
FIG. 5 is a diagram illustrating a first example circuit arrangement configuration of a circuit arrangement in the image pickup device.

FIG. 5 is a diagram illustrating a first example circuit arrangement configuration of the circuit arrangement in the image pickup device 1.

In the first example circuit arrangement configuration, the pixel array unit 24 is arranged in the upper structural body 11.

Among the pixel peripheral circuit units included in the image pickup device 1, a part of the row drive unit 22 is arranged in the upper structural body 11 and a part of the row drive unit 22 is arranged in the lower structural body 12. For example, in the row drive unit 22, the row drive circuit unit is arranged in the upper structural body 11, and the row decoder unit is arranged in the lower structural body 12.

The row drive unit 22 arranged in the upper structural body 11 is arranged outside the pixel array unit 24 in the row direction, and at least a part of the row drive unit 22 arranged in the lower structural body 12 is arranged on the lower side of the row drive unit 22 included in the upper structural body 11.

Among the pixel peripheral circuit units included in the image pickup device 1, a part of the column signal processing unit 25 is arranged in the upper structural body 11 and a part of the column signal processing unit 25 is arranged in the lower structural body 12. For example, in the column signal processing unit 25, the load circuit unit, the amplifier circuit unit, the noise processing unit, and the comparator unit of the ADC are arranged in the upper structural body 11, and the counter unit of the ADC is arranged in the lower structural body 12.

The column signal processing unit 25 arranged in the upper structural body 11 is arranged outside the pixel array unit 24 in the column direction, and at least a part of the column signal processing unit 25 arranged in the lower structural body 12 is arranged on the lower side of the column signal processing unit 25 included in the upper structural body 11.

Outside the row drive unit 22 arranged in the upper structural body 11, and outside the row drive unit 22 arranged in the lower structural body 12, a wiring connection unit 29 is arranged for connecting wiring lines of these two row drive units 22 together.

Also, outside the column signal processing unit 25 arranged in the upper structural body 11, and outside the column signal processing unit 25 arranged in the lower structural body 12, a wiring connection unit 29 is arranged for connecting wiring lines of these two column signal processing units 25 together. In these wiring connection units 29, a wiring connection structure is used that is described later with reference to FIG. 6.

The image signal processing unit 26 is arranged inside the row drive unit 22 and the column signal processing unit 25 arranged in the lower structural body 12.

In the lower structural body 12, the input/output circuit unit 49 is arranged in a region on the lower side of the pixel array unit 24 of the upper structural body 11.

The input/output circuit unit 49 is a circuit unit including both or at least one of the input circuit unit 42 and the output circuit unit 47. In a case where the input/output circuit unit 49 includes both the input circuit unit 42 and the output circuit unit 47, a plurality of the input/output circuit units 49 is divided for each one of the external terminals 14 and arranged in the lower structural body 12. In a case where the input/output circuit unit 49 includes only the input circuit unit 42, a plurality of the input circuit units 42 is divided for each one of the external terminals 14 (input terminals 41) and arranged in the lower structural body 12.

In a case where the input/output circuit unit 49 includes only the output circuit unit 47, a plurality of the output circuit units 47 is divided for each one of the external terminals 14 (output terminal 48) and arranged in the lower structural body 12. The image signal processing unit 26 is arranged around each of the plurality of divided input/output circuit units 49. In other words, the input/output circuit unit 49 is arranged within a region where the image signal processing unit 26 is arranged.

Note that, in the lower structural body 12, the input/output circuit unit 49 may be arranged in a region on the lower side of the row drive unit 22 of the upper structural body 11 or a region on the lower side of the column signal processing unit 25.

In other words, the input/output circuit unit 49 can be arranged on the lower structural body 12 side where the external terminal 14 is formed and below a region of the pixel array unit 24 of the upper structural body 11, or in an arbitrary region below a pixel peripheral circuit unit of the upper structural body 11 (a circuit unit formed in the upper structural body 11 in a pixel peripheral circuit region 313 in FIG. 6).

Note that, including other example configurations described later, in the image pickup device 1 according to the present embodiment, in a region where the input terminal 41 and the input circuit unit 42 or the output circuit unit 47 and the output terminal 48 are arranged, a power supply terminal and a ground terminal may be arranged instead of these circuit units and terminals.

Among the transistor circuits arranged in the lower structural body 12, the power supply voltage of the transistor circuit constituting the input circuit unit 42 and the output circuit unit 47 may be higher than the power supply voltage of the transistor circuit constituting the image signal processing unit 26.

For example, the power supply voltage of the transistor circuit constituting the input circuit unit 42 and the output circuit unit 47 may be 1.8 V to 3.3 V, and the power supply voltage of the transistor circuit constituting the image signal processing unit 26 may be 1.2 V to 1.5 V.

Since the power supply voltages of the former (transistor circuit constituting the input circuit unit 42 and the output circuit unit 47) and the latter (transistor circuit constituting the image signal processing unit 26) are different from each other, a distance for separately arranging a well region to which the power supply voltage is applied in the input circuit unit 42 and the output circuit unit 47, and a well region to which the power supply voltage is applied in the image signal processing unit 26 arranged around the input circuit unit 42 and the output circuit unit 47, that is, a so-called well separation region width is desirably greater than a distance provided between a plurality of the well regions to which the power supply voltage is applied in the image signal processing unit 26.

Furthermore, the depth of an element isolation region included in the input circuit unit 42 and the output circuit unit 47 may be deeper than the depth of an element isolation region included in the image signal processing unit 26. Furthermore, the gate length of the transistor included in the input circuit unit 42 and the output circuit unit 47 is desirably greater than the gate length of the transistor included in the image signal processing unit 26.

Among the pixel peripheral circuit units included in the image pickup device 1, the power supply voltage of the transistor circuit constituting a part of the pixel peripheral circuit unit arranged in the upper structural body 11, for example, any of the load circuit unit, the amplifier circuit unit, the noise processing unit, and the comparator unit of the ADC included in the column signal processing unit 25 may be higher than the power supply voltage of the transistor circuit constituting a part of the pixel peripheral circuit unit arranged in the lower structural body 12, for example, the counter unit of the ADC included in the column signal processing unit 25.

As an example, the power supply voltage of the transistor circuit of the former (the pixel peripheral circuit unit arranged in the upper structural body 11, for example, any of the load circuit unit, the amplifier circuit unit, the noise processing unit, or the comparator unit of the ADC included in the column signal processing unit 25) may be 1.8 V to 3.3 V, and the power supply voltage of the transistor circuit of the latter (the pixel peripheral circuit unit arranged in the lower structural body 12, for example, the counter unit of the ADC) is 1.2 V to 1.5 V.

The power supply voltage of the latter transistor circuit may be the same as the power supply voltage of the transistor circuit constituting the image signal processing unit 26 arranged in the lower structural body 12. Since the power supply voltage of the former transistor circuit is higher than the power supply voltage of the latter transistor circuit, the distance provided between the plurality of well regions to which the power supply voltage is applied in the former transistor circuit is desirably greater than the distance provided between the plurality of well regions to which the power supply voltage is applied in the latter transistor circuit.

Furthermore, the depth of the element isolation region included in the former transistor circuit is desirably deeper than the depth of the element isolation region included in the latter transistor circuit. Furthermore, the gate length of the transistor included in the former transistor circuit is desirably greater than the gate length of the transistor included in the latter transistor circuit.

Moreover, the power supply voltage of the pixel transistor circuit constituting the pixel 31 arranged in the upper structural body 11 may be the same as the power supply voltage of the transistor circuit constituting the pixel peripheral circuit unit (for example, any of the load circuit unit, the amplifier circuit unit, the noise processing unit, or the comparator unit of the ADC included in the column signal processing unit 25) arranged in the upper structural body 11.

The power supply voltage of the pixel transistor circuit constituting the pixel 31 arranged in the upper structural body 11 may be higher than the power supply voltage of the transistor circuit constituting the image signal processing unit 26 or the pixel peripheral circuit unit (for example, the counter unit of the ADC) arranged in the lower structural body 12. Therefore, in a case where an element isolation region is used having a structure of digging the semiconductor substrate as the element isolation region, the depth of a part of the element isolation region included around the pixel transistor arranged in the upper structural body 11 may be deeper than the depth of the element isolation region included around the transistor of the image signal processing unit 26 or the pixel peripheral circuit unit arranged in the lower structural body 12.

Alternatively, as the element isolation region around the pixel transistor, not the element isolation region digging the semiconductor substrate, but an element isolation region may be used forming an impurity region having a conductivity type opposite to that of the diffusion layer region of the pixel transistor, in a part around the pixel transistor.

Furthermore, the gate length of the pixel transistor arranged in the upper structural body 11 may be greater than the gate length of the transistor of the image signal processing unit 26 or the pixel peripheral circuit unit arranged in the lower structural body 12. On the other hand, in order to suppress occurrence of a noise charge in the vicinity of the element isolation region where there is a possibility of increase due to deepening of the element isolation region, the depth of the element isolation region included around the pixel transistor arranged in the upper structural body 11 may be shallower than the depth of the element isolation region included around the transistor constituting the pixel peripheral circuit unit arranged in the upper structural body 11.

Alternatively, as the element isolation region around the pixel transistor, not the element isolation region digging the semiconductor substrate, but an element isolation region may be used forming an impurity region having a conductivity type opposite to that of the diffusion layer region of the pixel transistor, in a part around the pixel transistor.

<6. Cross-Sectional Structure of Image Pickup Device>

The cross-sectional structure and circuit arrangement of the image pickup device 1 according to the present embodiment will be further described with reference to FIG. 6. FIG. 6 is a diagram illustrating a cross-sectional structure of the image pickup device 1 taken along a line A-A' of FIG. 5. Note that, for convenience, a part of FIG. 6 is illustrated by being changed to a cross-sectional structure in another example configuration of the present technology described later.

In a portion including the upper structural body 11 included in the image pickup device 1 and the above portion of the upper structural body 11, a pixel array unit 24 is arranged in which the plurality of pixels 31 is arrayed in an array, the pixels 31 each including the on-chip lens 16, the color filter 15, the pixel transistor, and the photodiode 51. In the region (pixel array region) of the pixel array unit 24, a pixel transistor region 301 is also arranged. The pixel transistor region 301 is a region where at least one of the transfer transistor 52, the amplifier transistor 55, and the reset transistor 54 is formed.

The plurality of external terminals 14 is arranged in a region positioned on the lower surface of a semiconductor substrate 81 included in the lower structural body 12 and below the pixel array unit 24 included in the upper structural body 11.

Note that, in the description of FIG. 6, the "region positioned on the lower surface of the semiconductor substrate 81 included in the lower structural body 12 and below the pixel array unit 24 included in the upper structural body 11" is referred to as a first specific region, and a "region positioned on the upper surface of the semiconductor substrate 81 included in the lower structural body 12 and below the pixel array unit 24 included in the upper structural body 11" is referred to as a second specific region.

At least a part of the plurality of external terminals 14 arranged in the first specific region is a signal input terminal 14A for inputting a signal from the outside to the image pickup device 1, or a signal output terminal 14B for outputting a signal from the image pickup device 1 to the outside. In other words, the signal input terminal 14A and the signal output terminal 14B are external terminals 14 excluding the power supply terminal and the ground terminal from the external terminals 14. In the present disclosure, the signal input terminal 14A or the signal output terminal 14B is referred to as a signal input/output terminal 14C.

A through-via 88 penetrating through the semiconductor substrate 81 is arranged in a region that is in the first specific region and in the vicinity of the signal input/output terminal 14C. Note that, in the present disclosure, a via hole penetrating through the semiconductor substrate 81 and a via wiring line formed inside the via hole may be collectively referred to simply as the through-via 88.

The through-via hole desirably has a structure formed by digging from the lower surface of the semiconductor substrate 81 to a conductive pad 322 that is a part of a multilayer wiring layer 82 arranged above the upper surface of the semiconductor substrate 81 and becomes an end (bottom) of the via hole (hereinafter referred to as a via pad 322).

The signal input/output terminal 14C arranged in the first specific region is electrically connected to the through-via 88 (more specifically, to the via wiring line formed in the through-via hole) also arranged in the first specific region.

In a region that is in the second specific region and in the vicinity of the signal input/output terminal 14C and the through-via, the input/output circuit unit 49 is arranged including the input circuit unit 42 or the output circuit unit 47.

The signal input/output terminal 14C arranged in the first specific region is electrically connected to the input/output circuit unit 49 via the through-via 88 and the via pad 322, or a part of the multilayer wiring layer 82.

A region where the input/output circuit unit 49 is arranged is referred to as an input/output circuit region 311. On the upper surface of the semiconductor substrate 81 included in the lower structural body 12, a signal processing circuit region 312 is formed adjacent to the input/output circuit region 311. The signal processing circuit region 312 is a region where the image signal processing unit 26 is formed described with reference to FIG. 2.

A region where the pixel peripheral circuit unit is arranged including all or part of the column signal processing unit 25 and the row drive unit 22 described with reference to FIG. 2, is referred to as the pixel peripheral circuit region 313. In the lower surface of a semiconductor substrate 101 included in the upper structural body 11 and the upper surface of the semiconductor substrate 81 included in the lower structural body 12, in a region on the outside of the pixel array unit 24, the pixel peripheral circuit region 313 is arranged.

The signal input/output terminal 14C may be arranged in a region on the lower side of the input/output circuit region 311 arranged in the lower structural body 12, or may be arranged in a region on the lower side of the signal processing circuit region 312. Alternatively, the signal input/output terminal 14C may be arranged on the lower side of the pixel peripheral circuit unit such as the row drive unit 22 or the column signal processing unit 25 arranged in the lower structural body 12.

In the present disclosure, a wiring connection structure that connects a wiring line included in a multilayer wiring layer 102 of the upper structural body 11 and a wiring line included in the multilayer wiring layer 82 of the lower structural body 12 together may be referred to as an upper and lower wiring lines connection structure, and a region where the structure is arranged is referred to as an upper and lower wiring lines connection region 314.

The upper and lower wiring lines connection structure includes a first through-electrode (through-silicon-electrode) 109 penetrating through the semiconductor substrate 101 from the upper surface of the upper structural body 11 to the multilayer wiring layer 102, a second through-electrode (through-chip-electrode) 105 penetrating through the semiconductor substrate 101 and the multilayer wiring layer 102 from the upper surface of the upper structural body 11 to the multilayer wiring layer 82 of the lower structural body 12, and a through-electrode connection wiring line 106 for connecting these two through-electrodes (through silicon via, TSV) together. In the present disclosure, such an upper and lower wiring lines connection structure may be referred to as a twin contact structure.

The upper and lower wiring lines connection region 314 is arranged outside the pixel peripheral circuit region 313.

In the present embodiment, the pixel peripheral circuit region 313 is formed in both the upper structural body 11 and the lower structural body 12, but the pixel peripheral circuit region 313 may be formed only in one of the upper structural body 11 and the lower structural body 12.

Furthermore, in the present embodiment, the upper and lower wiring lines connection region 314 is arranged in a region that is outside the pixel array unit 24 and outside the pixel peripheral circuit region 313, but the upper and lower wiring lines connection region 314 may be arranged in a region that is outside the pixel array unit 24 and inside the pixel peripheral circuit region 313.

Moreover, in the present embodiment, as the structure that electrically connects the multilayer wiring layer 102 of the upper structural body 11 and the multilayer wiring layer 82 of the lower structural body 12 together, the twin contact structure is adopted that performs connection using two through-electrodes of the through-silicon-electrode 109 and the through-chip-electrodes 105.

As the structure that electrically connects the multilayer wiring layer 102 of the upper structural body 11 and the multilayer wiring layer 82 of the lower structural body 12 together, for example, a share contact structure may be used in which a wiring layer 103 of the upper structural body 11 and a wiring layer 83 of the lower structural body 12 are each commonly connected to one through-electrode.

<7. Circuit Arrangement of Image Pickup Device in Case where Another Upper and Lower Wiring Lines Connection Structure is Used>

A circuit arrangement and a cross-sectional structure of the image pickup device 1 will be described in a case where another upper and lower wiring lines connection structure is used, with reference to FIGS. 7 and 8.

Figure 6:
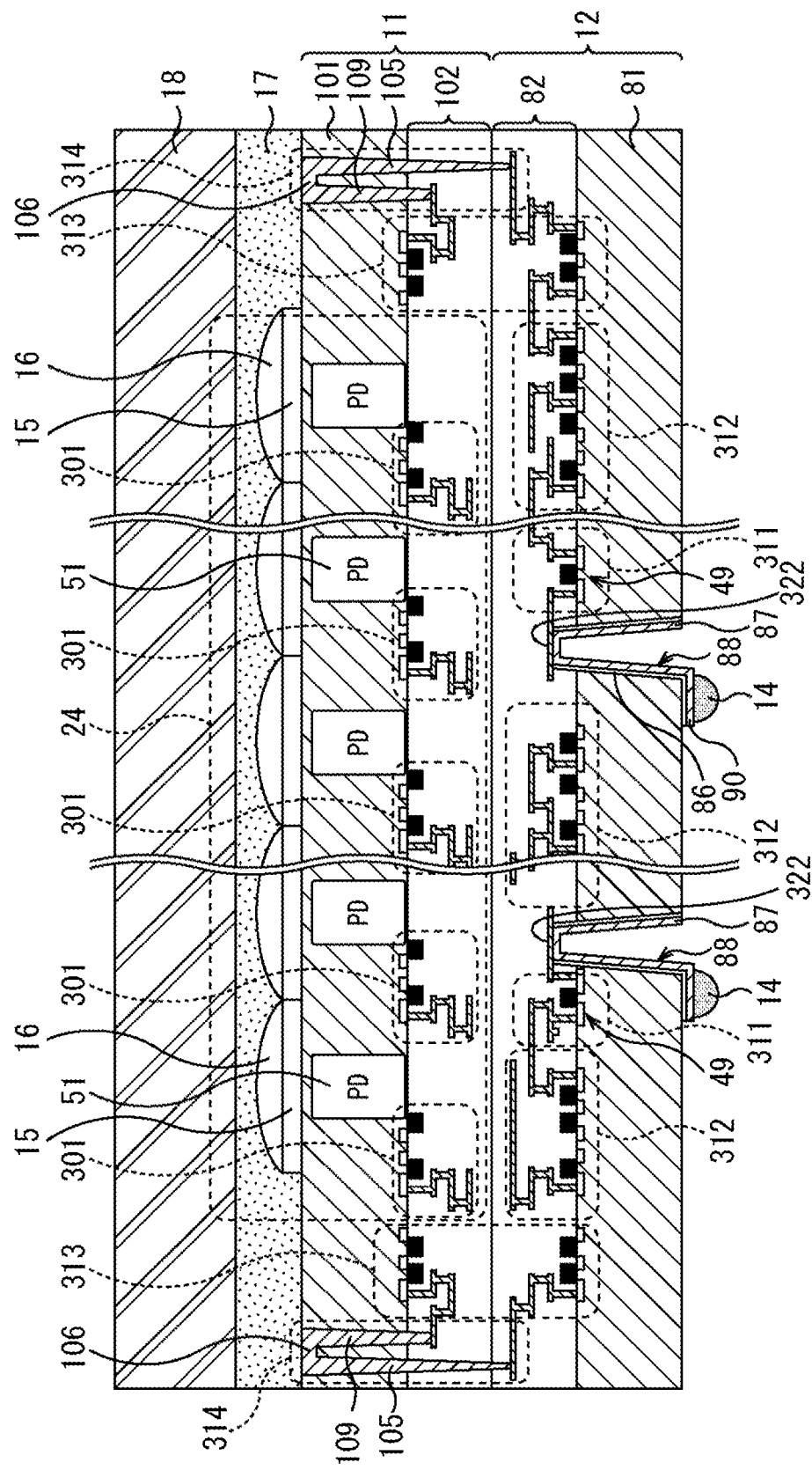
FIG. 6 is a diagram illustrating a cross-sectional structure taken along a line A-A' of FIG. 5.
Figure 7:
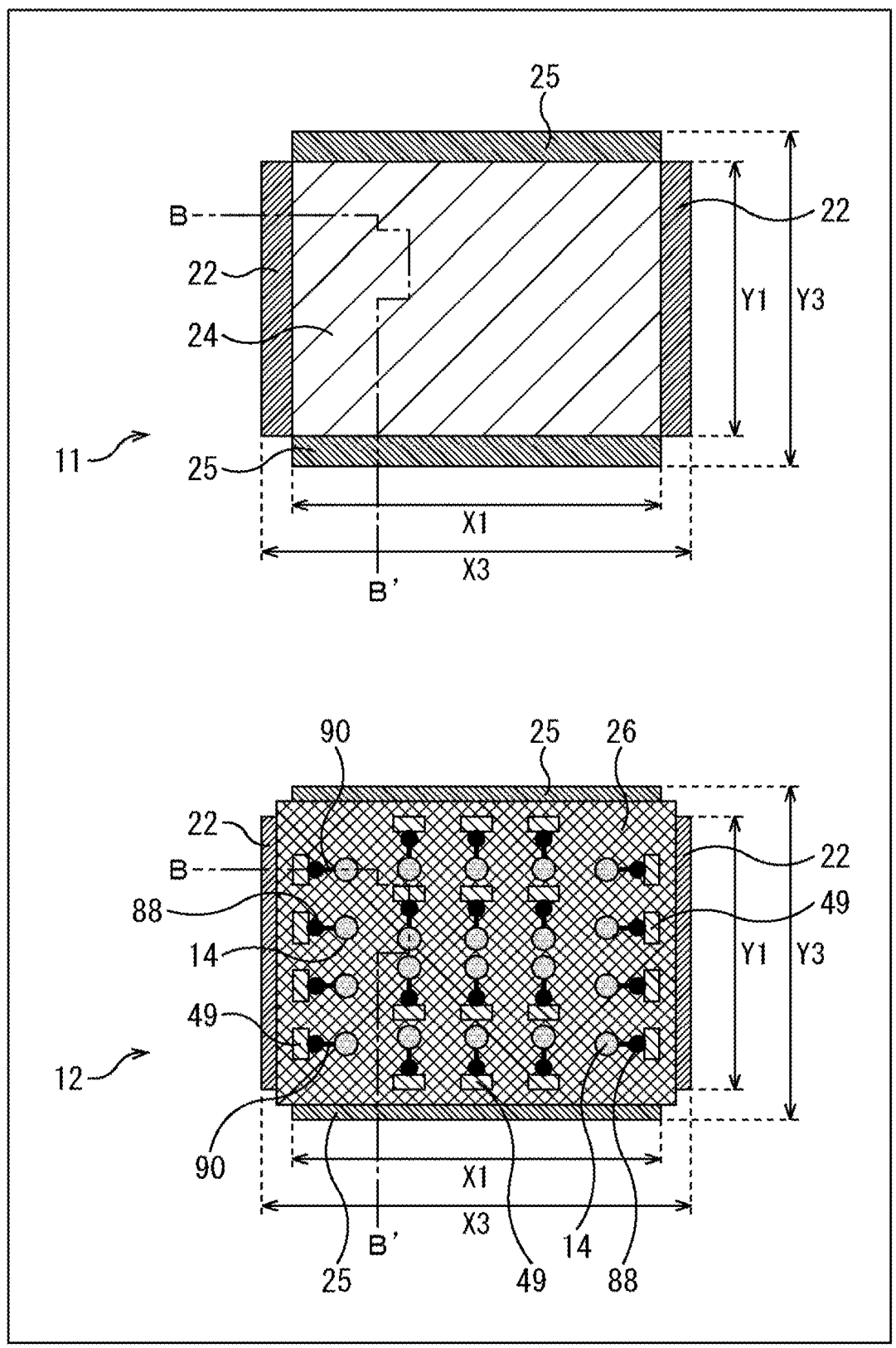
FIG. 7 is a diagram illustrating a second example circuit arrangement configuration of the circuit arrangement in the image pickup device.
Figure 8:
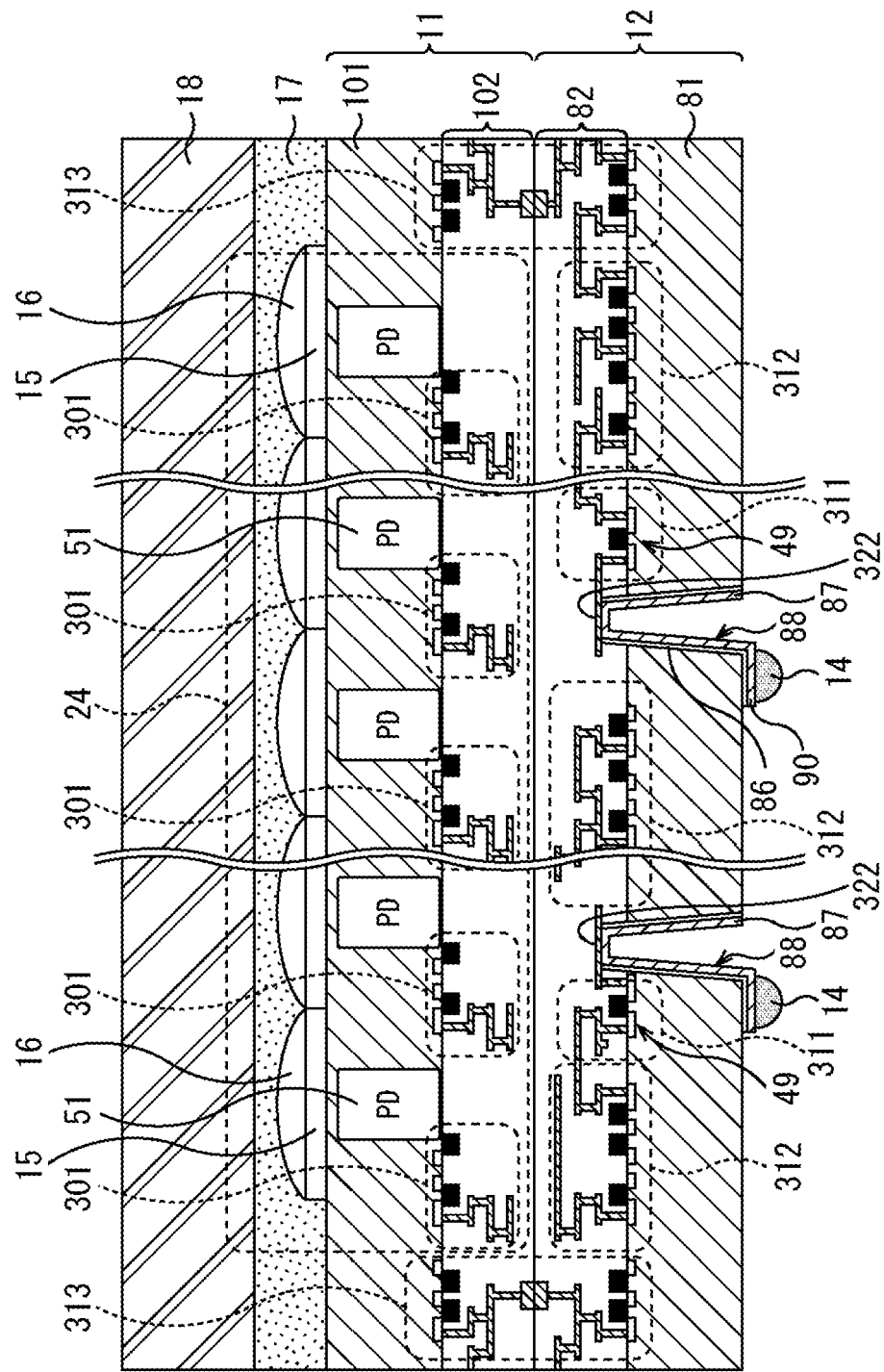
FIG. 8 is a diagram illustrating a cross-sectional structure taken along a line B-B' of FIG. 7.

FIG. 8 is a diagram illustrating a cross-sectional structure of the image pickup device 1 taken along a line B-B' of FIG. 7 in a case where a structure is used different from the upper and lower wiring lines connection structure illustrated in FIG. 6. Note that, for convenience, a part of FIG. 8 is illustrated by being changed to a cross-sectional structure in another example configuration of the present technology described later.

In the pixel peripheral circuit region 313 of FIG. 8, some of wiring lines of the multilayer wiring layer 102 of the upper structural body 11 are arranged on the lowermost surface of the multilayer wiring layer 102, in other words, on a bonding surface between the upper structural body 11 and the lower structural body 12. Furthermore, also some of wiring lines of the multilayer wiring layer 82 of the lower structural body 12 are arranged on the uppermost surface of the multilayer wiring layer 82, in other words, on the bonding surface between the upper structural body 11 and the lower structural body 12.

Then, the some of wiring lines of the multilayer wiring layer 102 and the some of wiring lines of the multilayer wiring layer 82 are arranged at substantially the same position on the bonding surface, and the wiring lines are electrically connected to each other. As a form of electrically connecting the wiring lines, a form may be used in which two wiring lines are directly brought into contact with each other, or a form may be used in which a thin insulating film or a high resistance film is formed between two wiring lines, and a part of the formed film is electrically conducting partially. Alternatively, a form may be used in which a thin insulating film or a high resistance film is formed between two wiring lines, and the two wiring lines propagate an electric signal by capacitive coupling.

In the present disclosure, as a generic name of the structure in which the some of wiring lines of the multilayer wiring layer 102 of the upper structural body 11 and the some of wiring lines of the multilayer wiring layer 82 of the lower structural body 12 are formed at substantially the same position on the bonding surface and the two wiring lines are electrically connected together, the structure may be referred to as an upper and lower wiring lines direct connection structure or simply as a wiring lines direct connection structure.

As a specific example of substantially the same position, for example, a position may be used where the two wiring lines to be electrically connected together overlap each other at least in a part thereof in a case where the image pickup device 1 is viewed from the upper side to the lower side in a plan view. In a case where, for example, copper (Cu) is used as a material of the two wiring lines to be connected together, the connection structure may be referred to as a Cu—Cu direct bonding structure or simply as a Cu—Cu bonding structure.

In a case where the upper and lower wiring lines direct connection structure is used, the connection structure can be arranged outside the pixel array unit 24. Alternatively, the connection structure can be arranged inside the pixel peripheral circuit region 313 included in the upper structural body 11, and inside the pixel peripheral circuit region 313 included in the lower structural body 12.

More specifically, among the wiring lines constituting the upper and lower wiring lines direct connection structure, the wiring line to be arranged on the side of the upper structural body 11 of the bonding surface can be arranged on the lower side of the circuit included in the pixel peripheral circuit region 313 of the upper structural body 11. Furthermore, among the wiring lines constituting the upper and lower wiring lines direct connection structure, the wiring line to be arranged on the side of the lower structural body 12 of the bonding surface can be arranged on the upper side of the circuit included in the pixel peripheral circuit region 313 of the lower structural body 12. Alternatively, by using the wiring line arranged in the pixel array unit 24 (pixel transistor region 301) as the wiring line of the upper structural body 11, the upper and lower wiring lines direct connection structure by the wiring line arranged in the pixel array unit 24 and the wiring line of the lower structural body 12 can be arranged below the pixel array unit 24 (pixel transistor region 301).

<Second Example Circuit Arrangement Configuration>

FIG. 7 is a diagram illustrating a second example circuit arrangement configuration of the image pickup device 1.

In the second example circuit arrangement configuration, the upper and lower wiring lines direct connection structure is used as the upper and lower wiring lines connection structure.

As illustrated in FIG. 7, the arrangement of the pixel array unit 24 in the second example circuit arrangement configuration is similar to the first example circuit arrangement configuration illustrated in FIG. 5. In other words, the pixel array unit 24 is arranged in the upper structural body 11.

Furthermore, as illustrated in FIG. 7, the arrangement of the row drive unit 22 and the column signal processing unit 25 of the image pickup device 1 in the second example circuit arrangement configuration is also similar to the arrangement of the first example circuit arrangement configuration illustrated in FIG. 5.

On the other hand, the arrangement of an upper and lower wiring lines connection portion in the second example circuit arrangement configuration is different from the arrangement of the first example circuit arrangement configuration illustrated in FIG. 5.

The connection between the wiring line of the row drive unit 22 arranged in the upper structural body 11 and the wiring line of the row drive unit 22 arranged in the lower structural body 12 is formed in a region where the row drive unit 22 arranged in the upper structural body 11 and the row drive unit 22 arranged in the lower structural body 12 overlap each other, by using the upper and lower wiring lines direct connection structure.

The connection between the wiring line of the column signal processing unit 25 arranged in the upper structural body 11 and the wiring line of the column signal processing unit 25 arranged in the lower structural body 12 is formed in a region where the column signal processing unit 25 arranged in the upper structural body 11 and the column signal processing unit 25 arranged in the lower structural body 12 overlap each other, by using the upper and lower wiring lines direct connection structure.

In the first example circuit arrangement configuration illustrated in FIG. 5, the upper and lower wiring lines connection structure for connection of the wiring lines of the row drive unit 22 and the upper and lower wiring lines connection structure for connection of the wiring lines of the column signal processing unit 25 are arranged in the wiring connection units 29 outside the row drive unit 22 and outside the column signal processing unit 25, respectively. On the other hand, in the second example circuit arrangement configuration illustrated in FIG. 7, the upper and lower wiring lines connection structure for connection of the wiring lines of the row drive unit 22 and the upper and lower wiring lines connection structure for connection of the wiring lines of the column signal processing unit 25 are formed within the region of the row drive unit 22 and within the region of the column signal processing unit 25, respectively. Therefore, in the image pickup device 1 described in the second example circuit arrangement configuration, the wiring connection unit 29 is omitted in the upper structural body 11 and the lower structural body 12, and a device can be implemented having a smaller external size than the image pickup device 1 described in the first example circuit arrangement configuration.

<8. Comparative Example with Other Image Pickup Devices>

Comparative Example 1

Features of the structure of the image pickup device 1 will be described as compared with the structure of another image pickup device.

Figure 9:
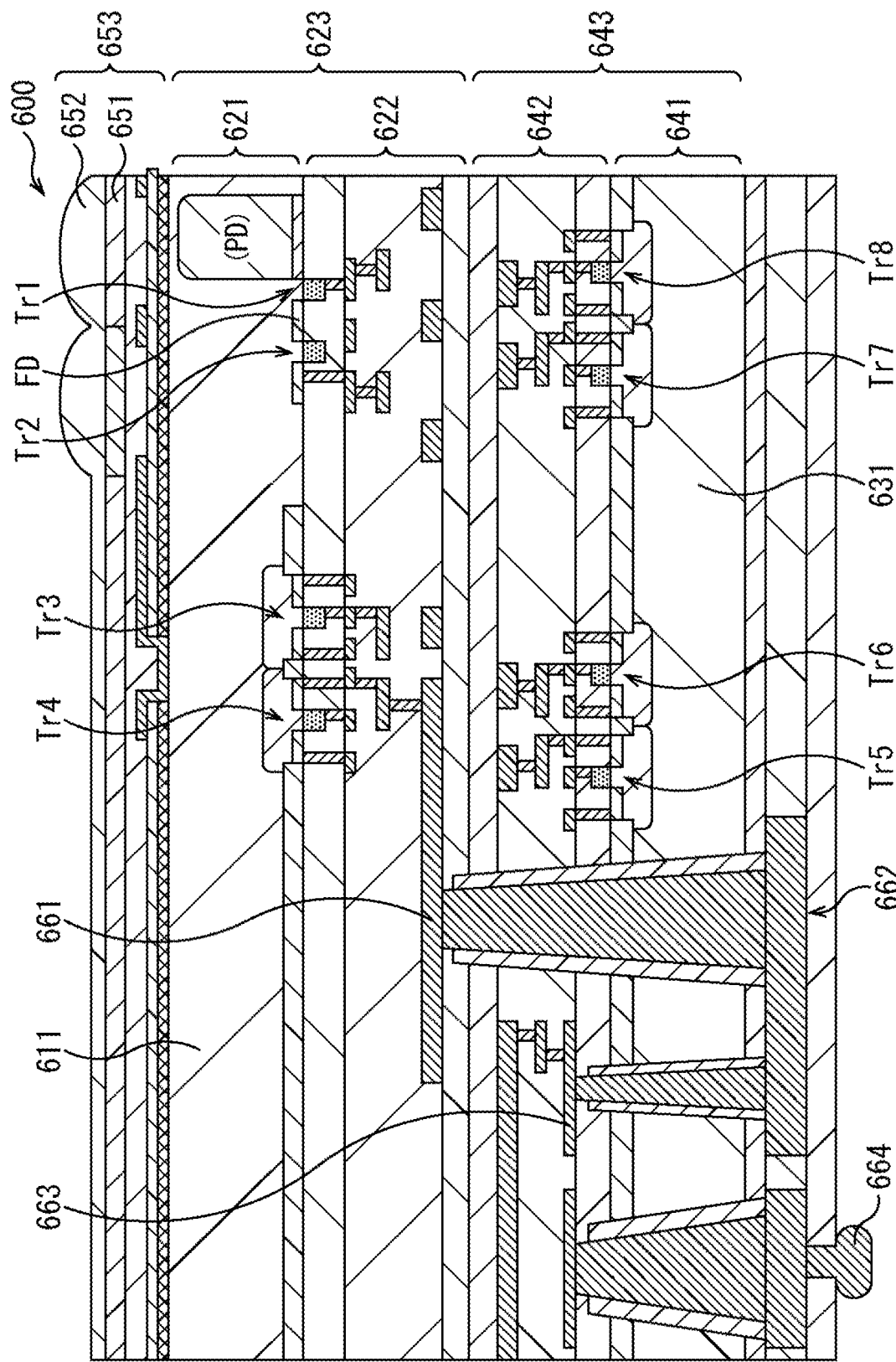
FIG. 9 is a diagram illustrating a cross section in a final shape of an image pickup device as Comparative Example 1.

FIG. 9 is a diagram illustrating a cross section in a final shape of an image pickup device disclosed in Japanese Patent Application Laid-Open No. 2014-72294 (hereinafter referred to as Comparative Structure Disclosure Document 1) as Comparative Example 1.

An image pickup device 600 of FIG. 9 has a structure in which a first portion 623 and a second portion 643 are layered, the first portion 623 including a first wiring portion 622 and a first element portion 621 including a first semiconductor layer 611, the second portion 643 including a second wiring portion 642 and a second element portion 641 including a second semiconductor layer 631. On the back surface side of the first portion 623, an optical member 653 is arranged including a color filter 651, an on-chip lens 652, and the like.

The image pickup device 600 has a structure that connects a first wiring line 661 and a second wiring line 663 together via a conductive member 662, outside transistors Tr 3 and Tr 4 constituting a control unit, and outside a region where transistors Tr 5 to Tr 8 constituting a signal processing unit are arranged, and an external terminal 664 is arranged outside this connection structure. Note that, there is no description of where the input/output circuit is arranged.

On the other hand, the present technology has a structure in which (1) the external terminal 14, (2) the semiconductor region where the input circuit unit 42 or the output circuit unit 47 connected to the external terminal 14 is formed, (3) the semiconductor region where the photodiode 51 that performs image pickup and the pixel transistor are formed, (4) the color filter 15 and the on-chip lens 16, and (5) the protective substrate 18 are layered in substantially the same region, whereby the external size can be made smaller than the image pickup device 600 of FIG. 9.

The image pickup device 600 of FIG. 9 does not include a protective substrate for protecting the on-chip lens 652 on the upper side of the on-chip lens 652 in its final shape. Then, in Comparative Structure Disclosure Document 1, as a method of manufacturing the image pickup device 600 of FIG. 9, it is described that the first portion 623 and the second portion 643 are bonded, the color filter 651 and the on-chip lens 652 are formed, and thereafter the substrate is inverted, and then an opening exposing an electrode unit and the external terminal 664 are formed. When forming the external terminal 664, it is necessary to crimp the external terminal 664 onto a metal wiring line by applying a stress of greater than or equal to a specific value. In the image pickup device 600 including no protective substrate on the on-chip lens 652, if the external terminal 664 is formed by the above manufacturing method, when the external terminal 664 is crimped, the on-chip lens 652 is pressed against the manufacturing apparatus, and the on-chip lens 652 may be scratched.

Moreover, in the image pickup device 600 of FIG. 9, the external terminal 664 is formed in a region outside a pixel array unit, and is not formed immediately below the on-chip lens 652. In this case, force applied to the on-chip lens 652 when the external terminal 664 is crimped becomes force obtained by diagonally dispersing force applied to crimp the external terminal 664.

Provisionally, in a case where the external terminal 664 is formed immediately below a pixel region, that is, immediately below the on-chip lens 652 in order to implement an image pickup device having a small external size, the on-chip lens 652 exists on an extended line of a direction of the force applied to crimp the external terminal 664, so that the force applied to the on-chip lens 652 becomes greater, and the occurrence of scratches on the on-chip lens 652 may become more serious.

Furthermore, in Comparative Structure Disclosure Document 1, a manufacturing method is also disclosed of forming the color filter 651 and the on-chip lens 652 after forming the external terminal 664.

However, in the case of the manufacturing method, in a state in which a number of protrusions by the external terminals 664 are included on the surface of the image pickup device, when the color filter 651 and the on-chip lens 652 are formed, it may be difficult to fix the image pickup device to the manufacturing apparatus with a general method such as a vacuum suction method.

On the other hand, the image pickup device 1 of FIG. 1 includes the protective substrate 18 above the on-chip lens 16. Therefore, it is possible to form the external terminal 14 without pressing the on-chip lens 16 against the manufacturing apparatus of the external terminal 14. The image pickup device 1 enables the structure in which (1) the external terminal 14, (2) the semiconductor region where the input circuit unit 42 or the output circuit unit 47 connected to the external terminal 14 is formed, (3) the semiconductor region where the photodiode 51 that performs image pickup and the pixel transistor are formed, (4) the color filter 15 and the on-chip lens 16, and (5) the protective substrate 18 are layered in substantially the same region, and the external size can be made smaller than the image pickup device 600 of FIG. 9.

Comparative Example 2

Figure 10:
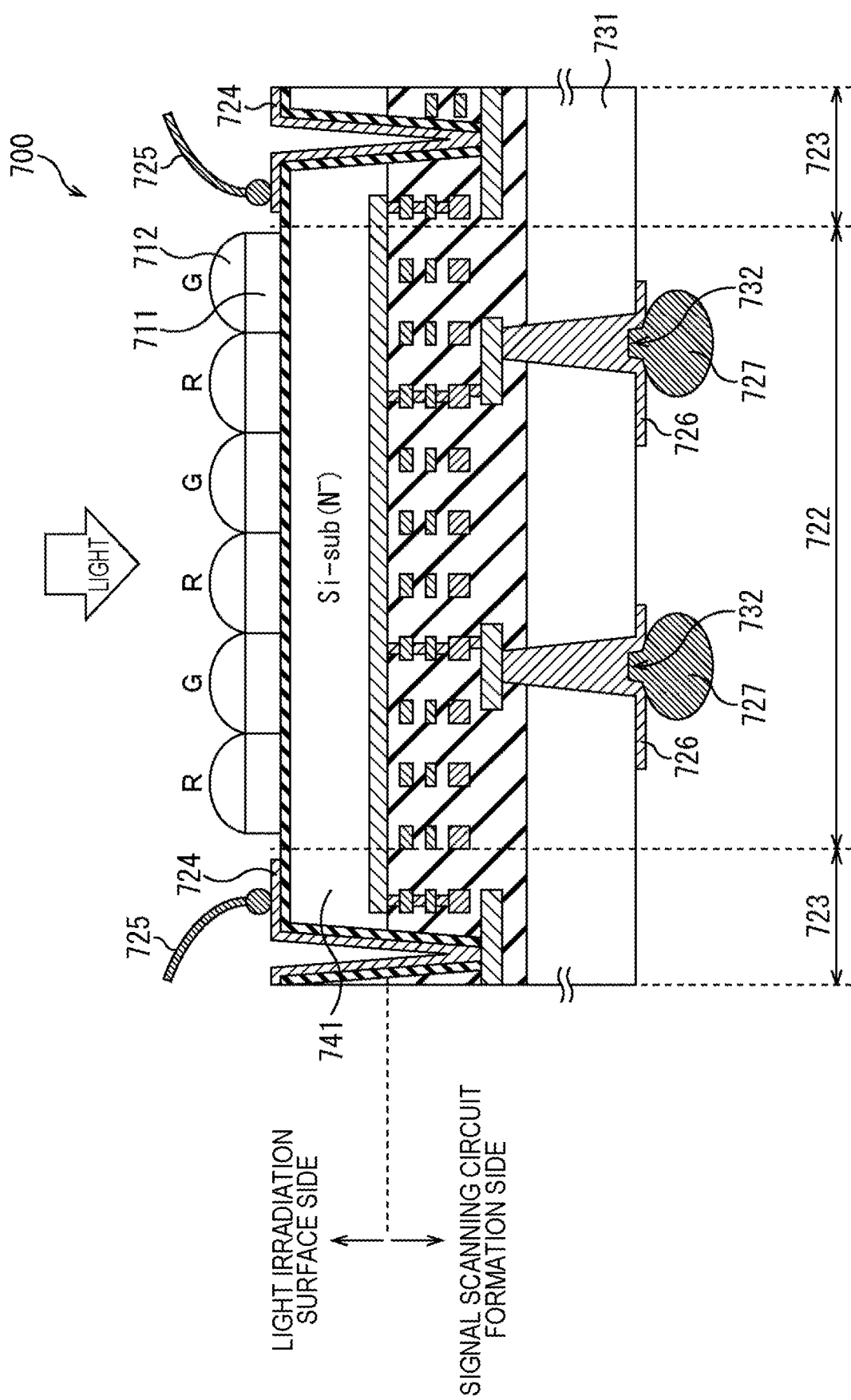
FIG. 10 is a diagram illustrating a cross section in a final shape of an image pickup device as Comparative Example 2.

FIG. 10 is a diagram illustrating a cross section in a final shape of an image pickup device disclosed in Japanese Patent Application Laid-Open No. 2010-50149 (Comparative Structure Disclosure Document 2) as Comparative Example 2.

An image pickup device 700 of FIG. 10 is divided into an image pickup region 722 where a photodiode (not illustrated), a color filter 711, an on-chip lens 712, and the like are formed, and a peripheral region 723 formed around the image pickup region 722.

In the peripheral region 723, a first pad 724 is arranged for a drive pulse and signal input/output. A bonding wire 725 is connected to the first pad 724. Then, a second pad 726 is arranged for giving a reference potential Vss, in the image pickup region 722. An external terminal (solder ball) 727 is provided on the second pad 726.

As described above, the image pickup device 700 includes the external terminal 727 on the lower side of a pixel array.

The image pickup device 1 has the structure in which (1) the external terminal 14, (2) the semiconductor region where the input circuit unit 42 or the output circuit unit 47 connected to the external terminal 14 is formed, (3) the semiconductor region where the photodiode 51 that performs image pickup and the pixel transistor are formed, (4) the color filter 15 and the on-chip lens 16, and (5) the protective substrate 18 are layered in substantially the same region, whereby the external size can be made smaller than the image pickup device 700 of FIG. 10.

The image pickup device 700 of FIG. 10 is a solid state semiconductor device that does not include a layered structure like the upper structural body 11 and the lower structural body 12 of the image pickup device 1, in other words, that includes only one layer of a semiconductor substrate including a transistor circuit.

In the image pickup device 700 disclosed in FIG. 10, a via 732 penetrating through a support substrate 731, and the external terminal 727 are formed on the lower side of the pixel array in the image pickup region 722 in its final shape.

However, the external terminal 727 formed in FIG. 10 is a terminal for the reference potential Vss (ground potential). The terminal of the reference potential Vss does not require an input circuit including a transistor circuit when the reference potential Vss is supplied to the inside of the image pickup device. Therefore, in the image pickup device 700 disclosed in FIG. 10, the external terminal 727 for the reference potential Vss can be arranged on the lower side of the image pickup region 722.

On the other hand, in the image pickup region 722, pixels each including a photodiode and a pixel transistor are arranged side by side. Therefore, in the case of a structure that includes only one layer of the semiconductor substrate 741 including a transistor circuit, it is difficult to form an input circuit together within a pixel region in the semiconductor substrate 741 including pixels. Therefore, in the image pickup device 700 including only one layer of the semiconductor substrate 741 disclosed in FIG. 10, it is possible to arrange a power supply terminal that does not require an input/output circuit on the lower side of the pixel region, but it is not possible to arrange an external terminal that requires an input circuit or an output circuit, in other words an external terminal for signal input or signal output.

Moreover, the image pickup device 700 of FIG. 10 does not include a protective substrate on the on-chip lens 712, similarly to the image pickup device 600 illustrated in FIG. 9. Therefore, a problem occurs that the on-chip lens 712 is scratched when the external terminal is crimped.

On the other hand, the image pickup device 1 has a structure in which a plurality of semiconductor substrates including a transistor circuit is layered. As a result, it is possible to arrange the external terminal 14 that requires an input circuit or an output circuit, in other words, the signal input/output terminal 14C for signal input or signal output, on the lower side of the pixel region.

Furthermore, the image pickup device 1 includes the protective substrate 18 on the on-chip lens 16. Therefore, it is possible to form the external terminal 14 without pressing the on-chip lens 16 against the manufacturing apparatus of the external terminal 14. As a result, the image pickup device 1 enables the structure in which (1) the external terminal 14, (2) the semiconductor region where the input circuit unit 42 or the output circuit unit 47 connected to the external terminal 14 is formed, (3) the semiconductor region where the photodiode 51 that performs image pickup and the pixel transistor are formed, (4) the color filter 15 and the on-chip lens 16, and (5) the protective substrate 18 are layered in substantially the same region, and the external size can be made smaller than the image pickup device 700 of FIG. 10.

Comparative Example 3

Figure 11:
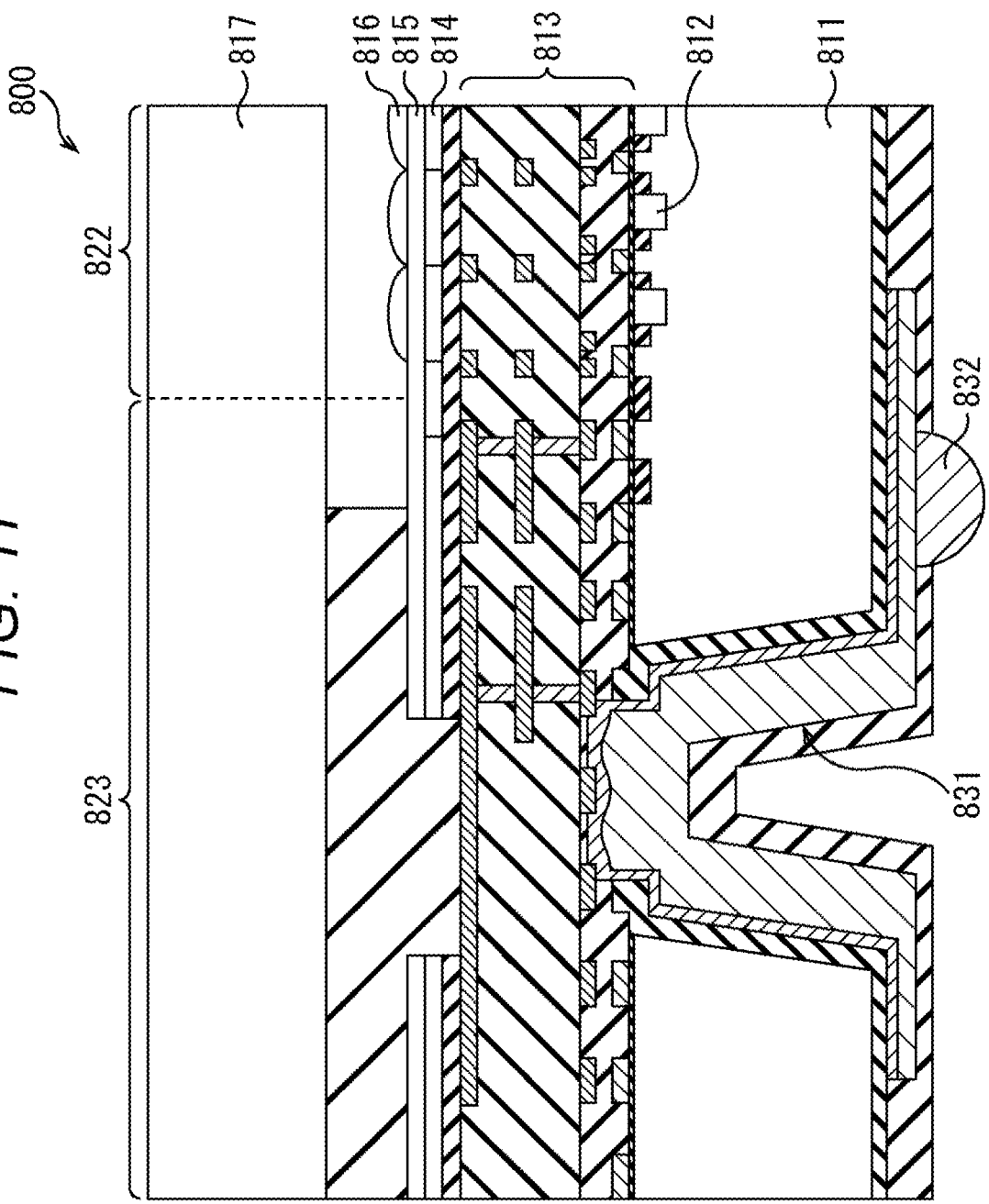
FIG. 11 is a diagram illustrating a cross section in a final shape of an image pickup device as Comparative Example 3.

FIG. 11 is a diagram illustrating a cross section in a final shape of an image pickup device disclosed in Japanese Patent Application Laid-Open No. 2011-9645 (Comparative Structure Disclosure Document 3) as Comparative Example 3.

An image pickup device 800 of FIG. 11 includes an image pickup element 812 including a photodiode and a transistor on a first principal surface (upper surface) of a semiconductor substrate 811. On the upper side of the image pickup element 812, a multilayer wiring layer 813, a color filter 814, an overcoat 815, and an on-chip lens 816 are formed. Furthermore, the image pickup device 800 includes a protective substrate 817 on the upper side of the on-chip lens 816.

Outside the image pickup pixel unit 822 including the image pickup element 812, the color filter 814, and the on-chip lens 816, a peripheral circuit unit 823 is arranged including a through-silicon-electrode 831 penetrating through the semiconductor substrate 811, an external terminal (solder ball) 832 to be connected to the outside, and the like.

Similarly to the image pickup device 700 of Comparative Example 2, the image pickup device 800 of FIG. 11 is a solid state semiconductor device that does not include a layered structure in which an upper structural body and a lower structural body are layered, in other words, that includes only one layer of a semiconductor substrate including a transistor circuit. Therefore, it is not possible to arrange an external terminal that requires an input circuit or an output circuit, in other words, an external input terminal for signal input or signal output, on the lower side of a pixel region.

On the other hand, the image pickup device 1 has a structure in which a plurality of semiconductor substrates including a transistor circuit is layered. As a result, it is possible to arrange the external terminal 14 that requires an input circuit or an output circuit, in other words, the external terminal 14 for signal input or signal output, on the lower side of the pixel region.

As a result, the image pickup device 1 enables the structure in which (1) the external terminal 14, (2) the semiconductor region where the input circuit unit 42 or the output circuit unit 47 connected to the external terminal 14 is formed, (3) the semiconductor region where the photodiode 51 that performs image pickup and the pixel transistor are formed, (4) the color filter 15 and the on-chip lens 16, and (5) the protective substrate 18 are layered in substantially the same region, and the external size can be made smaller than the image pickup device 800 of FIG. 11.

Furthermore, in a case where the through-silicon-electrode 831 is formed only in the outer peripheral portion (the peripheral circuit unit 823) of the device as in the image pickup device 800 of FIG. 11, similarly, a power supply terminal and a ground terminal are arranged only in the outer peripheral portion of the device.

In this case, it has been necessary to arrange a large number of power supply terminals and ground terminals for countermeasures against IR drop and wiring delay. On the other hand, in the image pickup device 1, since a plurality of the through-vias 88 can be arranged in an arbitrary region of the lower structural body 12 inside from the upper and lower substrates connection region 314, some of the through-vias 88 can be used for the power supply terminal and the ground terminal. In other words, the power supply terminal and the ground terminal can also be arranged in the arbitrary region. As a result, the number of power supply terminals and ground terminals can be reduced as compared with a case where the power supply terminal and the ground terminal are arranged only in the outer peripheral portion. As a result, a circuit area of the entire image pickup device 1 can be reduced.

<Difference Between Image Pickup Device of FIG. 1 and Comparative Example>

The image pickup device 1 has the structure in which (1) the external terminal 14, (2) the semiconductor region where the input circuit unit 42 or the output circuit unit 47 connected to the external terminal 14 is formed, (3) the semiconductor region where the photodiode 51 that performs image pickup and the pixel transistor are formed, (4) the color filter 15 and the on-chip lens 16, and (5) the protective substrate 18 are layered in substantially the same region, whereby the external size can be made smaller.

In the case of the image pickup device having the semiconductor layered structure without the protective substrate given in Comparative Example 1 and Comparative Example 2, the on-chip lens may be scratched. In other words, there is an inhibitory factor to obtain an image pickup device having an external size equivalent to that of the present technology by adopting a structure in which the above (1) to (4) are layered in substantially the same region. That is, a function and effect of "implementing a compact image pickup device by layering the above (1) to (4) in substantially the same region" is a function and effect that cannot be obtained by the image pickup device having the semiconductor layered structure without the protective substrate given in Comparative Example 1 and Comparative Example 2.

In the case of the solid state semiconductor device including only one layer of the semiconductor substrate including the transistor circuit given in Comparative Example 3, it is not possible to obtain an image pickup device having an external size equivalent to that of the present technology by adopting the structure in which the above (1) to (5) are layered in substantially the same region. In other words, there is an inhibitory factor. That is, a function and effect of "implementing a compact image pickup device by layering the above (1) to (5) in substantially the same region" is a function and effect that cannot be obtained by the image pickup device that includes only one layer of the semiconductor substrate including the transistor circuit given in Comparative Example 3.

As described above, in the present technology, a function and effect of "implementing an image pickup device having a smaller external size than the image pickup device not including a structure by the structure in which the above-described (1) to (5) are layered in substantially the same region" is a function and effect that cannot be obtained by the configuration alone of the "image pickup device having the semiconductor layered structure without the protective substrate" described in Comparative Example 1 and Comparative Example 2, and also is a function and effect that cannot be obtained by the configuration alone of the "image pickup device that includes only one layer of the semiconductor substrate including the transistor circuit" described in Comparative Example 3.

<9. Other Example Circuit Arrangement Configurations of Image Pickup Device>

<Third Example Circuit Arrangement Configuration>

Figure 12:
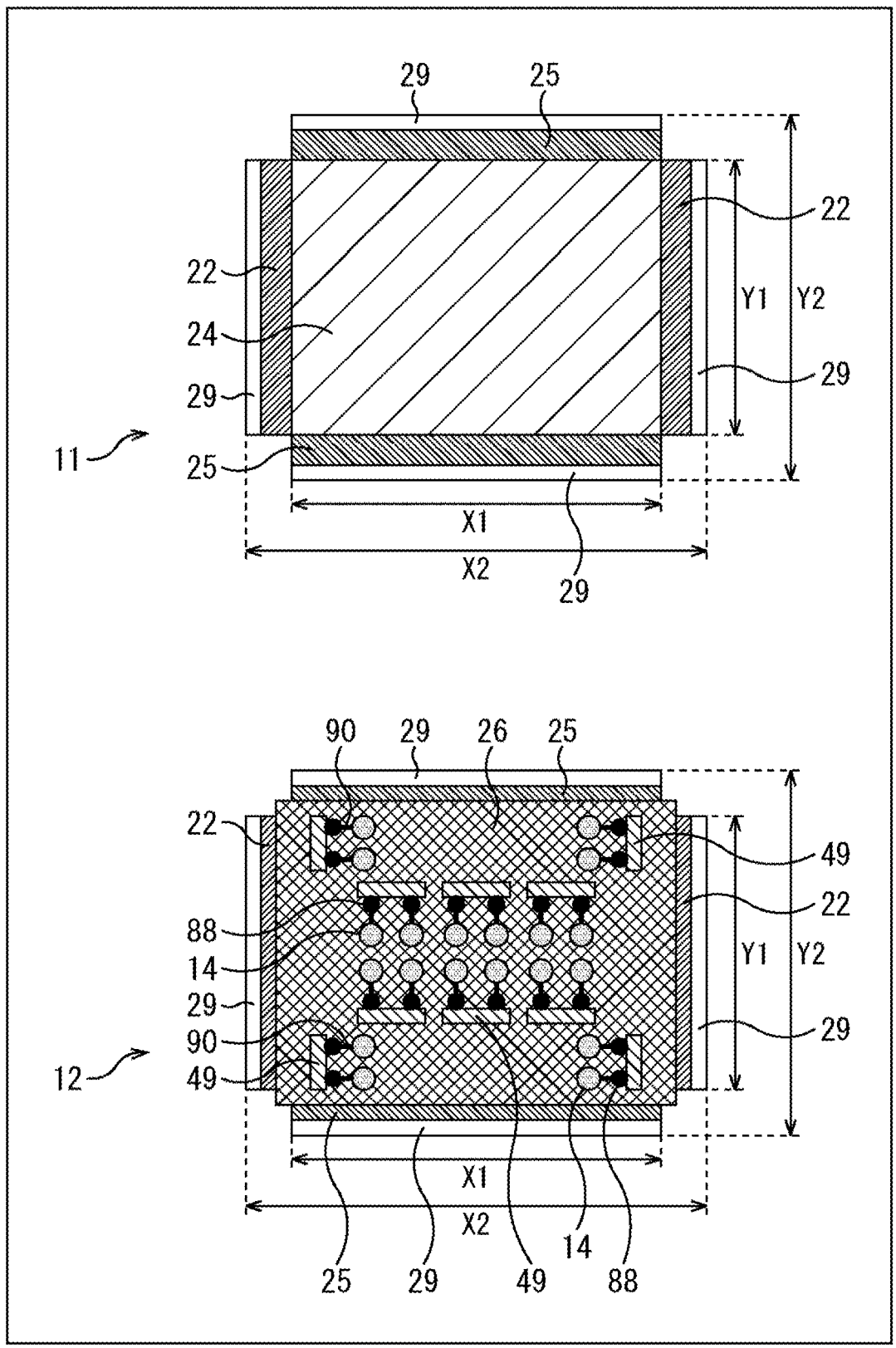
FIG. 12 is a diagram illustrating a third example circuit arrangement configuration of the circuit arrangement in the image pickup device.

FIG. 12 is a diagram illustrating a third example circuit arrangement configuration that is another example circuit arrangement configuration of the image pickup device 1 and is a modification of the first example circuit arrangement configuration.

In the first example circuit arrangement configuration illustrated in FIG. 5, the input/output circuit units 49 are arranged separately for each one of the external terminals 14. Then, the image signal processing unit 26 surrounds the periphery of each of the input/output circuit units 49.

On the other hand, in the third example circuit arrangement configuration illustrated in FIG. 12, the input/output circuit units 49 are collectively arranged for each of the plurality of external terminals 14. In the inside of a region of one of the input/output circuit units 49, for example, the input/output circuit unit 49 of a certain external terminal 14 and the input/output circuit unit 49 of another external terminal 14 are arranged in contact with each other, and the image signal processing unit 26 is not arranged between these input/output circuit units 49.

As compared with the first example circuit arrangement configuration in which the input/output circuit unit 49 and the image signal processing unit 26 respectively having different power supply voltages are alternately arranged adjacent to each other, in the third example circuit arrangement configuration in which the input/output circuit units 49 having the same power supply voltage are collectively arranged as one block of an input/output circuit unit region, the number of places is reduced where the wells having different power supply voltages are arranged separately, so that there is a possibility that more circuits can be mounted to, for example, the image signal processing unit 26, in the lower structural body 12, even if the external sizes of the image pickup devices 1 are the same as each other.

Moreover, in the third example circuit arrangement configuration illustrated in FIG. 12, some of the input/output circuit units 49 may be arranged on the lower side of the pixel peripheral circuit unit included in the upper structural body 11, for example, the lower side of the row drive unit 22 included in the upper structural body 11, or outside a region where the image signal processing unit 26 included in the lower structural body 12 is arranged, instead of being arranged on the lower side of the pixel array unit 24 included in the upper structural body 11. As a result, there is a possibility that even more circuits can be mounted to, for example, the image signal processing unit 26, in the lower structural body 12, even if the external sizes of the image pickup devices 1 are the same as each other.

<Fourth Example Circuit Arrangement Configuration>

Figure 13:
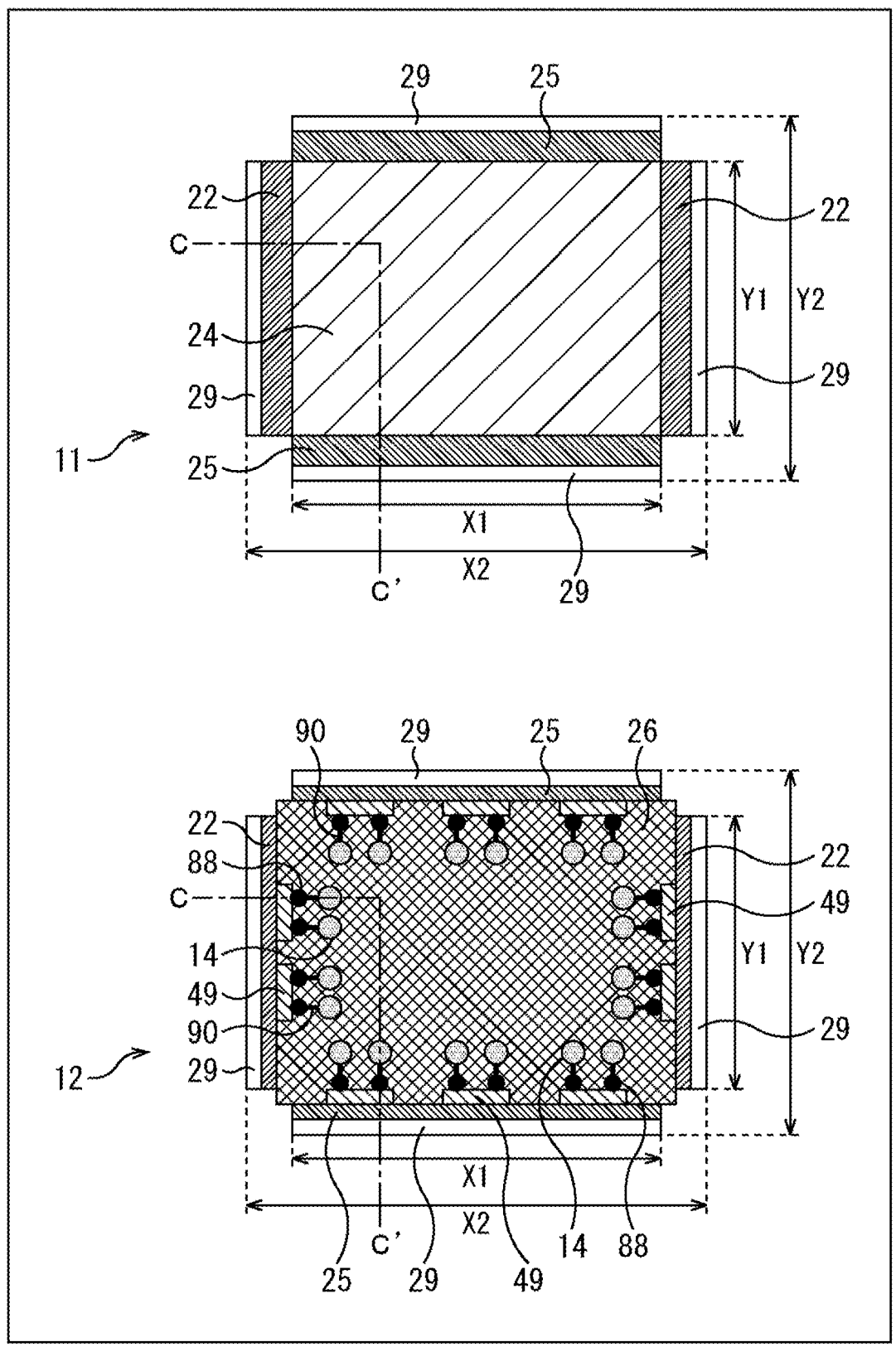
FIG. 13 is a diagram illustrating a fourth example circuit arrangement configuration of the circuit arrangement in the image pickup device.

FIG. 13 is a diagram illustrating a fourth example circuit arrangement configuration that is another example circuit arrangement configuration of the image pickup device 1 and is a modification of the first and third example circuit arrangement configurations.

Figure 14:
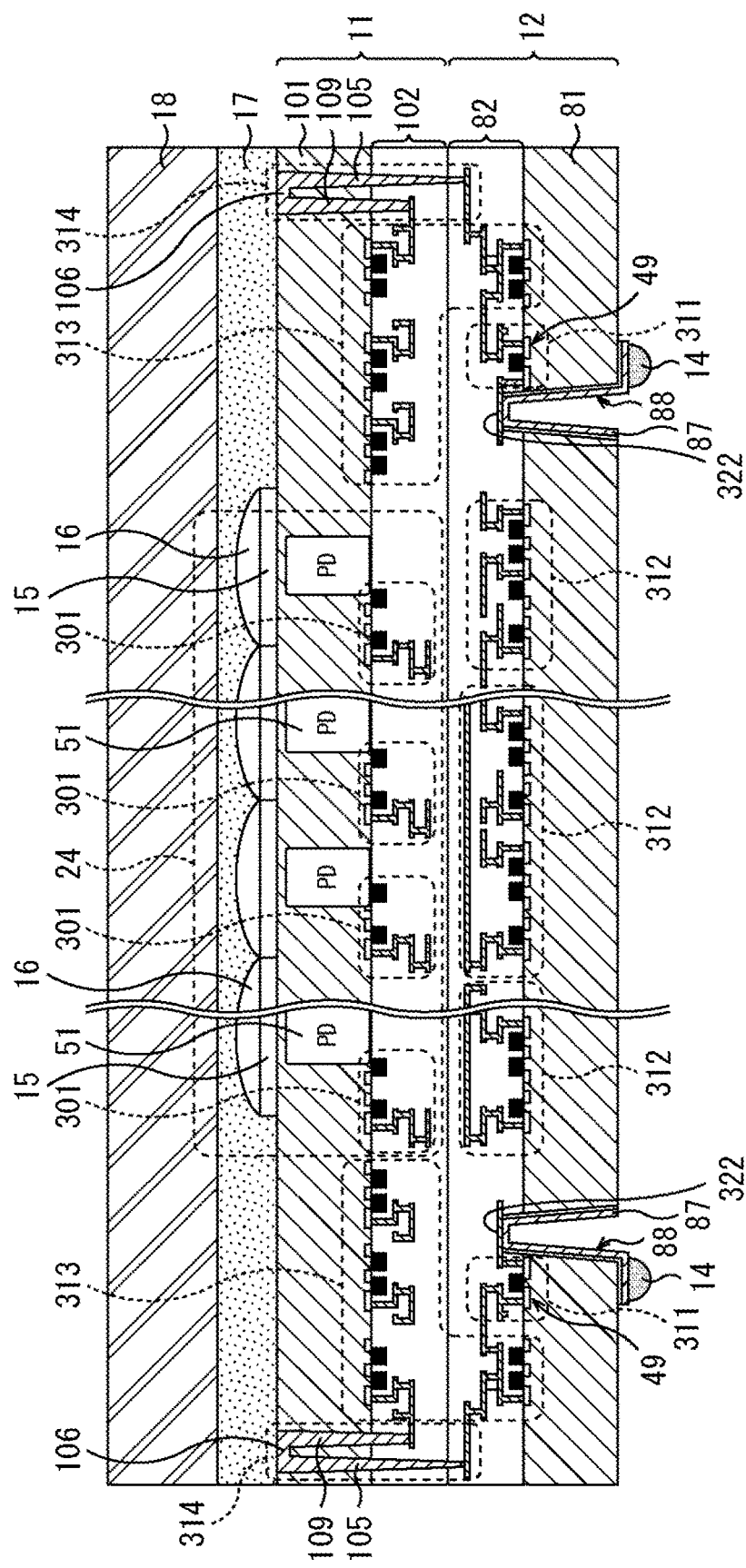
FIG. 14 is a diagram illustrating a cross-sectional structure taken along a line C-C' of FIG. 13.

FIG. 14 is a diagram illustrating a cross-sectional structure of the image pickup device 1 taken along a line C-C' of FIG. 13. Note that, for convenience, a part of FIG. 14 is illustrated by being changed to a cross-sectional structure in another example configuration of the present technology described later.

In the fourth example circuit arrangement configuration illustrated in FIGS. 13 and 14, all of the input/output circuit units 49, in other words, the input circuit units 42 and the output circuit units 47, are arranged in the outer peripheral portion of a region where the image signal processing unit 26 included in the lower structural body 12 is arranged. A region where the input/output circuit units 49 are arranged may be on the lower side of the row drive unit 22 and the column signal processing unit 25 (the pixel peripheral circuit region 313) included in the upper structural body 11, or may be on the outer peripheral portion lower side of the pixel array unit 24 included in the upper structural body 11.

Note that, the region where the input/output circuit units 49 are arranged need not be arranged without any discontinuity over the entire row direction of the column signal processing unit 25, for example, and there may be a region where the input/output circuit units 49 are not arranged between the column signal processing unit 25 and the image signal processing unit 26.

Furthermore, the region where the input/output circuit units 49 are arranged need not be arranged without any discontinuity over the entire column direction of the row drive unit 22, and there may be a region where the input/output circuit units 49 are not arranged between the row drive unit 22 and the image signal processing unit 26.

With the fourth example circuit arrangement configuration, the number of places where the wells having different power supply voltages are arranged separately is reduced as compared with the third example circuit arrangement configuration, so that there is a possibility that more circuits can be mounted to, for example, the image signal processing unit 26, in the lower structural body 12, even if the external sizes of the image pickup devices 1 are the same as each other.

<Fifth Example Circuit Arrangement Configuration>

Figure 15:
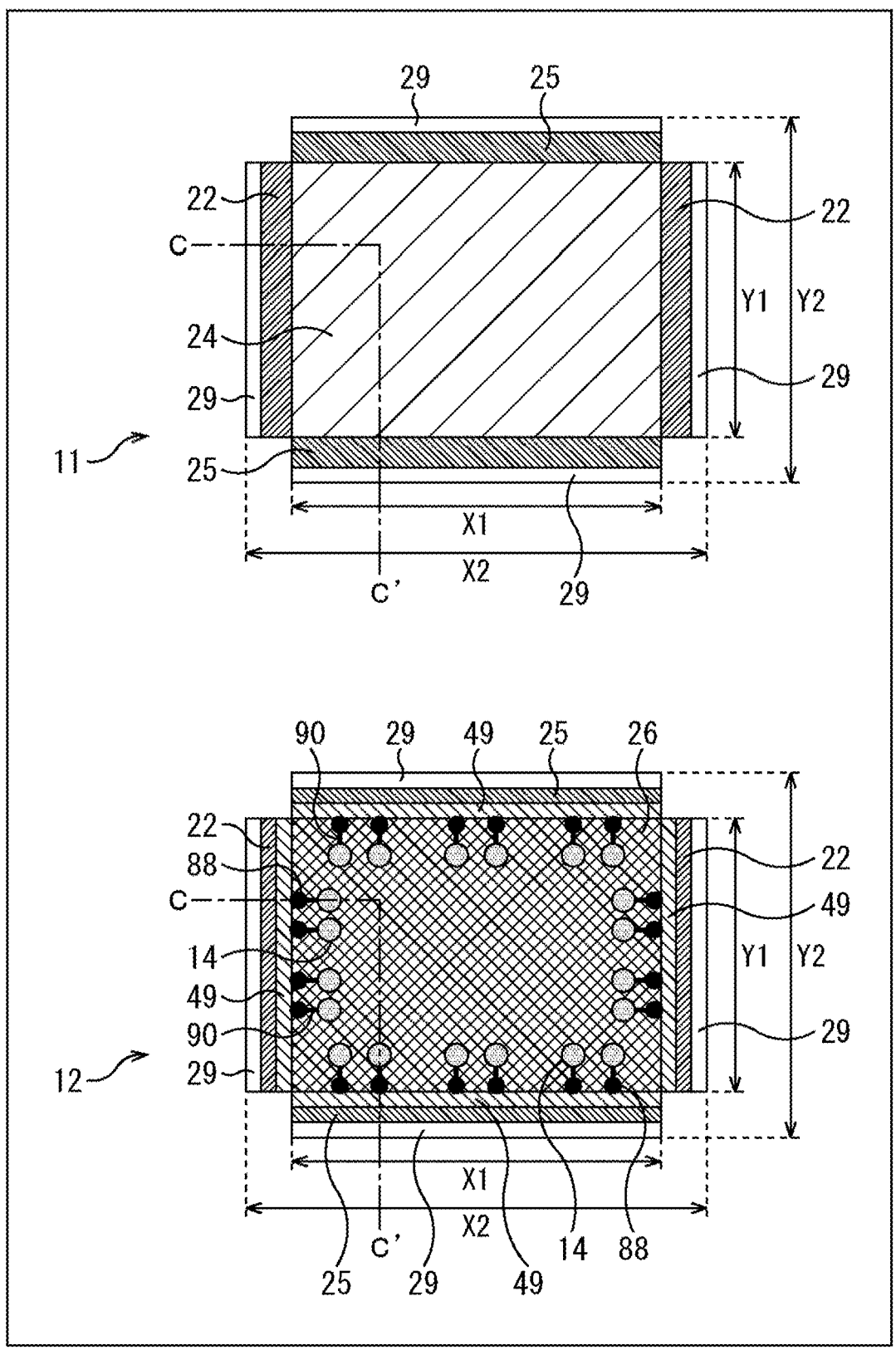
FIG. 15 is a diagram illustrating a fifth example circuit arrangement configuration of the circuit arrangement in the image pickup device.

FIG. 15 is a diagram illustrating a fifth example circuit arrangement configuration that is another example circuit arrangement configuration of the image pickup device 1 and is a modification of the first, third, and fourth example circuit arrangement configurations.

In the fourth example circuit arrangement configuration illustrated in FIG. 13, there is a region where the input/output circuit units 49 are not arranged between the column signal processing unit 25 and the image signal processing unit 26, and between the row drive unit 22 and the image signal processing unit 26.

On the other hand, in the fifth example circuit arrangement configuration illustrated in FIG. 15, the input/output circuit units 49 are arranged in rows extending over the entire row direction of the column signal processing unit 25, and furthermore, over the entire column direction of the row drive unit 22. As a result, there is a possibility that the area of the input/output circuit units 49 can be increased.

Furthermore, in the fifth example circuit arrangement configuration, there is a possibility that more circuits can be mounted to, for example, the image signal processing unit 26, in the lower structural body 12, even if the external size of the image pickup device 1 is the same as that of the image pickup device 1 of the first and third example circuit arrangement configurations.

<Sixth Example Circuit Arrangement Configuration>

FIG. 16 is a diagram illustrating a sixth example circuit arrangement configuration that is another example circuit arrangement configuration of the image pickup device 1 and is a modification of the first and third example circuit arrangement configurations.

In the first and third example circuit arrangement configurations, the input/output circuit units 49 are arranged in a region on the lower side of the pixel array unit 24 of the upper structural body 11, in the lower structural body 12, and the image signal processing unit 26 is arranged around the input/output circuit units 49.

In the sixth example circuit arrangement configuration of FIG. 16, the image signal processing unit 26 of the lower structural body 12 is arranged having a configuration including a plurality of (three in FIG. 16) circuit blocks divided by a broken line. Then, in the sixth example circuit arrangement configuration, the input/output circuit units 49 are arranged in a portion on a block boundary of a circuit block included in the image signal processing unit 26, or on a boundary with the row drive unit 22.

In a case where the image signal processing unit 26 is arranged to be divided into a plurality of circuit blocks, a ground line and a power supply line to the circuit included in each circuit block are sometimes arranged in the block boundary portion. Therefore, there are cases where the circuits are arranged so that a distance between the circuits in the block boundary portion is greater than a distance between the circuits inside the circuit block.

By arranging the input/output circuit units 49 in the boundary portion of the circuit block in which the circuit density is relatively low as described above, there is a possibility that the layout design of the circuit can be facilitated and the input/output circuit units 49 can be arranged without lowering the degree of integration of the circuits, as compared with a case where the input/output circuit units 49 are arranged inside the circuit block. As a result, there is a possibility that more circuits can be mounted to, for example, the image signal processing unit 26, in the lower structural body 12, by using the sixth example circuit arrangement configuration, even if the external sizes of the image pickup devices 1 are the same as each other.

<Seventh Example Circuit Arrangement Configuration>

Figure 17:
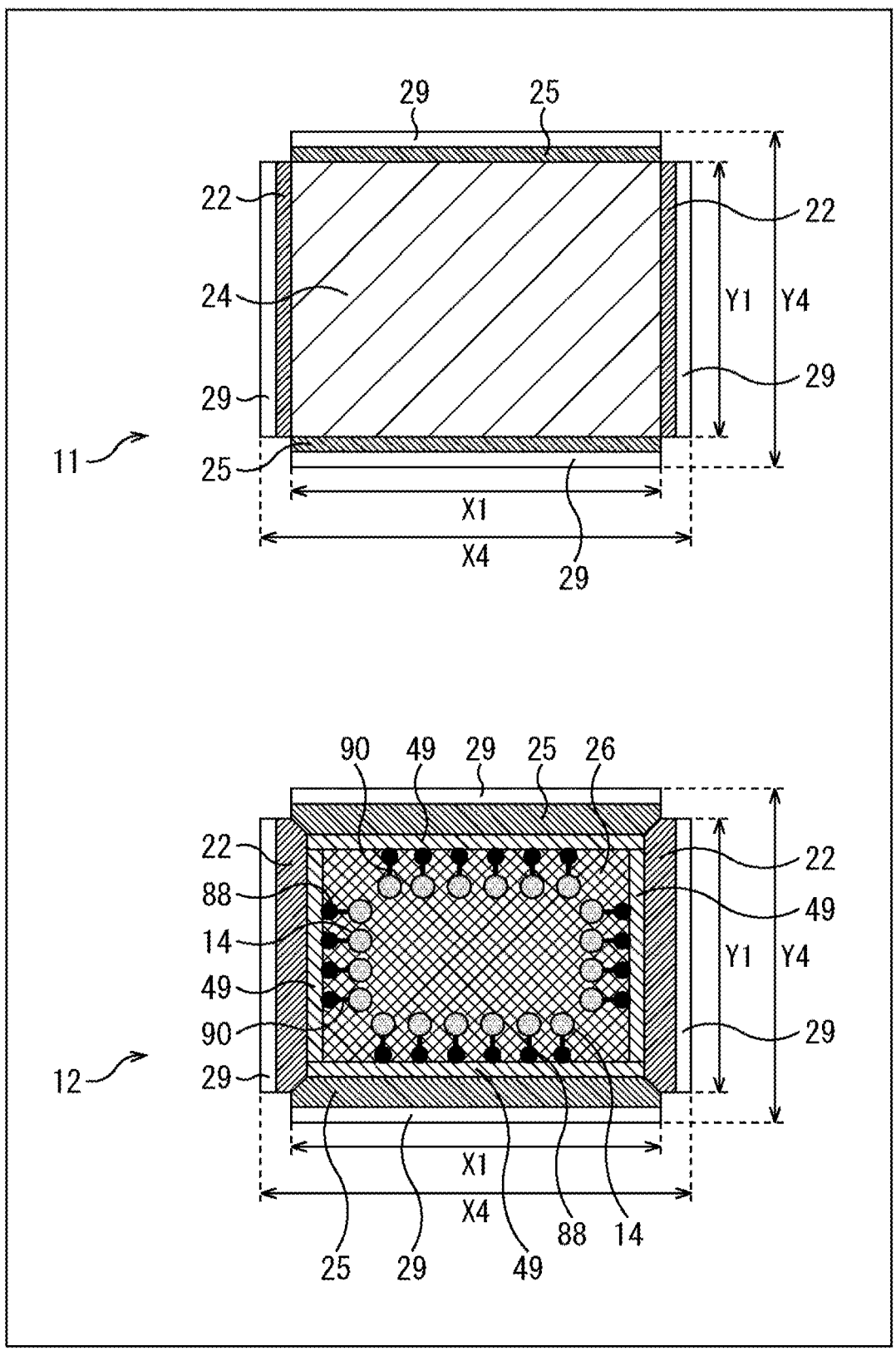
FIG. 17 is a diagram illustrating a seventh example circuit arrangement configuration of the circuit arrangement in the image pickup device.

FIG. 17 is a diagram illustrating a seventh example circuit arrangement configuration that is another example circuit arrangement configuration of the image pickup device 1 and is a modification of the fifth example circuit arrangement configuration.

In the seventh example circuit arrangement configuration of FIG. 17, the area of the row drive unit 22 arranged in the lower structural body 12 is greater than the area of the row drive unit 22 arranged in the upper structural body 11. Furthermore, the row drive unit 22 arranged in the lower structural body 12 is arranged to be extended toward the inside of the device as compared with the row drive unit 22 arranged in the upper structural body 11.

Similarly, the area of the column signal processing unit 25 arranged in the lower structural body 12 is greater than the area of the column signal processing unit 25 arranged in the upper structural body 11. Furthermore, the column signal processing unit 25 arranged in the lower structural body 12 is arranged to be extended toward the inside of the device as compared with the column signal processing unit 25 arranged in the upper structural body 11.

As a result, in the seventh example circuit arrangement configuration, as compared with the fifth example circuit arrangement configuration illustrated in FIG. 15, there is a possibility that the external size of the image pickup device 1 can be reduced even if the sizes of the pixel array units 24 of the image pickup devices 1 are the same as each other.

Note that, the example arrangement of the row drive unit 22 and the column signal processing unit 25 given in the seventh example circuit arrangement configuration can also be adapted to other example configurations of the present technology.

<Eighth Example Circuit Arrangement Configuration>

Figure 18:
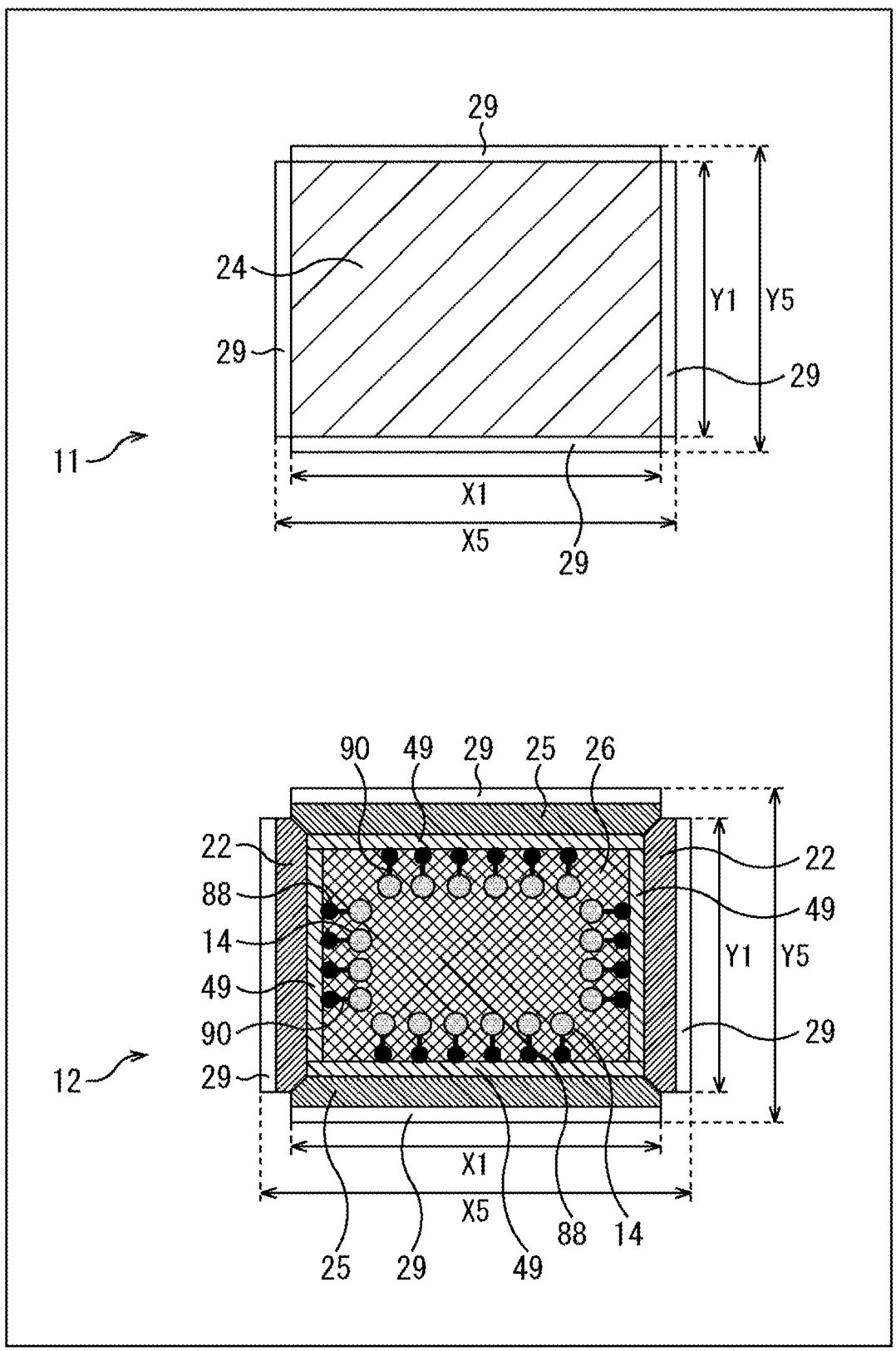
FIG. 18 is a diagram illustrating an eighth example circuit arrangement configuration of the circuit arrangement in the image pickup device.

FIG. 18 is a diagram illustrating an eighth example circuit arrangement configuration that is another example circuit arrangement configuration of the image pickup device 1 and is a modification of the seventh example circuit arrangement configuration.

In the seventh example circuit arrangement configuration illustrated in FIG. 17, the row drive unit 22 is arranged also in the upper structural body 11, although the area is smaller than that of the row drive unit 22 arranged in the lower structural body 12. Similarly, the column signal processing unit 25 is arranged also in the upper structural body 11, although the area is smaller than that of the column signal processing unit 25 arranged in the lower structural body 12.

On the other hand, in the eighth example circuit arrangement configuration of FIG. 18, the row drive unit 22 and the column signal processing unit 25 are arranged only in the lower structural body 12. A signal output from the row drive unit 22 to the pixel array unit 24 is transmitted from the row drive unit 22 arranged in the lower structural body 12 to the pixel array unit 24 arranged in the upper structural body 11 via the wiring connection unit 29 including the upper and lower wiring lines connection structure of the pixel peripheral circuit region 313 illustrated in FIG. 8.

Similarly, a signal input from the pixel array unit 24 to the column signal processing unit 25 is transmitted from the pixel array unit 24 arranged in the upper structural body 11 to the column signal processing unit 25 arranged in the lower structural body 12 via the wiring connection unit 29 including the upper and lower wiring lines connection structure of the pixel peripheral circuit region 313 illustrated in FIG. 8. As a result, as compared with the seventh example circuit arrangement configuration illustrated in FIG. 17, in the eighth example circuit arrangement configuration, there is a possibility that the external size of the image pickup device 1 can be reduced even if the sizes of the pixel array units 24 of the image pickup devices 1 are the same as each other.

Note that, the example arrangement of the row drive unit 22 and the column signal processing unit 25 given in the eighth example circuit arrangement configuration can also be adapted to other example configurations of the present technology.

<Ninth Example Circuit Arrangement Configuration>

Figure 19:
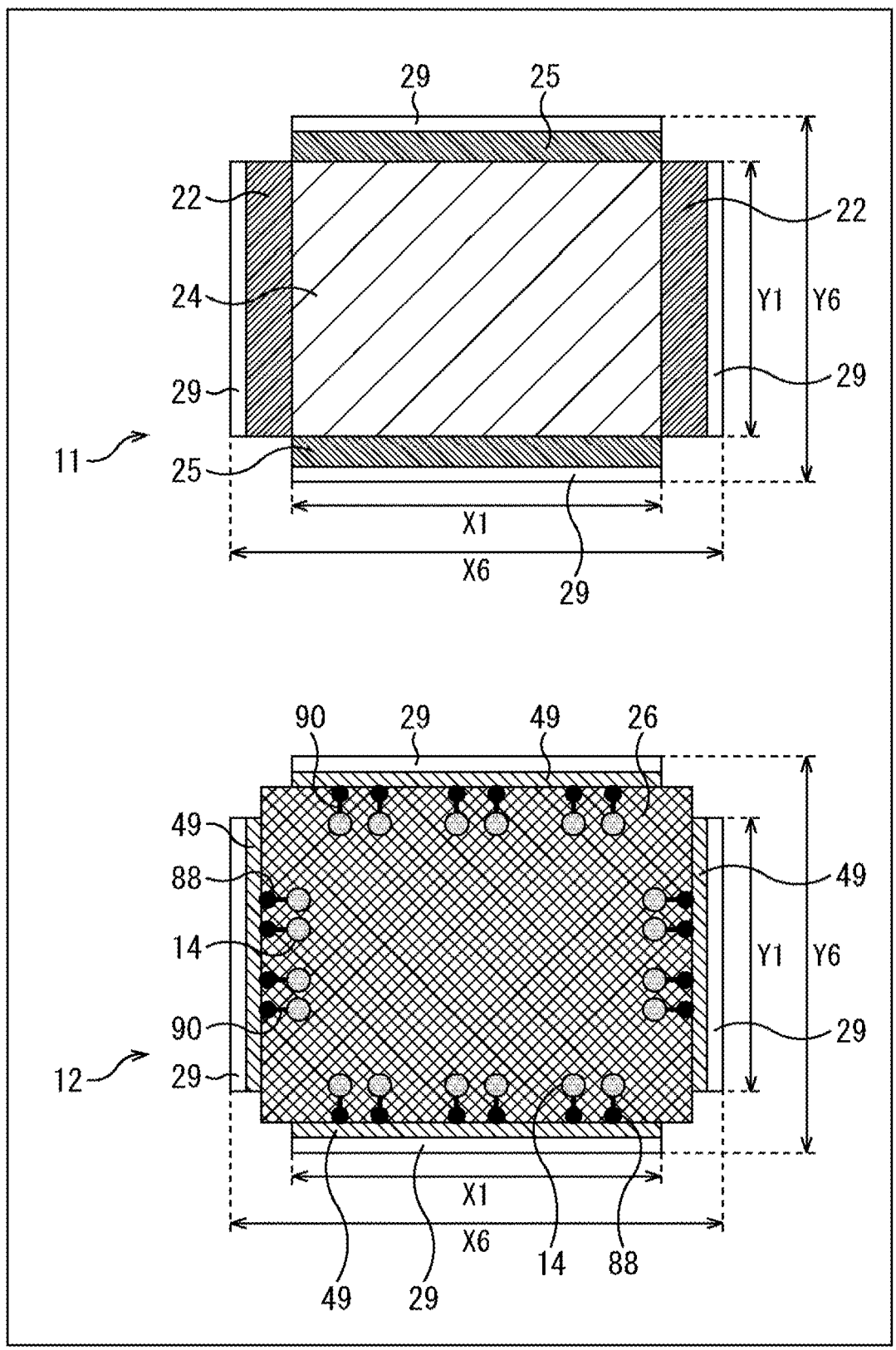
FIG. 19 is a diagram illustrating a ninth example circuit arrangement configuration of the circuit arrangement in the image pickup device.

FIG. 19 is a diagram illustrating a ninth example circuit arrangement configuration that is another example circuit arrangement configuration of the image pickup device 1 and is a modification of the fifth example circuit arrangement configuration.

In the ninth example circuit arrangement configuration illustrated in FIG. 19, the row drive unit 22 and the column signal processing unit 25 are all arranged in the upper structural body 11. Then, in the lower structural body 12, in a region positioned on the lower side of the row drive unit 22 and the column signal processing unit 25 arranged in the upper structural body 11, the image signal processing unit 26 is arranged to be extended in an outer peripheral direction, as compared with the fifth example circuit arrangement configuration illustrated in FIG. 15.

Furthermore, the input/output circuit units 49 may be arranged in a region positioned on the lower side of the row drive unit 22 and the column signal processing unit 25 arranged in the upper structural body 11. As a result, as compared with the fifth example circuit arrangement configuration illustrated in FIG. 15, in the ninth example circuit arrangement configuration, there is a possibility that the area of the image signal processing unit 26 can be increased and more circuits can be mounted to the image signal processing unit 26 even if the sizes of the pixel array units 24 of the image pickup devices 1 are the same as each other.

Note that, the example arrangement of the row drive unit 22 and the column signal processing unit 25 given in the ninth example circuit arrangement configuration can also be adapted to other example configurations of the present technology.

<Tenth Example Circuit Arrangement Configuration>

FIG. 20 is a diagram illustrating a tenth example circuit arrangement configuration that is another example circuit arrangement configuration of the image pickup device 1 and is a modification of the second example circuit arrangement configuration.

Figure 21:
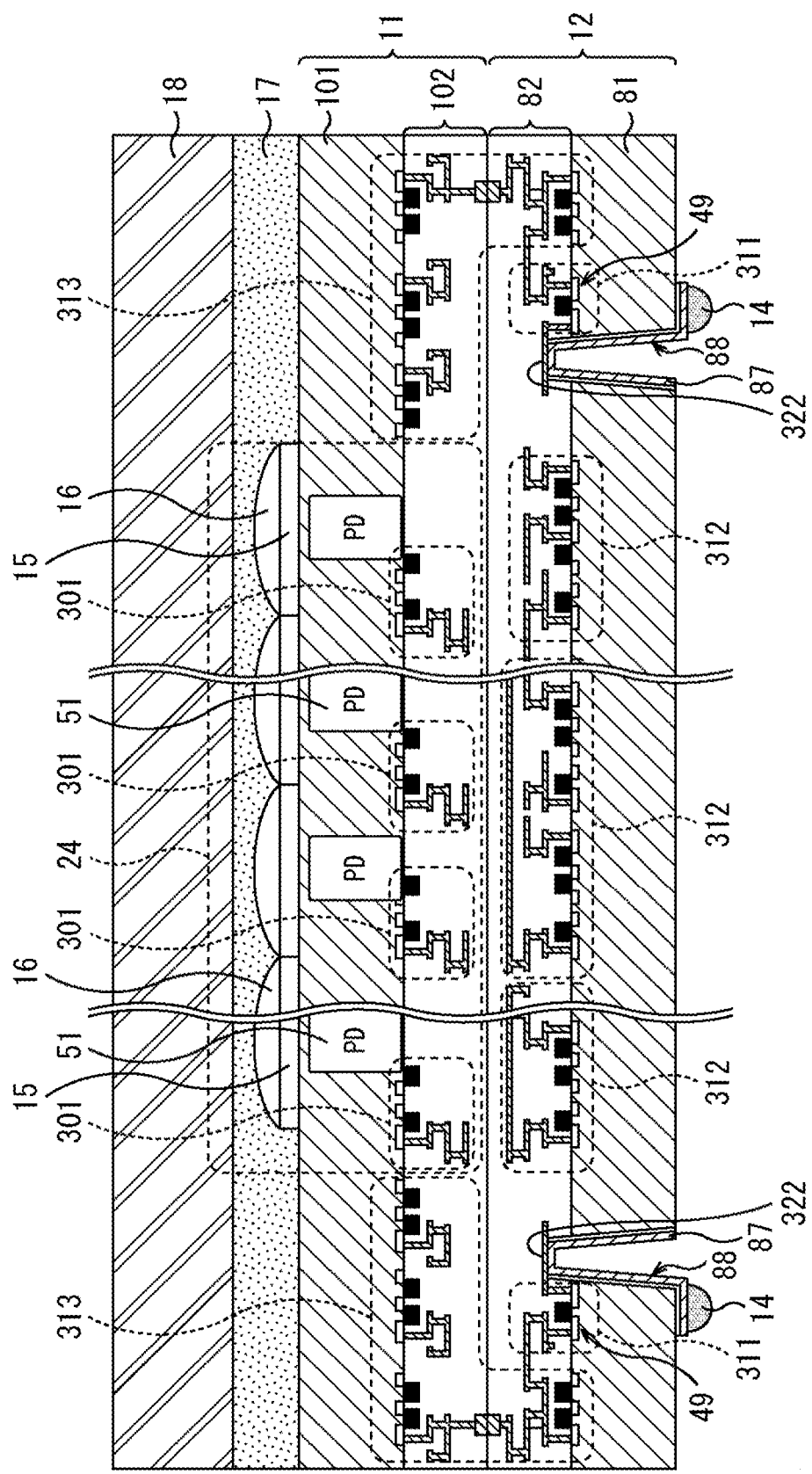
FIG. 21 is a diagram illustrating a cross-sectional structure taken along a line D-D' of FIG. 20.

FIG. 21 is a diagram illustrating a cross-sectional structure of the image pickup device 1 taken along a line D-D' of FIG. 20. Note that, for convenience, a part of FIG. 21 is illustrated by being changed to a cross-sectional structure in another example configuration of the present technology described later.

In the tenth circuit arrangement example illustrated in FIGS. 20 and 21, similarly to the second example circuit arrangement configuration illustrated in FIGS. 7 and 8, the upper and lower wiring lines direct connection structure can be arranged inside the peripheral circuit region 313 included in the upper structural body 11, and inside the pixel peripheral circuit region 313 included in the lower structural body 12.

Furthermore, in the tenth example circuit arrangement configuration illustrated in FIGS. 20 and 21, all of the input/output circuit units 49, in other words, the input circuit units 42 and the output circuit units 47 are arranged outside a region where the image signal processing unit 26 of the lower structural body 12 is arranged. A region where the input/output circuit units 49 are arranged may be on the lower side of the row drive unit 22 and the column signal processing unit 25 included in the upper structural body 11, or may be on the lower side of the pixel array unit 24 included in the upper structural body 11.

Note that, the region where the Input/output circuit units 49 are arranged need not be arranged without any discontinuity over the entire row direction of the column signal processing unit 25, for example, and, there may be a region where the input/output circuit units 49 are not arranged between the column signal processing unit 25 and the image signal processing unit 26.

Furthermore, the region where the input/output circuit units 49 are arranged need not be arranged without any discontinuity over the entire column direction of the row drive unit 22, and there may be a region where the input/output circuit units 49 are not arranged between the row drive unit 22 and the image signal processing unit 26. With the tenth example circuit arrangement configuration, there is a possibility that more circuits can be mounted to, for example, the image signal processing unit 26, in the lower structural body 12, even if the external size of the image pickup device 1 is the same as that of the image pickup device 1 of the second example circuit arrangement configuration illustrated in FIG. 7.

Note that, the example arrangement of the circuit given in the tenth example circuit arrangement configuration can also be adapted to other example configurations of the present technology.

<Eleventh Example Circuit Arrangement Configuration>

Figure 22:
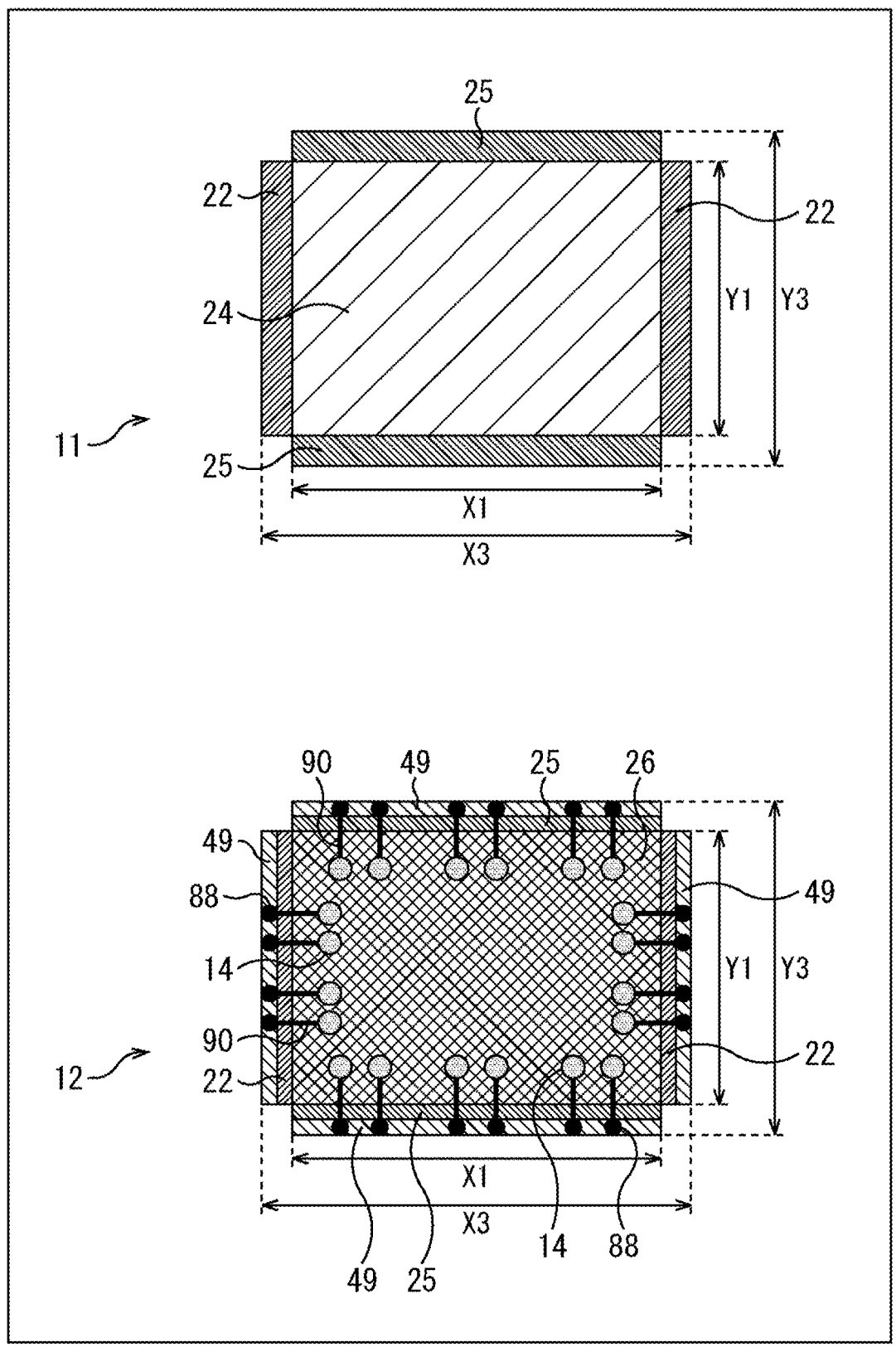
FIG. 22 is a diagram illustrating an eleventh example circuit arrangement configuration of the circuit arrangement in the image pickup device.

FIG. 22 is a diagram illustrating an eleventh example circuit arrangement configuration that is another example circuit arrangement configuration of the image pickup device 1 and is a modification of the tenth example circuit arrangement configuration.

In the tenth example circuit arrangement configuration illustrated in FIG. 20, a part of the row drive unit 22 and a part of the column signal processing unit 25 are arranged in both the upper structural body 11 and the lower structural body 12. Then, in the lower structural body 12, the input/output circuit units 49 are arranged in a region that is on the lower side of the row drive unit 22 arranged in the upper structural body 11 and on the inside from the row drive unit 22 arranged in the lower structural body 12 of the device.

Similarly, in the lower structural body 12, the input/output circuit units 49 are arranged in a region that is on the lower side of the column signal processing unit 25 arranged in the upper structural body 11 and on the inside from the column signal processing unit 25 arranged in the lower structural body 12 of the device.

In the eleventh example circuit arrangement configuration illustrated in FIG. 22, a part of the row drive unit 22 and a part of the column signal processing unit 25 are arranged in both the upper structural body 11 and the lower structural body 12. Then, in the lower structural body 12, the input/output circuit units 49 are arranged in a region that is on the lower side of the row drive unit 22 arranged in the upper structural body 11 and on the outside from the row drive unit 22 arranged in the lower structural body 12 of the device. Similarly, in the lower structural body 12, the input/output circuit units 49 are arranged in a region that is on the lower side of the column signal processing unit 25 arranged in the upper structural body 11 and on the outside from the column signal processing unit 25 arranged in the lower structural body 12 of the device.

As a result, as compared with the tenth example circuit arrangement configuration illustrated in FIG. 20, there is a possibility that, for example, in the lower structural body 12, arrangement can be facilitated of a signal line between the image signal processing unit 26 and the row drive unit 22 arranged in the lower structural body 12 and a signal line between the image signal processing unit 26 and the column signal processing unit 25, or these signal lines can be arranged with high density.

Note that, the example arrangement of the circuit given in the eleventh example circuit arrangement configuration can also be adapted to other example configurations of the present technology.

<10. Detailed Structure of Image Pickup Device>

Figure 23:
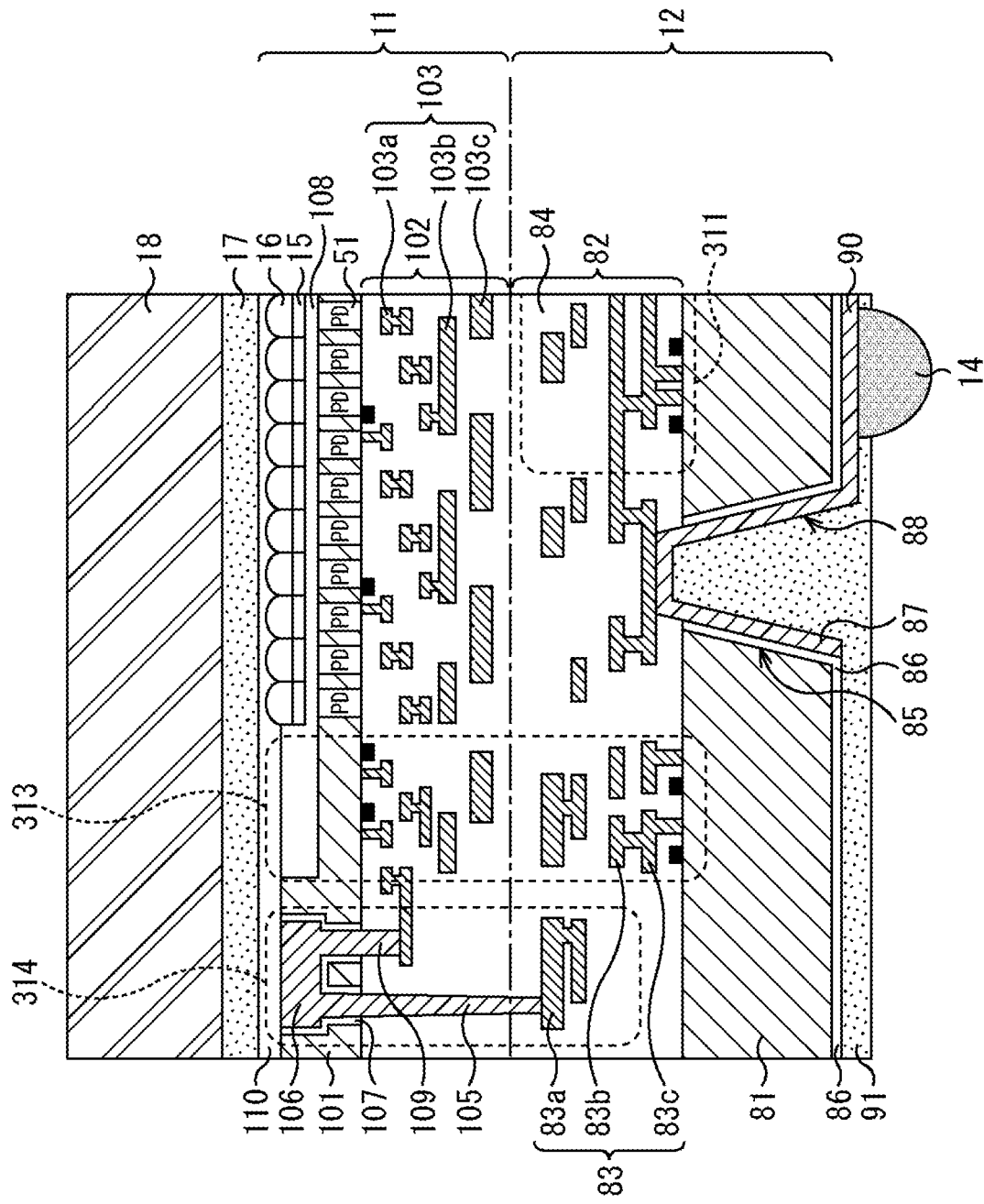
FIG. 23 is an enlarged cross-sectional view near an outer periphery of an image pickup device 1.

Next, with reference to FIG. 23, a detailed structure of the image pickup device 1 will be described. FIG. 23 is an enlarged cross-sectional view illustrating near the outer periphery of the image pickup device 1 having the twin contact structure.

On the lower structural body 12, the multilayer wiring layer 82 is formed on the upper side (upper structural body 11 side) of the semiconductor substrate 81 including silicon (Si), for example. The multilayer wiring layer 82 forms the input/output circuit region 311, the signal processing circuit region 312 (not illustrated in FIG. 23), the pixel peripheral circuit region 313, and the like illustrated in FIG. 6.

The multilayer wiring layer 82 includes a plurality of the wiring layers 83 including an uppermost wiring layer 83a closest to the upper structural body 11, an intermediate wiring layer 83b, a lowermost wiring layer 83c closest to the semiconductor substrate 81, and the like, and an interlayer insulating film 84 formed between the wiring layers 83.

The plurality of wiring layers 83 is formed by using, for example, copper (Cu), aluminum (Al), tungsten (W), or the like, and the interlayer insulating film 84 includes, for example, a silicon oxide film, a silicon nitride film, or the like. For each of the plurality of wiring layers 83 and the interlayer insulating film 84, all layers may include the same material, or two or more materials may be used depending on the layer.

A through-silicon hole 85 penetrating through the semiconductor substrate 81 is formed at a predetermined position of the semiconductor substrate 81, and a connection conductor 87 is embedded in the inner wall of the silicon through hole 85 via an insulating film 86, whereby the through-via (through silicon via (TSV)) 88 is formed.

The insulating film 86 can include, for example, SiO2 film, SiN film, or the like. In the present embodiment, the through via 88 has an inverted tapered shape in which a plane area of the wiring layer 83 side is smaller than that of the external terminal 14 side, but on the contrary, the through-via 88 may have a forward tapered shape in which a plane area of the external terminal 14 side is smaller, or may have a non-tapered shape in which the areas of the external terminal 14 side and the wiring layer 83 side are substantially the same as each other.

The connection conductor 87 of the through-via 88 is connected to a rewiring line 90 formed on the lower surface side of the semiconductor substrate 81, and the rewiring line 90 is connected to the external terminal 14. The connection conductor 87 and the rewiring line 90 can include, for example, copper (Cu), tungsten (W), titanium (Ti), tantalum (Ta), titanium tungsten alloy (TiW), polysilicon, or the like.

Furthermore, a solder mask (solder resist) 91 is formed on the lower surface side of the semiconductor substrate 81 to cover the rewiring line 90 and the insulating film 86 except for a region where the external terminal 14 is formed.

On the other hand, in the upper structural body 11, the multilayer wiring layer 102 is formed on the lower side (lower structural body 12 side) of the semiconductor substrate 101 including silicon (Si), for example. The multilayer wiring layer 102 forms the circuit of the pixel 31 illustrated in FIG. 3.

The multilayer wiring layer 102 includes a plurality of the wiring layers 103 including an uppermost wiring layer 103a closest to the semiconductor substrate 101, an intermediate wiring layer 103b, a lowermost wiring layer 103c closest to the lower structural body 12, and the like, and an interlayer insulating film 104 formed between the wiring layers 103.

As a material to be used as the plurality of wiring layers 103 and the interlayer insulating film 104, a material can be used of the same type as the material of the wiring layer 83 and the interlayer insulating film 84 described above. Furthermore, similarly to the wiring layer 83 and the interlayer insulating film 84 described above, the plurality of wiring layer 103 and the interlayer insulating film 104 may be formed by using one material, or two or more materials.

Note that, in the example of FIG. 23, the multilayer wiring layer 102 of the upper structural body 11 includes five-layer wiring layer 103, and the multilayer wiring layer 82 of the lower structural body 12 includes four-layer wiring layer 83; however, the total number of wiring layers is not limited thereto, and the multilayer wiring layer can be formed with an arbitrary number of layers.

In the semiconductor substrate 101, the photodiode 51 formed by a PN junction is formed for each pixel 31.

Furthermore, although detailed illustration is omitted, the plurality of pixel transistors such as the transfer transistor 52 and the amplifier transistor 55, the FD 53, and the like are also formed in the multilayer wiring layer 102 and the semiconductor substrate 101.

At a predetermined position of the semiconductor substrate 101 on which the color filter 15 and the on-chip lens 16 are not formed, the through-silicon-electrode 109 connected to a predetermined wiring layer 103 of the upper structural body 11, and the through-chip-electrode 105 connected to the predetermined wiring layer 83 of the lower structural body 12 are formed.

The through-chip-electrode 105 and the through-silicon-electrode 109 are connected together by the connection wiring line 106 formed on the upper surface of the semiconductor substrate 101. Furthermore, an insulating film 107 is formed between the semiconductor substrate 101 and each of the through-silicon-electrode 109 and the through-chip-electrode 105.

A flattening film 108 is formed between the photodiode 51 of the semiconductor substrate 101 and the color filter 15, and a flattening film 110 is also formed between the on-chip lens 16 and the glass seal resin 17.

As described above, the layered structural body 13 of the image pickup device 1 illustrated in FIG. 1 has a layered structure in which the multilayer wiring layer 82 side of the lower structural body 12 and the multilayer wiring layer 102 side of the upper structural body 11 are pasted together. In FIG. 23, a pasting surface between the multilayer wiring layer 82 of the lower structural body 12 and the multilayer wiring layer 102 of the upper structural body 11 is indicated by a one-dot chain line.

Furthermore, in the layered structural body 13 of the image pickup device 1, the wiring layer 103 of the upper structural body 11 and the wiring layer 83 of the lower structural body 12 are connected together by the two through-electrodes of the through-silicon-electrode 109 and the through-chip-electrode 105, and the wiring layer 83 of the lower structural body 12 and the external terminal (back surface electrode) 14 are connected together by the through-via 88 and the rewiring line 90. As a result, the pixel signal generated by the pixel 31 of the upper structural body 11 is transmitted to the lower structural body 12, subjected to signal processing in the lower structural body 12, and output from the external terminal 14 to the outside of the device.

<11. Manufacturing Method>
<Manufacturing Method in Case of Twin Contact Structure>

Next, with reference to FIGS. 24 to 38, a method will be described of manufacturing the image pickup device 1 having a twin contact structure.

Initially, the lower structural body 12 and the upper structural body 11 each in the wafer state are separately manufactured.

As the lower structural body 12, the input/output circuit unit 49, and a multilayer wiring layer 82 to be a part of the row drive unit 22 or the column signal processing unit 25 are formed in a region to be each chip portion of the silicon substrate (silicon wafer) 81. The semiconductor substrate 81 at this point is in a state before being thinned, and has a thickness of about 600 μm, for example.

On the other hand, as the upper structural body 11, the photodiode 51 of each pixel 31 and the source/drain region of the pixel transistor are formed in a region to be a chip portion of the silicon substrate (silicon wafer) 101. Furthermore, a multilayer wiring layer 102 constituting the row drive signal line 32, the vertical signal line 33, and the like is formed on one surface of the semiconductor substrate 101. The semiconductor substrate 101 at this point is also in a state before being thinned, and has a thickness of about 600 μm, for example.

Figure 24:
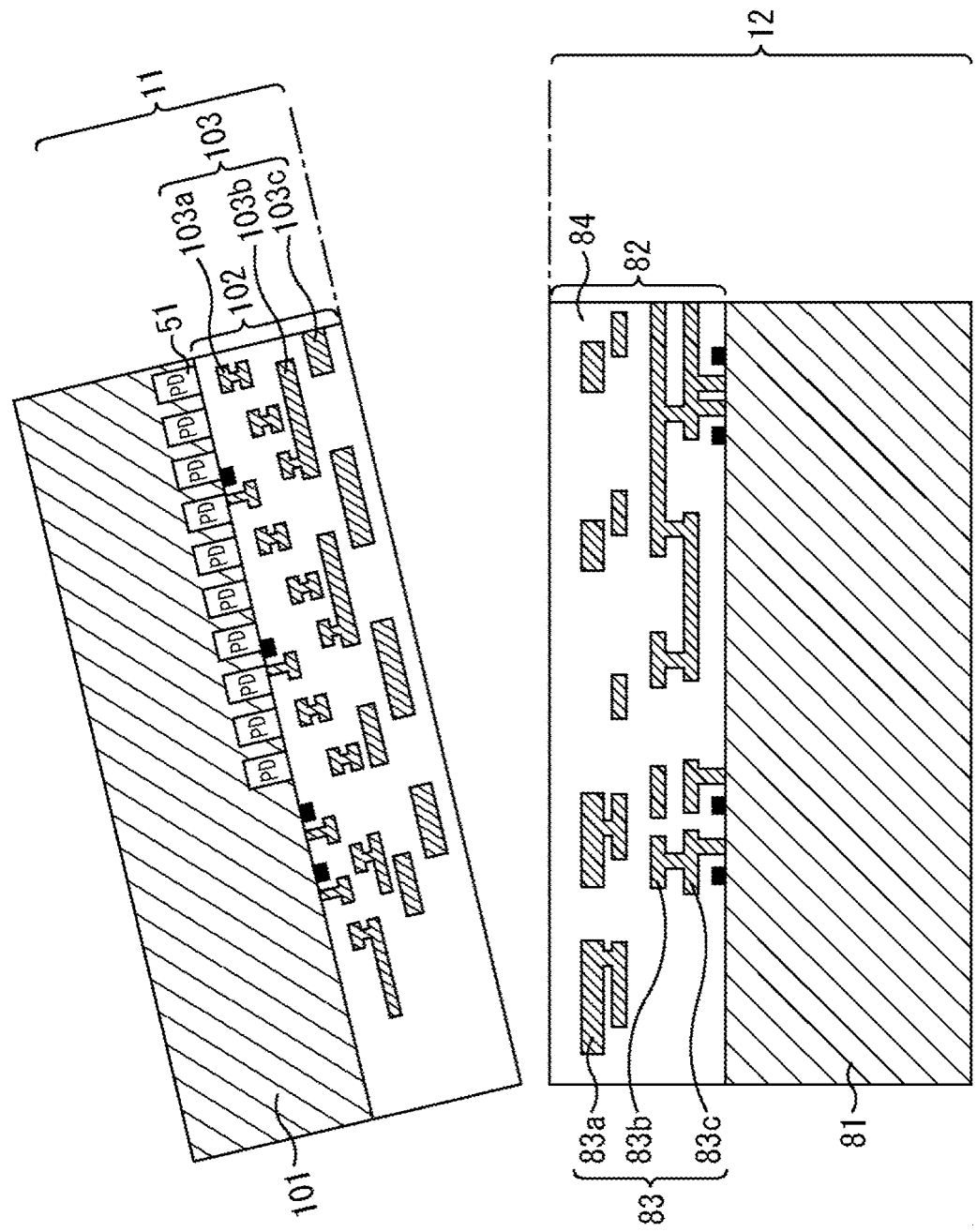
FIG. 24 is a diagram for explaining a method of manufacturing the image pickup device with a twin contact structure.
Figure 25:
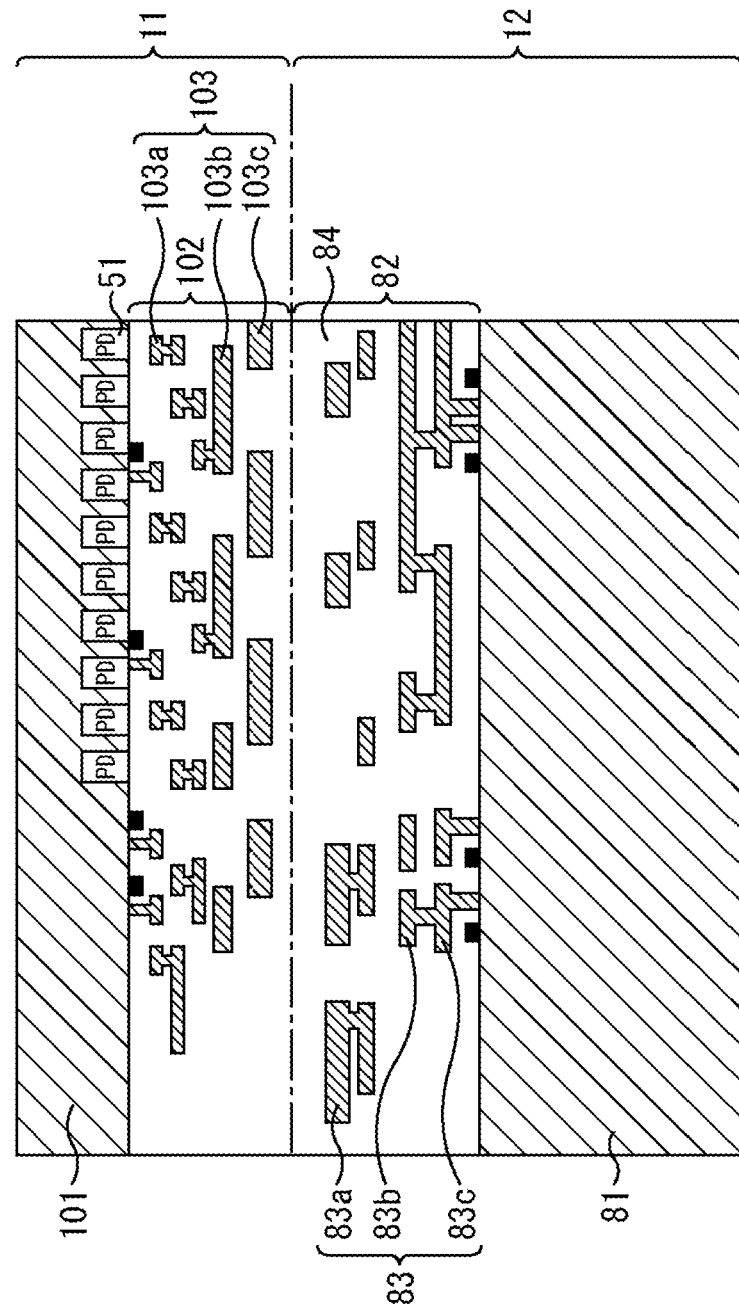
FIG. 25 is a diagram for explaining the method of manufacturing the image pickup device with the twin contact structure.

Then, as illustrated in FIG. 24, after the multilayer wiring layer 82 side of the lower structural body 12 and the multilayer wiring layer 102 side of the upper structural body 11 each in the manufactured wafer state are pasted together to face each other, as illustrated in FIG. 25, the semiconductor substrate 101 of the upper structural body 11 is thinned.

For pasting, for example, there are plasma bonding and bonding with an adhesive, but in the present embodiment, the pasting is assumed to be performed by the plasma bonding. In the case of the plasma bonding, a film such as a plasma TEOS film, a plasma SiN film, a SiON film (block film), or a SiC film is formed on each of the bonding surfaces of the upper structural body 11 and the lower structural body 12, and the bonding surfaces are subjected to plasma treatment and superposed on each other, and then annealing treatment is performed to bond the both structural bodies together.

Figure 26:
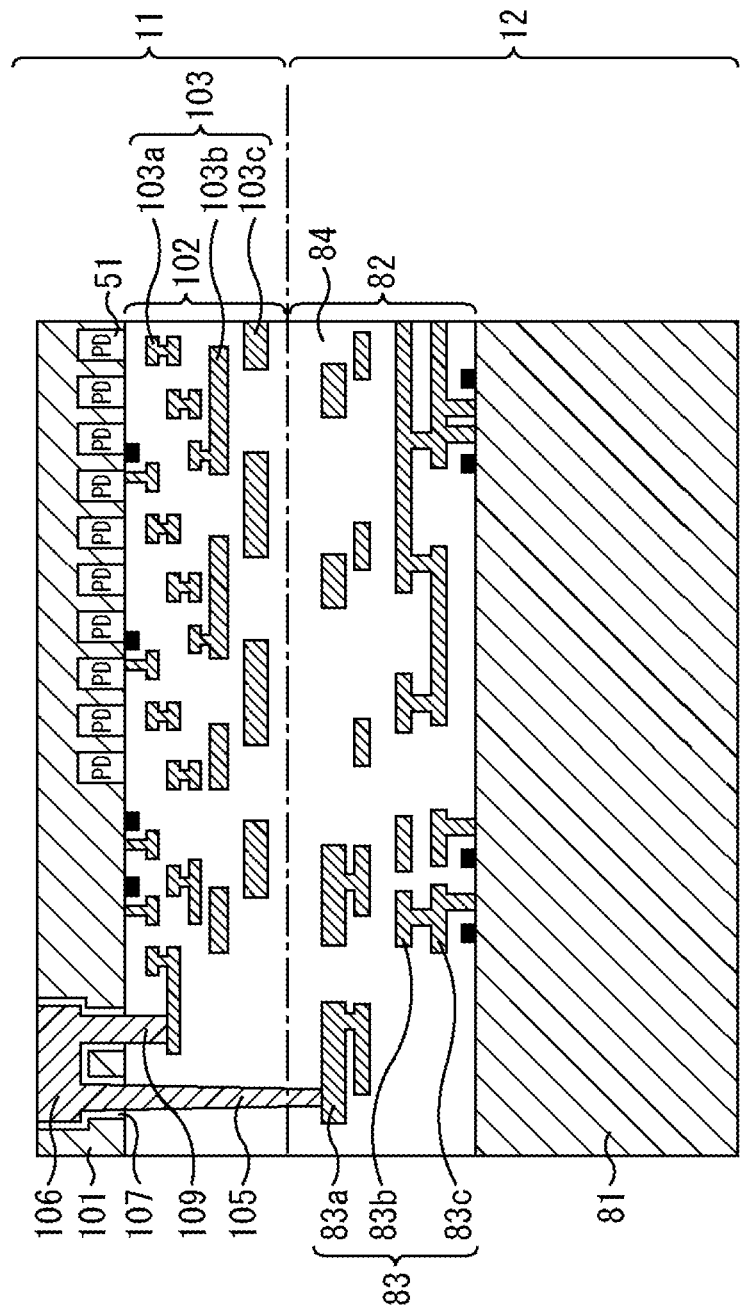
FIG. 26 is a diagram for explaining the method of manufacturing the image pickup device with the twin contact structure.

After the semiconductor substrate 101 of the upper structural body 11 is thinned, as illustrated in FIG. 26, the through-silicon-electrode 109 and the through-chip-electrode 105, and the connection wiring line 106 for connecting the electrodes are formed by using a damascene method or the like, in a region to be the upper and lower wiring lines connection region 314.

Figure 27:
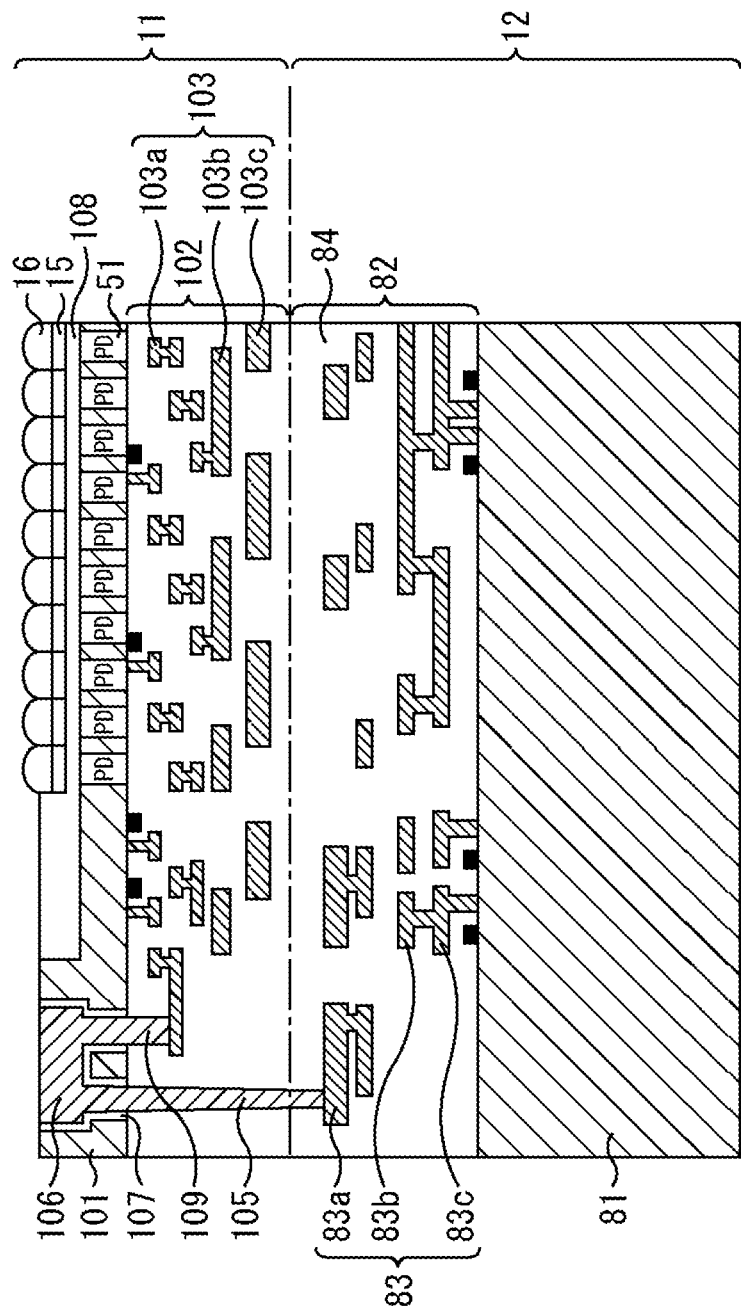
FIG. 27 is a diagram for explaining the method of manufacturing the image pickup device with the twin contact structure.

Next, as illustrated in FIG. 27, the color filter 15 and the on-chip lens 16 are formed above the photodiode 51 of each pixel 31 via the flattening film 108.

Figure 28:
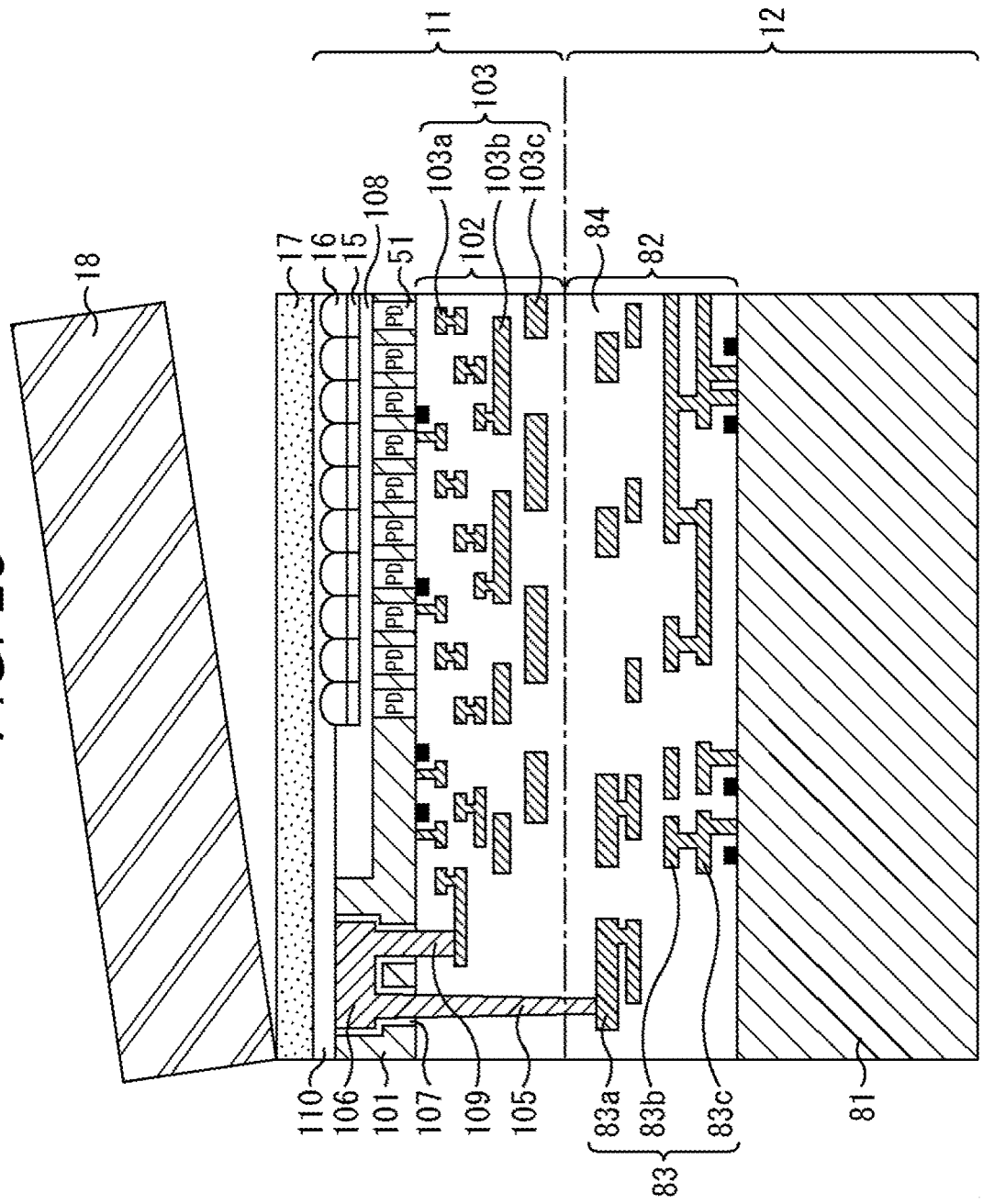
FIG. 28 is a diagram for explaining the method of manufacturing the image pickup device with the twin contact structure.
Figure 29:
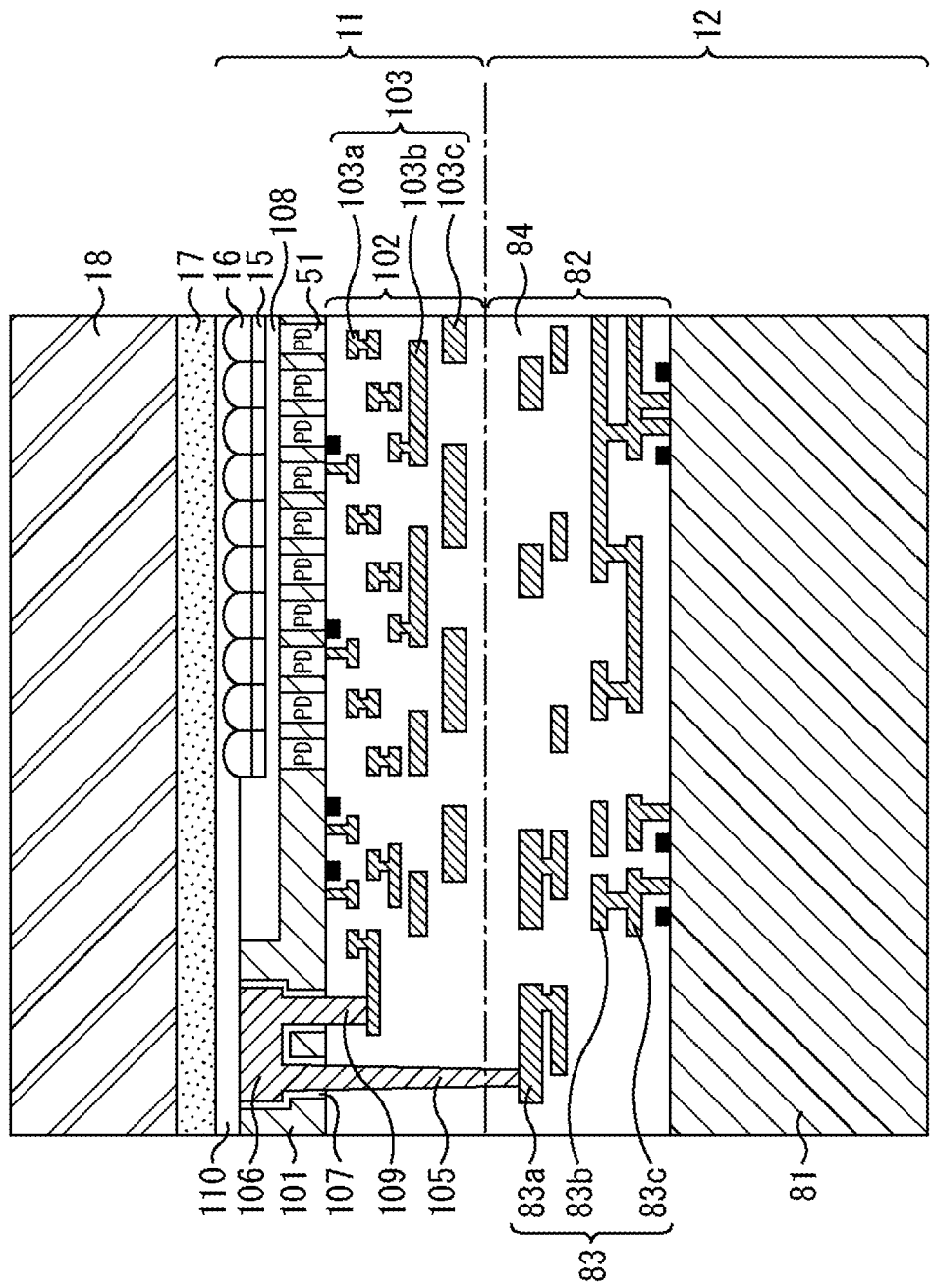
FIG. 29 is a diagram for explaining the method of manufacturing the image pickup device with the twin contact structure.

Then, as illustrated in FIG. 28, on the entire surface on which the on-chip lens 16 includes the layered structural body 13 in which the upper structural body 11 and the lower structural body 12 are pasted together, the glass seal resin 17 is applied via the flattening film 110, and as illustrated in FIG. 29, the glass protective substrate 18 is connected thereto, with a cavity-less structure.

Figure 30:
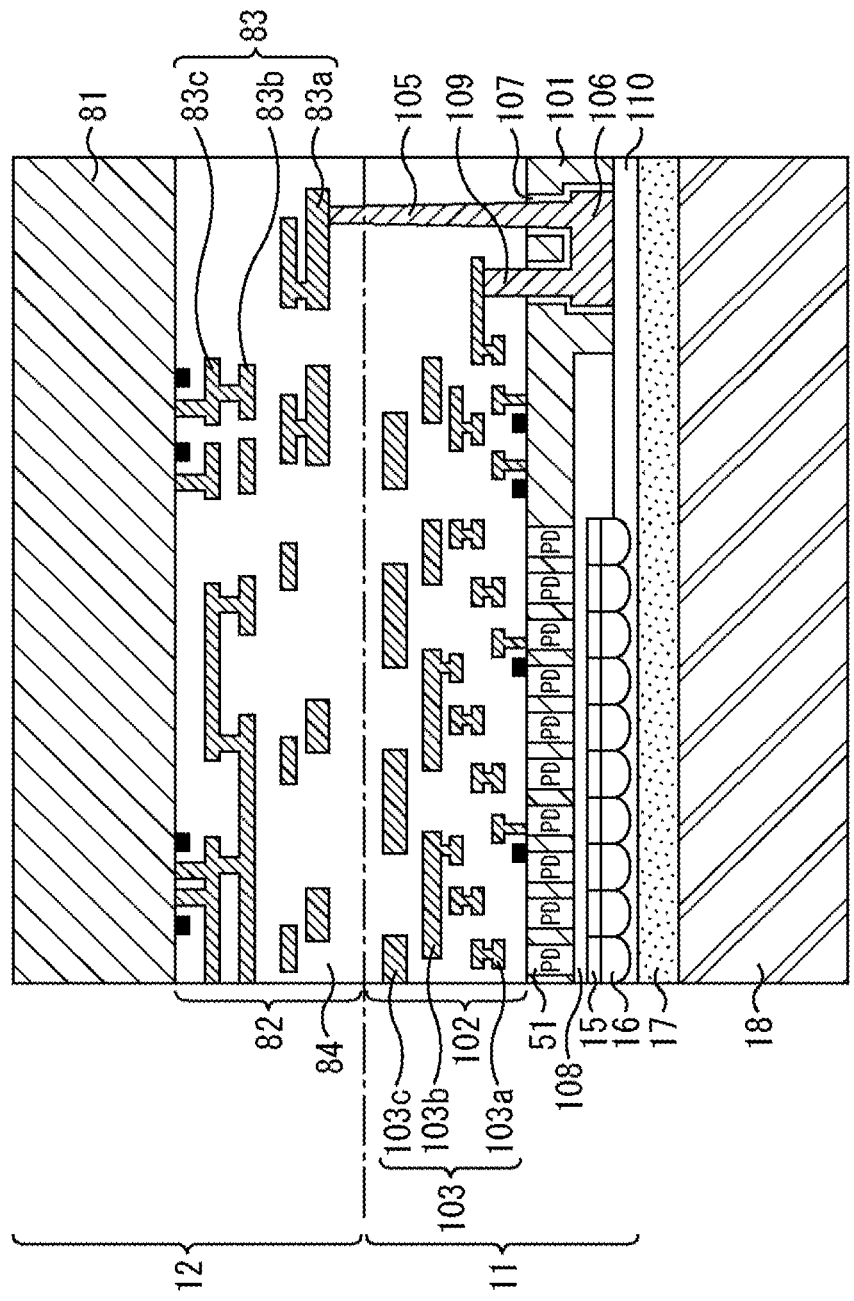
FIG. 30 is a diagram for explaining the method of manufacturing the image pickup device with the twin contact structure.

Next, as illustrated in FIG. 30, after the entire layered structural body 13 is inverted, the semiconductor substrate 81 of the lower structural body 12 is thinned to have a thickness to the extent that it does not affect device characteristics, for example, about 30 μm to 100 μm.

Figure 31:
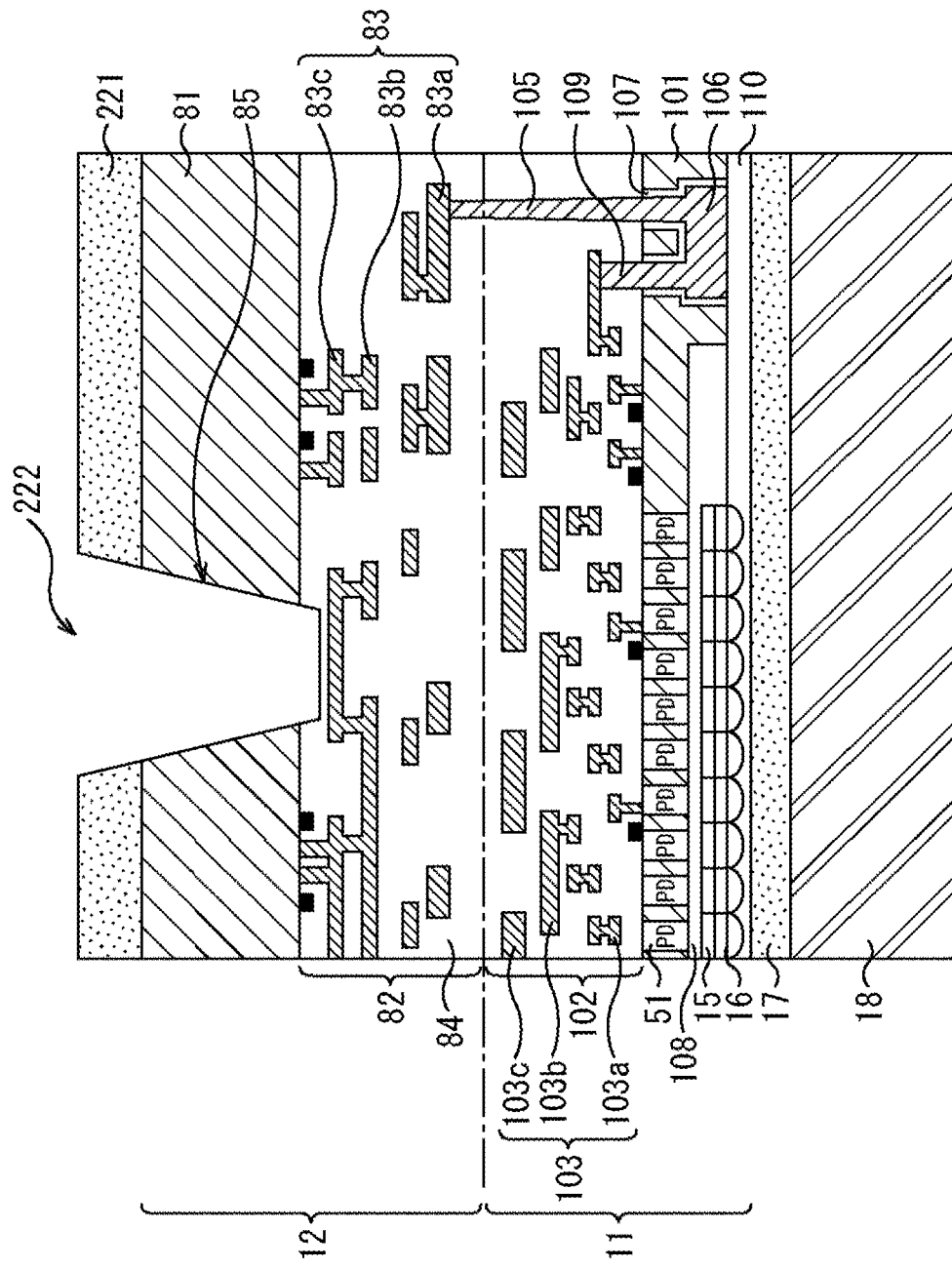
FIG. 31 is a diagram for explaining the method of manufacturing the image pickup device with the twin contact structure.

Next, as illustrated in FIG. 31, after photoresist 221 is patterned to open a position where the through-via 88 (not illustrated) is arranged on the thinned semiconductor substrate 81, the semiconductor substrate 81 and a part of the interlayer insulating film 84 under the semiconductor substrate 81 are removed by dry etching, and an opening 222 is formed.

Figure 32:
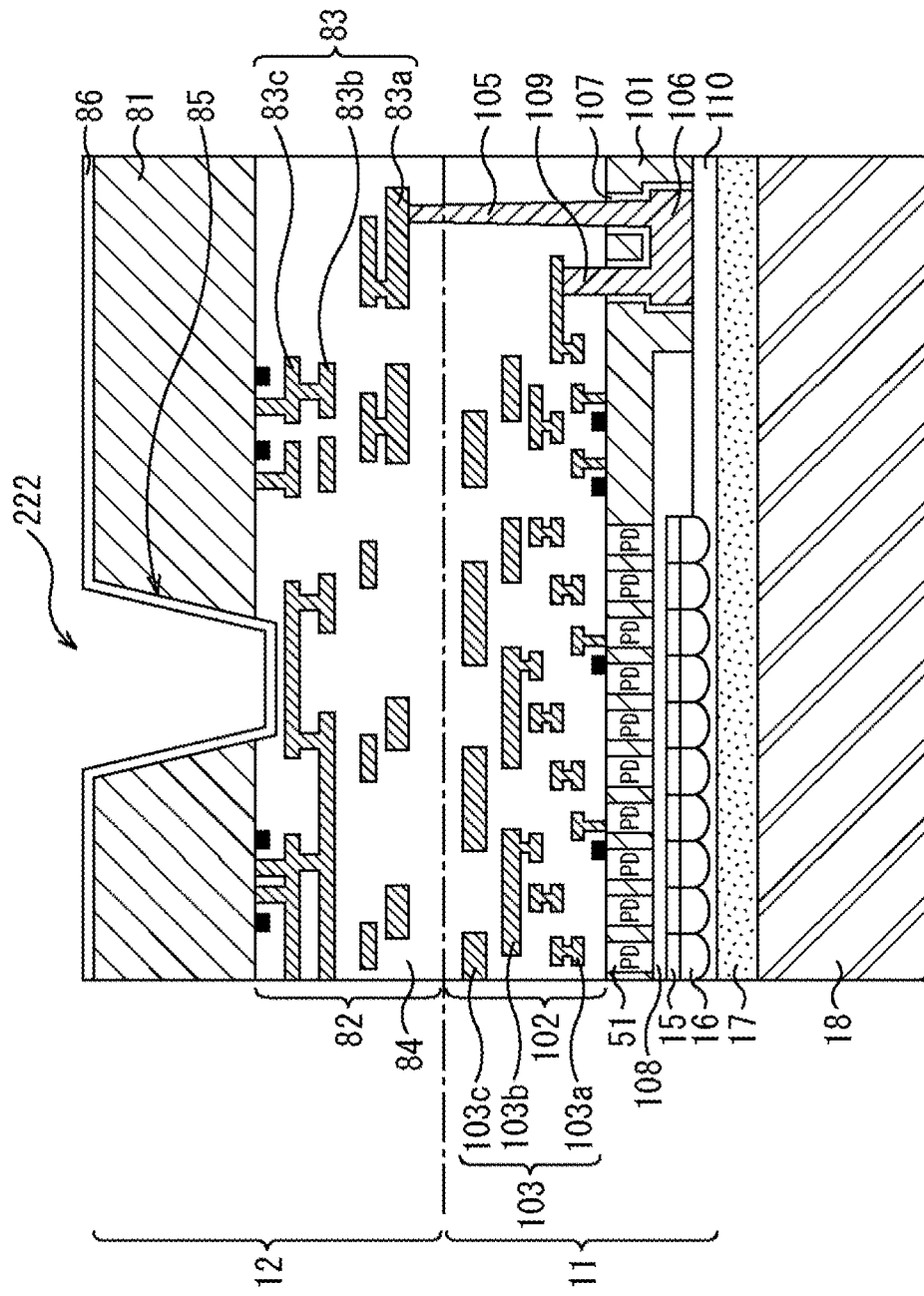
FIG. 32 is a diagram for explaining the method of manufacturing the image pickup device with the twin contact structure.

Next, as illustrated in FIG. 32, the insulating film (isolation film) 86 is formed over the entire upper surface of the semiconductor substrate 81 including the opening 222 by, for example, a plasma CVD method. As described above, the insulating film 86 can be, for example, SiO2 film, SiN film, or the like.

Figure 33:
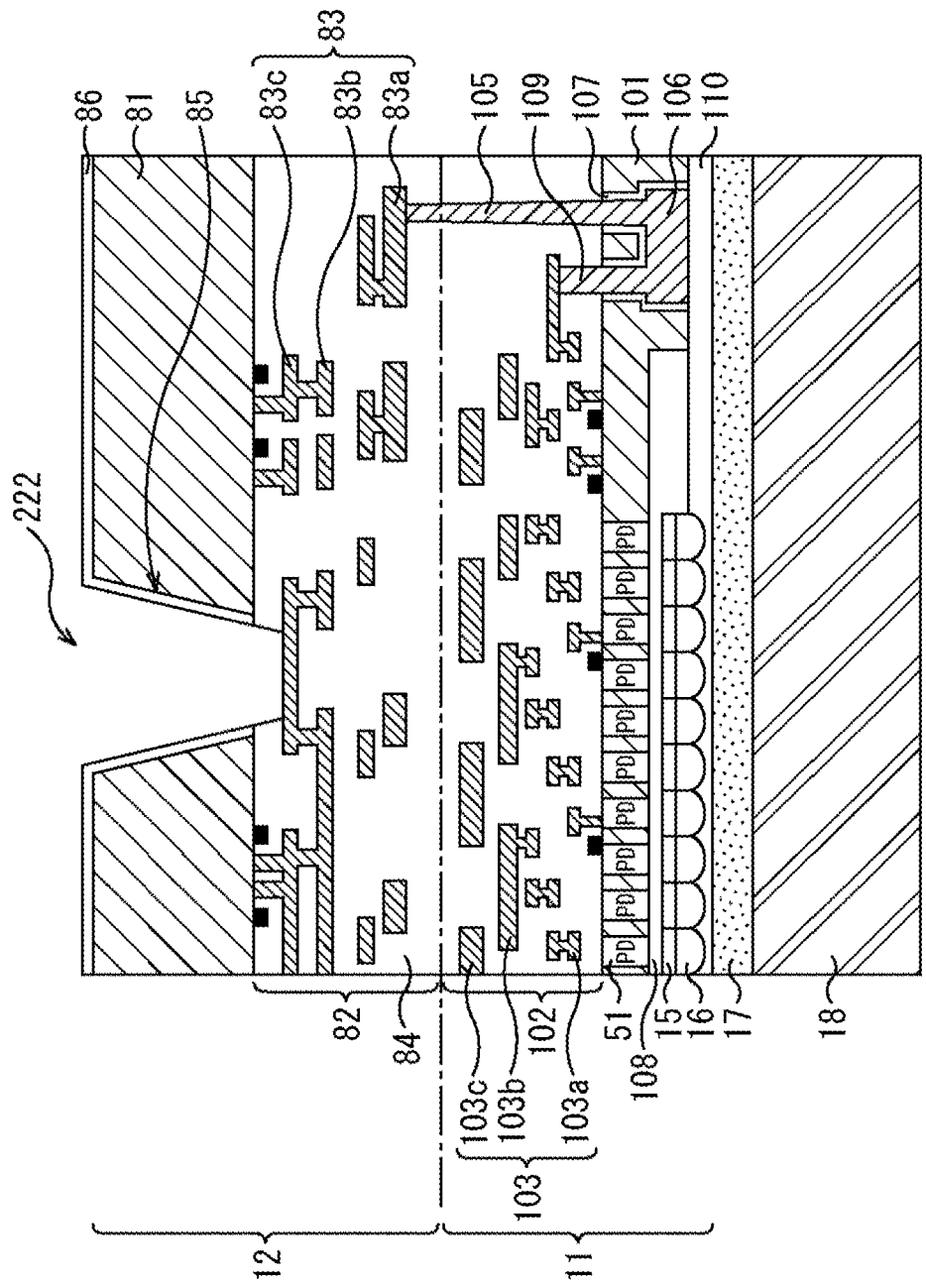
FIG. 33 is a diagram for explaining the method of manufacturing the image pickup device with the twin contact structure.

Next, as illustrated in FIG. 33, the insulating film 86 on the bottom surface of the opening 222 is removed by an etch-back method, and the wiring layer 83c closest to the semiconductor substrate 81 is exposed.

Figure 34:
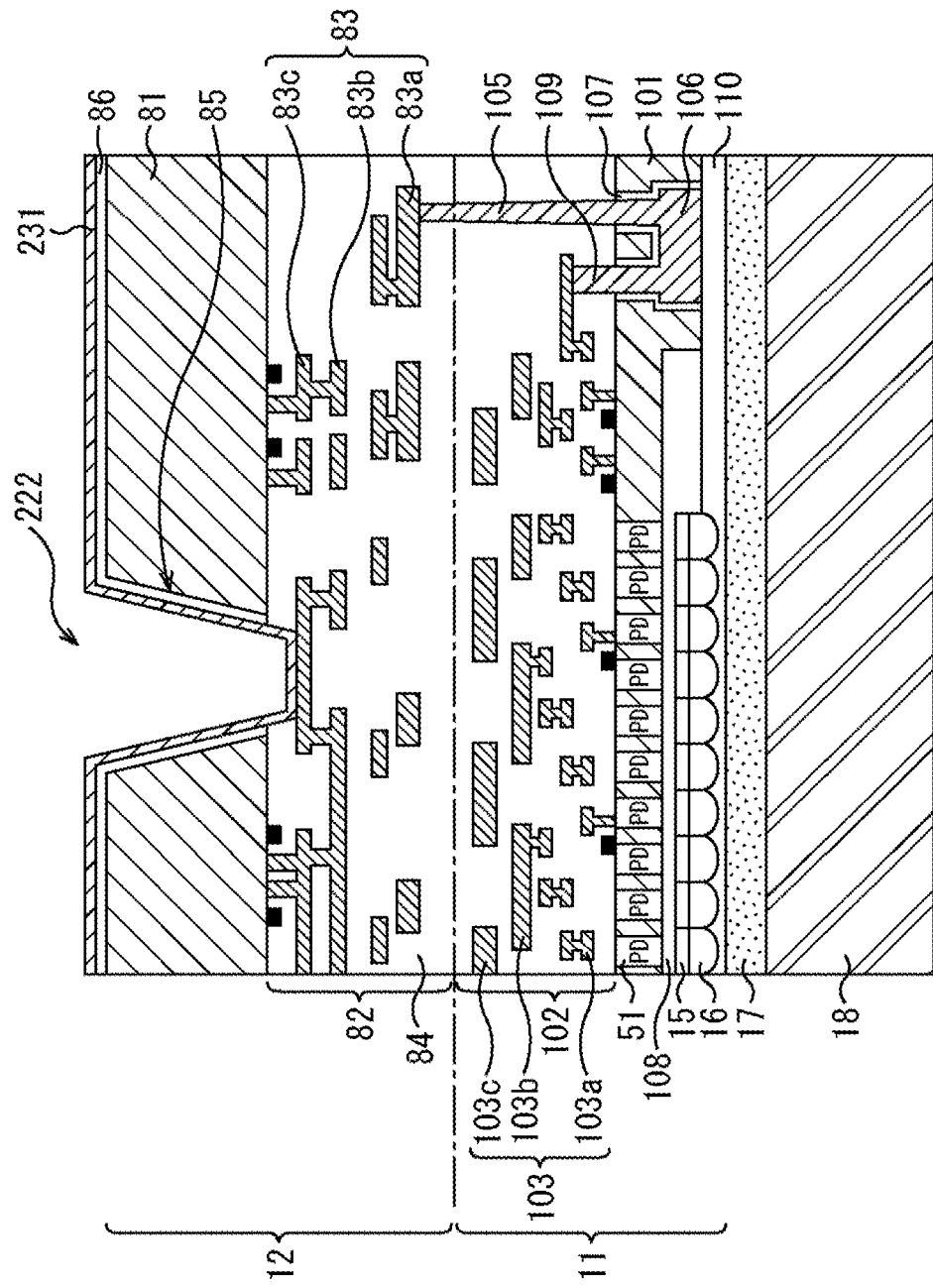
FIG. 34 is a diagram for explaining the method of manufacturing the image pickup device with the twin contact structure.

Next, as illustrated in FIG. 34, a barrier metal film (not illustrated) and a Cu seed layer 231 are formed by using a sputtering method. The barrier metal film is a film for preventing diffusion of the connection conductor 87 (Cu) illustrated in FIG. 35, and the Cu seed layer 231 serves as an electrode for embedding the connection conductor 87 by an electrolytic plating method.

As a material of the barrier metal film, tantalum (Ta), titanium (Ti), tungsten (W), zirconium (Zr), a nitride film thereof, a carbonized film thereof, or the like can be used. In the present embodiment, titanium is used as the barrier metal film.

Figure 35:
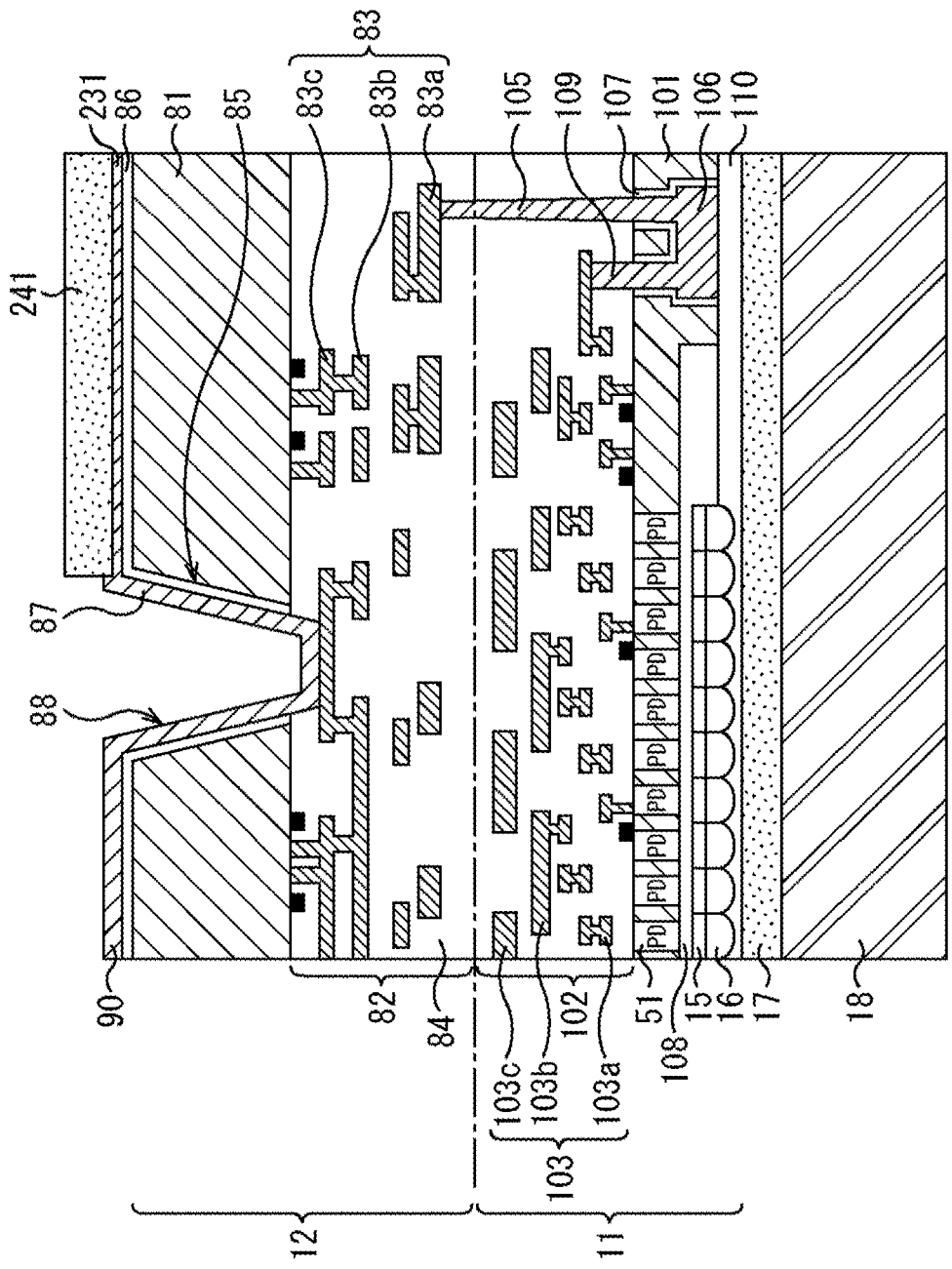
FIG. 35 is a diagram for explaining the method of manufacturing the image pickup device with the twin contact structure.

Next, as illustrated in FIG. 35, after a resist pattern 241 is formed on a required region on the Cu seed layer 231, copper (Cu) as the connection conductor 87 is plated by the electrolytic plating method. As a result, the through-via 88 is formed, and the rewiring line 90 is also formed on the upper side of the semiconductor substrate 81.

Figure 36:
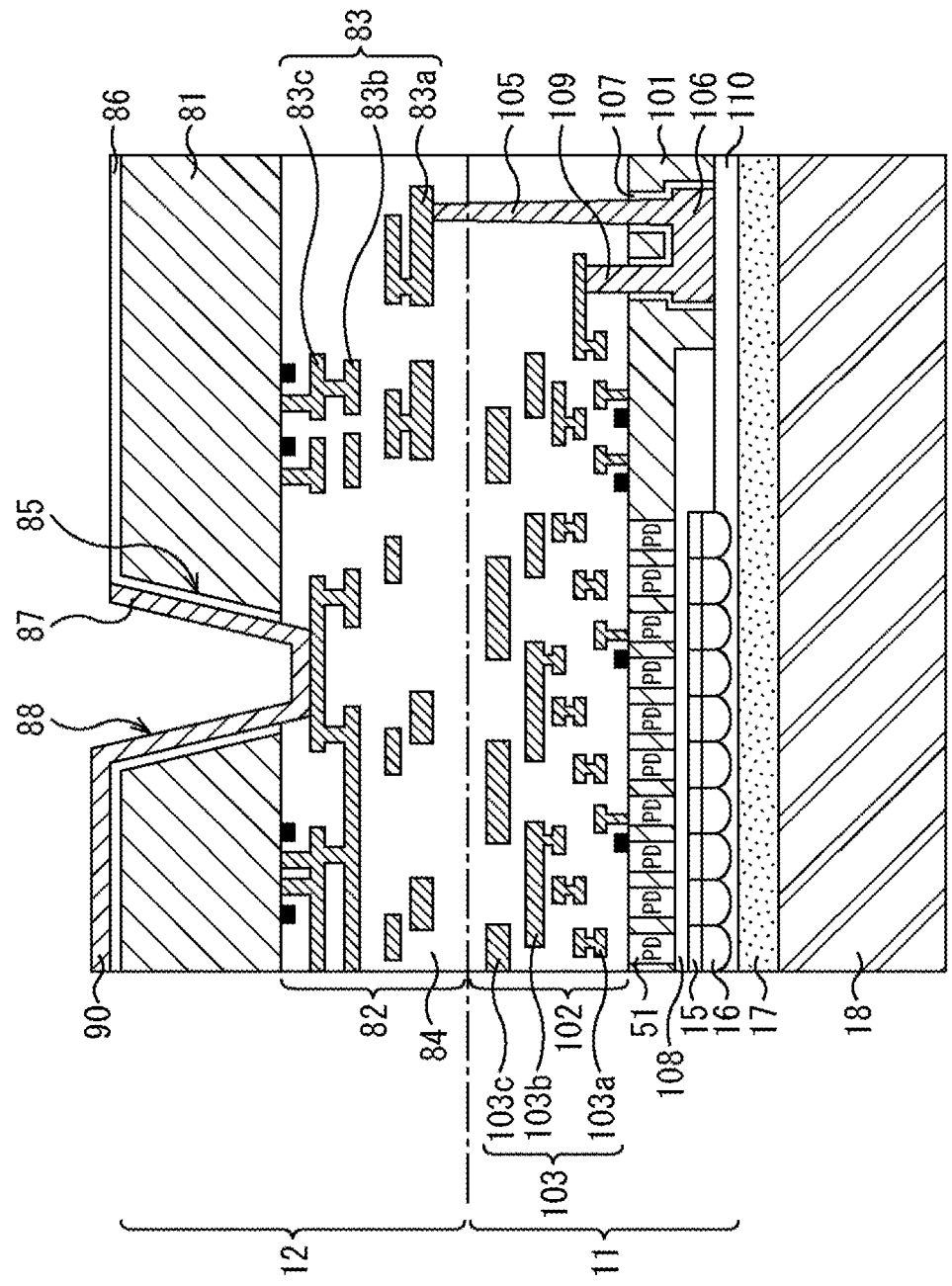
FIG. 36 is a diagram for explaining the method of manufacturing the image pickup device with the twin contact structure.

Next, as illustrated in FIG. 36, after the resist pattern 241 is removed, the barrier metal film (not illustrated) and the Cu seed layer 231 under the resist pattern 241 are removed by wet etching.

Figure 37:
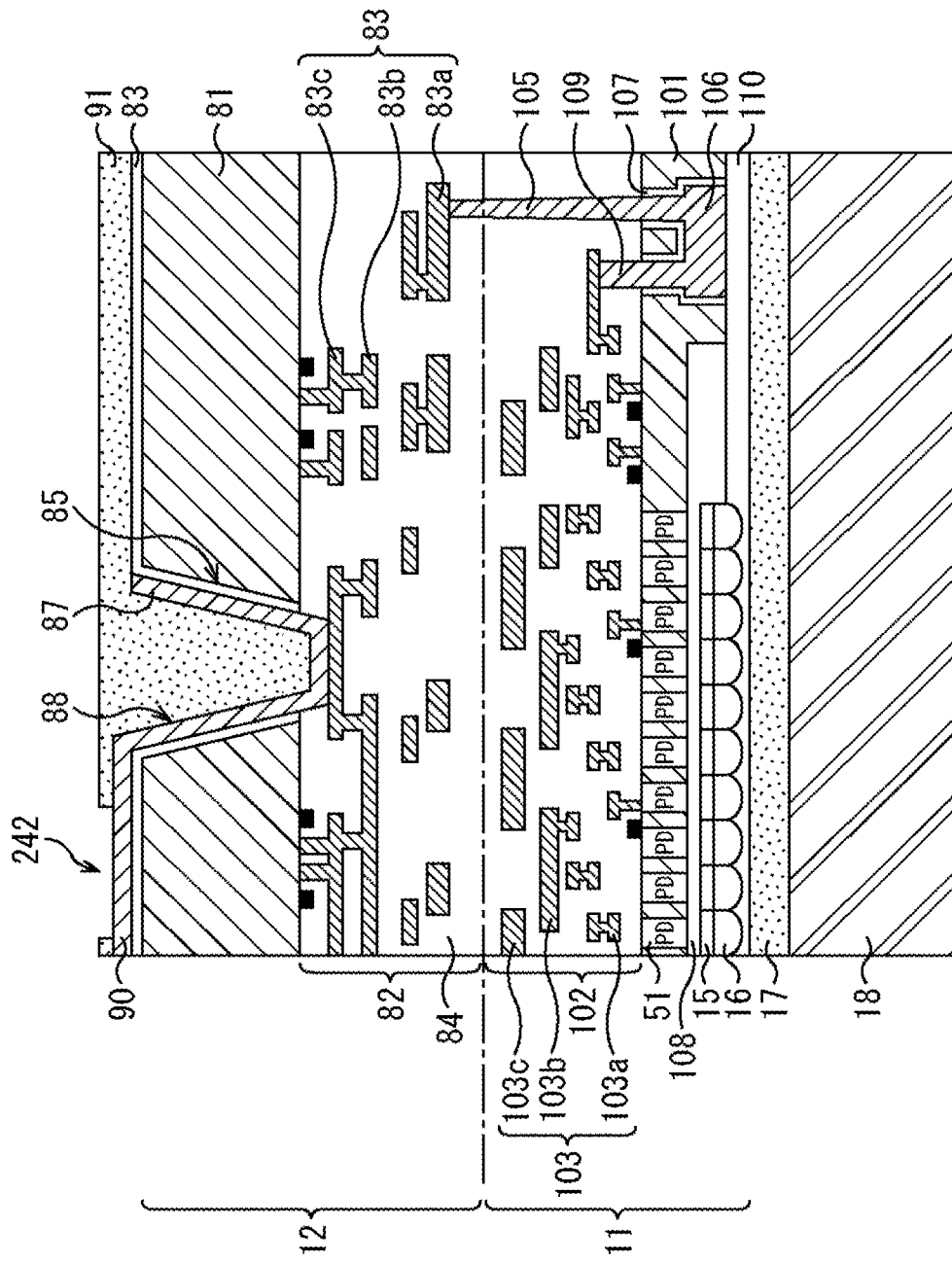
FIG. 37 is a diagram for explaining the method of manufacturing the image pickup device with the twin contact structure.

Next, as illustrated in FIG. 37, after the solder mask 91 is formed and the rewiring line 90 is protected, the solder mask 91 is removed only in a region where the external terminal 14 is to be mounted, whereby a solder mask opening 242 is formed.

Figure 38:
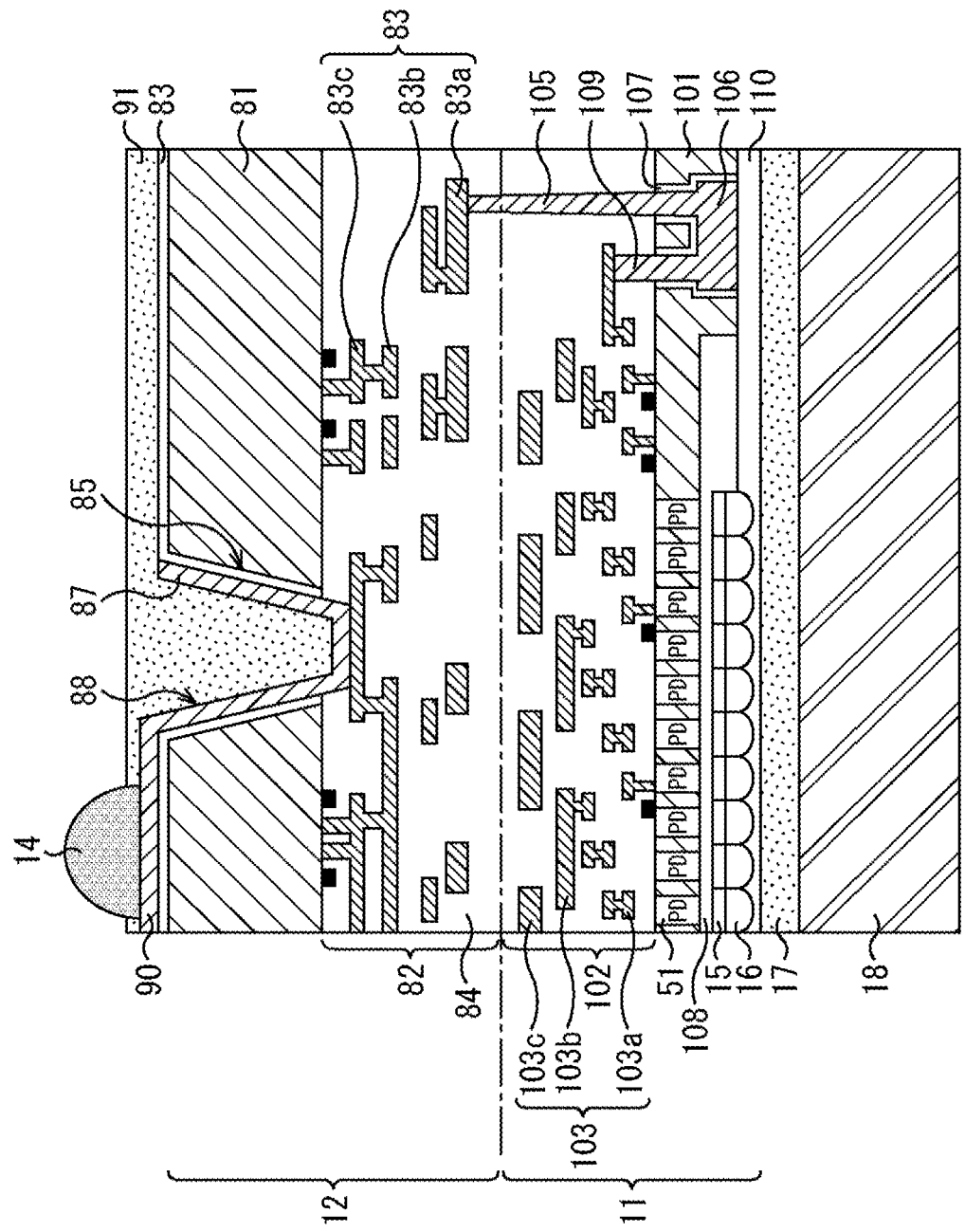
FIG. 38 is a diagram for explaining the method of manufacturing the image pickup device with the twin contact structure.

Then, as illustrated in FIG. 38, the external terminal 14 is formed in the solder mask opening 242 by a solder ball mounting method or the like.

As described above, according to the manufacturing method of the present disclosure, first, the upper structural body 11 (first semiconductor substrate) on which the photodiode 51 that performs photoelectric conversion, the pixel transistor circuit, and the like are formed, and the lower structural body 12 (second semiconductor substrate) formed such that the input/output circuit unit 49 for outputting the pixel signal output from the pixel 31 to the outside of the image pickup device 1 is below the pixel array unit 24, are pasted together so that the wiring layers face each other.

Then, the through-via 88 penetrating through the lower structural body 12 is formed, and the external terminal 14 is formed that is electrically connected to the outside of the image pickup device 1 via the input/output circuit unit 49 and the through-via 88. As a result, the image pickup device 1 illustrated in FIG. 5 can be manufactured.

According to the manufacturing method of the present disclosure, since the through-via 88 is formed by using the glass protective substrate 18 as a support substrate, the through-via 88 has a shape digging from the external terminal 14 side to the wiring layer 83 (circuit) side.

<Manufacturing Method in Case of Cu—Cu Direct Bonding Structure>

Next, with reference to FIGS. 39 to 43, a method will be described of manufacturing the image pickup device 1 in a case where the lower structural body 12 and the upper structural body 11 are connected together by a Cu—Cu direct bonding structure.

Initially, the lower structural body 12 and the upper structural body 11 each in the wafer state are separately manufactured, similarly to the manufacturing method in a case where the twin contact structure is adopted as the upper and lower wiring lines connection structure.

Figure 39:
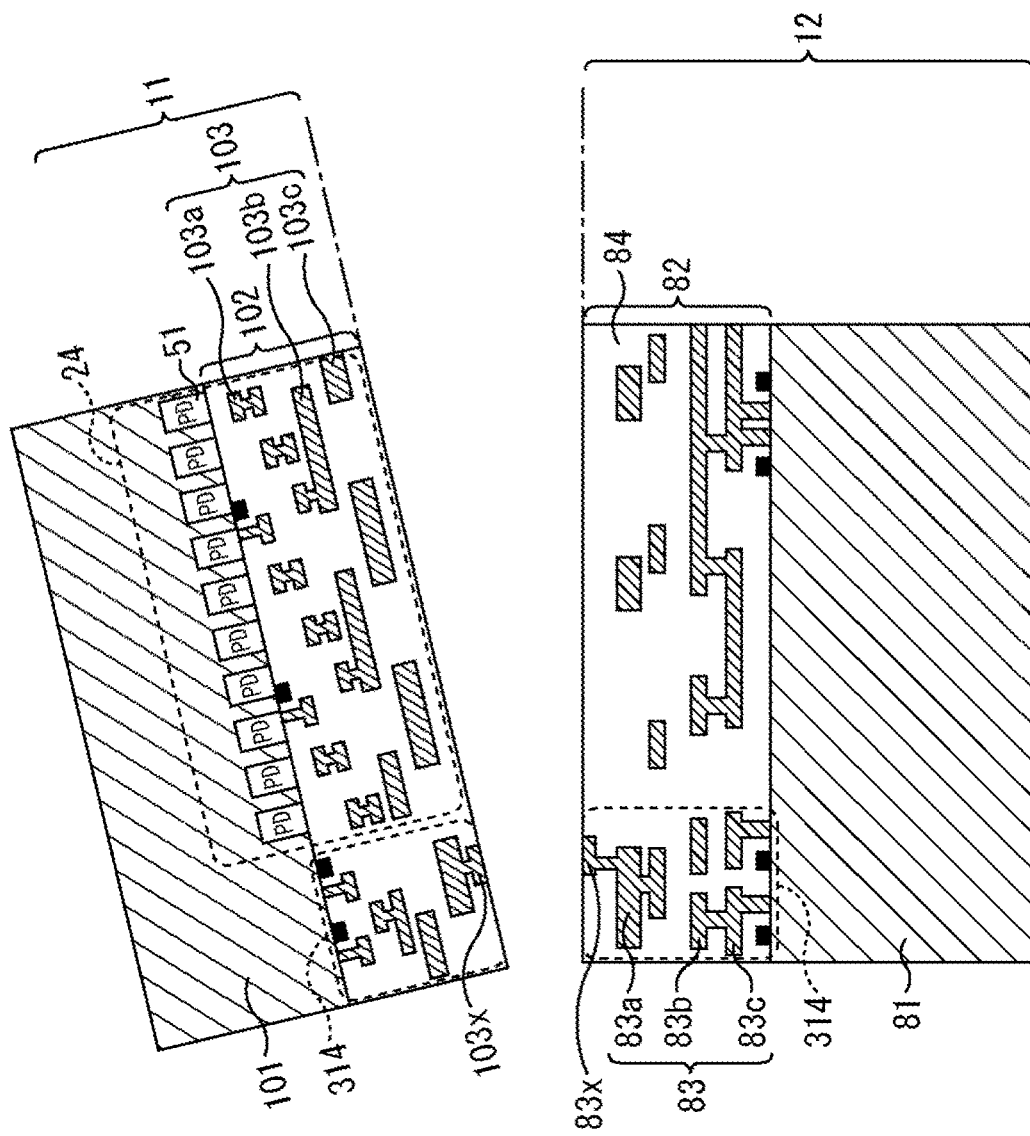
FIG. 39 is a diagram for explaining a method of manufacturing the image pickup device in FIG. 5 with a Cu—Cu direct bonding structure.

However, as a point different from the twin contact structure, as illustrated in FIG. 39, in the upper and lower wiring lines connection region 314 on the further outside of the pixel array unit 24, in the upper structural body 11, a wiring layer 103x for directly connecting to a wiring layer 83x of the lower structural body 12 is formed on the further lower structural body 12 side from the lowermost wiring layer 103c closest to the lower structural body 12.

Similarly, in the upper and lower wiring lines connection region 314, also in the lower structural body 12, the wiring layer 83x for directly connecting to the wiring layer 103x of the upper structural body 11 is formed on the further upper structural body 11 side from the uppermost wiring layer 83a closest to the upper structural body 11.

Figure 40:
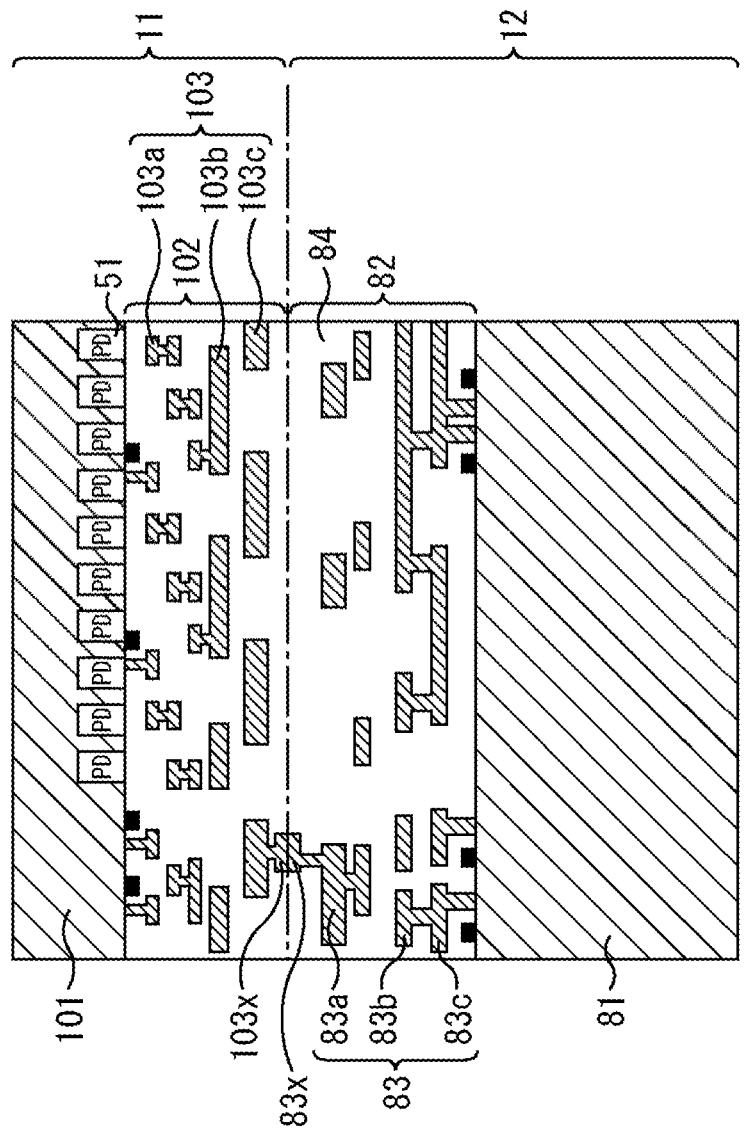
FIG. 40 is a diagram for explaining the method of manufacturing the image pickup device in FIG. 5 with the Cu—Cu direct bonding structure.

Then, as illustrated in FIG. 40, after the multilayer wiring layer 82 side of the lower structural body 12 and the multilayer wiring layer 102 side of the upper structural body 11 are pasted together to face each other, the semiconductor substrate 101 of the upper structural body 11 is thinned. By this pasting, the wiring layer 83x of the lower structural body 12 and the wiring layer 103x of the upper structural body 11 are connected together by metal bond (Cu—Cu bonding).

Figure 41:
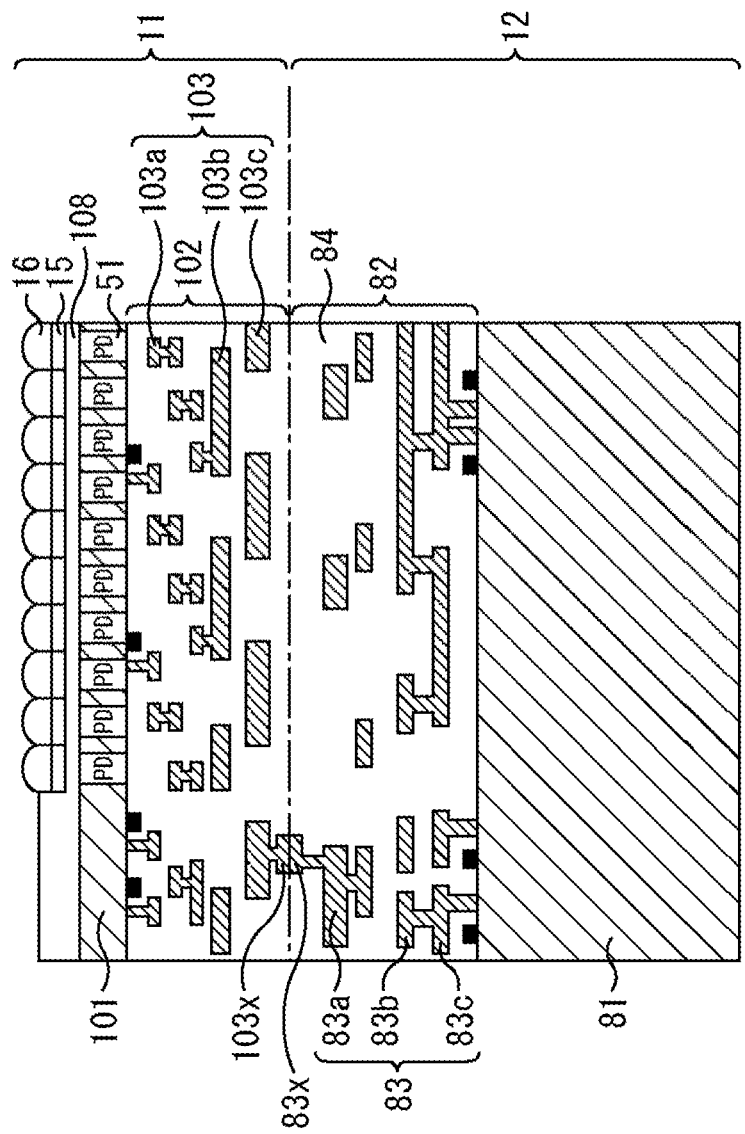
FIG. 41 is a diagram for explaining the method of manufacturing the image pickup device in FIG. 5 with the Cu—Cu direct bonding structure.

Next, as illustrated in FIG. 41, the color filter 15 and the on-chip lens 16 are formed above the photodiode 51 of each pixel 31 via the flattening film 108.

Figure 42:
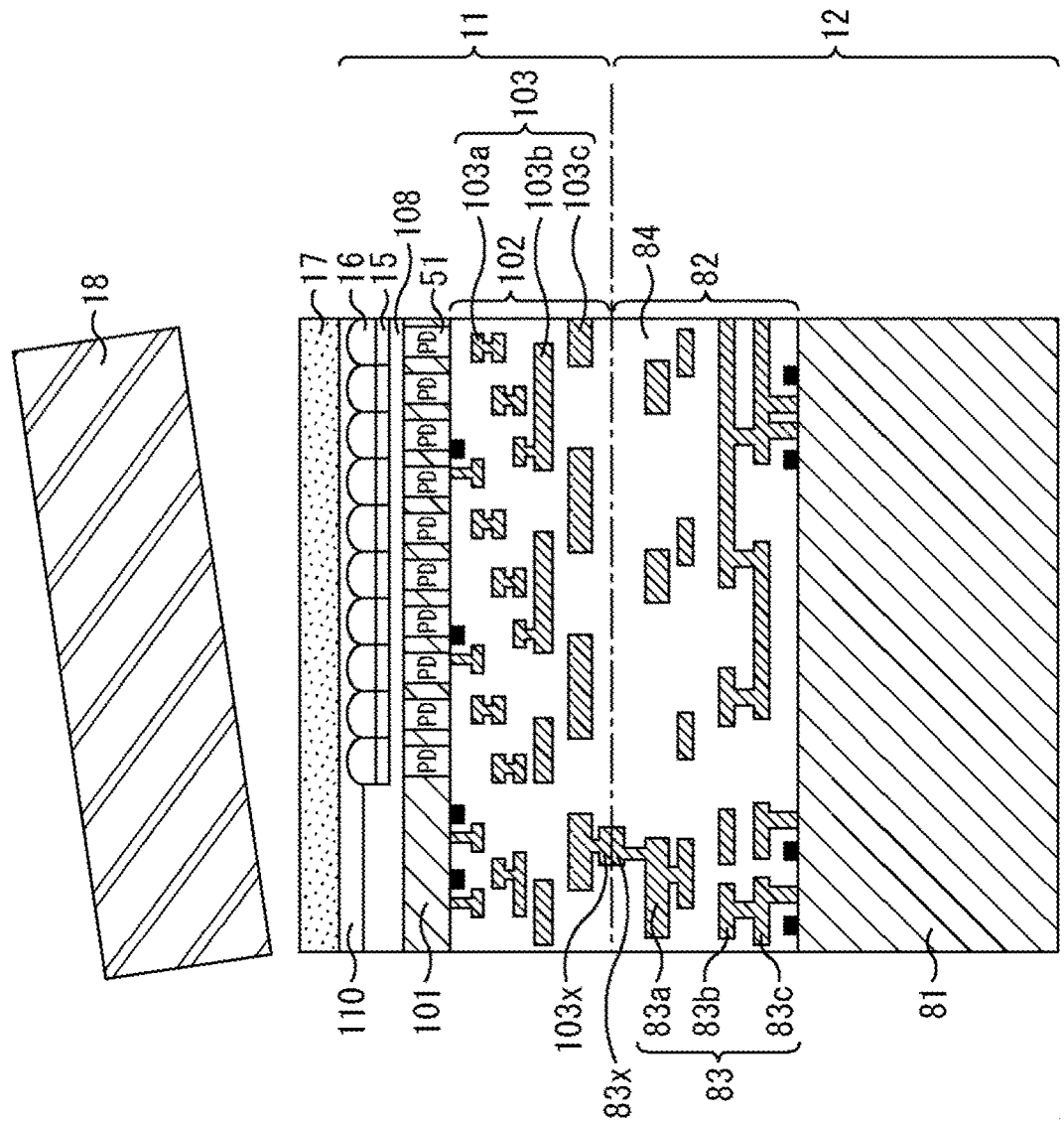
FIG. 42 is a diagram for explaining the method of manufacturing the image pickup device in FIG. 5 with the Cu—Cu direct bonding structure.

Then, as illustrated in FIG. 42, the glass seal resin 17 is applied via the flattening film 110 to the entire surface on which the on-chip lens 16 includes the lower structural body 12 and the upper structural body 11 pasted together, and the glass protective substrate 18 is connected thereto, with a cavity-less structure.

Note that, in this example, in the lower structural body 12, separately from the wiring layers 83a to 83c to be a part of the input/output circuit unit 49, the row drive unit 22, or the column signal processing unit 25, the wiring layer 83x is formed for directly connecting to the wiring layer 103 of the upper structural body 11, and in the upper structural body 11, separately from the wiring layers 103a to 103c to be a drive wiring line of the pixel transistor, and the like, the wiring layer 103x is formed for directly connecting to the wiring layer 83 of the lower structural body 12; however, of course, the uppermost wiring layer 83a of the lower structural body 12 and the lowermost wiring layer 103c of the upper structural body 11 may be connected together by metal bond (Cu—Cu bonding).

Figure 43:
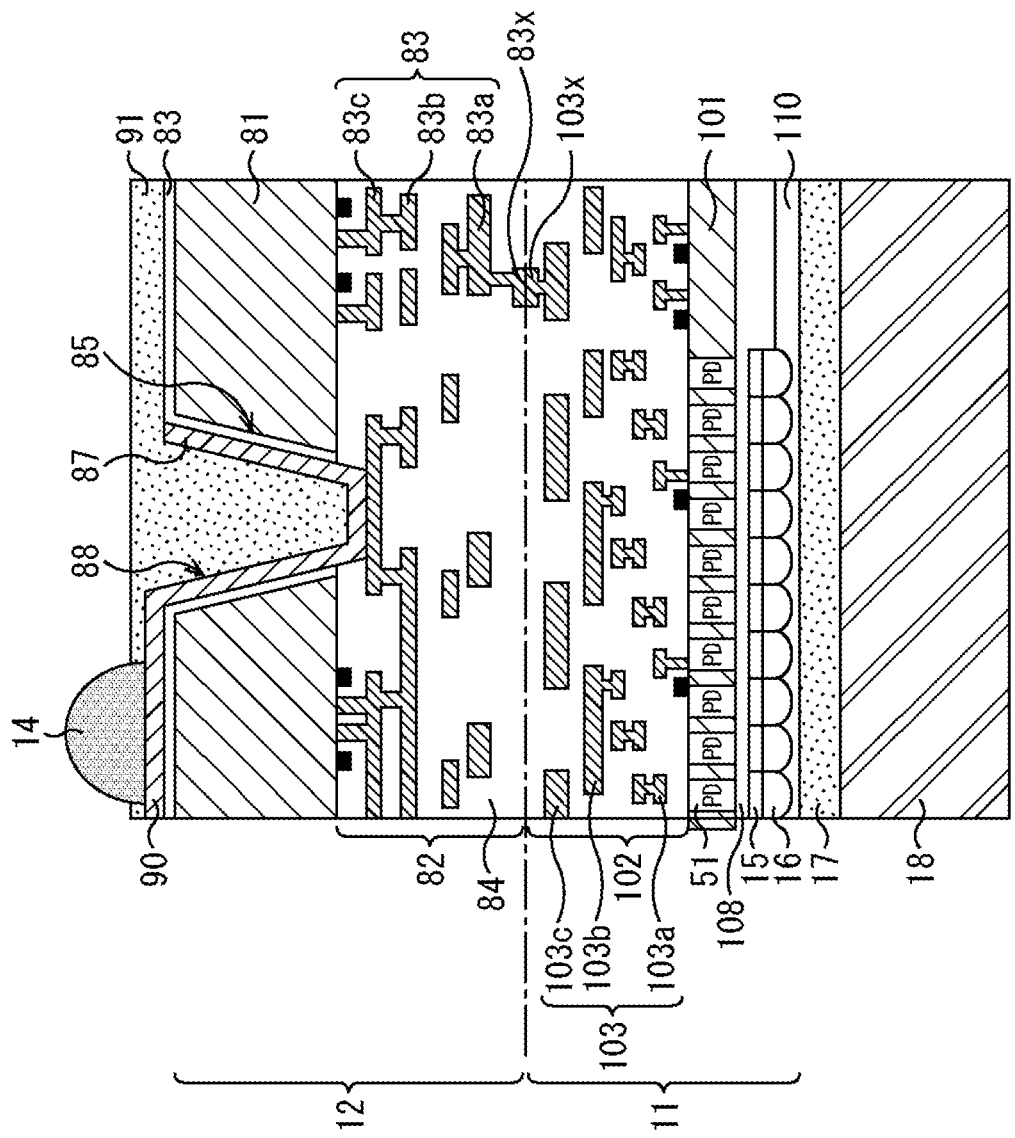
FIG. 43 is a diagram for explaining the method of manufacturing the image pickup device in FIG. 5 with the Cu—Cu direct bonding structure.

Steps subsequent to the step illustrated in FIG. 42 are similar to the steps given with reference to FIGS. 30 to 38 in the case where the twin contact structure is adopted as the upper and lower wiring lines connection structure. As a final state, a state illustrated in FIG. 43 is obtained.

<12. Further Modification>
<Further Modification 1>

Next, a further modification of the image pickup device 1 will be described with reference to FIG. 44.

Figure 44:
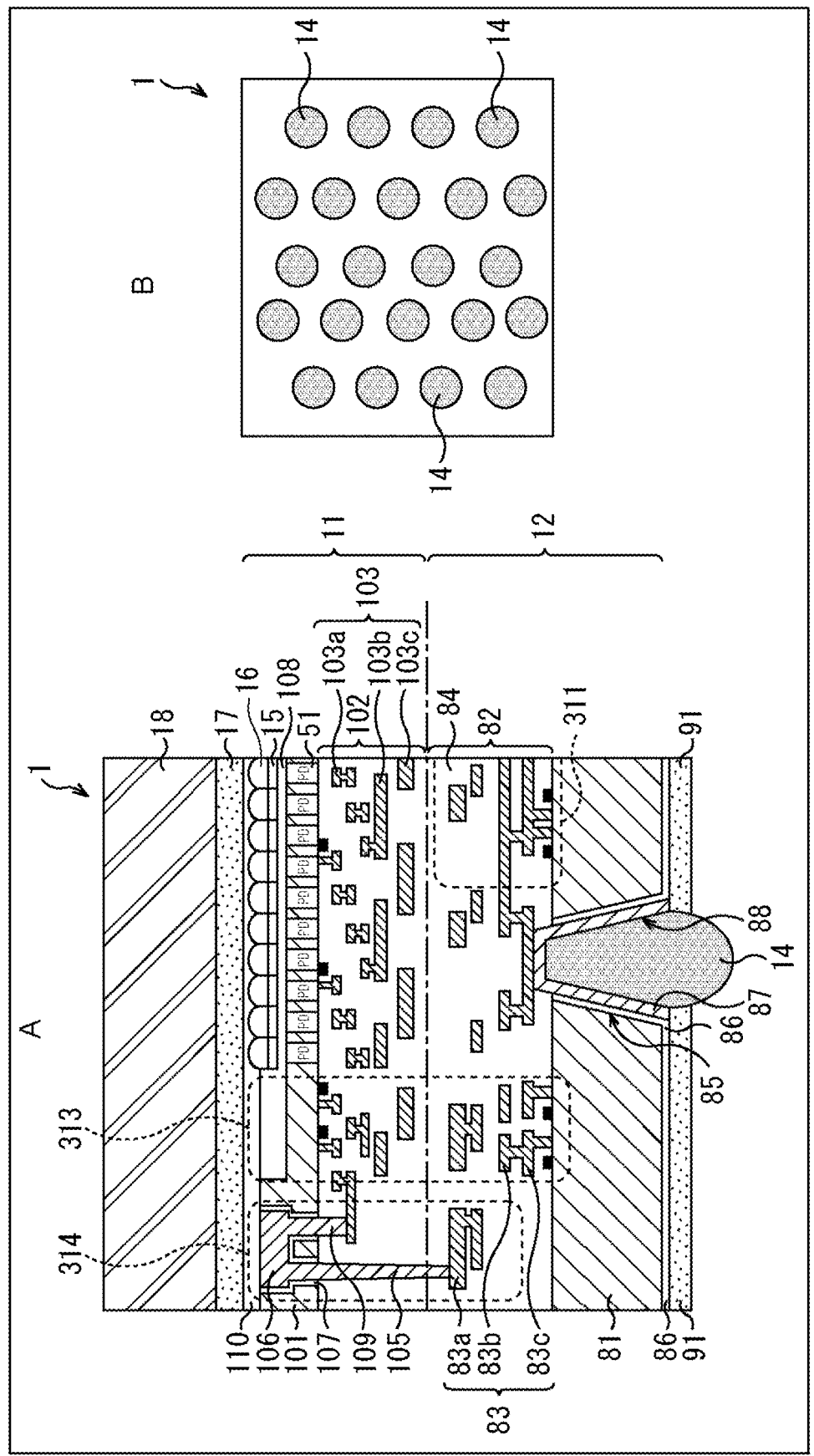
FIG. 44 is a diagram for explaining Further Modification 1 of the image pickup device.

A of FIG. 44 is a cross-sectional view near the outer periphery of the image pickup device 1 according to Further Modification 1, and B of FIG. 44 is a plan view of the external terminal 14 side of the image pickup device 1 according to Further Modification 1.

In Further Modification 1, as illustrated in A of FIG. 44, the external terminal 14 is formed immediately above the through-via 88 to overlap a position of the through-via 88 at a planar position. As a result, as illustrated in B of FIG. 44, since the area for forming the rewiring line 90 is unnecessary on the back surface side of the image pickup device 1, it is possible to eliminate a shortage of the area forming the input/output unit 21.

<Further Modification 2>

Next, a further modification of the image pickup device 1 will be described with reference to FIG. 45.

Figure 45:
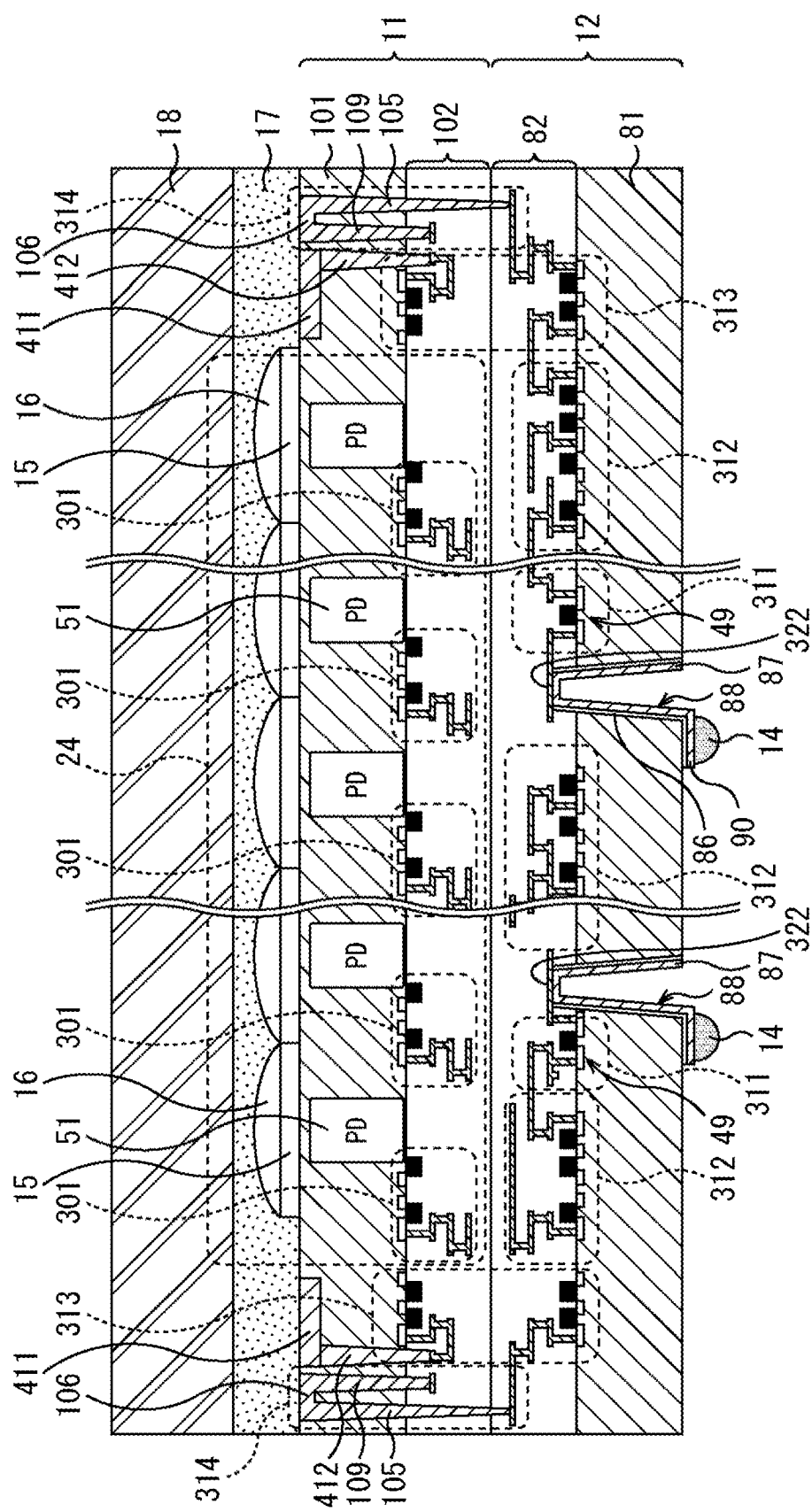
FIG. 45 is a diagram for explaining Further Modification 2 of the image pickup device.

FIG. 45 is a cross-sectional view of the image pickup device 1 according to Further Modification 2.

In Further Modification 2, the image pickup device 1 includes a conductive pad 411 for contact with a measurement probe, for the purpose of measuring operation of the image pickup device 1 in a state before the image pickup device 1 is divided into the solid pieces, in other words, in a state in which the plurality of image pickup devices 1 is mounted on the wafer, by using a general probe type semiconductor device measuring machine, for example.

As illustrated in FIG. 45, the conductive pad 411 for probe measurement is formed in a region outside the pixel array unit 24, for example, on the upper side of the pixel peripheral circuit region 313 where the row drive unit 22, the column signal processing unit 25, and the like are formed. The conductive pad 411 is connected to a predetermined wiring layer 103 of the upper structural body 11 by a through-silicon-electrode 412.

The conductive pad 411 for probe measurement is desirably formed before the protective substrate 18 is arranged on the surface of the image pickup device 1. As a result, it is possible to measure the operation of the image pickup device 1 in a state in which the plurality of image pickup devices 1 is formed on the wafer before the protective substrate 18 is fixed.

The conductive pad 411 for probe measurement may be formed by a part of the multilayer wiring layer 102 included in the upper structural body 11.

Furthermore, the conductive pad 411 for probe measurement may be formed on the upper side of a region for acquiring a reference level signal, in other words, a black level signal, which is included in the image pickup device 1, the region being generally referred to as an optical black pixel region or simply an optical black region (not illustrated).

By forming the conductive pad 411 for probe measurement on the image pickup device 1 before fixing the protective substrate 18 of the image pickup device 1, it is possible to measure the operation of the image pickup device 1 by using a probe type semiconductor device measuring apparatus, in a state in which the plurality of image pickup devices 1 is formed on the wafer before the protective substrate 18 is fixed.

<Further Modification 3>

Next, a further modification of the image pickup device 1 will be described with reference to FIG. 46.

Figure 46:
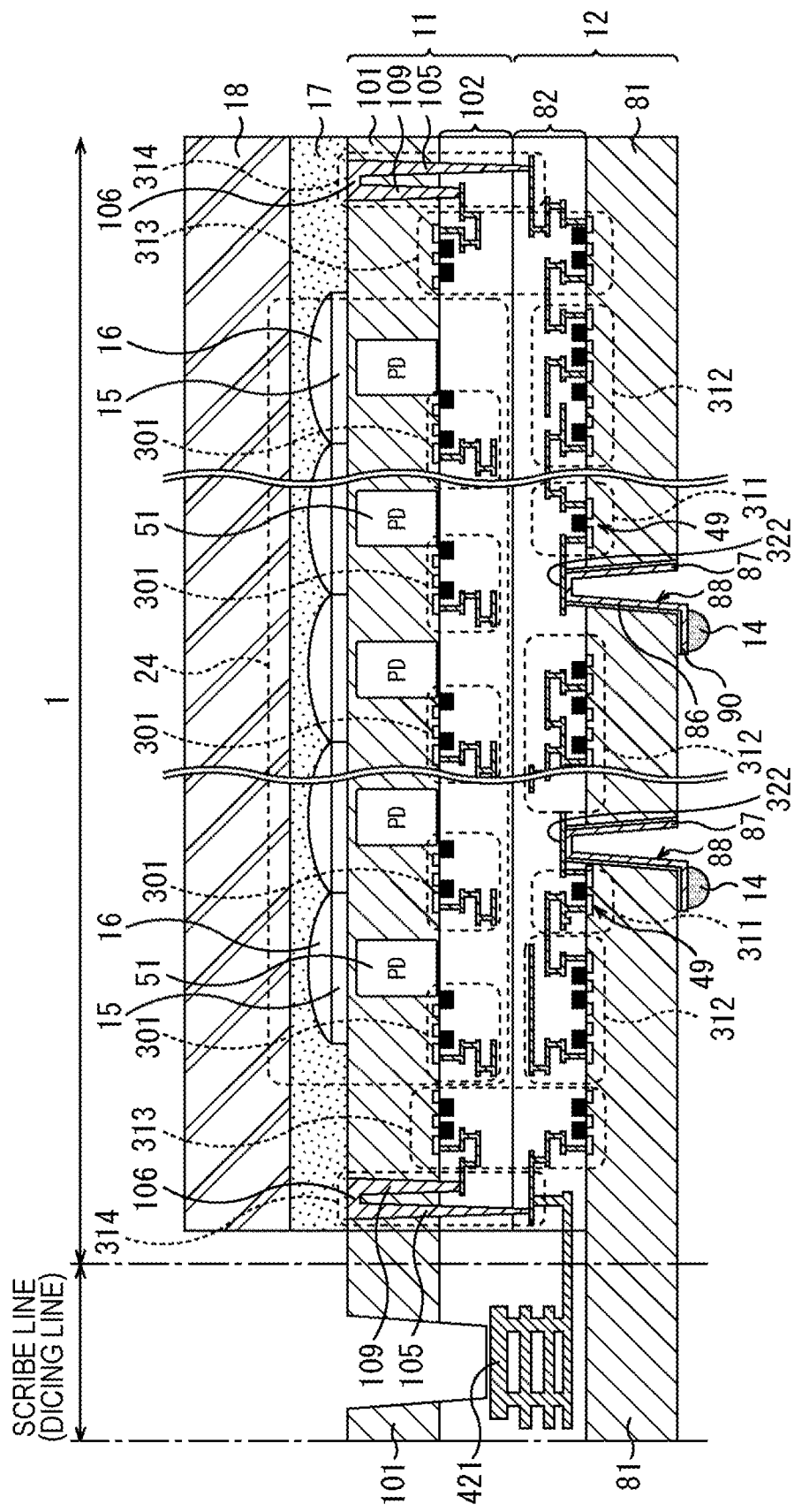
FIG. 46 is a diagram for explaining Further Modification 3 of the image pickup device.

FIG. 46 is a cross-sectional view of the image pickup device 1 according to Further Modification 3.

The image pickup device 1 according to Further Modification 3 also includes a conductive pad 421 for contact with a measurement probe, for the purpose of measuring operation of the image pickup device 1 in a state before the image pickup device 1 is divided into the solid pieces, in other words, in a state in which the plurality of image pickup devices 1 is mounted on the wafer, by using a general probe type semiconductor device measuring machine, for example.

As illustrated in FIG. 46, the conductive pad 421 for probe measurement is formed on a scribe line (dicing line) between the image pickup devices 1.

The conductive pad 421 for probe measurement is desirably formed before the protective substrate 18 is arranged on the surface of the image pickup device 1. As a result, it is possible to measure the operation of the image pickup device 1 in a state in which the plurality of image pickup devices 1 is formed on the wafer before the protective substrate 18 is fixed.

The conductive pad 421 for probe measurement may be formed by a part of the multilayer wiring layer 102 included in the upper structural body 11, may be formed by a part of the multilayer wiring layer 82 included in the lower structural body 12, or may be formed by the same layer as a part of a conductive layer used in the upper and lower wiring lines connection structure. Then, the conductive pad 421 for probe measurement may be connected to the inside of the image pickup device 1 via a part of the multilayer wiring layer 102 included in the upper structural body 11, or may be connected to the inside of the image pickup device 1 via a part of the multilayer wiring layer 82 included in the lower structural body 12.

By forming the conductive pad 421 for probe measurement on the image pickup device 1 before fixing the protective substrate 18 of the image pickup device 1, it is possible to measure the operation of the image pickup device 1 by using a probe type semiconductor device measuring apparatus, in a state in which the plurality of image pickup devices 1 is formed on the wafer before the protective substrate 18 is fixed.

<Further Modification 4>

Next, a further modification of the image pickup device 1 will be described with reference to FIG. 47.

Figure 47:
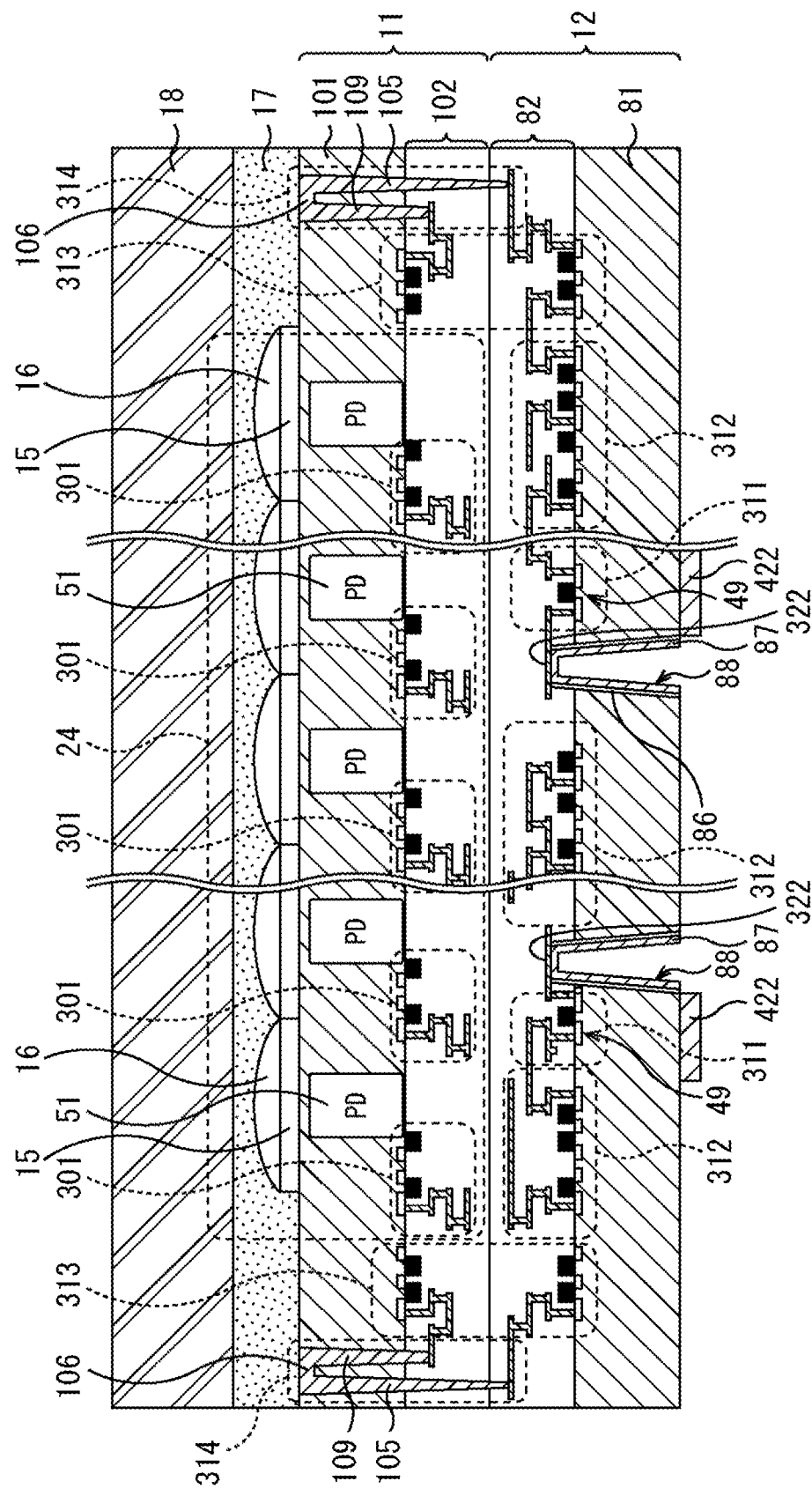
FIG. 47 is a diagram for explaining Further Modification 4 of the image pickup device.

FIG. 47 is a cross-sectional view of the image pickup device 1 according to Further Modification 4.

The image pickup device 1 according to Further Modification 4 also includes a conductive pad 422 for contact with a measurement probe, for the purpose of measuring operation of the image pickup device 1 in a state in which the plurality of image pickup devices 1 is mounted on the wafer.

As illustrated in FIG. 47, the conductive pad 422 for probe measurement is formed on the lower side of the lower structural body 12 in a state in which the plurality of image pickup devices 1 is formed on the wafer. The conductive pad 422 for probe measurement may be formed by the rewiring line 90 included in the lower structural body 12, for example.

After the protective substrate 18 is arranged on the surface of the image pickup device 1 in a state in which the plurality of image pickup devices 1 is formed on the wafer, it is possible to measure the operation of the image pickup device 1 by turning the wafer upside down to arrange the protective substrate 18 on the lower side and to arrange the conductive pad 422 for probe measurement on the upper side. In this case, the operation of the image pickup device 1 may be measured by using a device that causes light to enter from the lower side of the image pickup device 1.

<13. Example of Three-Layer Layered Structural Body>

In each of the embodiments described above, the layered structural body 13 of the image pickup device 1 includes two layers of the lower structural body 12 and the upper structural body 11, but the layered structural body 13 can include three or more layers.

Figure 48:
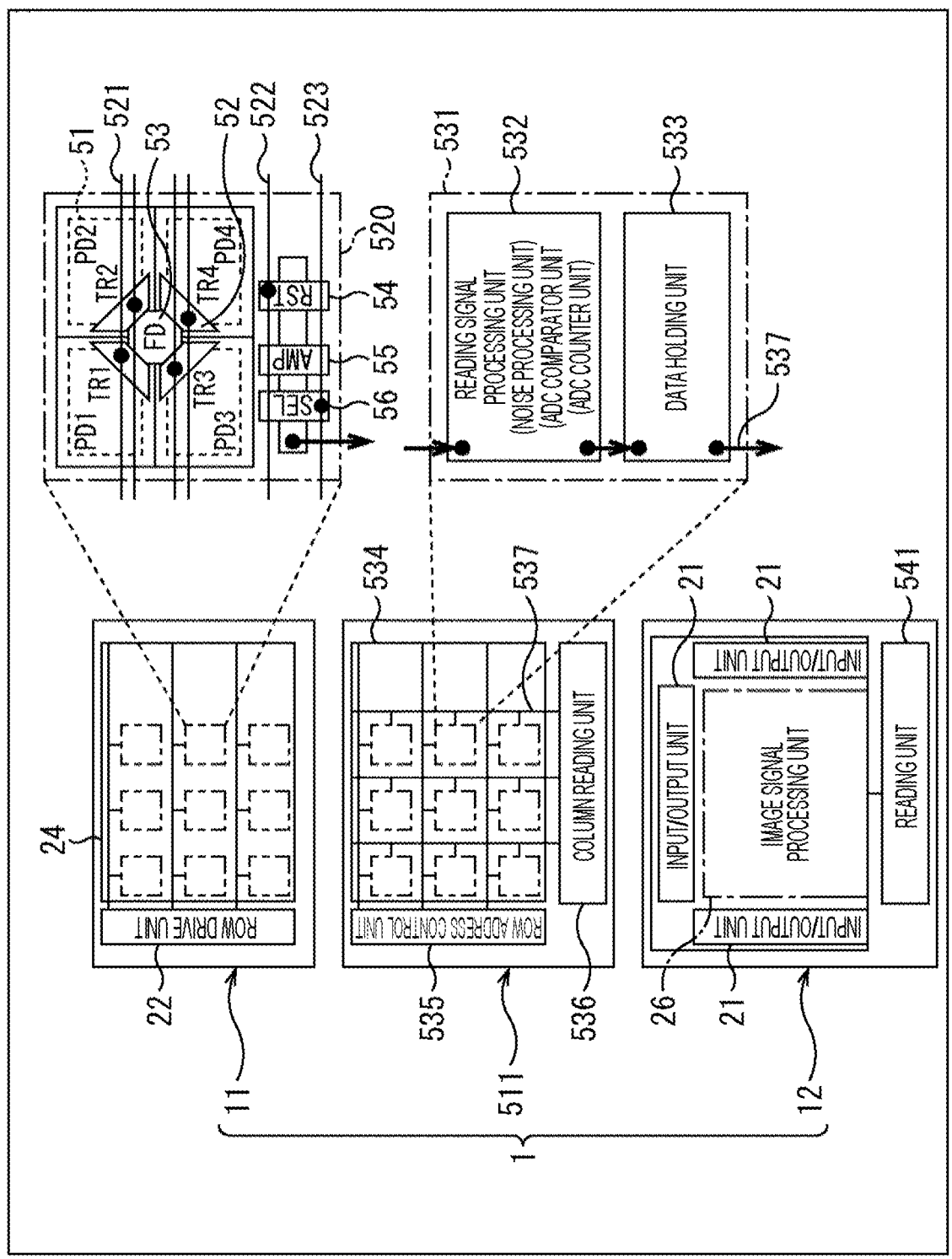
FIG. 48 is a diagram for explaining an example in which the image pickup device includes a three-layer layered structural body.
Figure 49:
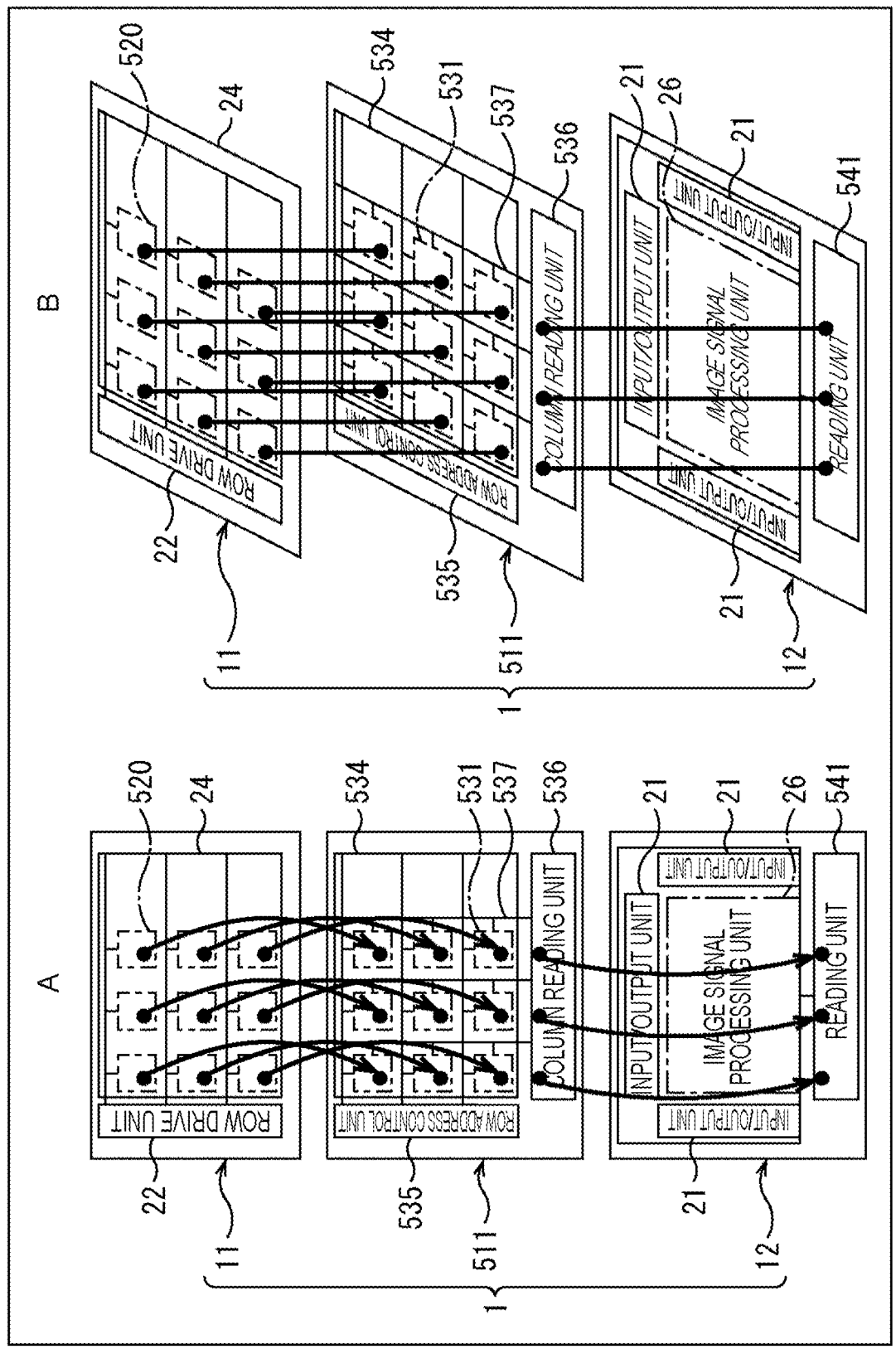
FIG. 49 is a diagram for explaining the example in which the image pickup device includes the three-layer layered structural body.

With reference to FIGS. 48 and 49, an example will be described in which the layered structural body 13 includes three layers by providing a third structural body 511 between the lower structural body 12 and the upper structural body 11.

FIG. 48 illustrates a configuration in a case where the pixel array unit 24 has a pixel sharing structure.

In the pixel sharing structure, the photodiode (PD) 51 and the transfer transistor 52 are included for each pixel 31, but the FD 53, the amplifier transistor 55, the reset transistor 54, and the selection transistor 56 are shared by a plurality of pixels.

FIG. 48 illustrates a structure in which, as a shared unit 520, four pixels of two pixels in the row direction and two pixels in the column direction (2×2) shares the FD 53, the amplifier transistor 55, the reset transistor 54, and the selection transistor 56.

A transfer transistor drive signal line 521 extending in the row direction is connected one by one to each of gate electrodes of the four transfer transistors 52. The four transfer transistor drive signal lines 521 connected to the respective gate electrodes of the four transfer transistors 52 and extending in the row direction are arranged in the column direction in parallel to each other.

The FD 53 is connected to the gate electrode of the amplifier transistor 55 and the diffusion layer of the reset transistor 54 via wiring lines (not illustrated). One reset transistor drive signal line 522 extending in the row direction is connected to the gate electrode of the reset transistor 54.

One select transistor drive signal line 523 extending in the row direction is connected to the gate electrode of the selection transistor 56. The selection transistor 56 may be omitted.

In the example system configuration of the image pickup device 1 illustrated in FIG. 2, the plurality of pixels 31 is connected to the vertical signal line 33 extending in the column direction for each pixel. Then, each of a plurality of the vertical signal lines 33 is connected to the column signal processing unit 25 arranged subsequent thereto, and noise processing and AD conversion processing are performed in the column signal processing unit 25.

On the other hand, the image pickup device 1 with the three-layer layered structural body 13 illustrated in FIG. 48 includes an area signal processing unit 531 in the third structural body 511 between the lower structural body 12 and the upper structural body 11.

The area signal processing unit 531 includes a reading signal processing unit 532 including a noise processing unit and the ADC, and a data holding unit 533 that holds digital data after AD conversion.

For example, in a case where each of the pixels 31 of the shared unit 520 outputs data expressed in 16 bits after the AD conversion, the data holding unit 533 includes a data holding means, such as a latch for 64 bits and a shift register, for holding these data.

The area signal processing unit 531 further includes an output signal wiring line 537 for outputting the data held in the data holding unit 533 to the outside of the area signal processing unit 531. The output signal wiring line may be, for example, a 64-bit signal line for outputting 64-bit data held in the data holding unit 533 in parallel, a 16-bit signal line for outputting data of four pixels held in the data holding unit 533 for one pixel at a time, or an 8-bit signal line that is a half of the data for one pixel or 32-bit signal line that is the data for two pixels. Alternatively, the output signal wiring line may be a 1-bit signal line that reads the data held in the data holding unit 533 one bit at a time.

In the image pickup device 1 illustrated in FIG. 48, one shared unit 520 of the upper structural body 11 is connected to one area signal processing unit 531 of the third structural body 511. In other words, the shared unit 520 and the area signal processing unit 531 correspond one to one. Therefore, as illustrated in FIG. 48, the third structural body 511 includes an area signal processing unit array 534 in which a plurality of the area signal processing units 531 is arrayed in the row direction and the column direction.

Furthermore, the third structural body 511 includes a row address control unit 535 that reads data of the data holding unit 533 included in each of the plurality of area signal processing units 531 respectively arrayed in the row direction and the column direction. The row address control unit 535 determines a reading position in the row direction similarly to a general semiconductor memory device.

The area signal processing unit 531 arranged in the row direction of the area signal processing unit array 534 is connected to a control signal line extending in the row direction from the row address control unit 535, and operation of the area signal processing unit 531 is controlled by control of the row address control unit 535.

The area signal processing unit 531 arranged in the column direction of the area signal processing unit array 534 is connected to the column reading signal line 537 extending in the column direction, and the column reading signal line is connected to a column reading unit 536 arranged subsequent to the area signal processing unit array 534.

For the data held in the data holding unit 533 of each area signal processing unit 531 of the area signal processing unit array 534, the data of the data holding unit 533 of all the area signal processing units 531 arranged in the row direction may be read at the same time to the column reading unit 536, or only the data may be read of the specific area signal processing unit 531 specified by the column reading unit 536.

To the column reading unit 536, a wiring line is connected for outputting the data read from the area signal processing unit 531 to the outside of the third structural body 511.

The lower structural body 12 is connected to a wiring line from the column reading unit 536 of the third structural body 511, and includes a reading unit 541 for receiving the data output from the column reading unit 536.

Furthermore, the lower structural body 12 includes the image signal processing unit 26 for image signal processing of the data received from the third structural body 511.

Moreover, the lower structural body 12 includes the input/output unit 21 for outputting the data received from the third structural body 511 via the image signal processing unit 26 or outputting the data without passing therethrough. The input/output unit 21 may include not only the output circuit unit 47, but also the input circuit unit 42 for inputting, for example, a timing signal to be used in the pixel array unit 24 and characteristic data to be used in the image signal processing unit 26, from the outside of the image pickup device 1 into the device.

As illustrated in B of FIG. 49, each shared unit 520 formed in the upper structural body 11 is connected to the area signal processing unit 531 of the third structural body 511 arranged immediately below the shared unit 520. Wiring connection between the upper structural body 11 and the third structural body 511 can be connected by, for example, the Cu—Cu direct bonding structure illustrated in FIG. 8.

Furthermore, as illustrated in B of FIG. 49, the column reading unit 536 on the outside of the area signal processing unit array 534 formed in the third structural body 511 is connected to the reading unit 541 of the lower structural body 12, the reading unit 541 being arranged immediately below the column reading unit 536. Wiring connection between the third structural body 511 and the lower structural body 12 can be connected by, for example, the Cu—Cu direct bonding structure illustrated in FIG. 8, or the twin contact structure illustrated in FIG. 6.

Accordingly, as illustrated in A of FIG. 49, the pixel signal of each shared unit 520 formed in the upper structural body 11 is output to the corresponding area signal processing unit 531 of the third structural body 511. The data held in the data holding unit 533 of the area signal processing unit 531 is output from the column reading unit 536, and supplied to the reading unit 541 of the lower structural body 12. Then, the data is subjected to various types of signal processing (for example, tone curve correction processing) in the image signal processing unit 26, and output from the input/output unit 21 to the outside of the device.

Note that, in the image pickup device 1 with the three-layer layered structural body 13, the input/output unit 21 formed in the lower structural body 12 may be arranged on the lower side of the row address control unit 535 of the third structural body 511.

Furthermore, in the image pickup device 1 with the three-layer layered structural body 13, the input/output unit 21 formed in the lower structural body 12 may be arranged on the lower side of the area signal processing unit 531 of the third structural body 511.

Moreover, in the image pickup device 1 with the three-layer layered structural body 13, the input/output unit 21 formed in the lower structural body 12 may be arranged on the lower side of the pixel array unit 24 of the upper structural body 11.

<14. Configuration Including Lens Module>
<First Structure>

Figure 50:
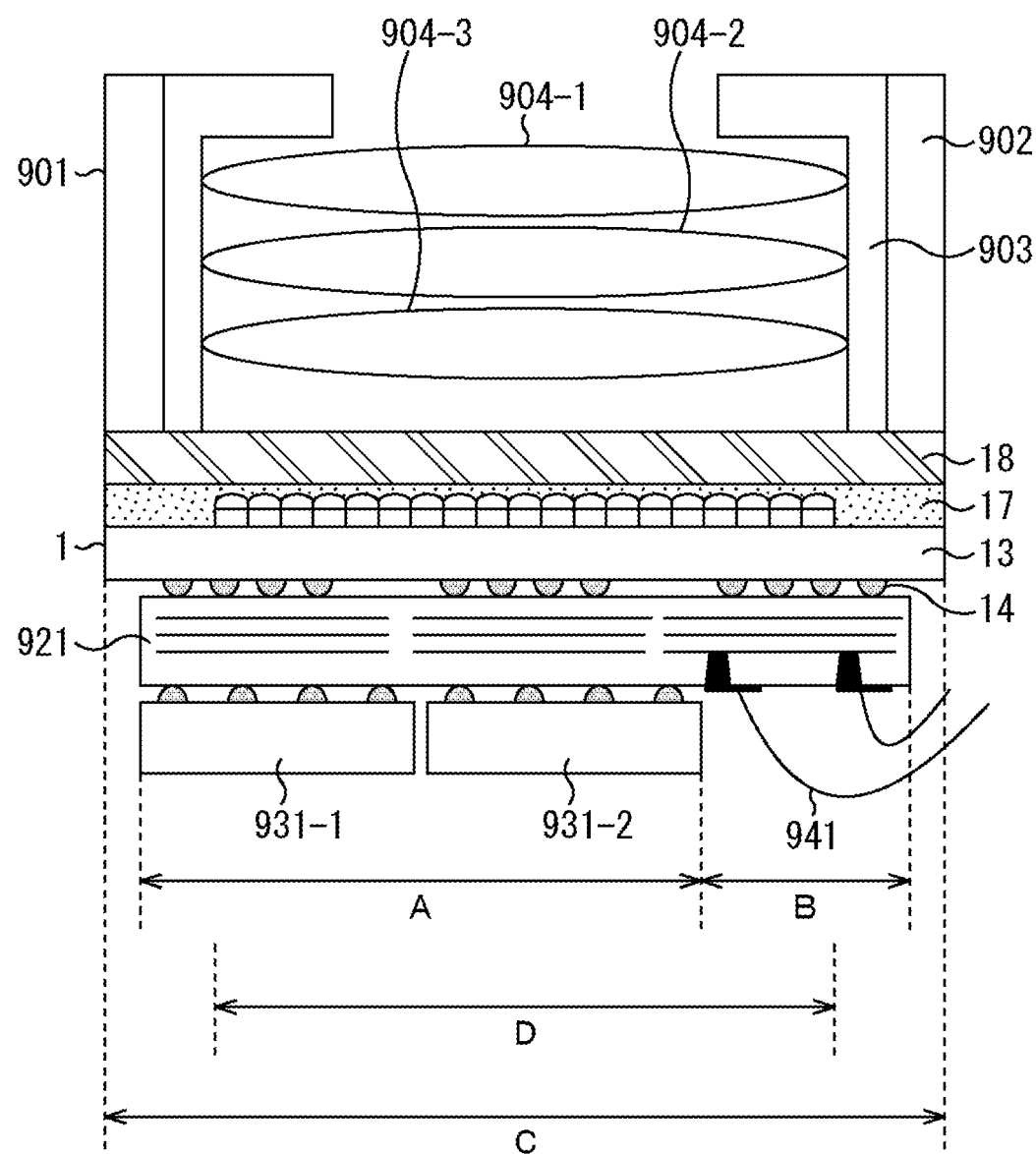
FIG. 50 is a diagram for explaining a configuration of the image pickup device connected to a lens module and a substrate.

A configuration will be described in a case where the above-described image pickup device 1 is combined with a lens module. FIG. 50 illustrates an example configuration (a first structure of the image pickup device 1 including the lens module) in the case where the image pickup device 1 is combined with the lens module.

In the configuration illustrated in FIG. 50, a lens module 901 is placed on the protective substrate 18 of the image pickup device 1, and a substrate 921 is connected under the layered structural body 13 of the image pickup device 1.

The lens module 901 includes an actuator 902, a lens barrel 903, and a lens 904. A lens 904-1, a lens 904-2, and a lens 904-3 are incorporated inside the lens barrel 903, and the lens barrel 903 holds the lenses 904-1 to 904-3. The lens barrel 903 is enclosed in the actuator 902.

For example, a screw (not illustrated) is included on the outer side surface of the lens barrel 903, and a screw (not illustrated) is included in a portion within the actuator 902 at a position to be screwed with the screw of the lens barrel 903, and the screw of the lens barrel 903 and the screw inside the actuator 902 are screwed together. The reason why the lens barrel 903 is screwed to the actuator 902 is to adjust the distance to the image pickup device 1 (to adjust the focus) during manufacturing. Note that, such a manner of mounting the lens barrel 903 on the actuator 902 is merely an example, and the lens barrel 903 may be mounted on the actuator 902 in another mechanism.

In a case where the lens barrel 903 is movable in the vertical direction in the figure, and enabled to perform auto-focus (AF), for example, a coil is provided on the side surface of the lens barrel 903 (lens carry to which the lens barrel 903 is mounted). Furthermore, a magnet is provided at a position that faces the coil and is the inside of the actuator 902. The magnet is provided with a yoke, and the coil, the magnet, and the yoke constitute a voice coil motor.

When current flows through the coil, force is generated in the vertical direction in the figure. With this generated force, the lens barrel 903 moves upward or downward. As the lens barrel 903 moves, the distance changes between the lenses 904-1 to 904-3 held by the lens barrel 903 and the image pickup device 1. With such a mechanism, auto-focus can be implemented.

Note that, the auto-focus can be implemented with another mechanism, and a configuration is set depending on the manner of implementation.

At the center of the lower part of the lens module 901, the image pickup device 1 is provided. The image pickup device 1 has a structure as illustrated in FIG. 1, for example. The image pickup device 1 includes the external terminal 14 on the bottom. The external terminal 14 is connected to the substrate 921 (a wiring line within the substrate 921) provided on the lower side of the image pickup device 1. The wiring line is formed within the substrate 921.

A circuit board 931-1 and a circuit board 931-2 are connected to the substrate 921 by external terminals. Furthermore, a bonding wire 941 is connected to the substrate 921. On the lower part of the substrate 921 (the side opposite to the side connected to the image pickup device 1), a region to which the circuit board 931 is connected (circuit board region A), and a region to which the bonding wire 941 is connected by wire bonding, to be connected to an external circuit (not illustrated) (wire bonding region B) are provided.

Note that, the one to be connected to the substrate 921 is not limited to the circuit board 931. A passive element may be connected, such as a chip capacitor, a chip resistor, or a wireless antenna. Furthermore, an IC or an active element may be connected, such as a power supply IC, a wireless transmission IC, or a semiconductor memory. Furthermore, an electronic board may be connected on which these passive elements, ICs, or active elements are mounted. These aspects are collectively referred to as a circuit board 931 in the present specification. The circuit board 931 described in the present specification may be any of these aspects or may include all of them.

In the structure illustrated in FIG. 50, the lens module 901, the image pickup device 1, and the circuit board 931 are layered in the longitudinal direction. Here, FIG. 51 illustrates a conventional structure for comparison.

Figure 51:
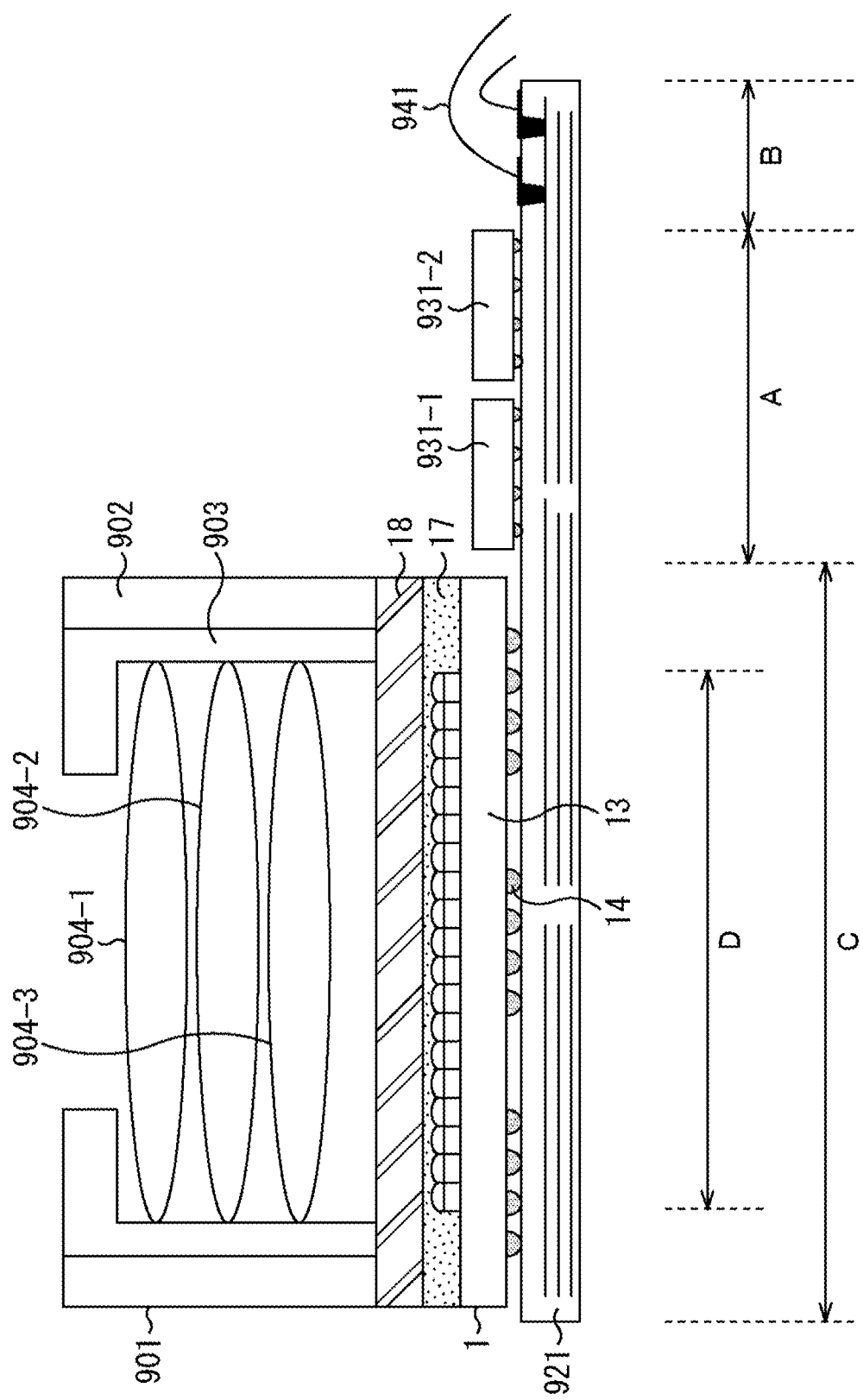
FIG. 51 is a diagram for explaining a configuration of the image pickup device connected to the lens module and the substrate.

The structure illustrated in FIG. 51 is the same as the structure illustrated in FIG. 50 in that the image pickup device 1 is provided on the lower side of the lens module 901 and is connected to the substrate 921 via the external terminal 14, but different in that the circuit board 931 and the bonding wire 941 are provided not on the lower side of the image pickup device 1 but on the same plane.

In the structure illustrated in FIG. 51, the circuit board 931-1, the circuit board 931-2, and the bonding wire 941 are connected to the side that is on the substrate 921 extended to the right side of the image pickup device 1 in the figure and on which the image pickup device 1 is loaded. In other words, the substrate 921 on which the image pickup device 1, the circuit board 931, and the bonding wire 941 are mounted includes the circuit board region A, the wire bonding region B, and a lens module region C. In the lens module region C, an image pickup device region D is included in which the image pickup device 1 is mounted.

In the structure illustrated in FIG. 51, the lens module region C, the circuit board region A, and the wire bonding region B are provided on a plane of the substrate 921. In contrast, in the structure illustrated in FIG. 50, it is sufficient that only the lens module region C is provided on the plane of the substrate 921.

Referring again to FIG. 50, in the lens module region C, the image pickup device region D is included. Furthermore, in the lens module region D, the circuit board region A and the wire bonding region B are also included. In other words, in the structure illustrated in FIG. 50, if there is a size equivalent to that of the lens module region C as viewed from the plane of the substrate 921, main components can be mounted, such as the lens module 901, the image pickup device 1, the circuit board 931, and the bonding wire 941.

As described above, by adopting the structure illustrated in FIG. 50, in other words, the structure in which the lens module 901, the image pickup device 1, and the circuit board 931 (the bonding wire 941) are layered, it is possible to downsize the plane area. As described above, by forming the structure in which the plane area is downsized, for example, it is possible to form a structure suitable for application to devices for which downsizing is desired, such as a capsule endoscope as described later.

<Second Structure>

Figure 52:
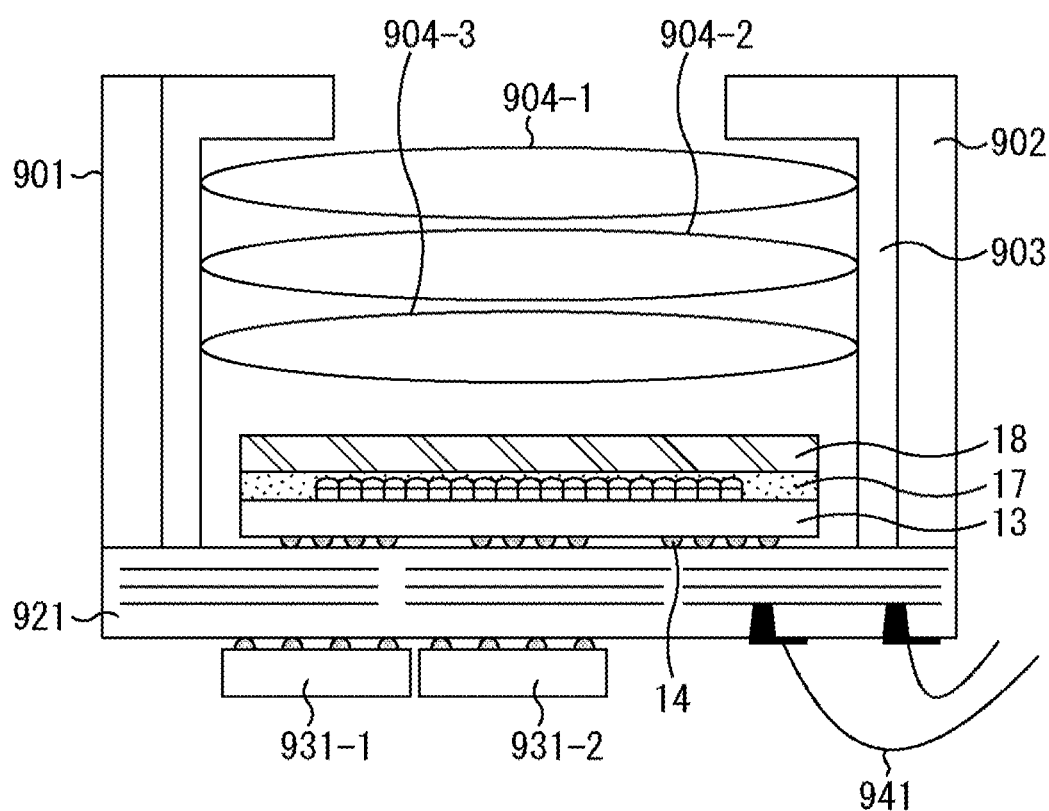
FIG. 52 is a diagram for explaining a configuration of the image pickup device connected to the lens module and the substrate.

FIG. 52 illustrates a second structure of the image pickup device 1 including the lens module. In the structure illustrated in FIG. 52, the lens module 901 is placed on the substrate 921. The structure illustrated in FIG. 50 is compared with the structure illustrated in FIG. 52. In the structure illustrated in FIG. 50, the lens module 901 (frame constituting a part of the lens module 901) is placed on the protective substrate 18 of the image pickup device 1, whereas in the structure illustrated in FIG. 52, the lens module 901 (frame constituting a part of the lens module 901) is placed on the substrate 921.

Also in the structure illustrated in FIG. 52, the image pickup device 1 is placed on the upper side of the substrate 921, and the circuit board 931 and the bonding wire 941 are connected to the lower side. As described above, the lens module 901 may be placed on the substrate 921 while surrounding the image pickup device 1.

Also in the structure illustrated in FIG. 52, it is sufficient that the plane area of the substrate 921 has a size substantially equivalent to that of the lens module region C, and the plane area can be downsized as compared with the structure illustrated in FIG. 51.

<Third Structure>

Figure 53:
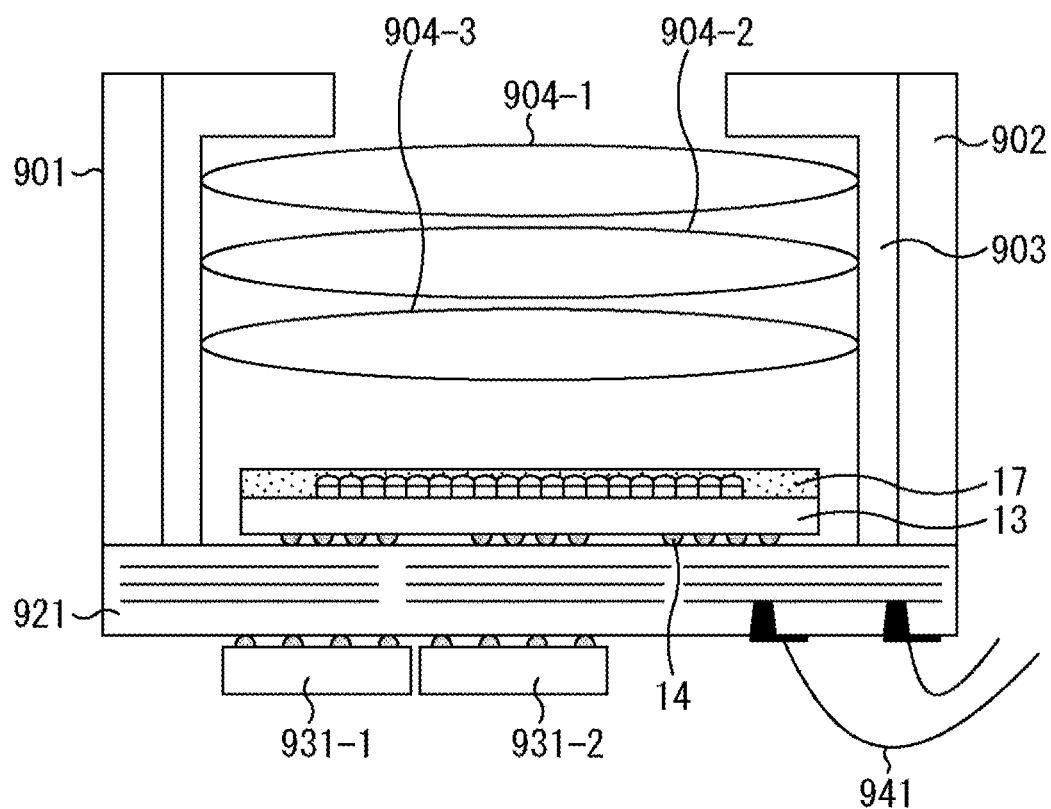
FIG. 53 is a diagram for explaining a configuration of the image pickup device connected to the lens module and the substrate.

FIG. 53 illustrates a third structure of the image pickup device 1 including the lens module. The structure illustrated in FIG. 53 has a structure in which the protective substrate 18 of the image pickup device 1 is not included. The structure illustrated in FIG. 52 is compared with the structure illustrated in FIG. 53. The image pickup device 1 in the structure illustrated in FIG. 53 differs from the image pickup device 1 illustrated in FIG. 52 in that the protective substrate 18 is removed, and the other portions are the same as each other.

The protective substrate 18 is provided to protect the on-chip lens 16 and the color filter 15. By adopting the structure in which the image pickup device 1 is surrounded by the lens module 901 and the substrate 921, the image pickup device 1 can be mounted in a space where influences from the outside can be blocked, and the on-chip lens 16 and the color filter 15 can be protected. Therefore, as illustrated in FIG. 53, the image pickup device 1 may have a structure in which the protective substrate 18 is not layered.

Also in the structure illustrated in FIG. 53, the image pickup device 1 is placed on the upper side of the substrate 921, and the circuit board 931 and the bonding wire 941 are connected to the lower side. As described above, the lens module 901 may be placed on the substrate 921 while surrounding the image pickup device 1.

Also in the structure illustrated in FIG. 53, it is sufficient that the plane area of the substrate 921 has a size substantially equivalent to that of the lens module region C, and the plane area can be downsized as compared with the structure illustrated in FIG. 51.

<Fourth Structure>

Figure 54:
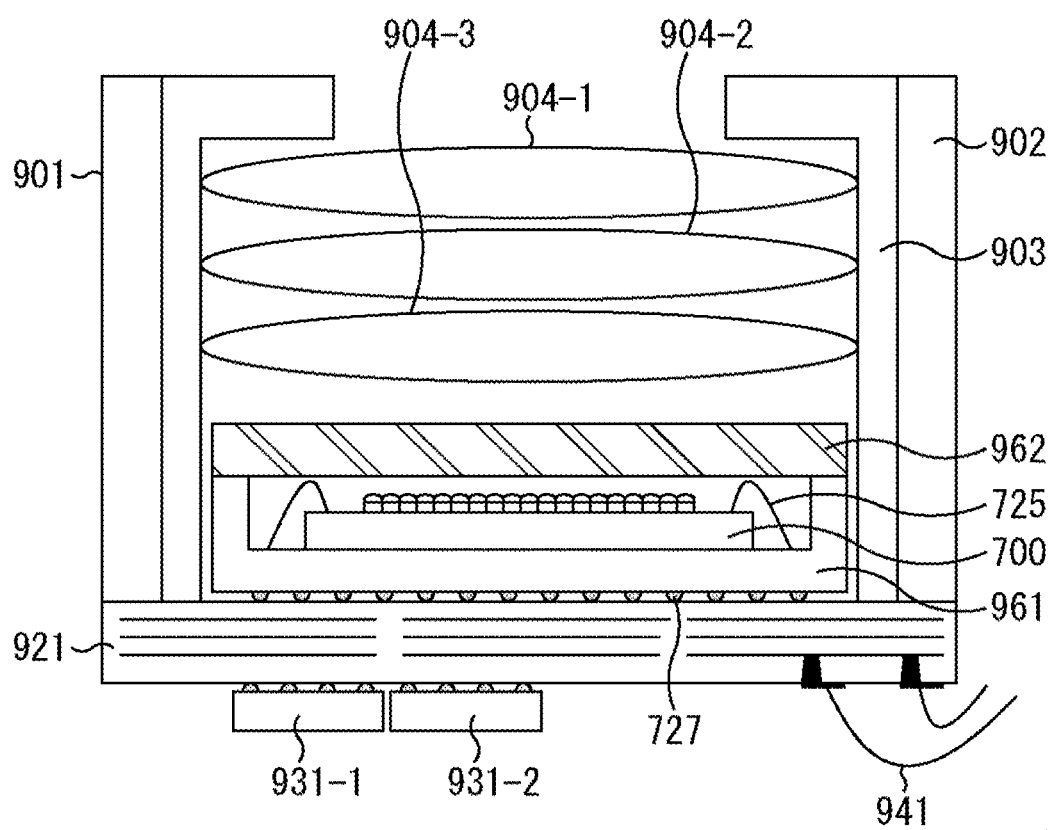
FIG. 54 is a diagram for explaining a configuration of the image pickup device connected to the lens module and the substrate.

FIG. 54 illustrates a fourth structure of the image pickup device including the lens module. Although the structures illustrated in FIGS. 50 to 53 have been described by taking as an example a case where the image pickup device 1 illustrated in FIG. 1 is used as the image pickup device 1, for example, regarding the structure in which the lens module 901, the image pickup device 1, and the circuit board 931 are layered and the plane area is downsized, its application is not limited to the image pickup device 1 illustrated in FIG. 1.

For example, as a modification of the image pickup device 1, the structure can be applied to the image pickup device 1 having the structure described with reference to FIGS. 44 to 47.

Furthermore, the image pickup device 600, the image pickup device 700, or the image pickup device 800 illustrated in FIGS. 9 to 11 can be used instead of the image pickup device 1. FIG. 54 illustrates an example structure in which the lens module 901 and the substrate 921 are layered on the image pickup device 700 illustrated in FIG. 10, for example.

As illustrated in FIG. 54, the image pickup device 700 is placed on a frame 961 and connected to the external terminal 727 provided on the bottom of the frame 961 via the bonding wire 725 by wire bonding.

A protective substrate 962 (for example, glass) is layered on the frame 961. As in the structure illustrated in FIG. 53, the lens module 901 is layered on the substrate 921.

Also in the structure illustrated in FIG. 54, it is sufficient that the plane area of the substrate 921 has a size substantially equivalent to that of the lens module region C, and the plane area can be downsized as compared with the structure illustrated in FIG. 51.

<Fifth Structure>

Figure 55:
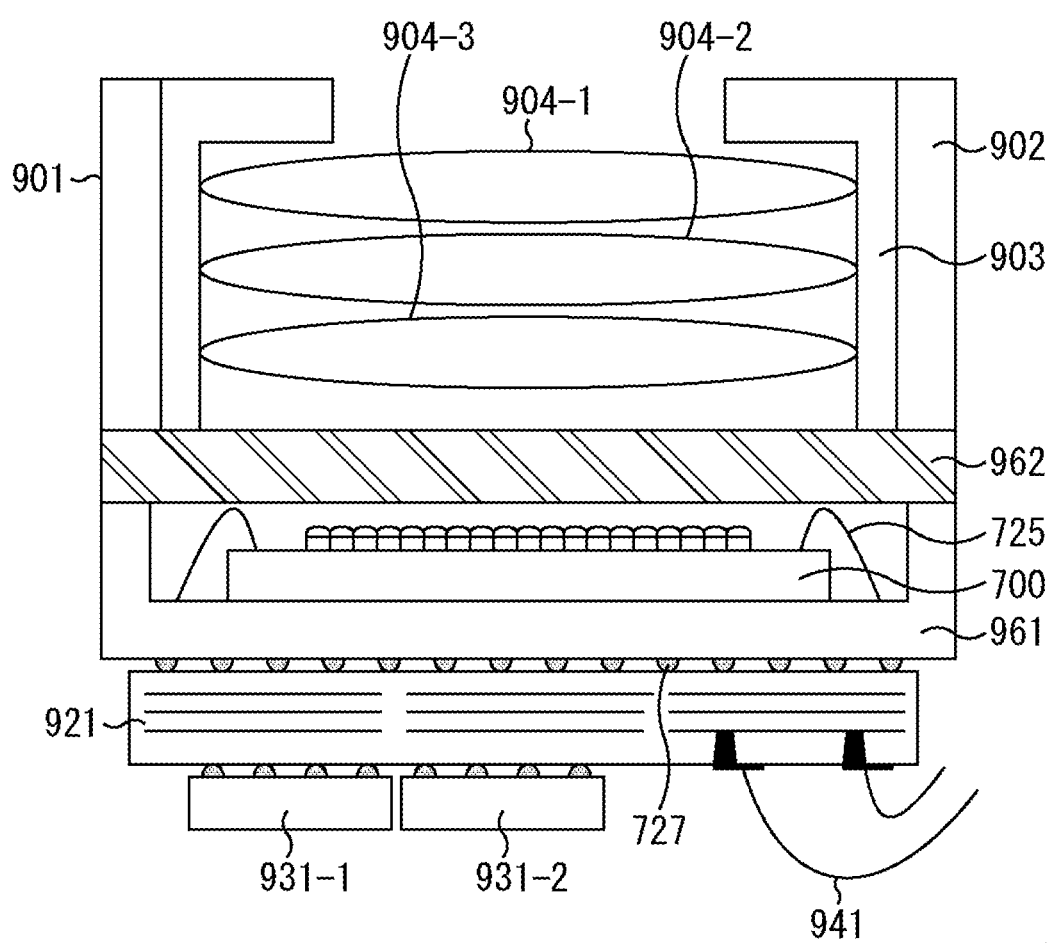
FIG. 55 is a diagram for explaining a configuration of the image pickup device connected to the lens module and the substrate.

FIG. 55 illustrates a fifth structure of the image pickup device including the lens module. As in the structure illustrated in FIG. 54, the structure illustrated in FIG. 55 has a structure in which the image pickup device 700 is loaded on the substrate 921, and the lens module 901 is layered on the protective substrate 962 provided on the frame 961.

Also in the case of the structure illustrated in FIG. 55, as in the case of the structure illustrated in FIG. 50, it is sufficient that the plane area of the substrate 921 has a size substantially equivalent to that of the lens module region C, and the plane area can be downsized as compared with the structure illustrated in FIG. 51.

<Sixth Structure>

Figure 56:
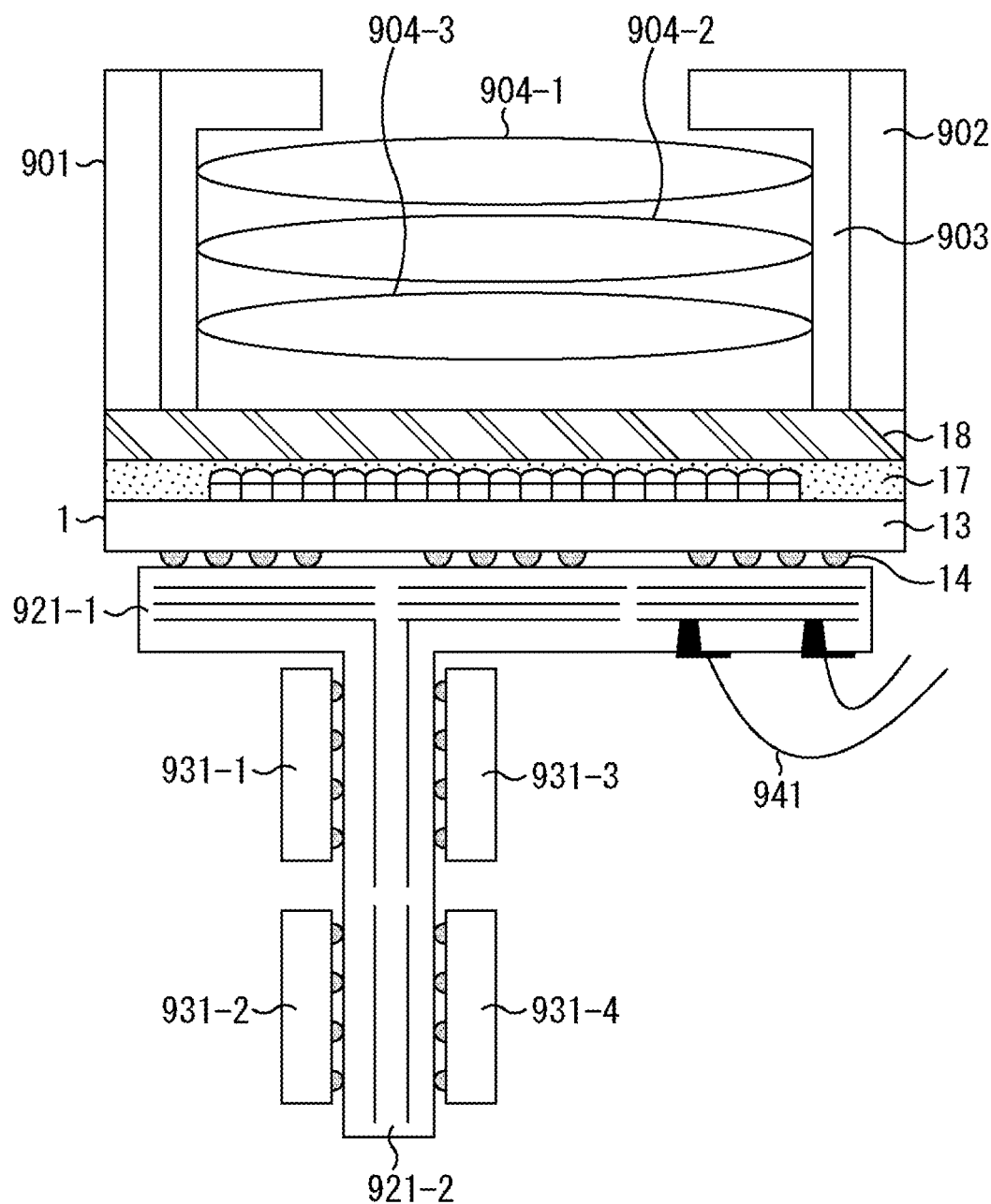
FIG. 56 is a diagram for explaining a configuration of the image pickup device connected to the lens module and the substrate.

FIG. 56 illustrates a sixth structure of the image pickup device including the lens module. The structure illustrated in FIG. 56 is different from the first to fifth structures in that the substrate 921 has a T shape. A substrate 921-1 is arranged in the lateral direction, and a substrate 921-2 is arranged in the longitudinal direction. In addition, the substrate 921-1 and the substrate 921-2 are substrates that are connected to intersect perpendicularly with each other.

To the substrate 921-2 arranged in the longitudinal direction, the circuit boards 931-1 to 931-4 are connected. On the upper side of the substrate 921-1, the image pickup device 1 and the lens module 901 are layered having the structure illustrated in FIG. 50. Note that, in FIG. 56, the first structure illustrated in FIG. 50 is exemplified, but the structure from the lens module 901 to the substrate 921-1 may be the second structure illustrated in FIG. 52, the third structure illustrated in FIG. 53, the fourth structure illustrated in FIG. 54, or the fifth structure illustrated in FIG. 55.

Note that, in the example illustrated in FIG. 56, as an example, a case has been described where the number of the substrates 921-2 arranged in the longitudinal direction is one, but many substrates 921, such as two, three, can be connected to the substrate 921-1 arranged in the lateral direction.

As illustrated in FIG. 56, by forming the substrate 921 into a three-dimensional configuration such as a T-shape, it is possible to connect more circuit boards 931. Furthermore, also in the case of the structure illustrated in FIG. 56, as in the structures of FIGS. 1 to 5, it is sufficient that the plane area of the substrate 921 has a size substantially equivalent to that of the lens module region C, and the plane area can be downsized as compared with the structure illustrated in FIG. 51.

<15. Configuration of Capsule Endoscope>

Here, an example will be described of a device suitable for applying the image pickup device with the lens module whose plane area is downsized as described with reference to FIGS. 50 to 56.

The technology according to the present disclosure can be applied to various products. For example, the technology according to the present disclosure may be applied to a patient's in-vivo information acquiring system using a capsule endoscope.

Figure 57:
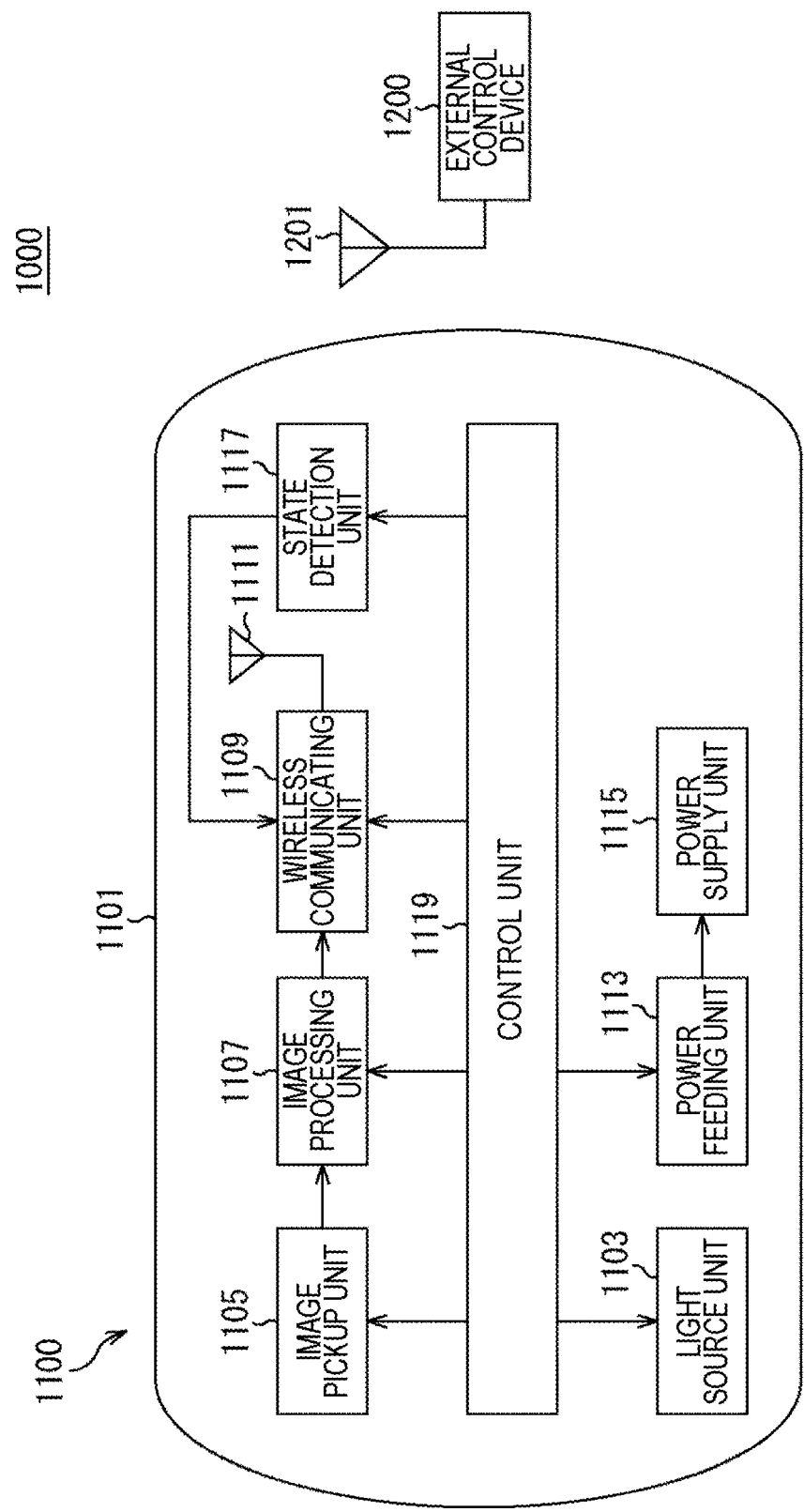
FIG. 57 is a diagram for explaining a configuration of a capsule endoscope.

FIG. 57 is a diagram illustrating an example of a schematic configuration of an in-vivo information acquiring system 1000 to which the technology according to the present disclosure can be applied. Referring to FIG. 57, the in-vivo information acquiring system 1000 includes a capsule endoscope 1100, and an external control device 1200 that comprehensively controls operation of the in-vivo information acquiring system 1000. At the time of examination, the capsule endoscope 1100 is swallowed by the patient.

The capsule endoscope 1100 has an image pickup function and a wireless communication function, and moves until being naturally discharged from the patient while moving inside the internal organs such as the stomach and the intestines by peristaltic movement or the like, sequentially captures images inside the internal organs (hereinafter, also referred to as in-vivo images) at predetermined intervals, and sequentially transmits information on the in-vivo image wirelessly to the external control device 1200 outside the body. The external control device 1200 generates image data for displaying the in-vivo image on a display device (not illustrated) on the basis of the received information on the in-vivo image.

In the in-vivo information acquiring system 1000, in this way, it is possible to obtain the captured image of the inside of the patient's body at any time from the time when the capsule endoscope 1100 is swallowed until it is discharged.

Configurations and functions of the capsule endoscope 1100 and the external control device 1200 will be described in more detail. As illustrated, the capsule endoscope 1100 includes, in a capsule type housing 1101, functions of a light source unit 1103, an image pickup unit 1105, an image processing unit 1107, a wireless communication unit 1109, a power feeding unit 1113, a power supply unit 1115, a state detection unit 1117, and a control unit 1119.

The light source unit 1103 includes a light source, for example, a light emitting diode (LED) or the like, and emits light to an image pickup field of the image pickup unit 1105.

The image pickup unit 1105 includes an image pickup element and an optical system including a plurality of lenses provided in front of the image pickup element. Reflected light (hereinafter referred to as observation light) of the light emitted to body tissue as an observation target is collected by the optical system and is incident on the image pickup element. The image pickup element receives the observation light and performs photoelectric conversion, thereby generating an electric signal corresponding to the observation light, that is, an image signal corresponding to the observation image. The image signal generated by the image pickup unit 1105 is provided to the image processing unit 1107.

Note that, as the image pickup element of the image pickup unit 1105, various known image pickup elements may be used, such as a complementary metal oxide semiconductor (CMOS) image sensor, or a charge coupled device (CCD) image sensor.

The image processing unit 1107 includes a processor such as a central processing unit (CPU), or a graphics processing unit (GPU), and performs various types of signal processing on the image signal generated by the image pickup unit 1105. The signal processing may be minimum processing for transmitting the image signal to the external control device 1200 (for example, image data compression, frame rate conversion, data rate conversion and/or format conversion, and the like). The image processing unit 1107 is configured to perform only the minimum processing required, whereby the image processing unit 1107 can be implemented to be smaller and have lower power consumption, which is suitable for the capsule endoscope 1100.

Furthermore, by forming the image pickup unit 1105 and the image processing unit 1107 to have structures as illustrated in FIGS. 50 to 56 (except for FIG. 51), the plane area can be downsized, which is suitable for the capsule endoscope 1100.

In other words, for example, the image pickup device 1 and the lens module 901 illustrated in FIG. 50 can be applied as the image pickup unit 1105, and the circuit board 931 can be applied as the image processing unit 1107.

In FIG. 57, in a case where the left-right direction is a direction in which the capsule endoscope 1100 moves, it is obvious that the smaller the size (width) in the vertical direction, the more the burden on the patient is reduced. In a case where the image pickup device 1 illustrated in FIG. 50 is mounted on such a capsule endoscope 1100, an opening of the lens module 901 is provided in the left-right direction, and for example, in FIG. 57, in the left side in the figure.

Therefore, the size in the vertical direction of the capsule endoscope 1100 decreases accordingly as the plane area decreases of the substrate 921 on which the image pickup device 1 is placed. As described above, for example, in the image pickup device 1 illustrated in FIG. 50, since the plane area of the substrate 921 can be downsized, the image pickup device 1 can be obtained suitable for application to the capsule endoscope 1100 or the like.

Note that, if there is a margin in the space in the housing 1101 and power consumption, further signal processing (for example, noise removal processing, another image quality improvement processing, and the like) may be performed in the image processing unit 1107. The image processing unit 1107 provides the image signal subjected to the signal processing to the wireless communication unit 1109 as RAW data. Note that, in a case where the information on a state (movement, orientation, and the like) of the capsule endoscope 1100 is acquired by the state detection unit 1117, the wireless communication unit 1109 may provide the image signal to the wireless communication unit 1109 in association with the information. As a result, a position in the body in which the image is captured, an image pickup direction of the image, and the like can be associated with the captured image.

The wireless communication unit 1109 includes a communication device capable of transmitting/receiving various types of information to/from the external control device 1200. The communication device includes an antenna 1111, a processing circuit that performs modulation processing and the like for transmitting/receiving signals, and the like. The wireless communication unit 1109 performs predetermined processing such as modulation processing on the image signal subjected to signal processing by the image processing unit 1107, and transmits the image signal to the external control device 1200 via the antenna 1111. Furthermore, the wireless communication unit 1109 receives a control signal related to drive control of the capsule endoscope 1100 from the external control device 1200 via the antenna 1111. The wireless communication unit 1109 provides the received control signal to the control unit 1119.

The power feeding unit 1113 includes an antenna coil for power reception, a power regeneration circuit for regenerating power from a current generated in the antenna coil, a booster circuit, and the like. In the power feeding unit 1113, the power is generated using the principle of so-called non-contact charging. Specifically, a magnetic field (electromagnetic wave) of a predetermined frequency is given to the antenna coil of the power feeding unit 1113 from the outside, whereby induced electromotive force is generated in the antenna coil.

The electromagnetic wave may be a carrier wave transmitted from the external control device 1200 via an antenna 1201, for example. The power is regenerated from the induced electromotive force by the power regeneration circuit, and its potential is appropriately adjusted in the booster circuit, whereby power for storage is generated. The power generated by the power feeding unit 1113 is stored in the power supply unit 1115.

The power supply unit 1115 includes a secondary battery, and stores the power generated by the power feeding unit 1113. In FIG. 57, for avoiding complication of the drawing, illustration of an arrow or the like indicating a supply destination of the power from the power supply unit 1115 is omitted; however, the power stored in the power supply unit 1115 is supplied to the light source unit 1103, the image pickup unit 1105, the image processing unit 1107, the wireless communication unit 1109, the state detection unit 1117, and the control unit 1119, and can be used for driving these units.

The state detection unit 1117 includes a sensor for detecting a state of the capsule endoscope 1100, such as an acceleration sensor and/or a gyro sensor. The state detection unit 1117 can acquire information on the state of the capsule endoscope 1100 from a detection result by the sensor. The state detection unit 1117 provides the acquired information on the state of the capsule endoscope 1100 to the image processing unit 1107. In the image processing unit 1107, as described above, the information on the state of the capsule endoscope 1100 can be associated with the image signal.

The control unit 1119 includes a processor such as a CPU, and comprehensively controls operation of the capsule endoscope 1100 by operating in accordance with a predetermined program. The control unit 1119 appropriately controls drive of the light source unit 1103, the image pickup unit 1105, the image processing unit 1107, the wireless communication unit 1109, the power feeding unit 1113, the power supply unit 1115, and the state detection unit 1117 in accordance with the control signal transmitted from the external control device 1200, thereby implementing the functions in the units as described above.

The external control device 1200 can be a processor such as a CPU, or a GPU, or a microprocessor, a control board, or the like on which the processor and a memory element such as a memory are mixedly mounted. The external control device 1200 includes the antenna 1201, and is enabled to transmit/receive various types of information to/from the capsule endoscope 1100 via the antenna 1201.

Specifically, the external control device 1200 transmits the control signal to the control unit 1119 of the capsule endoscope 1100, thereby controlling the operation of the capsule endoscope 1100. For example, by the control signal from the external control device 1200, a light emission condition can be changed with respect to the observation target, in the light source unit 1103. Furthermore, by the control signal from the external control device 1200, an image pickup condition (for example, a frame rate, an exposure value, and the like in the image pickup unit 1105) can be changed. Furthermore, by the control signal from the external control device 1200, details of processing in the image processing unit 1107, and conditions under which the wireless communication unit 1109 transmits the image signal (for example, a transmission interval, the number of transmitted images, and the like) may be changed.

Furthermore, the external control device 1200 performs various types of image processing to the image signal transmitted from the capsule endoscope 1100, and generates image data for displaying the captured in-vivo image on the display device. As the image processing, various types of known signal processing may be performed, for example, development processing (demosaic processing), image quality improvement processing (band enhancement processing, super resolution processing, noise reduction (NR) processing and/or camera shake correction processing, and the like) and/or enlargement processing (electronic zoom processing), and the like.

The external control device 1200 controls drive of the display device (not illustrated) to display the captured in-vivo image on the basis of the generated image data. Alternatively, the external control device 1200 may cause a recording device (not illustrated) to record the generated image data, or cause a printing device (not illustrated) to print out the generated image data.

In the above, an example has been described of the in-vivo information acquiring system 1000 to which the technology according to the present disclosure can be applied. By forming the image pickup unit 1105 and the image processing unit 1107 to have structures as illustrated in FIGS. 50 to 56 (excluding FIG. 51), the plane area can be downsized, and the capsule endoscope 1100 itself can be downsized. Furthermore, by applying the image pickup device 1, the package size itself can be downsized, and the capsule endoscope 1100 itself can be downsized. Downsizing becomes possible in this way, so that the burden on the patient can be further reduced.

<16. Method of Manufacturing Image Pickup Device with Lens Module>

Figure 58:
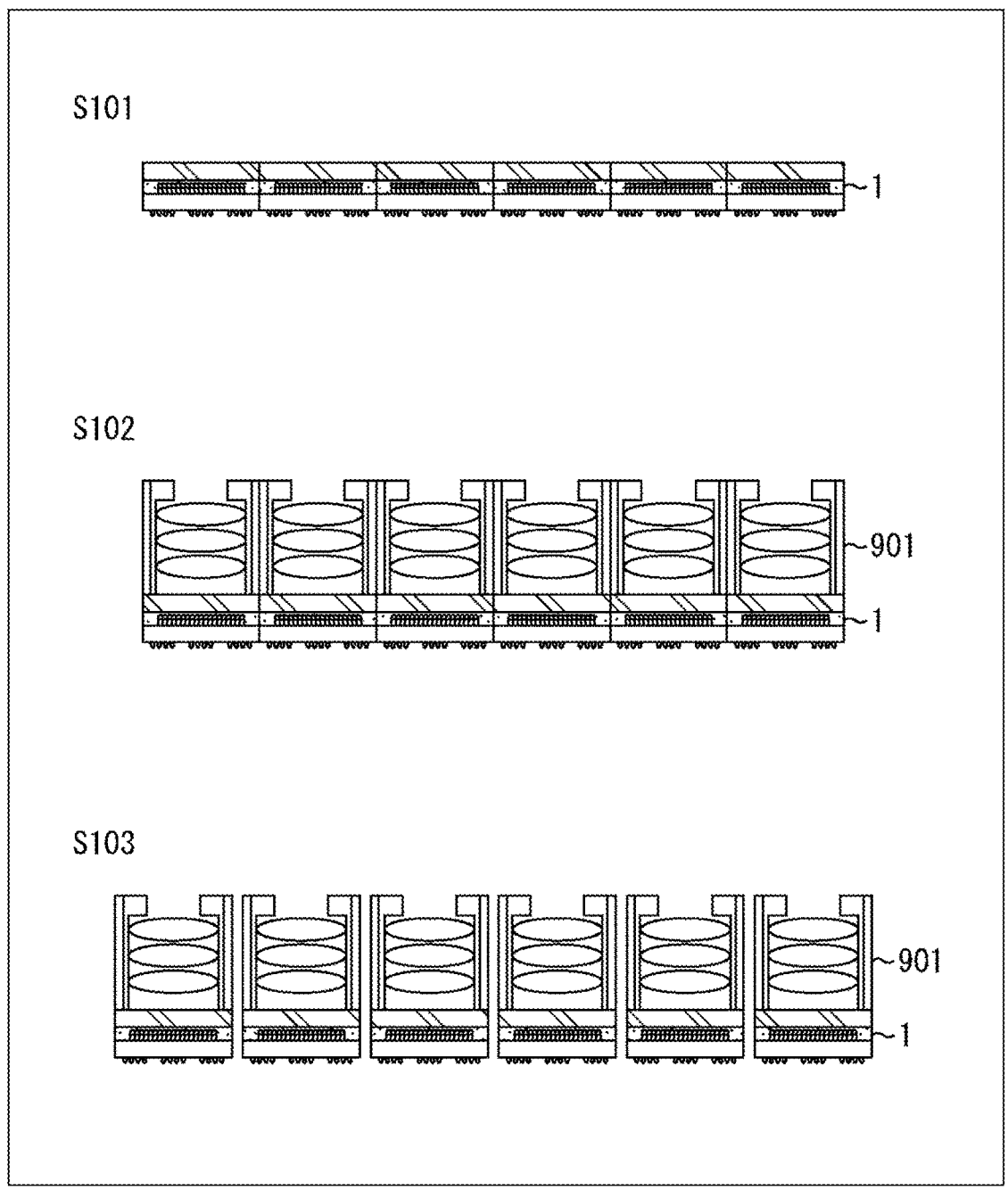
FIG. 58 is a diagram for explaining a step of connecting the lens module and the substrate to the image pickup device.
Figure 59:
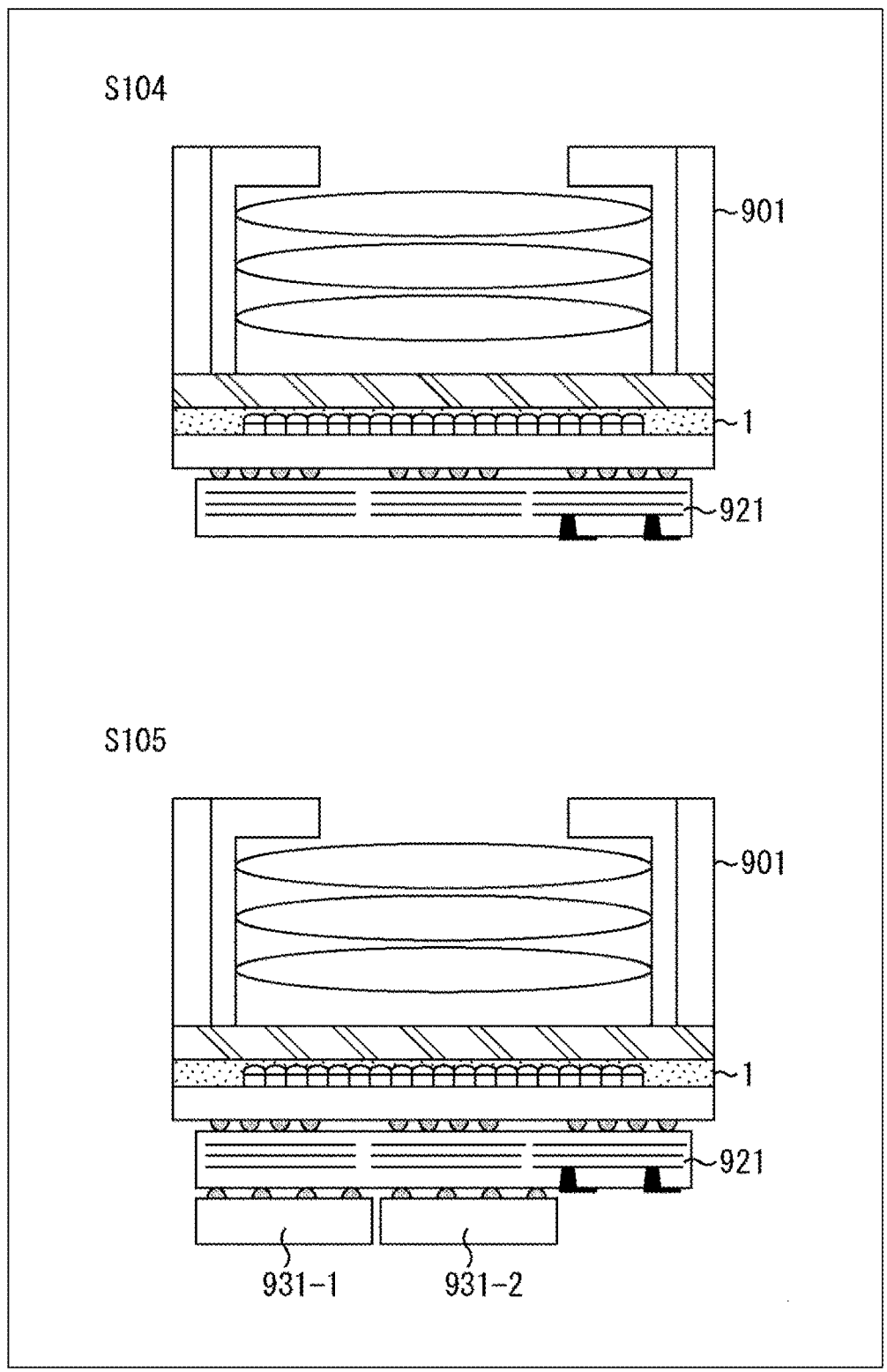
FIG. 59 is a diagram for explaining the step of connecting the lens module and the substrate to the image pickup device.

A method will be described of manufacturing the image pickup device with the lens module 901 illustrated in FIGS. 50 to 56 (excluding FIG. 51), with reference to FIGS. 58 and 59.

In step S101, as described above (with reference to FIGS. 24 to 43), the image pickup device 1 is manufactured in a wafer state. In step S102, the lens module 901 is loaded on the image pickup device 1. The lens module 901 is also manufactured in a wafer state.

In step S103, individualization is performed. By the individualization, the image pickup device 1 is manufactured on which the lens module 901 is layered. Moreover, in step S104 (FIG. 59), the substrate 921 is connected to the image pickup device 1.

Here, an example has been described in which the individualization is performed in step S103, and then the substrate 921 is layered in step S104, but this flow can be interchanged. The substrate 921 may be layered on the image pickup device 1 in a wafer state in step S103, and then the individualization may be performed in step S104.

In step S105, the circuit board 931 is further connected to the substrate 921 of the image pickup device 1 individualized.

Here, an example has been described in which the circuit board 931 is layered in step S105 after the individualization, but this flow can be interchanged. The substrate 921 may layered on the image pickup device 1 in a wafer state in step S103, the circuit board 931 may be further layered in step S104, and the individualization may be performed in step S105.

In this way, the image pickup device 1 is manufactured including the lens module 901 as illustrated in FIG. 50.

Thereafter, if necessary, the bonding wire 941 is connected to the image pickup device 1, and connected to an external circuit.

<17. About Compound Eye Form>

Figure 60:
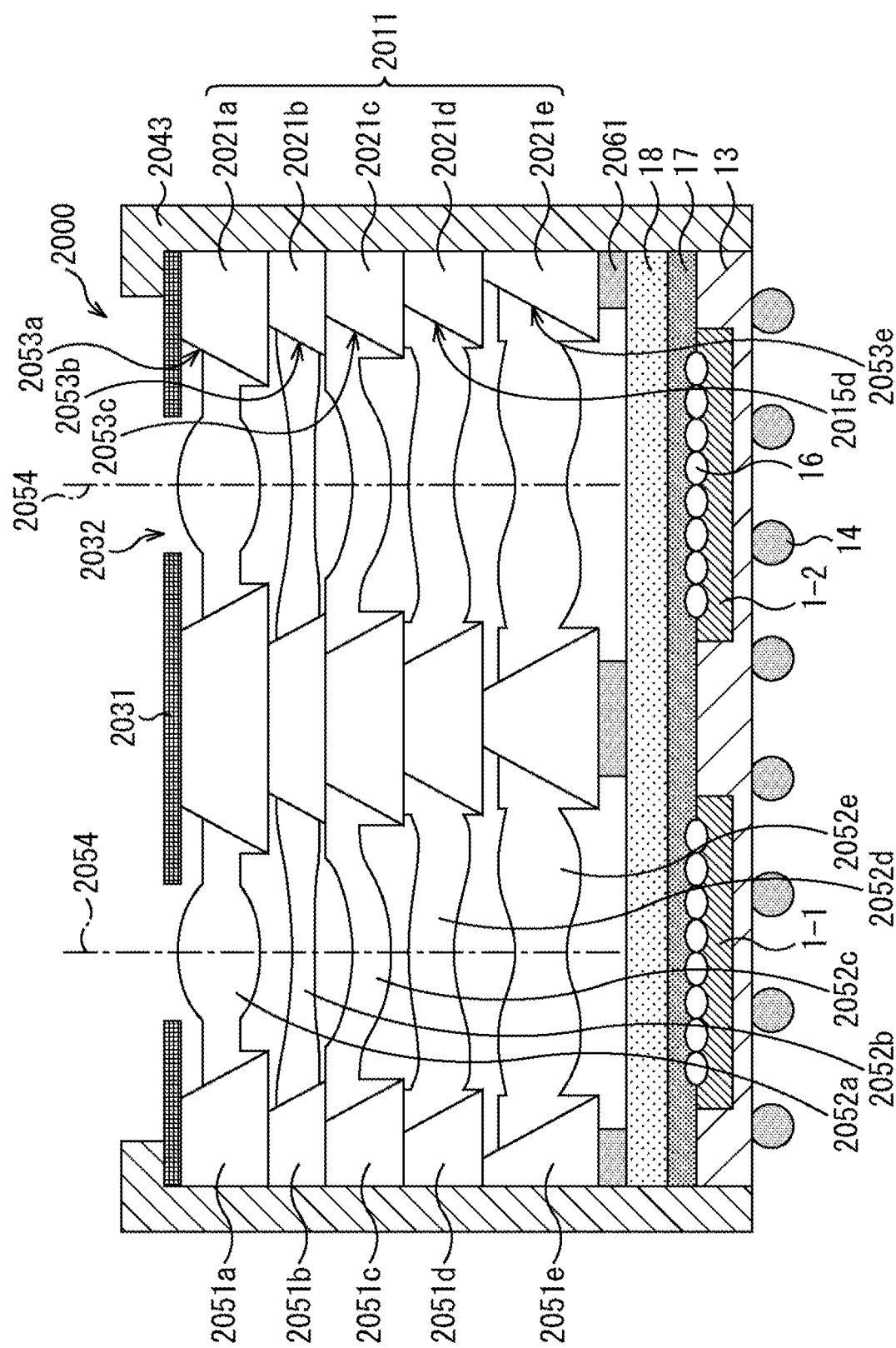
FIG. 60 is a diagram for explaining a configuration of a camera module.

Next, a compound eye form using the image pickup device 1 will be described. FIG. 60 is a diagram illustrating a form of a camera module using a layered lens structural body.

A camera module 2000 illustrated in FIG. 60 includes a layered lens structural body 2011 in which a plurality of lens-attached substrates 2021a to 2021e is layered, and a layered structural body 13. The layered lens structural body 2011 includes a plurality of optical units. A one-dot chain line 2054 represents an optical axis of each optical unit. The layered structural body 13 is arranged on the lower side of the layered lens structural body 2011. In the camera module 2000, light entering the camera module 2000 from above is transmitted through the layered lens structural body 2011, and received by the layered structural body 13 arranged on the lower side of the layered lens structural body 2011.

The layered lens structural body 2011 includes five lens-attached substrates 2021a to 2021e layered. In a case where the five lens-attached substrates 2021a to 2021e are not particularly distinguished, they are simply described as a lens-attached substrate 2021.

A cross-sectional shape of a through hole 2053 of each lens-attached substrate 2021 constituting the layered lens structural body 2011 has a so-called downwardly narrowing shape in which the opening width decreases toward the lower side (side where the layered structural body 13 is arranged).

A diaphragm plate 2031 is arranged on the layered lens structural body 2011. The diaphragm plate 2031 includes a layer including a material having light absorption property or light shielding property, for example. The diaphragm plate 2031 is provided with an opening 2032.

The layered structural body 13 includes, for example, a surface illuminated or backside illuminated complementary metal oxide semiconductor (CMOS) image sensor. The on-chip lens 16 is formed on the upper surface of the layered structural body 13 on the layered lens structural body 2011 side, and the external terminal 14 that inputs/outputs a signal is formed on the lower surface of the layered structural body 13.

The layered lens structural body 2011, the layered structural body 13, the diaphragm plate 2031, and the like are housed in a lens barrel 2043.

In the present embodiment, the layered lens structural body 2011 includes five lens-attached substrates 2021a to 2021e layered, but there is no particular limitation as long as the number of layered lens-attached substrates 2021 is two or more.

Each of the lens-attached substrates 2021 constituting the layered lens structural body 2011 includes a carrier substrate 2051 to which a lens resin portion 2052 is added. The carrier substrate 2051 includes the through hole 2053, and the lens resin portion 2052 is formed inside the through hole 2053.

Note that, in a case where the carrier substrate 2051, the lens resin portion 2052, the through hole 2053, and the carrier substrate 2051 of each of the lens-attached substrates 2021a to 2021e are distinguished, as illustrated in FIG. 13, in correspondence with the lens-attached substrates 2021a to 2021e, they are denoted as the carrier substrates 2051a to 2051e, the lens resin portions 2052a to 2052e, the through holes 2053a to 2053e and will be described.

On the upper side of the layered structural body 13, the glass seal resin 17 having optical transparency is arranged.

The layered structural body 13 and the protective substrate 18 are fixed via the glass seal resin 17.

On the upper side of the protective substrate 18, a structural material 2061 is arranged. The protective substrate 18 and the layered lens structural body 2011 are fixed via the structural material 2061. The structural material 2061 is, for example, an epoxy resin.

The glass seal resin 17 is arranged on the entire upper surface of the layered structural body 13. The layered structural body 13 and the protective substrate 18 are fixed via the glass seal resin 17. In a case where stress is applied to the protective substrate 18 from above the protective substrate 18, the glass seal resin 17 arranged on the entire upper surface of the layered structural body 13 provides a function or an effect to prevent the stress from being concentratedly applied to a partial region of the layered structural body 13 and to disperse and receive the stress on the entire surface of the layered structural body 13.

On the upper side of the protective substrate 18, the structural material 2061 is arranged. The protective substrate 18 and the layered lens structural body 2011 are fixed via the structural material 2061.

In the description in FIG. 60 and the following figures, in the figure, a portion including the layered structural body 13 and the like positioned on the left side is referred to as an image pickup device 1-1, and a portion including the layered structural body 13 and the like positioned on the right side is referred to as an image pickup device 1-2.

The camera module 2000 having a configuration as illustrated in FIG. 60 can include a total of four optical units (image pickup devices 1), two in each of the longitudinal and lateral directions, on an incident surface of light as illustrated in A of FIG. 61. In the four optical units, the shapes of the lenses are the same as each other and the sizes of the openings 2032 of the diaphragm plates 2031 are the same as each other.

In the camera module 2000, optical axes included in respective two optical units extend in the same direction, the two optical units being arranged for each of the longitudinal direction and the lateral direction of the incident surface of the light. The camera module 2000 having such a structure is suitable for photographing an image having a higher resolution as compared to photographing with one optical unit by using a super resolution technology.

In the camera module 2000, for each of the longitudinal direction and the lateral direction, images are photographed by (a light receiving element included in) a plurality of the layered structural bodies 13 respectively arranged at different positions while their optical axes are oriented in the same direction, or images are photographed by light receiving pixels in respective different regions of one light receiving element, whereby it is possible to obtain a plurality of images that are not always the same while the optical axes are oriented in the same direction. An image with high resolution can be obtained by combining the image data for each location included in the plurality of images that are not identical to each other.

The camera module 2000 can also be configured as illustrated in B of FIG. 61. The configuration illustrated in B of FIG. 61 includes a total of four optical units (image pickup devices 1), two in each of the longitudinal and lateral directions, on the incident surface of the light. In the four optical units, the shapes of the lenses are the same as each other.

The four optical units each include the diaphragm plate 2031 on the uppermost layer of the layered lens structural body 2011, but the size of the opening 2032 of the diaphragm plate 2031 differs among the four optical units. As a result, the camera module 2000 can implement the following camera module 2000, for example.

In other words, for example, in a monitoring camera for crime prevention, in the camera module 2000 using the layered structural body 13 including light receiving pixels respectively provided with three types of color filters of R, G, and B and receiving three types of light of R, G, and B for monitoring a color image in the daytime, and a light receiving pixel not provided with color filters for R, G, and B for monitoring a black and white image in the nighttime, it is possible to increase the size of the aperture of the diaphragm for only the pixel for photographing the nighttime black and white image with low illuminance.

<18. Camera Module Including Transmittance Attenuation Layer>

Furthermore, it is also possible to adopt a configuration in which the camera module 2000 includes a pixel for high illuminance and a pixel for low illuminance, and performs image pickup of enlarged dynamic range by using a signal obtained by the pixel for high illuminance and a signal obtained by the pixel for low illuminance.

For example, a pixel A (pixel for low illuminance) and a pixel B (pixel for high illuminance) are included, in which a proper operation limit of a signal generation means (for example, photodiode) included in the pixel is higher (for example, saturation charge amount is greater) in the pixel B than in the pixel A, and the size of a generated signal conversion means (for example, charge-voltage conversion capacity) included in the pixel is greater in the pixel B than in the pixel A.

With these configurations, in the pixel B, since the output signal in a case where a certain amount of signal (for example, charge) is generated per unit time is suppressed to be smaller than in the pixel A, and the saturation charge amount is greater, for example, there is an effect that the pixel does not reach the operation limit even in a case where the illuminance of the subject is high, whereby an image having high gradation can be obtained.

On the other hand, in the pixel A, in a case where a certain amount of signal (for example, charge) is generated per unit time, the output signal greater than that of the pixel B can be obtained, so that, for example, there is an effect that an image having high gradation can be obtained even in a case where the illuminance of the subject is low.

Since the pixel A and the pixel B are included as described above, there is an effect that an image having high gradation can be obtained over a wide illuminance range, that is, an image having a so-called wide dynamic range can be obtained.

Figure 62:
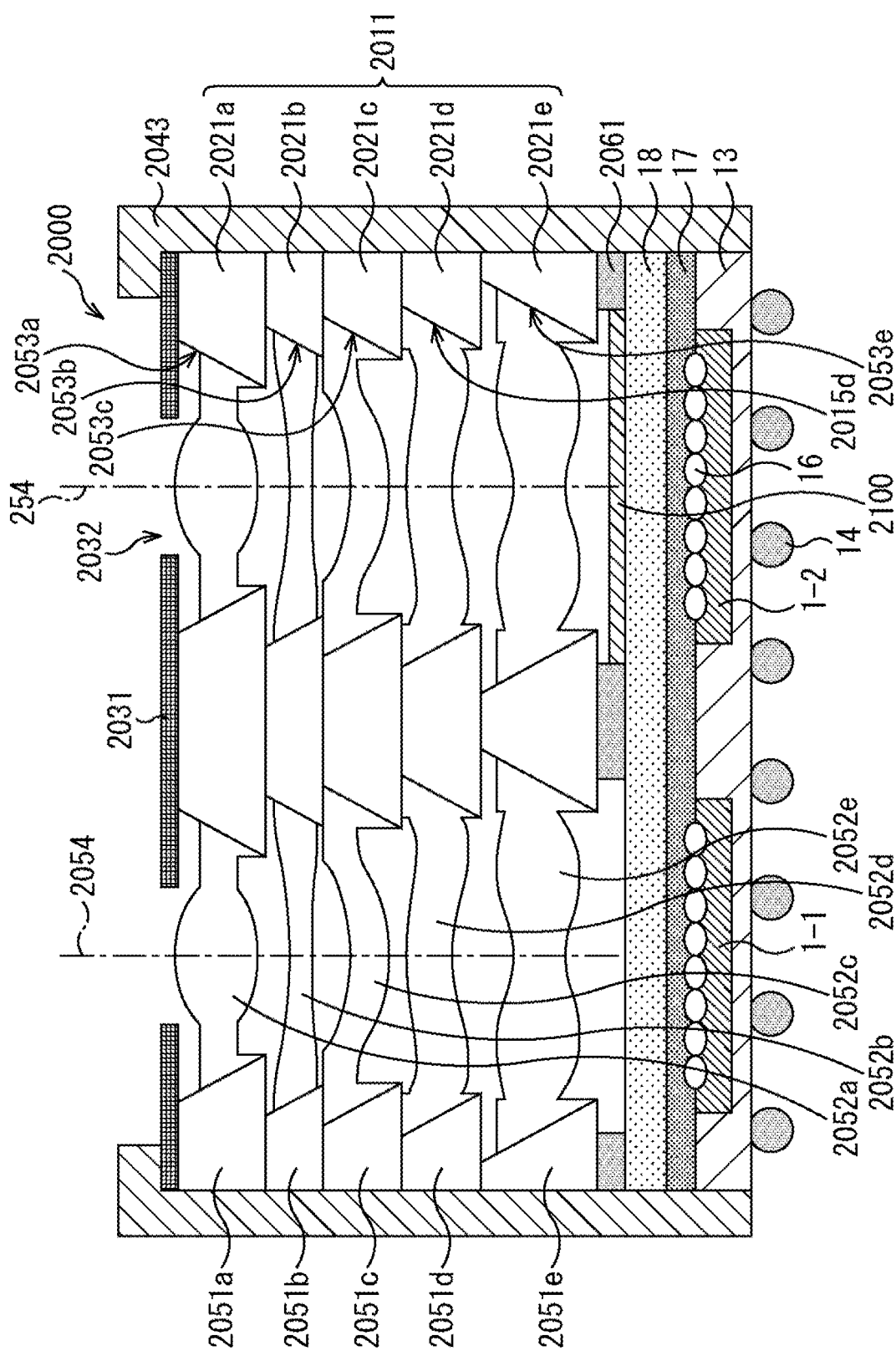
FIG. 62 is a diagram for explaining the configuration of the camera module.

As described above, in a case where the pixel for high illuminance and the pixel for low illuminance are included, although the pixel for high illuminance and the pixel for low illuminance can be implemented by making the sizes of the apertures of the diaphragm different from each other as illustrated in B of FIG. 61, the pixels can also be implemented by providing a layer that attenuates transmittance of incident light as illustrated in FIG. 62.

Since the camera module 2000 illustrated in FIG. 62 basically has a configuration similar to that of the camera module 2000 illustrated in FIG. 60, similar portions are denoted by similar reference numerals and description thereof will be omitted. Difference form the camera module 2000 illustrated in FIG. 60 is that a transmittance attenuation layer 2100 is formed on the protective substrate 18 of the image pickup device 1-2 of the camera module 2000 illustrated in FIG. 62, and other portions are the same as each other.

Note that, here, as illustrated in FIG. 62, an example configuration will be described in which in a device (camera module 2000) including two image pickup devices 1, one of the image pickup devices 1 includes the transmittance attenuation layer 2000 and the other does not include the transmittance attenuation layer 2000; however, the present technology is not limited only to such a configuration.

For example, the present technology may be applied to a device including one image pickup device 1 to include a transmittance attenuation layer 2000. Furthermore, it may also be applied to a device including the plurality of image pickup devices 1 to include the transmittance attenuation layer 2000 for a predetermined number of the image pickup devices 1.

Figure 63:
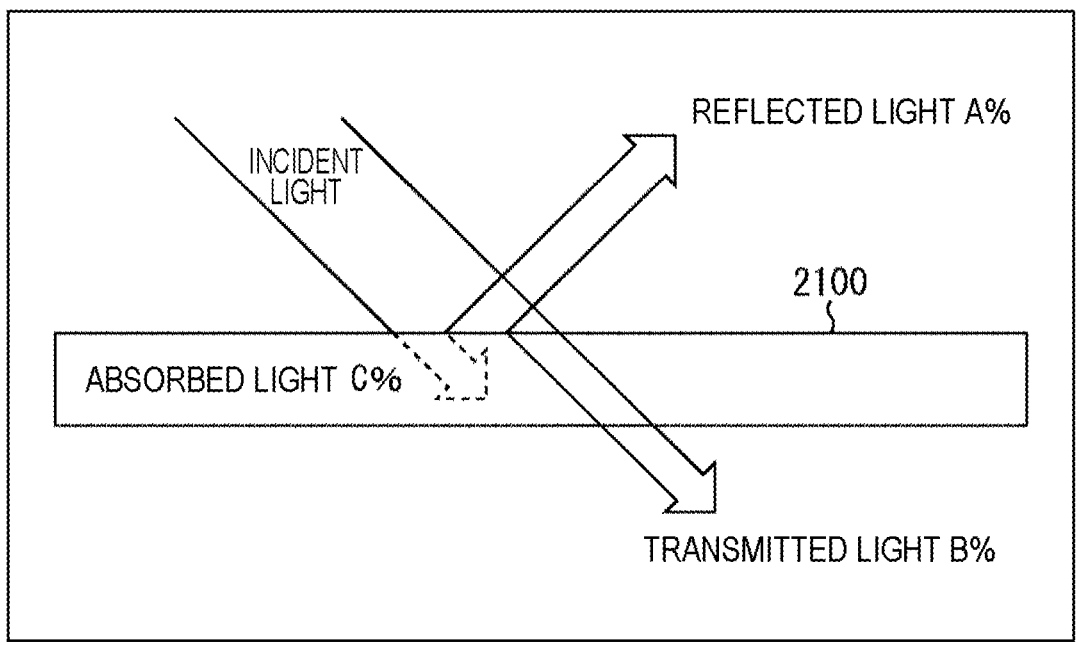
FIG. 63 is a diagram for explaining transmittance.

The transmittance attenuation layer 2100 is a layer that attenuates the transmittance of light incident thereon. The transmittance will be described with reference to FIG. 63. Out of the light incident on the transmittance attenuation layer 2100, A % of the light is reflected by the transmittance attenuation layer 2100, and B % of the light is transmitted through the transmittance attenuation layer 2100. Furthermore, out of the light incident on the transmittance attenuation layer 2100, C % of the light is absorbed by the transmittance attenuation layer 2100.

In other words, out of the light incident on the transmittance attenuation layer 2100, A % of the light is reflected light, B % is transmitted light, and C % is absorbed light. Note that, A+B+C=100%. The transmittance attenuation layer 2100 attenuates the ratio (transmittance) of transmitted light. In order to attenuate the transmittance, the ratio of reflected light may be increased, or the ratio of absorbed light may be increased.

In other words, the transmittance attenuation layer 2100 is formed on the image pickup device 1-2 to make the reflectance of greater than or equal to 0% and/or the absorptance of greater than or equal to 0%. The transmittance attenuation layer 2100 is a layer including a material for increasing the ratio of reflected light and a material for increasing the ratio of absorbed light.

Figure 64:
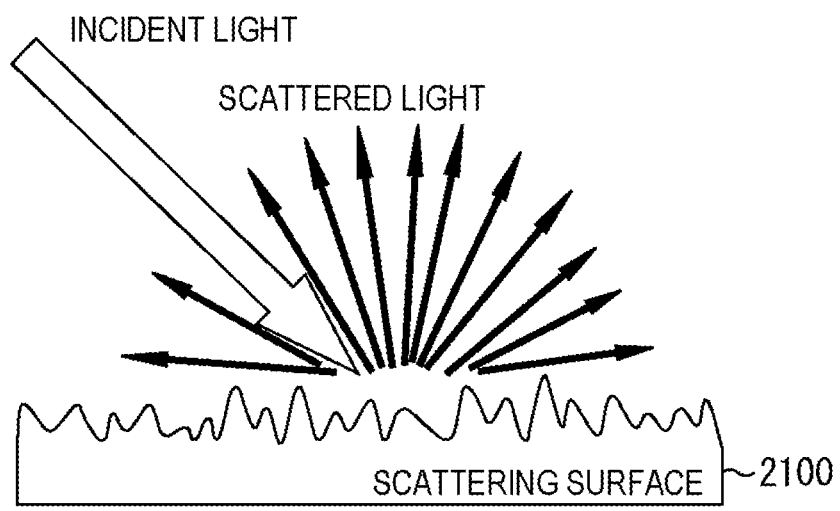
FIG. 64 is a diagram for explaining a scattering surface.

In order to increase the ratio of reflected light, as illustrated in FIG. 64, a scattering surface may be formed on the surface of the protective substrate 18. The protective substrate 18 includes, for example, a glass substrate, but a scattering surface may be formed on a glass surface of the glass substrate to form the transmittance attenuation layer 2100. Since the incident light is scattered by the scattering surface, the ratio of reflected light increases and the transmittance attenuates.

As described above, the transmittance attenuation layer 2100 is a layer in which at least one of the reflectance, the absorptance, and the scattering coefficient has a value other than 0.

As described above, the configuration is adopted in which the transmittance attenuation layer 2100 is formed in some of the image pickup devices 1 of the plurality of image pickup devices 1 included in the camera module 2000, and signals are obtained from the image pickup devices 1 respectively having different transmitted light ratios.

In the above-described embodiment, the image pickup device 1 (the image pickup device 1-2 in FIG. 62) provided with the transmittance attenuation layer 2100 corresponds to the pixel B, and since the output signal in a case where a certain amount of signal (for example, charge) is generated per unit time is suppressed to be smaller than in the pixel A, and the saturation charge amount is greater, for example, the pixel does not reach the operation limit even in a case where the illuminance of the subject is high, whereby the image pickup device 1 can be used as a pixel from which an image having high gradation can be obtained.

Furthermore, in the above-described embodiment, the image pickup device 1 (the image pickup device 1-1 in FIG. 62) not provided with the transmittance attenuation layer 2100 corresponds to the pixel A, and in a case where a certain amount of signal (for example, charge) is generated per unit time, the output signal greater than that of the pixel B can be obtained, so that, for example, the image pickup device 1 can be used as a pixel from which an image having high gradation can be obtained even in a case where the illuminance of the subject is low.

Therefore, since the camera module 2000 illustrated in FIG. 62 includes the image pickup device 1-1 and the image pickup device 1-2 respectively corresponding to the pixel A and the pixel B, the camera module 2000 can be a device from which an image having high gradation can be obtained over a wide illuminance range, that is, an image having a so-called wide dynamic range can be obtained.

Figure 65:
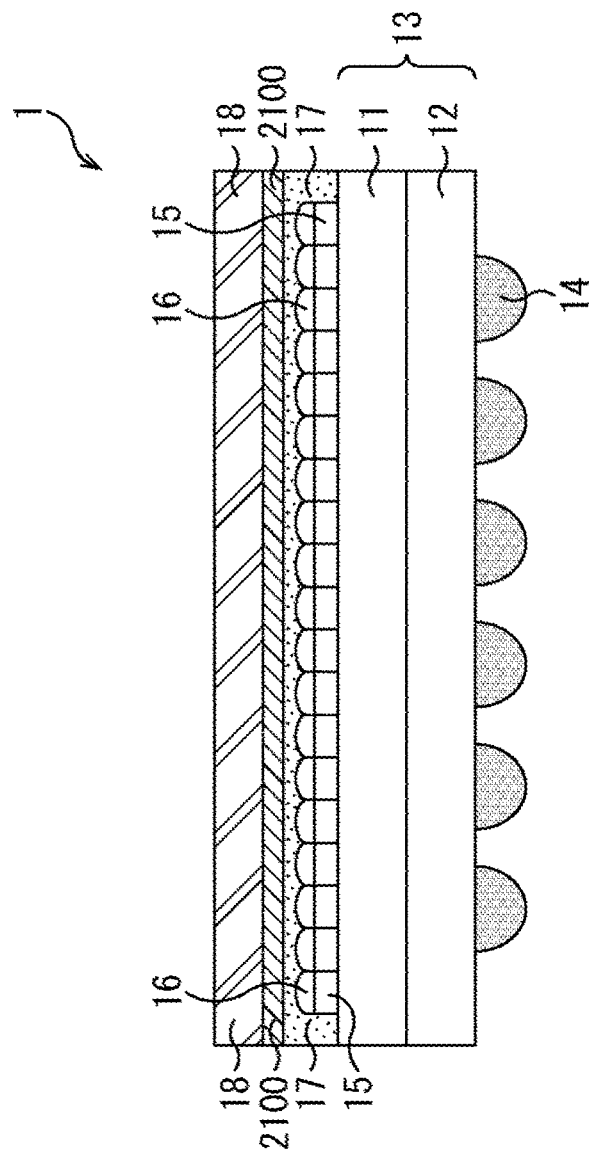
FIG. 65 is a diagram for explaining a forming position of a transmittance attenuation layer.
Figure 66:
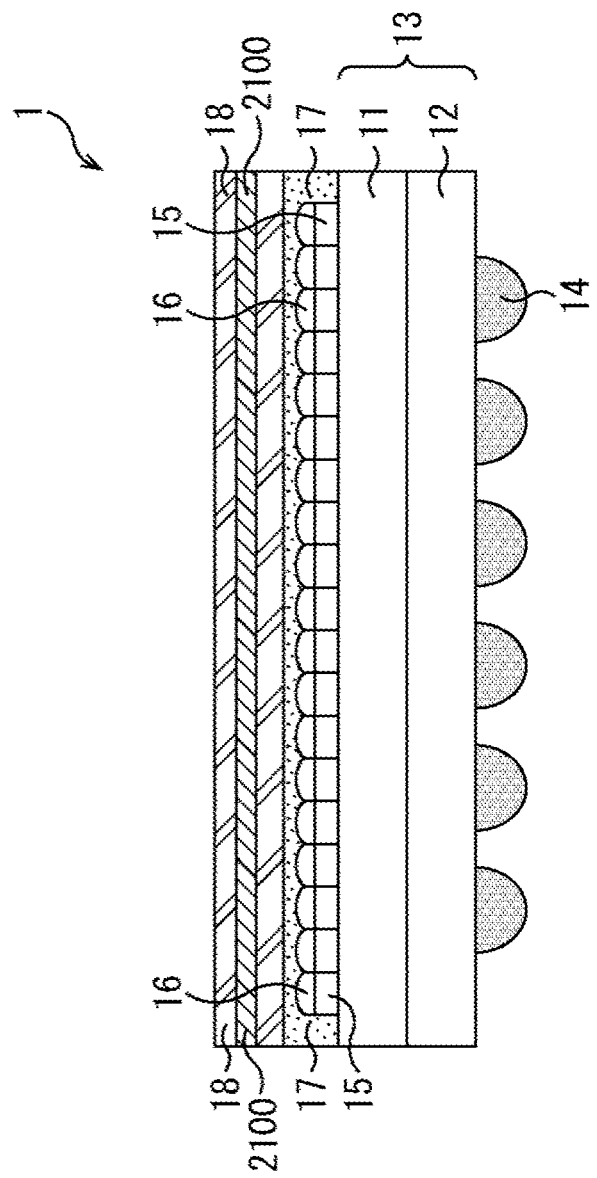
FIG. 66 is a diagram for explaining a forming position of the transmittance attenuation layer.

As illustrated in FIG. 62, the transmittance attenuation layer 2100 may be formed on the protective substrate 18 of the image pickup device 1; however, the transmittance attenuation layer 2100 may also be formed at a position illustrated in each of FIGS. 65 and 66. Referring to FIG. 65, the transmittance attenuation layer 2100 is formed between the protective substrate 18 of the image pickup device 1 and the glass seal resin 17. Furthermore, referring to FIG. 66, the transmittance attenuation layer 2100 is formed within the protective substrate 18 of the image pickup device 1.

As described above, the transmittance attenuation layer 2100 can be formed on the protective substrate 18, within the protective substrate 18, or under the protective substrate 18.

Figure 67:
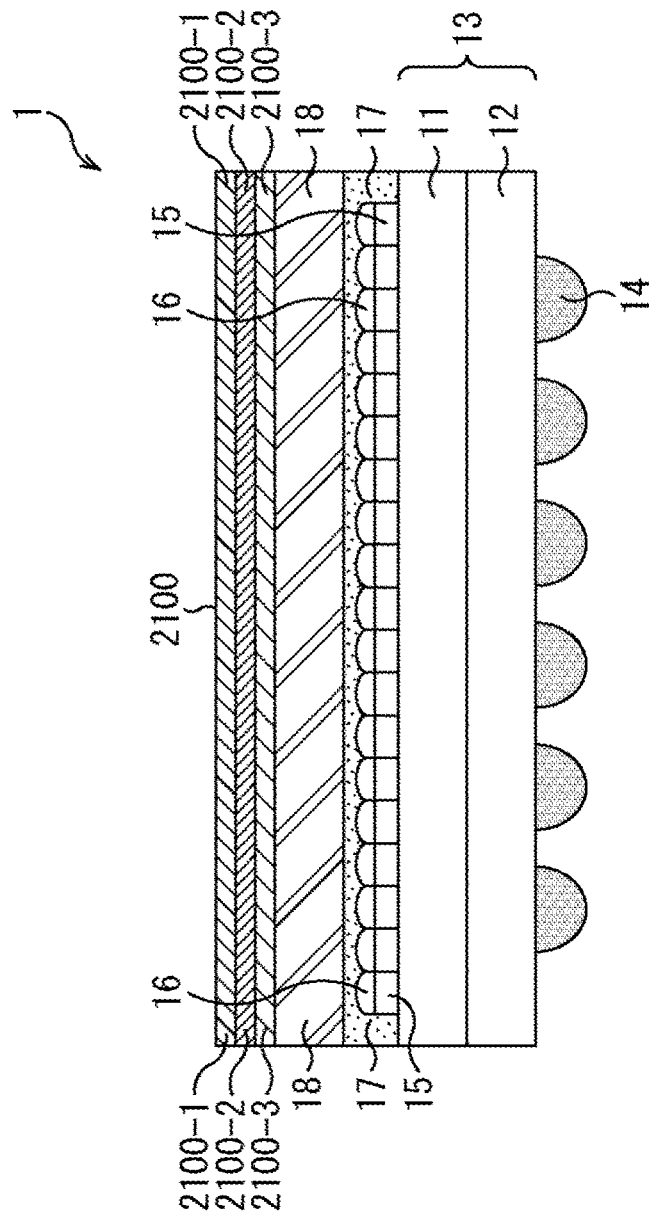
FIG. 67 is a diagram for explaining a shape of the transmittance attenuation layer.

Furthermore, as illustrated in FIG. 62, the transmittance attenuation layer 2100 may include a uniform material, with substantially the same thickness, on the protective substrate 18 of the image pickup device 1; however, as illustrated in FIG. 67, the transmittance attenuation layer 2100 may include a plurality of materials (a plurality of layers).

The transmittance attenuation layer 2100 illustrated in FIG. 67 includes three layers of a transmittance attenuation layer 2100-1, a transmittance attenuation layer 2100-2, and a transmittance attenuation layer 2100-3. The three layers of transmittance attenuation layers 2100 includes different materials, respectively. By including different materials, the layers are obtained with respective desired transmittances.

Note that, the transmittance attenuation layer 2100 may include a plurality of layers other than three layers.

Figure 68:
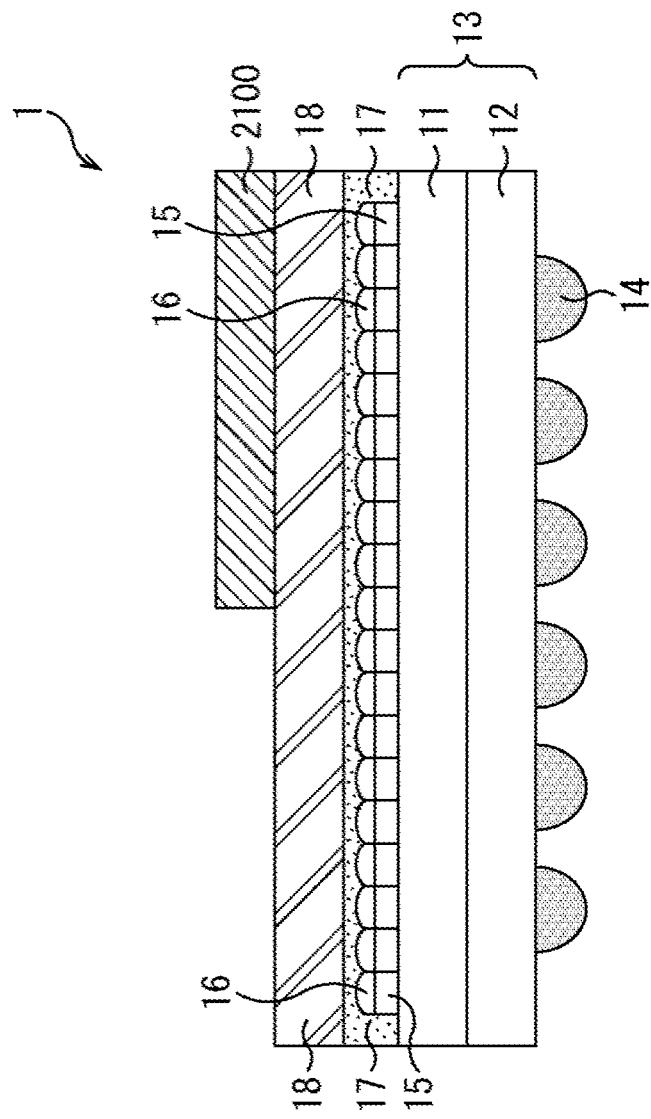
FIG. 68 is a diagram for explaining a shape of the transmittance attenuation layer.

Furthermore, as illustrated in FIG. 68, the transmittance attenuation layer 2100 may be formed not in the entire surface of the image pickup device 1 but in a part thereof. In the example illustrated in FIG. 68, an example is illustrated in which the transmittance attenuation layer 2100 is formed in a half region (a half region of an effective pixel region) of the plane of the protective substrate 18 of the image pickup device 1.

Figure 69:
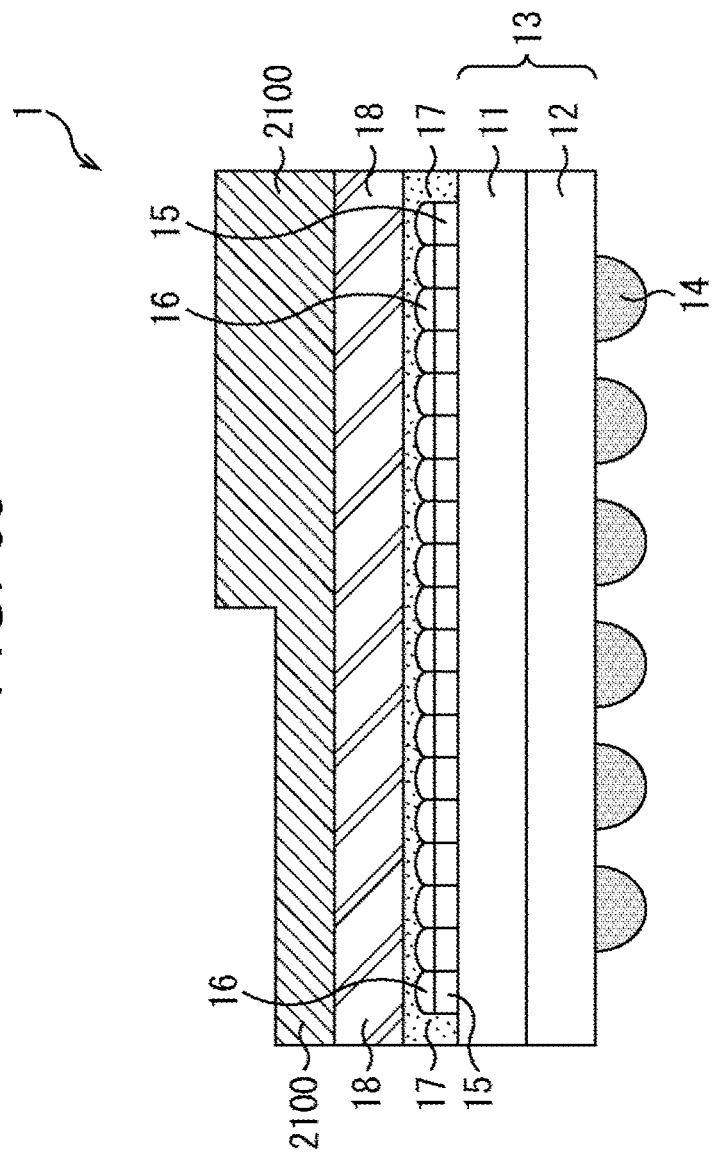
FIG. 69 is a diagram for explaining a shape of the transmittance attenuation layer.

Note that, FIG. 68 illustrates an example in which the transmittance attenuation layer 2100 is formed on the right half of the effective pixel region, but the transmittance attenuation layer 2100 may be formed in the left half, or in a strip shape. Furthermore, as illustrated in FIG. 69, the thickness of the transmittance attenuation layer 2100 may be set to different thicknesses on the left and right sides. In the example illustrated in FIG. 69, the thickness of the transmittance attenuation layer 2100 provided in the left half of the effective pixel region is formed to be thinner than the thickness of the transmittance attenuation layer 2100 provided in the right half.

As illustrated in FIGS. 68 and 69, by making the thickness of the transmittance attenuation layer 2100 different within the effective pixel region, it is possible to add a functional difference.

Figure 70:
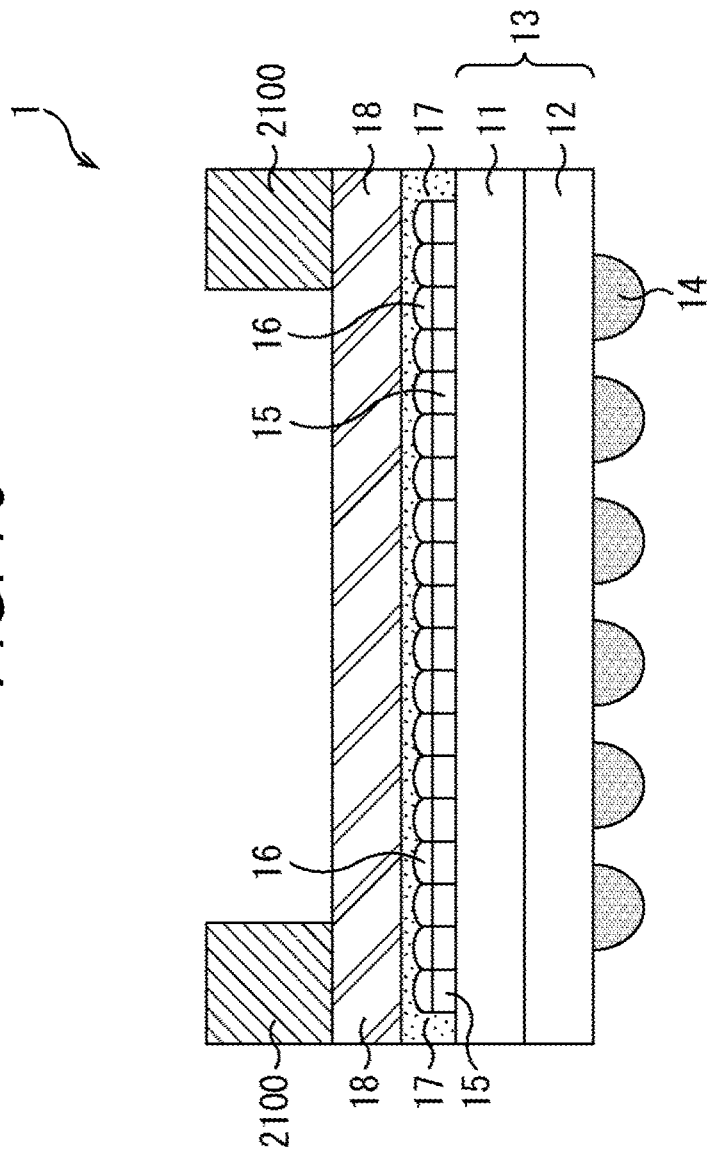
FIG. 70 is a diagram for explaining a shape of the transmittance attenuation layer.

Furthermore, as illustrated in FIG. 70, the transmittance attenuation layer 2100 may be formed at both ends of the image pickup device 1. For example, in a case where the optical black region (OPB region) is provided at both ends of the image pickup device 1, the transmittance attenuation layer 2100 may be formed on the optical black region. In this case, it is possible to obtain an effect that a flare can be suppressed.

For the transmittance attenuation layers 2100 described with reference to FIGS. 67 to 70, as described with reference to FIGS. 65 and 66, as for the positions where the transmittance attenuation layers 2100 are formed, the transmittance attenuation layers 2100 can be formed on the protective substrate 18, within the protective substrate 18, or under the protective substrate 18.

The transmittance attenuation layer 2100 can include a metal such as aluminum (Al), gold (Au), cobalt (Co), nickel (Ni), copper (Cu), tungsten (W), or titanium (Ti), or an inorganic material such as silicon monoxide (SiO), silicon nitride (SiN), or silicon oxynitride (SiON) film. Furthermore, an organic material may also be used. Furthermore, a polarizer such as crystal or liquid crystal may be used.

In a case where the transmittance attenuation layer 2100 includes an organic material, the transmittance attenuation layer 2100 may be configured to function also as a color filter. For example, the transmittance attenuation layer 2100 illustrated in FIG. 62 can be a red (R) color filter, a green (G) color filter, or a blue (B) color filter.

The transmittance attenuation layer 2100 includes any or combination of such a metal, an inorganic material, an organic material, and a polarizer.

Furthermore, as illustrated in A of FIG. 61, in the case of the camera module 2000 including four image pickup devices 1, each of the image pickup devices 1 may be used as the image pickup device 1 in which the red color filter is formed as the transmittance attenuation layer 2100, the image pickup device 1 in which the green color filter is formed as the transmittance attenuation layer 2100, or the image pickup device 1 in which the blue color filter is formed as the transmittance attenuation layer 2100. In this case, in a case where the RGB Bayer arrangement is applied, it is possible to configure such that the camera module 2000 includes two image pickup devices 1 in which the green color filter is formed as the transmittance attenuation layer 2100.

Furthermore, in the case of an arrangement of RGBC, it is configured such that, in one image pickup device 1 among the four image pickup devices 1, a transparent (C) color filter is formed as the transmittance attenuation layer 2100, or the transmittance attenuation layer 2100 is not formed.

As an arrangement of color filters of the camera module 2000 including four image pickup devices 1 as illustrated in A of FIG. 61, in addition to the RGB and RGBC described above, it is possible to apply the present technology to arrangements, for example, RCCC (among the four image pickup devices 1, one is the red color filter, and the rest of three are transparent color filters), RCCB (among the four image pickup devices 1, one is the red color filter, two are transparent color filters, and the rest of one is the blue color filter), and RGBIR (among the four image pickup devices 1, one is the red color filter, one is the green color filter, one is the blue color filter, and one is a color filter that transmits infrared rays), and the like.

<19. Formation of Transmittance Attenuation Layer>

Figure 71:
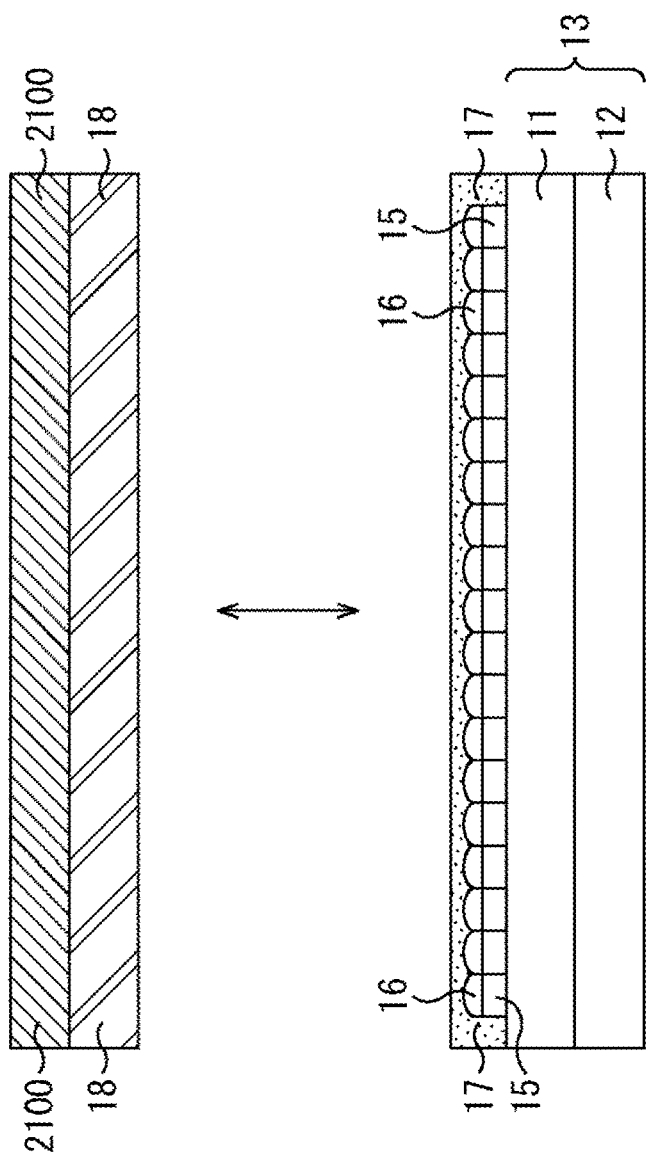
FIG. 71 is a diagram for explaining formation of the transmittance attenuation layer.

The transmittance attenuation layer 2100 can be formed as illustrated in FIG. 71. In other words, a substrate on which the transmittance attenuation layer 2100 is formed on the protective substrate 18 and a substrate layered up to the glass seal resin 17 are pasted to each other, whereby the image pickup device 1 can be manufactured on which the transmittance attenuation layer 2100 is formed.

In FIG. 71, a case is illustrated where the transmittance attenuation layer 2100 is formed on the protective substrate 18; however, from the state illustrated in FIG. 71, the substrate on which the transmittance attenuation layer 2100 is formed is inverted, and after the inversion, the transmittance attenuation layer 2100 and the glass seal resin 17 are bonded to each other, whereby the image pickup device 1 can be manufactured in which the transmittance attenuation layer 2100 is formed between the glass seal resin 17 and the protective substrate 18.

Figure 72:
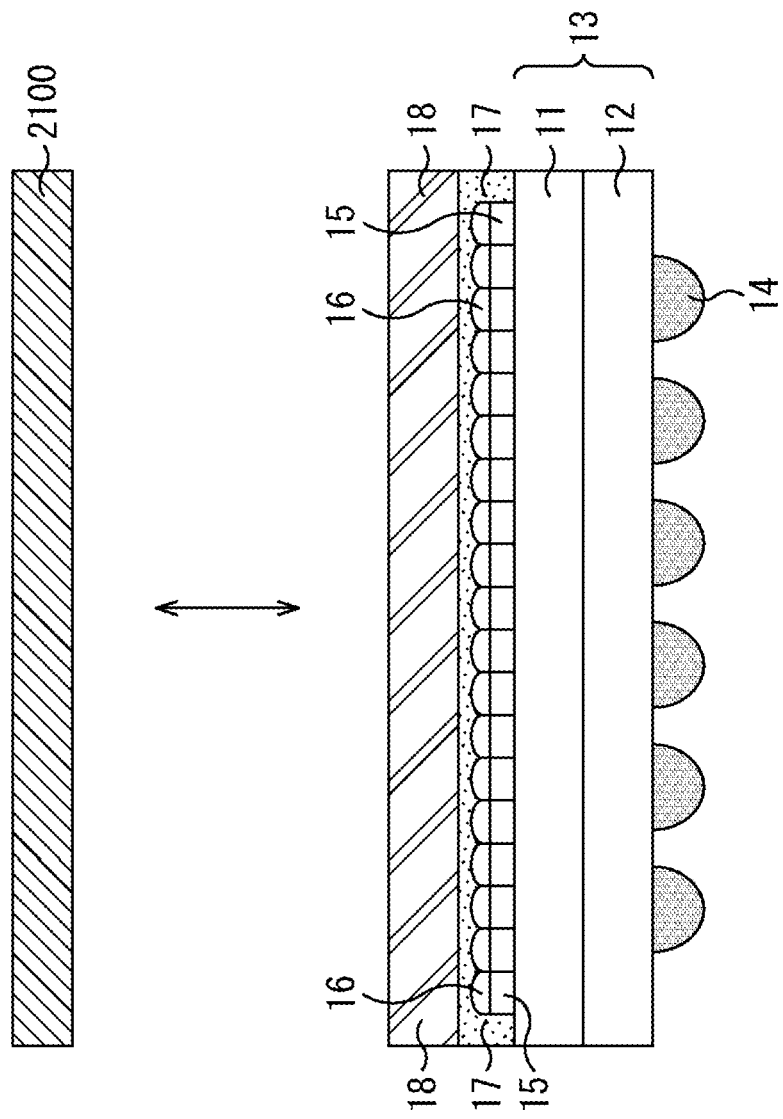
FIG. 72 is a diagram for explaining formation of the transmittance attenuation layer.

Furthermore, as illustrated in FIG. 72, the transmittance attenuation layer 2100 is formed on the image pickup device 1 formed up to the protective substrate 18, whereby the image pickup device 1 can be manufactured in which the transmittance attenuation layer 2100 is formed.

Formation of the transmittance attenuation layer 2100 illustrated in FIGS. 71 and 72 may be performed in a wafer state, or may be performed after individualization.

Figure 73:
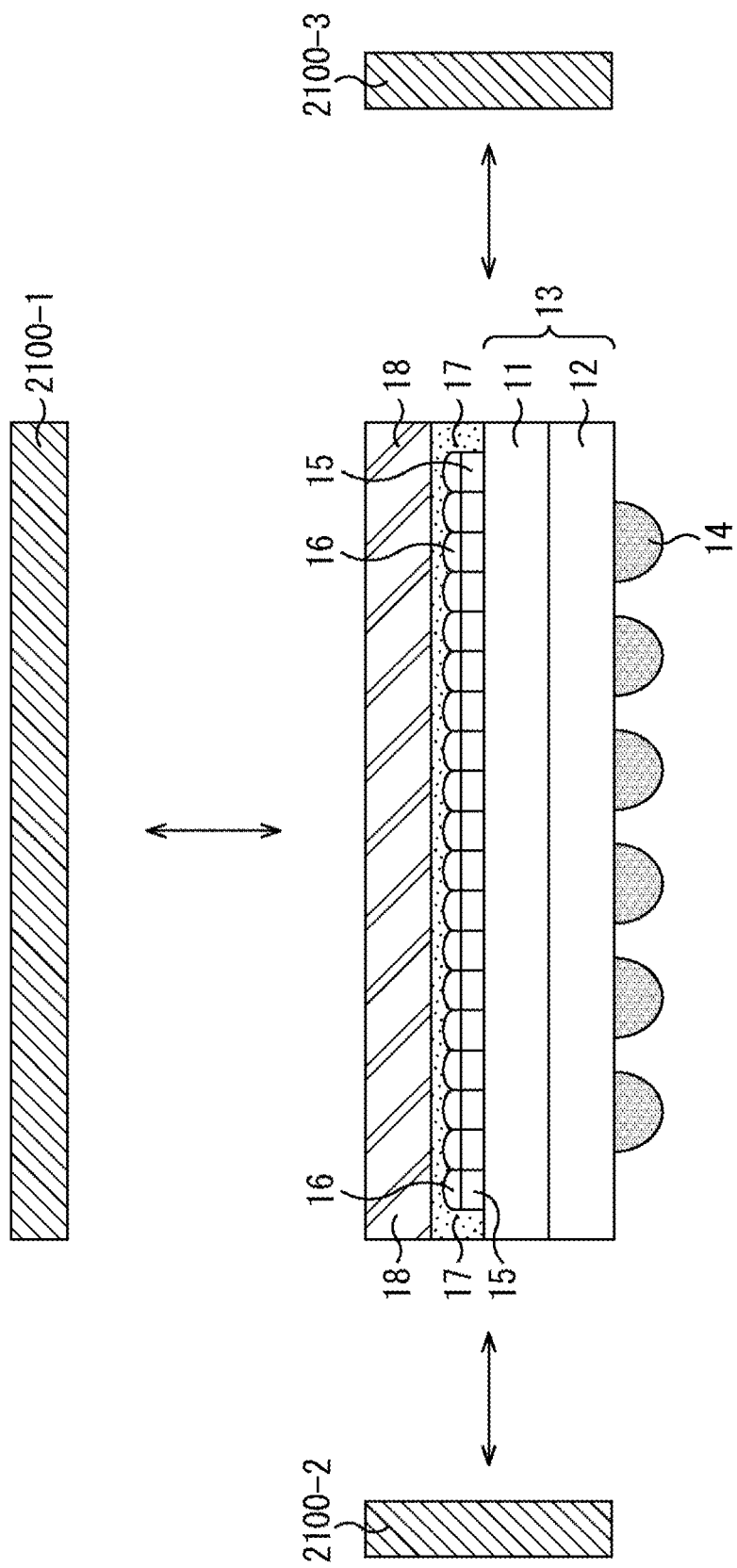
FIG. 73 is a diagram for explaining formation of the transmittance attenuation layer.

In a case where the transmittance attenuation layer 2100 is formed after the individualization, as illustrated in FIG. 73, the transmittance attenuation layer 2100 can also be formed on the side surface of the image pickup device 1. After the individualization, each chip (image pickup device 1) is handled in a state of adhering to a sheet, and when the transmittance attenuation layer 2100 is formed on the protective substrate 18 after the sheet is expanded, the transmittance attenuation layer 2100 is formed also on the side surface.

For example, in a case where the transmittance attenuation layer 2100 includes a material having a moisture-proof effect, the image pickup device 1 can be surrounded by the material having the moisture-proof effect, and moisture can be prevented from entering the image pickup device 1.

In the above-described embodiment, the transmittance attenuation layer 2100 is described as the layer that attenuates the transmittance of the light incident thereon, but the layer may be formed as a layer that improves the transmittance. For example, the surface of the protective substrate 18 including a glass substrate is subjected to moth-eye processing, whereby the reflectance of the glass interface can be suppressed, and the transmittance can be improved.

<20. Application Example to Electronic Apparatus>

The present technology is not limited to application to image pickup devices. In other words, the present disclosure is applicable to all electronic apparatuses using an image pickup device for an image capturing unit (photoelectric conversion unit), such as an image pickup device such as a digital still camera or a video camera, a mobile terminal device having an image pickup function, and a copying machine using an image pickup device for an image reading unit. The image pickup device may be in a form formed as a one-chip or in a modular form having an image pickup function in which an image pickup unit and a signal processing unit or an optical system are packaged together.

Figure 74:
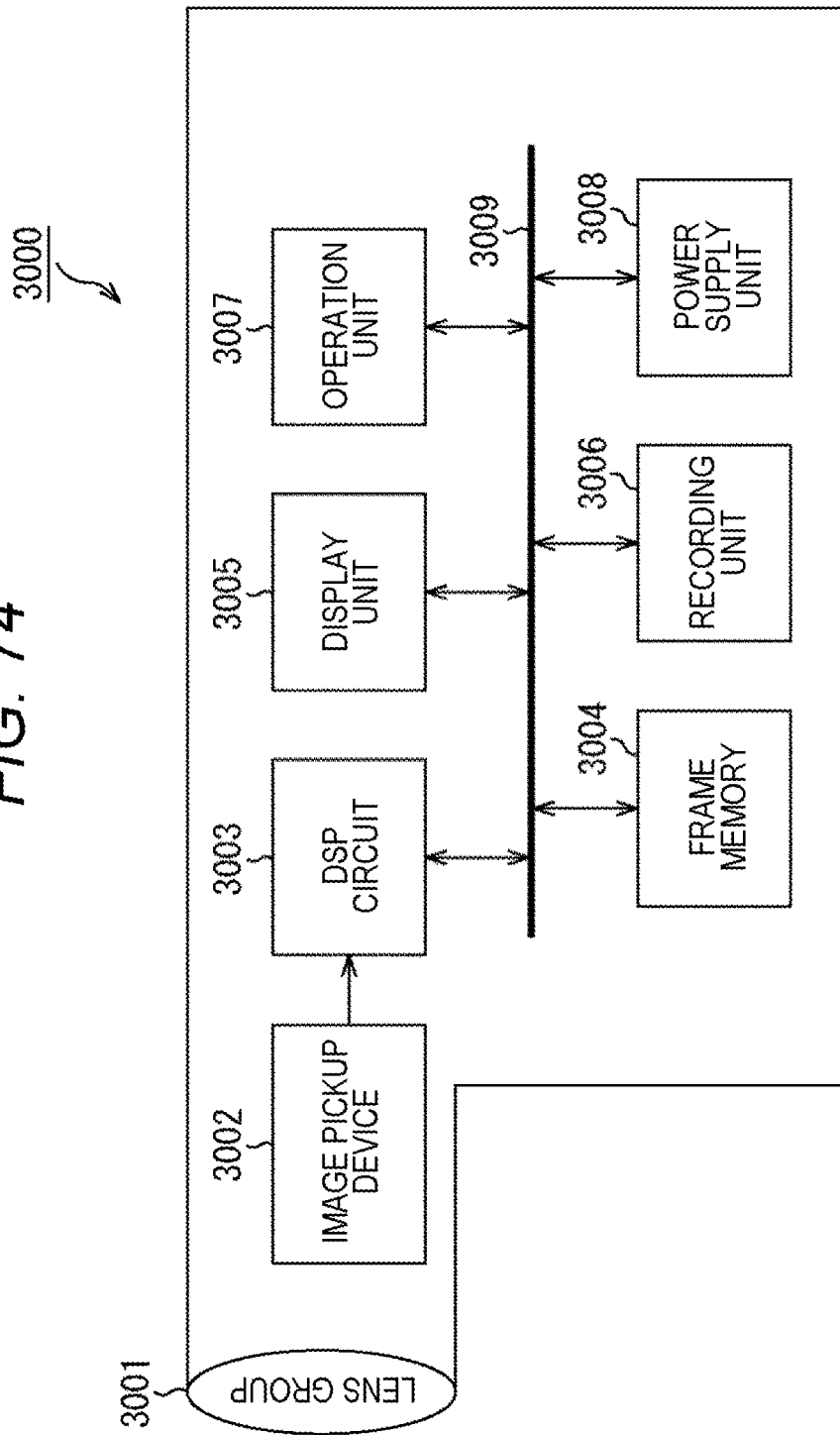
FIG. 74 is a block diagram illustrating an example configuration of the image pickup device as an electronic apparatus to which the present technology is applied.

FIG. 74 is a block diagram illustrating an example configuration of the image pickup device as an electronic apparatus to which the present technology is applied.

An image pickup apparatus 3000 of FIG. 74 includes: an optical unit 3001 including a lens group and the like; an image pickup device 3002 in which the configuration of the image pickup device 1 of FIG. 1 is adopted; and a digital signal processor (DSP) circuit 3003 that is a camera signal processing circuit. Furthermore, the image pickup apparatus 3000 also includes a frame memory 3004, a display unit 3005, a recording unit 3006, an operation unit 3007, and a power supply unit 3008. The DSP circuit 3003, the frame memory 3004, the display unit 3005, the recording unit 3006, the operation unit 3007, and the power supply unit 3008 are connected to each other via a bus line 3009.

The optical unit 3001 takes in incident light (image light) from a subject and forms an image on an image pickup surface of the image pickup device 3002. The image pickup device 3002 converts the amount of light of the incident light formed on the image pickup surface by the optical unit 3001 into an electrical signal for each pixel, and outputs the electrical signal as the pixel signal. As the image pickup device 3002, an image pick up device can be used that is downsized by that, a conductive pad for contact with a measurement probe is not provided on the outer peripheral portion, for the purpose of measuring the operation of the image pickup device 1 of FIG. 1, in other words, the layered structural body 13, but instead, the input/output circuit unit 49 is arranged in a region below the region of the pixel array unit 24 of the upper structural body 11, or in a region below the pixel peripheral circuit region 313 of the upper structural body 11.

The display unit 3005 includes, for example, a panel type display device such as a liquid crystal panel or an organic electro-luminescence (EL) panel, and displays a moving image or a still image captured by the image pickup device 3002. The recording unit 3006 records the moving image or the still image captured by the image pickup device 3002 on a recording medium such as a hard disk or a semiconductor memory.

The operation unit 3007, under operation by a user, issues an operation command for various functions included in the image pickup apparatus 3000. The power supply unit 3008 supplies various power supplies that are operation power supplies for the DSP circuit 3003, the frame memory 3004, the display unit 3005, the recording unit 3006, and the operation unit 3007, to these supply targets as appropriate.

As described above, the package size of a semiconductor package can be downsized by using the image pickup device 1 according to the above-described embodiments as the image pickup device 3002. Accordingly, also in the image pickup apparatus 3000 such as a video camera or a digital still camera, or further a camera module for a mobile device such as a cellular phone, the apparatus can be downsized.

<21. Usage Examples of Image Sensor>

Figure 75:
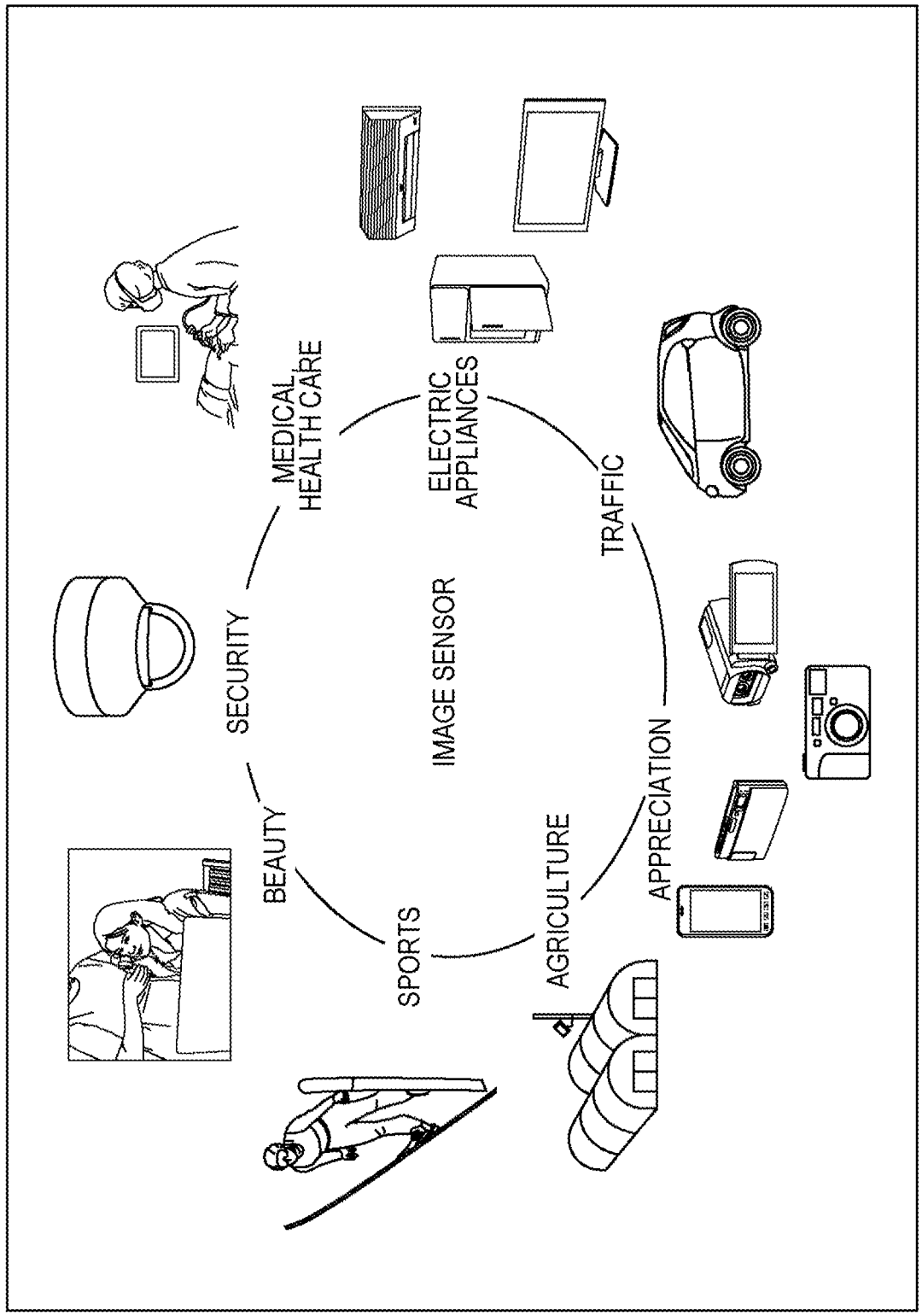
FIG. 75 is a diagram for explaining a usage example of the image pickup device in FIG. 1.

FIG. 75 is a diagram illustrating usage examples using the above-described image pickup device 1.

The CMOS image sensor as the image pickup device 1 can be used, for example, for various cases for sensing light, such as visible light, infrared light, ultraviolet light, or X rays, as described below.

An apparatus that photographs an image to be used for appreciation, such as a digital camera or a portable device with a camera function An apparatus to be used for traffic, such as an automotive sensor for photographing ahead of, behind, around, inside a car, and the like, a monitoring camera for monitoring traveling vehicles and roads, and a distance sensor for measuring a distance between vehicles and the like, for safe driving such as automatic stop, recognition of driver's condition, and the like An apparatus to be used for electric appliances, such as a TV, a refrigerator, and an air conditioner to photograph user's gesture and operate the appliances according to the gesture An apparatus to be used for medical care and healthcare, such as an endoscope or an apparatus for angiography by receiving infrared light An apparatus to be used for security, such as a monitoring camera for crime prevention applications, or a camera for person authentication applications An apparatus to be used for beauty, such as a skin measuring instrument for photographing skin, and a microscope for photographing a scalp An apparatus to be used for sports, such as a wearable camera or an action camera for sports applications, or the like An apparatus to be used for agriculture, such as a camera for monitoring conditions of fields and crops The image pickup device 1 can be applied to both the one that uses electrons as signal charges and the one that uses holes as signal charges.

Furthermore, the present disclosure is applicable not only to application to the image pickup device that detects and captures distribution of the amount of incident light of visible light as an image, but also to the image pickup device that captures distribution of the incident amount of infrared rays, X rays, particles, or the like as an image, and as a broad sense of meaning, generally to image pickup devices (physical quantity distribution detection device) for detecting and capturing, as an image, distribution of other physical quantities such as pressure and capacitance, such as a fingerprint detection sensor.

Furthermore, the present disclosure is applicable not only to image pickup devices but also to other semiconductor devices including a semiconductor integrated circuit in general.

<22. Application Example to Endoscopic Surgical System>

The present technology according to the present disclosure can be applied to various products. For example, the present technology according to the present disclosure may be applied to an endoscopic surgical system.

Figure 76:
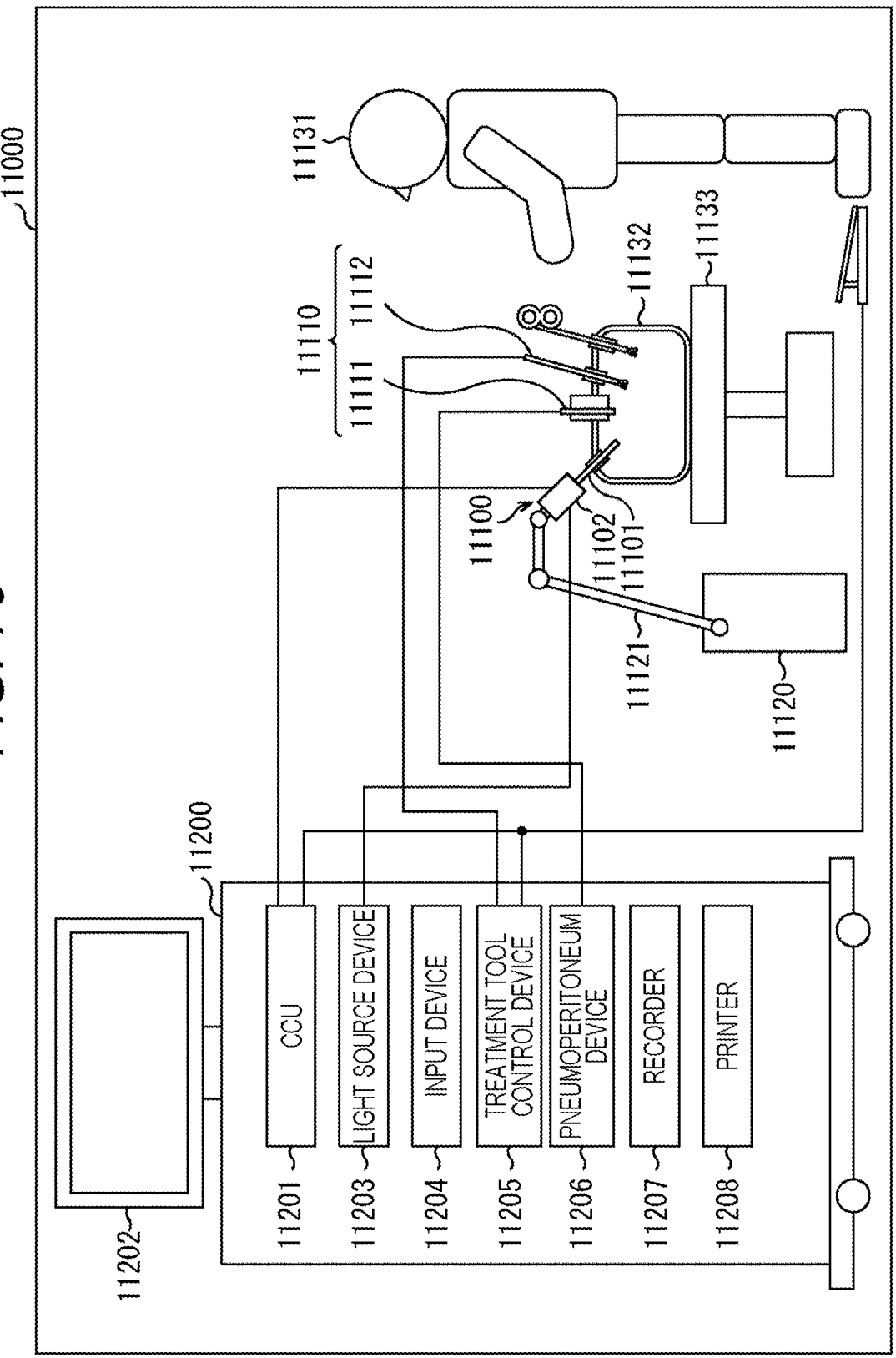
FIG. 76 is a diagram illustrating an example of a schematic configuration of an endoscopic surgical system.

FIG. 76 is a diagram illustrating an example of a schematic configuration of the endoscopic surgical system to which the present technology according to the present disclosure can be applied.

FIG. 76 illustrates a state in which an operator (doctor) 11131 is performing surgery on a patient 11132 on a patient bed 11133 using an endoscopic surgical system 11000. As illustrated, the endoscopic surgical system 11000 includes an endoscope 11100, other surgical tools 11110 such as a pneumoperitoneum tube 11111 and an energy treatment tool 11112, a support arm device 11120 that supports the endoscope 11100, and a cart 11200 on which various devices for endoscopic surgery are mounted.

The endoscope 11100 includes a lens barrel 11101 in which a region of a predetermined length from the distal end is inserted into the body cavity of the patient 11132, and a camera head 11102 connected to the proximal end of the lens barrel 11101. In the illustrated example, the endoscope 11100 formed as a so-called rigid scope including a rigid lens barrel 11101 is illustrated, but the endoscope 11100 may be formed as a so-called flexible scope including a flexible lens barrel.

At the distal end of the lens barrel 11101, an opening is provided into which an objective lens is fitted. A light source device 11203 is connected to the endoscope 11100, and light generated by the light source device 11203 is guided to the distal end of the lens barrel by a light guide extending inside the lens barrel 11101, and the light is emitted toward an observation target in the body cavity of the patient 11132 via the objective lens. Note that, the endoscope 11100 may be a direct viewing scope, an oblique viewing scope, or a side viewing scope.

An optical system and an image pickup element are provided inside the camera head 11102, and reflected light (observation light) from the observation target is converged on the image pickup element by the optical system. The observation light is photoelectrically converted by the image pickup element, and an electric signal corresponding to the observation light, that is, an image signal corresponding to the observation image is generated. The image signal is transmitted as RAW data to a camera control unit (CCU) 11201.

The CCU 11201 includes a central processing unit (CPU), a graphics processing unit (GPU), and the like, and comprehensively controls operation of the endoscope 11100 and a display device 11202. Moreover, the CCU 11201 receives the image signal from the camera head 11102 and applies various types of image processing, for example, development processing (demosaic processing), and the like, for displaying the image based on the image signal.

The display device 11202 displays an image based on the image signal subjected to the image processing by the CCU 11201, by the control from the CCU 11201.

The light source device 11203 includes a light source, for example, a light emitting diode (LED) or the like, and supplies irradiation light for photographing a surgical portion or the like to the endoscope 11100.

An input device 11204 is an input interface to the endoscopic surgical system 11000. A user can input various types of information and instructions to the endoscopic surgical system 11000 via the input device 11204. For example, the user inputs an instruction or the like to change image pickup conditions (type of irradiation light, magnification, focal length, and the like) for the endoscope 11100.

A treatment tool control device 11205 controls drive of the energy treatment tool 11112 for cauterization of tissue, incision, sealing of blood vessels, or the like. A pneumoperitoneum device 11206 injects a gas into the body cavity via the pneumoperitoneum tube 11111 to inflate the body cavity of the patient 11132, for the purpose of securing a visual field by the endoscope 11100 and securing a working space of the operator. A recorder 11207 is a device capable of recording various types of information on surgery. A printer 11208 is a device capable of printing various types of information regarding surgery in various formats such as text, image, graph, and the like.

Note that, the light source device 11203 that supplies irradiation light for photographing a surgical portion to the endoscope 11100 can include a white light source including, for example, an LED, a laser light source, or a combination thereof. In a case where the white light source includes a combination of R, G, and B laser light sources, the output intensity and the output timing of each color (each wavelength) can be controlled with high accuracy, so that adjustment of the white balance of the captured image in the light source device 11203. Furthermore, in this case, it is also possible to capture an image corresponding to each of R, G, and B in time division by emitting the laser light from each of the R, G, and B laser light sources in time division to the observation target, and controlling drive of the image pickup element of the camera head 11102 in synchronization with the emission timing. According to this method, a color image can be obtained without providing a color filter in the image pickup element.

Furthermore, drive of the light source device 11203 may be controlled such that the intensity of light to be output is changed at predetermined time intervals. By controlling the drive of the image pickup element of the camera head 11102 in synchronization with the timing of the light intensity change to acquire images in time division, and synthesizing the images, a high dynamic range image can be generated without so-called blocked up shadows or blown out highlights.

Furthermore, the light source device 11203 may be configured to be able to supply light of a predetermined wavelength band corresponding to special light observation. In the special light observation, for example, by using wavelength dependence of light absorption in body tissue, by emitting narrow band light compared to irradiation light (in other words, white light) at the time of ordinary observation, so-called Narrow Band Imaging is performed in which a predetermined tissue such as a blood vessel in a mucosal surface layer is photographed with high contrast. Alternatively, in the special light observation, fluorescence observation may be performed that obtain an image by fluorescence generated by emitting excitation light. In the fluorescence observation, it is possible to irradiate body tissue with excitation light to observe the fluorescence from the body tissue (autofluorescence observation), or to locally inject a reagent such as indocyanine green (ICG) into a body tissue and emit excitation light corresponding to the fluorescence wavelength of the reagent to obtain a fluorescent image, for example. The light source device 11203 can be configured to be able to supply narrow band light and/or excitation light corresponding to such special light observation.

Figure 77:
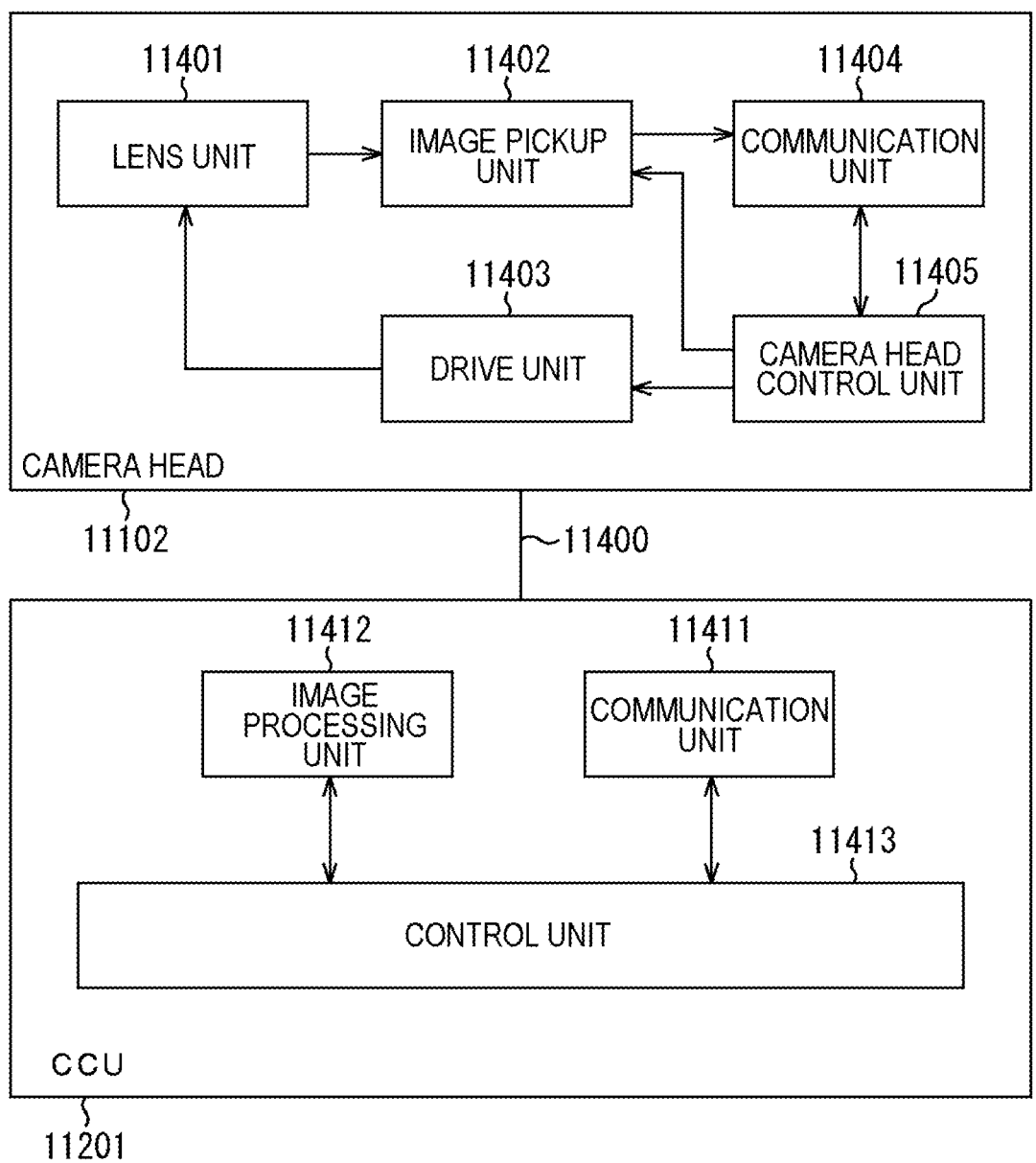
FIG. 77 is a block diagram illustrating an example of a functional configuration of a camera head and a CCU.

FIG. 77 is a block diagram illustrating an example of a functional configuration of the camera head 11102 and the CCU 11201 illustrated in FIG. 76.

The camera head 11102 includes a lens unit 11401, an image pickup unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at a connection portion with the lens barrel 11101. The observation light taken in from the distal end of the lens barrel 11101 is guided to the camera head 11102 and is incident on the lens unit 11401. The lens unit 11401 include a combination of a plurality of lenses including a zoom lens and a focus lens.

The image pickup unit 11402 includes an image pickup element. The image pickup element constituting the image pickup unit 11402 may be one (so-called single plate type) element, or a plurality of (so-called multiple plate type) elements. In a case where the image pickup unit 11402 includes the multiple plate type, for example, image signals corresponding to R, G, and B may be generated by respective image pickup elements, and a color image may be obtained by synthesizing the image signals. Alternatively, the image pickup unit 11402 may include a pair of image pickup elements for acquiring right-eye and left-eye image signals corresponding to three-dimensional (3D) display. By performing the 3D display, the operator 11131 can grasp the depth of living tissue in a surgical portion more accurately. Note that, in a case where the image pickup unit 11402 includes the multiple plate type, a plurality of systems of the lens units 11401 can be provided corresponding to respective image pickup elements.

Furthermore, the image pickup unit 11402 is not necessarily provided in the camera head 11102. For example, the image pickup unit 11402 may be provided inside the lens barrel 11101 immediately after the objective lens.

The drive unit 11403 includes an actuator and moves the zoom lens and the focus lens of the lens unit 11401 by a predetermined distance along the optical axis by control of the camera head control unit 11405. As a result, the magnification and the focus of the captured image by the image pickup unit 11402 can be appropriately adjusted.

The communication unit 11404 includes a communication device for transmitting/receiving various types of information to/from the CCU 11201. The communication unit 11404 transmits the image signal obtained from the image pickup unit 11402 as RAW data to the CCU 11201 via the transmission cable 11400.

Furthermore, the communication unit 11404 receives a control signal for controlling drive of the camera head 11102 from the CCU 11201, and supplies the control signal to the camera head control unit 11405. The control signal includes information regarding image pickup conditions, for example, information that specifies the frame rate of the captured image, information that specifies the exposure value at the time of image pickup, and/or information that specifies the magnification and focus of the captured image, and the like.

Note that, the image pickup conditions such as the frame rate, exposure value, magnification, and focus may be appropriately specified by the user, or automatically set by the control unit 11413 of the CCU 11201 on the basis of the acquired image signal. In the latter case, the so-called auto exposure (AE) function, auto-focus (AF) function, and auto white balance (AWB) function are installed in the endoscope 11100.

The camera head control unit 11405 controls the drive of the camera head 11102 on the basis of the control signal from the CCU 11201 received via the communication unit 11404.

The communication unit 11411 includes a communication device for transmitting/receiving various types of information to/from the camera head 11102. The communication unit 11411 receives the image signal transmitted from the camera head 11102 via the transmission cable 11400.

Furthermore, the communication unit 11411 transmits the control signal for controlling the drive of the camera head 11102 to the camera head 11102. The image signal and the control signal can be transmitted by electrical communication, optical communication, or the like.

The image processing unit 11412 performs various types of image processing on the image signal that is RAW data transmitted from the camera head 11102.

The control unit 11413 performs various types of control related to image pickup of a surgical portion or the like by the endoscope 11100 and display of the captured image obtained by the image pickup of the surgical portion or the like. For example, the control unit 11413 generates the control signal for controlling the drive of the camera head 11102.

Furthermore, the control unit 11413 causes the display device 11202 to display the captured image of the surgical portion or the like on the basis of the image signal subjected to the image processing by the image processing unit 11412. At this time, the control unit 11413 may recognize various objects in the captured image by using various image recognition technologies. For example, the control unit 11413 detects color, a shape of an edge, and the like of the object included in the captured image, thereby being able to recognize a surgical tool such as a forceps, a specific body part, bleeding, mist at the time of using the energy treatment tool 11112, or the like. When causing the display device 11202 to display the captured image, the control unit 11413 may cause the display device 11202 to superimpose and display various types of surgery assistance information on the image of the surgical portion by using the recognition result. The surgery assistance information is superimposed and displayed, and presented to the operator 11131, whereby the burden on the operator 11131 can be reduced, and the operator 11131 can reliably perform surgery.

The transmission cable 11400 connecting the camera head 11102 and the CCU 11201 together is an electric signal cable adaptable to communication of electric signals, an optical fiber adaptable to optical communication, or a composite cable thereof.

Here, in the illustrated example, communication is performed by wire using the transmission cable 11400, but communication between the camera head 11102 and the CCU 11201 may be performed wirelessly.

In the above, an example has been described of the endoscopic surgical system to which the technology according to the present disclosure can be applied. The technology according to the present disclosure can be applied to, for example, the endoscope 11100, (the image pickup unit 11402 of) the camera head 11102, (the image processing unit 11412 of) the CCU 11201, and the like) among the above-described configurations.

Note that, although the endoscopic surgical system has been described as an example here, the technology according to the present disclosure may be applied to other examples, for example, a microscopic surgery system, and the like.

<23. Application Example to Mobile Body>

The present technology according to the present disclosure can be applied to various products. The technology according to the present disclosure may be implemented as a device mounted on any type of mobile body, for example, a car, an electric car, a hybrid electric car, a motorcycle, a bicycle, a personal mobility, an airplane, a drone, a ship, a robot, and the like.

Figure 78:
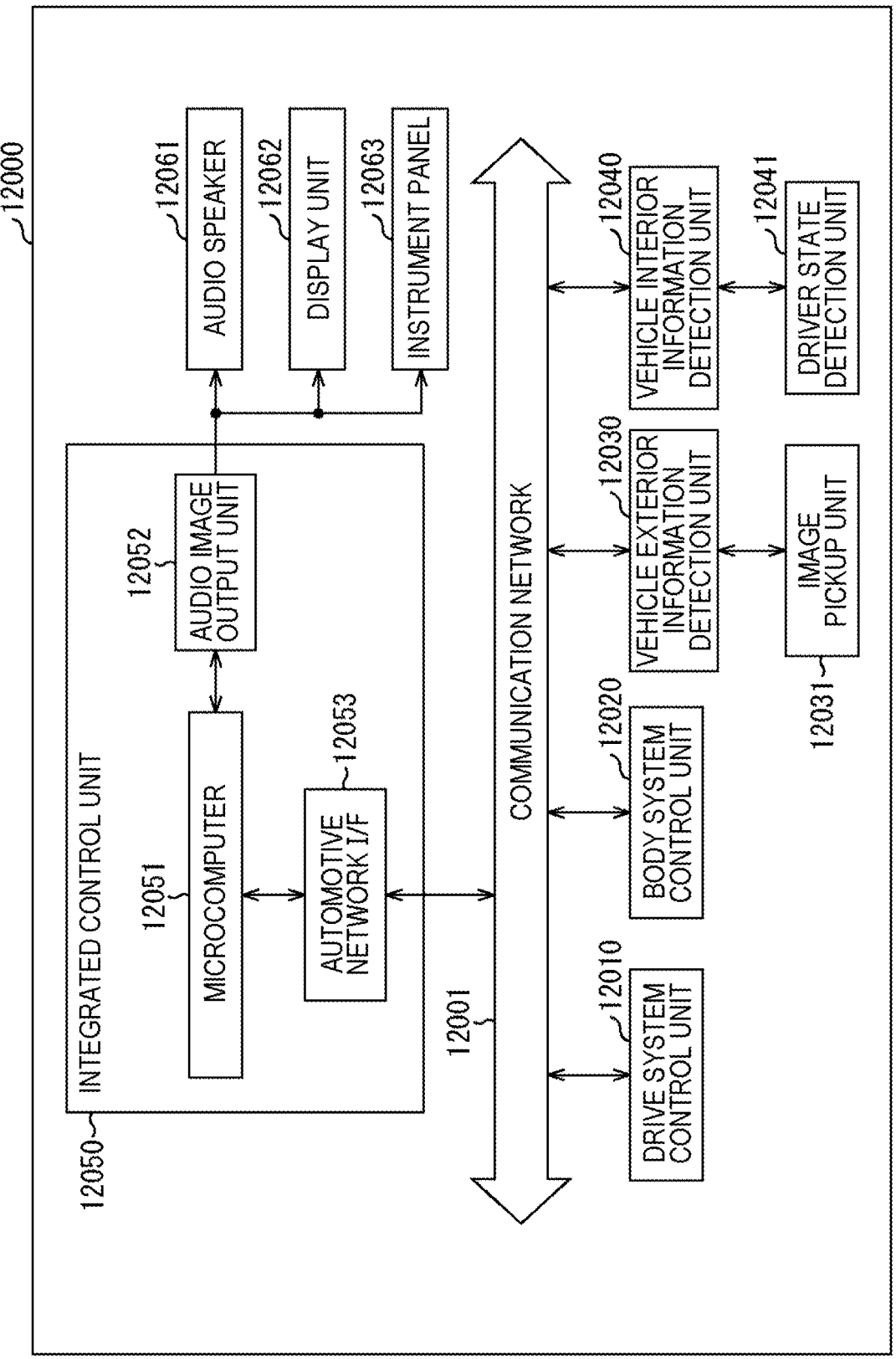
FIG. 78 is a block diagram illustrating an example of a schematic configuration of a vehicle control system.

FIG. 78 is a block diagram illustrating an example of a schematic configuration of a vehicle control system that is an example of a mobile body control system to which the technology according to the present disclosure can be applied.

A vehicle control system 12000 includes a plurality of electronic control units connected together via a communication network 12001. In the example illustrated in FIG. 78, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, an audio image output unit 12052, and an automotive network interface (I/F) 12053 are illustrated.

The drive system control unit 12010 controls operation of devices related to a drive system of a vehicle in accordance with various programs. For example, the drive system control unit 12010 functions as a control device of a driving force generating device for generating driving force of the vehicle, such as an internal combustion engine or a driving motor, a driving force transmitting mechanism for transmitting driving force to wheels, a steering mechanism for adjusting a steering angle, a braking device for generating braking force of the vehicle, and the like.

The body system control unit 12020 controls operation of various devices equipped on the vehicle body in accordance with various programs. For example, the body system control unit 12020 functions as a control device of a keyless entry system, a smart key system, a power window device, or various lamps such as a head lamp, a back lamp, a brake lamp, a turn signal lamp, and a fog lamp. In this case, to the body system control unit 12020, a radio wave transmitted from a portable device that substitutes for a key, or signals of various switches can be input. The body system control unit 12020 accepts input of these radio waves or signals and controls a door lock device, power window device, lamp, and the like of the vehicle.

The vehicle exterior information detection unit 12030 detects information on the outside of the vehicle on which the vehicle control system 12000 is mounted. For example, an image pickup unit 12031 is connected to the vehicle exterior information detection unit 12030. The vehicle exterior information detection unit 12030 causes the image pickup unit 12031 to capture an image outside the vehicle and receives the image captured. The vehicle exterior information detection unit 12030 may perform object detection processing or distance detection processing on a person, a car, an obstacle, a sign, a character on a road surface, or the like, on the basis of the received image.

The image pickup unit 12031 is an optical sensor that receives light and outputs an electric signal corresponding to the amount of light received. The image pickup unit 12031 can output the electric signal as an image, or as distance measurement information. Furthermore, the light received by the image pickup unit 12031 may be visible light, or invisible light such as infrared rays.

The vehicle interior information detection unit 12040 detects information on the inside of the vehicle. The vehicle interior information detection unit 12040 is connected to, for example, a driver state detection unit 12041 that detects a state of a driver. The driver state detection unit 12041 includes, for example, a camera that captures an image of the driver, and the vehicle interior information detection unit 12040 may calculate a degree of fatigue or a degree of concentration of the driver, or determine whether or not the driver is dozing, on the basis of the detection information input from the driver state detection unit 12041.

The microcomputer 12051 can calculate a control target value of the driving force generating device, the steering mechanism, or the braking device on the basis of the information inside and outside of the vehicle acquired by the vehicle exterior information detection unit 12030 or the vehicle interior information detection unit 12040, and output a control command to the drive system control unit 12010. For example, the microcomputer 12051 can perform cooperative control aiming for implementing functions of advanced driver assistance system (ADAS) including collision avoidance or shock mitigation of the vehicle, follow-up traveling based on an inter-vehicle distance, vehicle speed maintaining traveling, vehicle collision warning, vehicle lane departure warning, or the like.

Furthermore, the microcomputer 12051 can perform cooperative control aiming for automatic driving that autonomously travels without depending on operation of the driver, or the like, by controlling the driving force generating device, the steering mechanism, the braking device, or the like on the basis of information on the periphery of the vehicle acquired by the vehicle exterior information detection unit 12030 or the vehicle interior information detection unit 12040.

Furthermore, the microcomputer 12051 can output a control command to the body system control unit 12020 on the basis of information on the outside of the vehicle acquired by the vehicle exterior information detection unit 12030. For example, the microcomputer 12051 can perform cooperative control aiming for preventing dazzling such as switching from the high beam to the low beam, by controlling the head lamp depending on a position of a preceding vehicle or an oncoming vehicle detected by the vehicle exterior information detection unit 12030.

The audio image output unit 12052 transmits at least one of audio and image output signals to an output device capable of visually or aurally notifying an occupant of the vehicle or the outside of the vehicle of information. In the example of FIG. 78, as the output device, an audio speaker 12061, a display unit 12062, and an instrument panel 12063 are illustrated. The display unit 12062 may include, for example, at least one of an on-board display and a head-up display.

Figure 79:
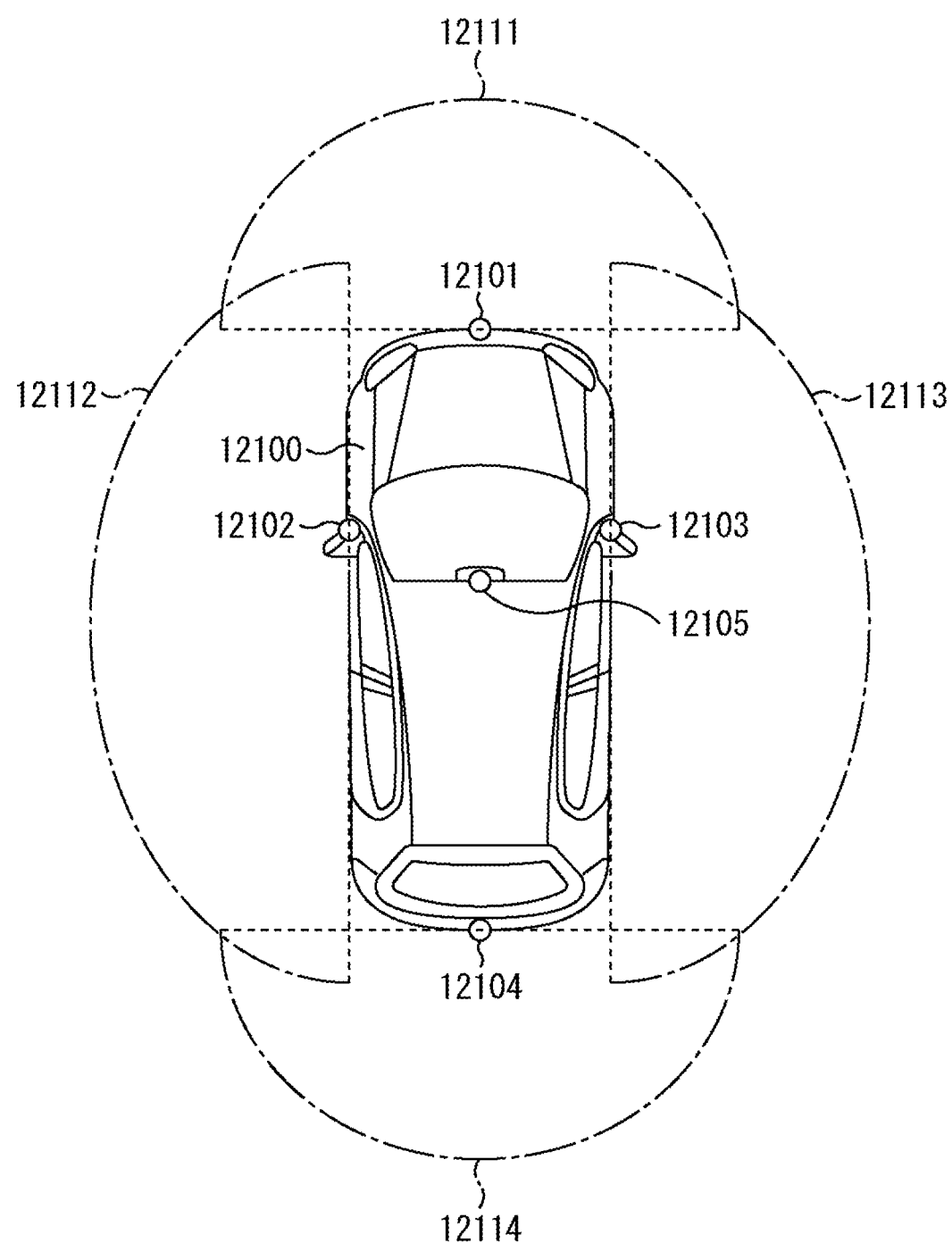
FIG. 79 is an explanatory diagram illustrating an example of installation positions of a vehicle exterior information detection unit and an image pickup unit.

FIG. 79 is a diagram illustrating an example of an installation position of the image pickup unit 12031.

In FIG. 79, the vehicle 12100 includes image pickup units 12101, 12102, 12103, 12104, and 12105 as the image pickup unit 12031.

The image pickup units 12101, 12102, 12103, 12104, and 12105 are provided at positions, for example, the front nose, the side mirror, the rear bumper, the back door, the upper part of the windshield in the vehicle interior, and the like of the vehicle 12100. The image pickup unit 12101 provided at the front nose and the image pickup unit 12105 provided at the upper part of the windshield in the vehicle interior mainly acquire images ahead of the vehicle 12100. The image pickup units 12102 and 12103 provided at the side mirrors mainly acquire images on the sides of the vehicle 12100. The image pickup unit 12104 provided at the rear bumper or the back door mainly acquires an image behind the vehicle 12100. The front images acquired by the image pickup units 12101 and 12105 are mainly used for detection of a preceding vehicle, a pedestrian, an obstacle, a traffic signal, a traffic sign, a lane, or the like.

Note that, FIG. 79 illustrates an example of a photographing range of the image pickup units 12101 to 12104. An image pickup range 12111 indicates an image pickup range of the image pickup unit 12101 provided at the front nose, image pickup ranges 12112 and 12113 respectively indicate image pickup ranges of the image pickup units 12102 and 12103 provided at the side mirrors, an image pickup range 12114 indicates an image pickup range of the image pickup unit 12104 provided at the rear bumper or the back door. For example, image data captured by the image pickup units 12101 to 12104 are superimposed on each other, whereby an overhead image is obtained of the vehicle 12100 viewed from above.

At least one of the image pickup units 12101 to 12104 may have a function of acquiring distance information. For example, at least one of the image pickup units 12101 to 12104 may be a stereo camera including a plurality of image pickup elements, or an image pickup element including pixels for phase difference detection.

For example, on the basis of the distance information obtained from the image pickup units 12101 to 12104, the microcomputer 12051 obtains a distance to each three-dimensional object within the image pickup ranges 12111 to 12114, and a temporal change of the distance (relative speed to the vehicle 12100), thereby being able to extract, as a preceding vehicle, a three-dimensional object that is in particular a closest three-dimensional object on a traveling path of the vehicle 12100 and traveling at a predetermined speed (for example, greater than or equal to 0 km/h) in substantially the same direction as that of the vehicle 12100. Moreover, the microcomputer 12051 can set an inter-vehicle distance to be secured in advance in front of the preceding vehicle, and can perform automatic brake control (including follow-up stop control), automatic acceleration control (including follow-up start control), and the like. As described above, it is possible to perform cooperative control aiming for automatic driving that autonomously travels without depending on operation of the driver, or the like.

For example, on the basis of the distance information obtained from the image pickup units 12101 to 12104, the microcomputer 12051 can extract three-dimensional object data regarding the three-dimensional object by classifying the objects into a two-wheeled vehicle, a regular vehicle, a large vehicle, a pedestrian, and other three-dimensional objects such as a utility pole, and use the data for automatic avoidance of obstacles. For example, the microcomputer 12051 identifies obstacles in the periphery of the vehicle 12100 into an obstacle visually recognizable to the driver of the vehicle 12100 and an obstacle difficult to be visually recognized. Then, the microcomputer 12051 determines a collision risk indicating a risk of collision with each obstacle, and when the collision risk is greater than or equal to a set value and there is a possibility of collision, the microcomputer 12051 outputs an alarm to the driver via the audio speaker 12061 and the display unit 12062, or performs forced deceleration or avoidance steering via the drive system control unit 12010, thereby being able to perform driving assistance for collision avoidance.

At least one of the image pickup units 12101 to 12104 may be an infrared camera that detects infrared rays. For example, the microcomputer 12051 can recognize a pedestrian by determining whether or not a pedestrian exists in the captured images of the image pickup units 12101 to 12104. Such pedestrian recognition is performed by, for example, a procedure of extracting feature points in the captured images of the image pickup units 12101 to 12104 as infrared cameras, and a procedure of performing pattern matching processing on a series of feature points indicating a contour of an object to determine whether or not the object is a pedestrian. When the microcomputer 12051 determines that a pedestrian exists in the captured images of the image pickup units 12101 to 12104 and recognizes the pedestrian, the audio image output unit 12052 controls the display unit 12062 so that a rectangular contour line for emphasis is superimposed and displayed on the recognized pedestrian. Furthermore, the audio image output unit 12052 may control the display unit 12062 so that an icon or the like indicating the pedestrian is displayed at a desired position.

In the above, an example has been described of the vehicle control system to which the technology according to the present disclosure can be applied. The technology according to the present disclosure can be applied to, for example, the image pickup unit 12031, and the like among the above-described configurations.

Embodiments of the present disclosure are not limited to the above-described embodiments, and various modifications are possible within the scope not departing from the gist of the present disclosure.

For example, it is possible to adopt a form in which all or a part of the plurality of embodiments is combined.

Note that, the effects described in the present specification are merely illustrative and not limiting and may have effects other than those described in the present specification.

Note that, the present disclosure can also be configured as described below.

(1)

An image pickup device including:

a first structural body and a second structural body that are layered, the first structural body including a pixel array unit in which a pixel that performs photoelectric conversion is two-dimensionally arrayed, the second structural body being positioned below the first structural body, the second structural body including an input circuit unit that inputs a predetermined signal from an outside of the device, an output circuit unit that outputs a pixel signal output from the pixel to the outside of the device, and a signal processing circuit;

an output unit and an input unit that are arranged below the pixel array unit of the first structural body, the output unit including the output circuit unit, a first through-via connected to the output circuit unit and penetrating through a semiconductor substrate constituting a part of the second structural body, and a signal output external terminal that connects the output circuit unit to the outside of the device via the first through-via, the input unit including the input circuit unit, a second through-via connected to the input circuit unit and penetrating through the semiconductor substrate, and a signal input external terminal that connects the input circuit unit to the outside of the device via the second through-via;

a substrate connected to the signal output external terminal and the signal input external terminal; and a circuit board connected to a first surface of the substrate, the first surface facing a second surface to which the signal output external terminal and the signal input external terminal are connected.

(2)

The image pickup device according to (1), further including:

a glass substrate positioned above the first structural body; and a lens barrel, in which the lens barrel is placed on the glass substrate.

(3)

The image pickup device according to (1), further including a lens barrel, in which the lens barrel is placed on the first structural body.

(4)

The image pickup device according to any of (1) to (3), in which the substrate includes two or more substrates that intersect perpendicularly to each other.

(5)

The image pickup device according to any of (1) to (4), further including a lens barrel, in which the circuit board is connected within a corresponding region of a surface within a region of the substrate in which the lens barrel is arranged and facing a surface in which the lens barrel is arranged.

(6)

The image pickup device according to any of (1) to (4), further including a lens barrel, in which the circuit board and a wire for wire bonding are each connected within a corresponding region of a surface within a region of the substrate in which the lens barrel is arranged and facing a surface in which the lens barrel is arranged.

(7)

An image pickup device including:

a first structural body, a glass substrate, a transmittance attenuation layer, and a second structural body that are layered, the first structural body including a pixel array unit in which a pixel that performs photoelectric conversion is two-dimensionally arrayed, the glass substrate being positioned above the first structural body, the transmittance attenuation layer being positioned above the first structural body and attenuating transmittance of incident light, the second structural body being positioned below the first structural body, the second structural body including an input circuit unit that inputs a predetermined signal from an outside of the device, an output circuit unit that outputs a pixel signal output from the pixel to the outside of the device, and a signal processing circuit; and an output unit and an input unit that are arranged below the pixel array unit of the first structural body, the output unit including the output circuit unit, a first through-via connected to the output circuit unit and penetrating through a semiconductor substrate constituting a part of the second structural body, and a signal output external terminal that connects the output circuit unit to the outside of the device via the first through-via, the input unit including the input circuit unit, a second through-via connected to the input circuit unit and penetrating through the semiconductor substrate, and a signal input external terminal that connects the input circuit unit to the outside of the device via the second through-via.

(8)

The image pickup device according to (7), in which the transmittance attenuation layer is formed on the glass substrate.

(9)

The image pickup device according to (7), in which the transmittance attenuation layer is formed within the glass substrate.

(10)

The image pickup device according to (7), in which the transmittance attenuation layer is formed between the glass substrate and the first structural body.

(11)

The image pickup device according to any of (7) to (10), in which the transmittance attenuation layer includes a plurality of layers.

(12)

The image pickup device according to (7), in which the transmittance attenuation layer is formed in a half region on the glass substrate.

(13)

The image pickup device according to (7), in which the transmittance attenuation layer is formed with different thicknesses on the glass substrate.

(14)

The image pickup device according to (7), in which the transmittance attenuation layer is formed on an optical black region.

(15)

The image pickup device according to (7), in which the transmittance attenuation layer also has a function as a color filter.

(16)

The image pickup device according to any of (7) to (15), in which the image pickup device includes a plurality of the image pickup devices, and the transmittance attenuation layer is formed in a predetermined number of the image pickup devices among the plurality of image pickup devices.

(17)

The image pickup device according to any of (7) to (16), in which the transmittance attenuation layer includes any or a combination of a metal, an inorganic material, an organic material, and a polarizer.

(18)

The image pickup device according to (7), in which the transmittance attenuation layer is formed by making a surface of the glass substrate a scattering surface for scattering light.

(19)

An image pickup device including:

a first structural body, a glass substrate, and a second structural body that are layered, the first structural body including a pixel array unit in which a pixel that performs photoelectric conversion is two-dimensionally arrayed, the glass substrate being positioned above the first structural body and including a light incident surface subjected to moth-eye processing, the second structural body being positioned below the first structural body, the second structural body including an input circuit unit that inputs a predetermined signal from an outside of the device, an output circuit unit that outputs a pixel signal output from the pixel to the outside of the device, and a signal processing circuit; and an output unit and an input unit that are arranged below the pixel array unit of the first structural body, the output unit including the output circuit unit, a first through-via connected to the output circuit unit and penetrating through a semiconductor substrate constituting a part of the second structural body, and a signal output external terminal that connects the output circuit unit to the outside of the device via the first through-via, the input unit including the input circuit unit, a second through-via connected to the input circuit unit and penetrating through the semiconductor substrate, and a signal input external terminal that connects the input circuit unit to the outside of the device via the second through-via.

(20)

An electronic apparatus including:

a first structural body and a second structural body that are layered, the first structural body including a pixel array unit in which a pixel that performs photoelectric conversion is two-dimensionally arrayed, the second structural body being positioned below the first structural body, the second structural body including an input circuit unit that inputs a predetermined signal from an outside of the device, an output circuit unit that outputs a pixel signal output from the pixel to the outside of the device, and a signal processing circuit;

an output unit and an input unit that are arranged below the pixel array unit of the first structural body, the output unit including the output circuit unit, a first through-via connected to the output circuit unit and penetrating through a semiconductor substrate constituting a part of the second structural body, and a signal output external terminal that connects the output circuit unit to the outside of the device via the first through-via, the input unit including the input circuit unit, a second through-via connected to the input circuit unit and penetrating through the semiconductor substrate, and a signal input external terminal that connects the input circuit unit to the outside of the device via the second through-via;

a substrate connected to the signal output external terminal and the signal input external terminal; and a circuit board connected to a first surface of the substrate, the first surface facing a second surface to which the signal output external terminal and the signal input external terminal are connected.

REFERENCE SIGNS LIST

1 Image pickup device
11 First structural body (upper structural body)
12 Second structural body (lower structural body)
13 Layered structural body
14 External terminal (signal input/output terminal)
15 Color filter
16 On-chip lens
17 Glass seal resin
18 Protective substrate
21 Input/output unit
22 Row drive unit
24 Pixel array unit
25 Column signal processing unit
26 Image signal processing unit
31 Pixel
41 Input terminal
42 Input circuit unit
47 Output circuit unit
48 Output terminal
49 Input/output circuit unit
51 Photodiode
81 Semiconductor substrate
88 Through-electrode via
90 Rewiring line
101 Semiconductor substrate
105 Through-chip-electrode
106 Connection wiring line
109 Through-silicon-electrode
311 Input/output circuit region
312 Signal processing circuit region
313 Pixel peripheral circuit region
314 Upper and lower substrates connection region
321 I/O circuit
901 Lens module
904 lens
921 Substrate
931 Circuit board
941 Bonding wire
2100 Transmittance attenuation layer

What is claimed is:

1. An image pickup device comprising:

a first structural body and a second structural body that are layered, the first structural body including a pixel array unit in which a pixel that performs photoelectric conversion is two-dimensionally arrayed, the second structural body being positioned below the first structural body, the second structural body including an input circuit unit that inputs a predetermined signal from an outside of the image pickup device, an output circuit unit that outputs a pixel signal output from the pixel to the outside of the image pickup device, and a signal processing circuit;

an output unit and an input unit that are arranged below the pixel array unit of the first structural body, the output unit including the output circuit unit, a first through-via connected to the output circuit unit and penetrating through a semiconductor substrate constituting a part of the second structural body, and a signal output external terminal that connects the output circuit unit to the outside of the image pickup device via the first through-via, the input unit including the input circuit unit, a second through-via connected to the input circuit unit and penetrating through the semiconductor substrate, and a signal input external terminal that connects the input circuit unit to the outside of the image pickup device via the second through-via;

a substrate connected to the signal output external terminal and the signal input external terminal; and a circuit board connected to a first surface of the substrate, the first surface facing a second surface to which the signal output external terminal and the signal input external terminal are connected.

2. The image pickup device according to claim 1, further comprising:

a glass substrate positioned above the first structural body; and a lens barrel, wherein the lens barrel is placed on the glass substrate.

3. The image pickup device according to claim 1, further comprising a lens barrel, wherein the lens barrel is placed on the first structural body.

4. The image pickup device according to claim 1, wherein the substrate includes two or more substrates that intersect perpendicularly to each other.

5. The image pickup device according to claim 1, further comprising a lens barrel, wherein the circuit board is connected within a corresponding region of a surface within a region of the substrate in which the lens barrel is arranged and facing a surface in which the lens barrel is arranged.

6. The image pickup device according to claim 1, further comprising a lens barrel, wherein the circuit board and a wire for wire bonding are each connected within a corresponding region of a surface within a region of the substrate in which the lens barrel is arranged and facing a surface in which the lens barrel is arranged.

7. An image pickup device comprising:

a first structural body, a glass substrate, a transmittance attenuation layer, and a second structural body that are layered, the first structural body including a pixel array unit in which a pixel that performs photoelectric conversion is two-dimensionally arrayed, the glass substrate being positioned above the first structural body, the transmittance attenuation layer being positioned above the first structural body and attenuating transmittance of incident light, the second structural body being positioned below the first structural body, the second structural body including an input circuit unit that inputs a predetermined signal from an outside of the image pickup device, an output circuit unit that outputs a pixel signal output from the pixel to the outside of the image pickup device, and a signal processing circuit; and an output unit and an input unit that are arranged below the pixel array unit of the first structural body, the output unit including the output circuit unit, a first through-via connected to the output circuit unit and penetrating through a semiconductor substrate constituting a part of the second structural body, and a signal output external terminal that connects the output circuit unit to the outside of the image pickup device via the first through-via, the input unit including the input circuit unit, a second through-via connected to the input circuit unit and penetrating through the semiconductor substrate, and a signal input external terminal that connects the input circuit unit to the outside of the image pickup device via the second through-via.

8. The image pickup device according to claim 7, wherein the transmittance attenuation layer is formed on the glass substrate.

9. The image pickup device according to claim 7, wherein the transmittance attenuation layer is formed within the glass substrate.

10. The image pickup device according to claim 7, wherein the transmittance attenuation layer is formed between the glass substrate and the first structural body.

11. The image pickup device according to claim 7, wherein the transmittance attenuation layer includes a plurality of layers.

12. The image pickup device according to claim 7, wherein the transmittance attenuation layer is formed in a half region on the glass substrate.

13. The image pickup device according to claim 7, wherein the transmittance attenuation layer is formed with different thicknesses on the glass substrate.

14. The image pickup device according to claim 7, wherein the transmittance attenuation layer is formed on an optical black region.

15. The image pickup device according to claim 7, wherein the transmittance attenuation layer also has a function as a color filter.

16. The image pickup device according to claim 7, wherein the image pickup device includes a plurality of the image pickup devices, and the transmittance attenuation layer is formed in a predetermined number of the image pickup devices among the plurality of image pickup devices.

17. The image pickup device according to claim 7, wherein the transmittance attenuation layer includes any or a combination of a metal, an inorganic material, an organic material, and a polarizer.

18. The image pickup device according to claim 7, wherein the transmittance attenuation layer is formed by making a surface of the glass substrate a scattering surface for scattering light.

19. An image pickup device comprising:
a first structural body, a glass substrate, and a second structural body that are layered, the first structural body including a pixel array unit in which a pixel that performs photoelectric conversion is two-dimensionally arrayed, the glass substrate being positioned above the first structural body and including a light incident surface subjected to moth-eye processing, the second structural body being positioned below the first structural body, the second structural body including an input circuit unit that inputs a predetermined signal from an outside of the image pickup device, an output circuit unit that outputs a pixel signal output from the pixel to the outside of the image pickup device, and a signal processing circuit; and an output unit and an input unit that are arranged below the pixel array unit of the first structural body, the output unit including the output circuit unit, a first through-via connected to the output circuit unit and penetrating through a semiconductor substrate constituting a part of the second structural body, and a signal output external terminal that connects the output circuit unit to the outside of the image pickup device via the first through-via, the input unit including the input circuit unit, a second through-via connected to the input circuit unit and penetrating through the semiconductor substrate, and a signal input external terminal that connects the input circuit unit to the outside of the image pickup device via the second through-via.

20. An electronic apparatus comprising:
a first structural body and a second structural body that are layered, the first structural body including a pixel array unit in which a pixel that performs photoelectric conversion is two-dimensionally arrayed, the second structural body being positioned below the first structural body, the second structural body including an input circuit unit that inputs a predetermined signal from an outside of the electronic apparatus, an output circuit unit that outputs a pixel signal output from the pixel to the outside of the electronic apparatus, and a signal processing circuit;

an output unit and an input unit that are arranged below the pixel array unit of the first structural body, the output unit including the output circuit unit, a first through-via connected to the output circuit unit and penetrating through a semiconductor substrate constituting a part of the second structural body, and a signal output external terminal that connects the output circuit unit to the outside of the electronic apparatus via the first through-via, the input unit including the input circuit unit, a second through-via connected to the input circuit unit and penetrating through the semiconductor substrate, and a signal input external terminal that connects the input circuit unit to the outside of the electronic apparatus via the second through-via;

a substrate connected to the signal output external terminal and the signal input external terminal; and a circuit board connected to a first surface of the substrate, the first surface facing a second surface to which the signal output external terminal and the signal input external terminal are connected.

* * * * *